US012206342B2

United States Patent
Moura et al.

(10) Patent No.: US 12,206,342 B2
(45) Date of Patent: *Jan. 21, 2025

(54) SUBSTRATE PROCESSING APPARATUS

(71) Applicant: Brooks Automation US, LLC., Chelmsford, MA (US)

(72) Inventors: Jairo T. Moura, Marlborough, MA (US); Vincent Tsang, Lincoln, MA (US); Karanjit Saini, Chelmsford, MA (US); Robert T. Caveney, Windham, NH (US); Robert C. May, Austin, TX (US); Daniel Babbs, Austin, TX (US)

(73) Assignee: Brooks Automation US, LLC, Chelmsford, MA (US)

( * ) Notice: Subject to any disclaimer, the term of this patent is extended or adjusted under 35 U.S.C. 154(b) by 154 days.

This patent is subject to a terminal disclaimer.

(21) Appl. No.: 18/050,300

(22) Filed: Oct. 27, 2022

(65) Prior Publication Data

US 2023/0143307 A1 May 11, 2023

Related U.S. Application Data

(60) Provisional application No. 63/273,579, filed on Oct. 29, 2021.

(51) Int. Cl.
*H01H 47/00* (2006.01)
*H01F 7/10* (2006.01)
(Continued)

(52) U.S. Cl.
CPC .............. *H02N 15/00* (2013.01); *H01F 7/10* (2013.01); *H01L 21/67265* (2013.01); *H01L 21/67748* (2013.01)

(58) Field of Classification Search
None
See application file for complete search history.

(56) References Cited

U.S. PATENT DOCUMENTS

| 4,624,617 A | 11/1986 | Belna |
| 4,654,571 A | 3/1987 | Hinds |

(Continued)

FOREIGN PATENT DOCUMENTS

| CN | 111279595 | 6/2020 |
| CN | 112840542 | 5/2021 |

(Continued)

OTHER PUBLICATIONS

International Search Report for International Application PCT/US2022/078882 dated Feb. 28, 2023.

*Primary Examiner* — Stephen W Jackson
(74) *Attorney, Agent, or Firm* — Perman & Green, LLP

(57) ABSTRACT

A linear electrical machine including a frame with a level reference plane, an array of electromagnets connected to the frame and coupled to an alternating current power source energizing each electromagnet, at least one reaction platen of paramagnetic, diamagnetic, or non-magnetic conductive material disposed to cooperate with the electromagnets of the array of electromagnets so that excitation of the electromagnets with alternating current generates levitation and propulsion forces against the reaction platen that controllably levitate and propel the reaction platen along at least one drive line, in a controlled attitude relative to the drive plane, and a controller operably coupled to the array of electromagnets and the alternating current power source and configured so as to sequentially excite the electromagnets with multiphase alternating current with a predetermined excitation characteristic so that each reaction platen is levitated and propelled with up to six degrees of freedom.

37 Claims, 61 Drawing Sheets

(51) Int. Cl.
  *H01L 21/67* (2006.01)
  *H01L 21/677* (2006.01)
  *H02N 15/00* (2006.01)

(56) References Cited

U.S. PATENT DOCUMENTS

| | | | |
|---|---|---|---|
| 5,163,546 A | 11/1992 | Kawada et al. |
| 5,180,048 A | 1/1993 | Kawada et al. |
| 5,309,049 A | 5/1994 | Kawada et al. |
| 5,428,283 A | 6/1995 | Kalman et al. |
| 5,641,054 A | 6/1997 | Mori et al. |
| 6,208,045 B1 | 5/2001 | Hazelton et al. |
| 6,231,732 B1 | 5/2001 | Hollars et al. |
| 6,279,728 B1 | 8/2001 | Jung et al. |
| 6,437,463 B1 | 8/2002 | Hazelton et al. |
| 6,452,292 B1 | 9/2002 | Binnard |
| 6,847,134 B2 | 1/2005 | Frissen et al. |
| 7,161,267 B2 | 1/2007 | Hol et al. |
| 7,199,493 B2 | 4/2007 | Ohishi |
| 7,224,252 B2 | 5/2007 | Meadow, Jr. et al. |
| 7,436,135 B2 | 10/2008 | Miyakawa |
| 7,808,133 B1 | 10/2010 | Widdowson et al. |
| 7,841,820 B2 | 11/2010 | Bonora et al. |
| 7,988,398 B2 | 8/2011 | Hofmeister et al. |
| 8,602,706 B2 | 12/2013 | Hofmeister et al. |
| 8,897,906 B2 | 11/2014 | Ohashi et al. |
| 9,027,739 B2 | 5/2015 | Hosek |
| 9,202,719 B2 | 12/2015 | Lu et al. |
| 9,685,849 B2 | 6/2017 | Lu et al. |
| 10,008,915 B2 | 6/2018 | Lu et al. |
| 10,056,816 B2 | 8/2018 | Lu |
| 10,116,195 B2 | 10/2018 | Lu |
| 10,222,237 B2 | 3/2019 | Lu |
| 10,348,177 B2 | 7/2019 | Lu |
| 10,348,178 B2 | 7/2019 | Lu |
| 10,554,110 B2 | 2/2020 | Lu et al. |
| 10,636,687 B2 | 4/2020 | Lau et al. |
| 10,704,927 B2 | 7/2020 | Lu |
| 10,707,738 B2 | 7/2020 | Lu |
| 10,819,205 B2 | 10/2020 | Lu |
| 10,926,418 B2 | 2/2021 | Lu |
| 10,958,148 B2 | 3/2021 | Lu |
| 10,978,330 B2 | 4/2021 | Yin et al. |
| 11,370,621 B2 | 6/2022 | Yamamoto |
| 11,476,139 B2 * | 10/2022 | Moura ............. H01L 21/67727 |
| 2005/0105991 A1 | 5/2005 | Hofmeister et al. |
| 2007/0183871 A1 | 8/2007 | Hofmeister et al. |
| 2010/0054897 A1 | 3/2010 | Bufano et al. |
| 2013/0230369 A1 | 9/2013 | Hofmeister et al. |
| 2015/0333663 A1 | 11/2015 | Wei et al. |
| 2017/0242346 A1 | 8/2017 | Okada et al. |
| 2018/0158707 A1 | 6/2018 | Hunter et al. |
| 2020/0030995 A1 | 1/2020 | Lu et al. |
| 2021/0043484 A1 | 2/2021 | Moura |
| 2021/0221008 A1 | 7/2021 | Lu et al. |
| 2021/0265188 A1 | 8/2021 | Moura et al. |

FOREIGN PATENT DOCUMENTS

| | | |
|---|---|---|
| EP | 3152822 | 7/2019 |
| JP | 05252610 | 9/1993 |
| KR | 20210082088 | 7/2021 |
| WO | 2010092473 | 8/2010 |
| WO | 2017142481 | 8/2017 |
| WO | 2018176137 | 4/2018 |
| WO | 2020073118 | 4/2020 |
| WO | 2020243814 | 12/2020 |
| WO | 2021119819 | 6/2021 |

\* cited by examiner

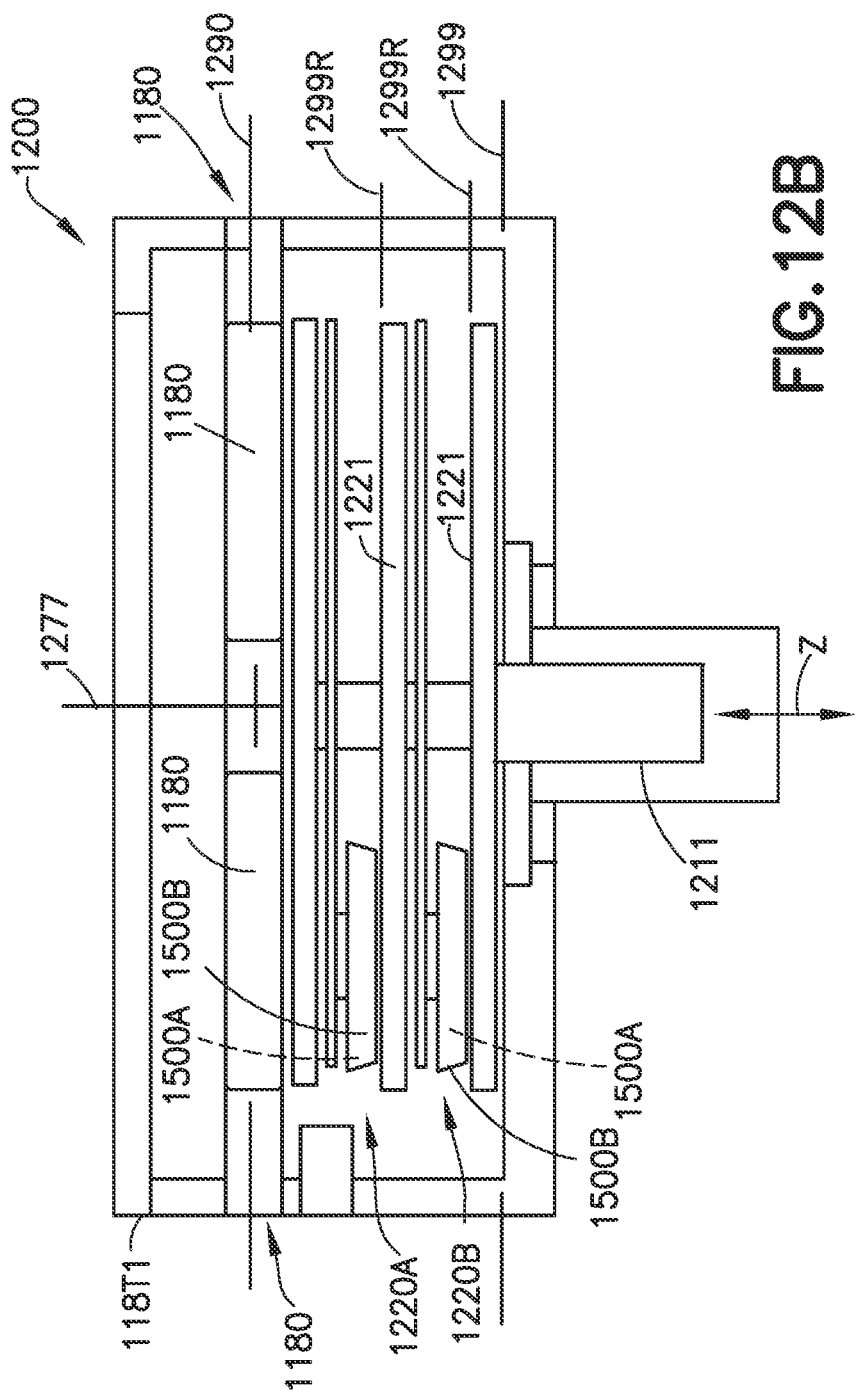

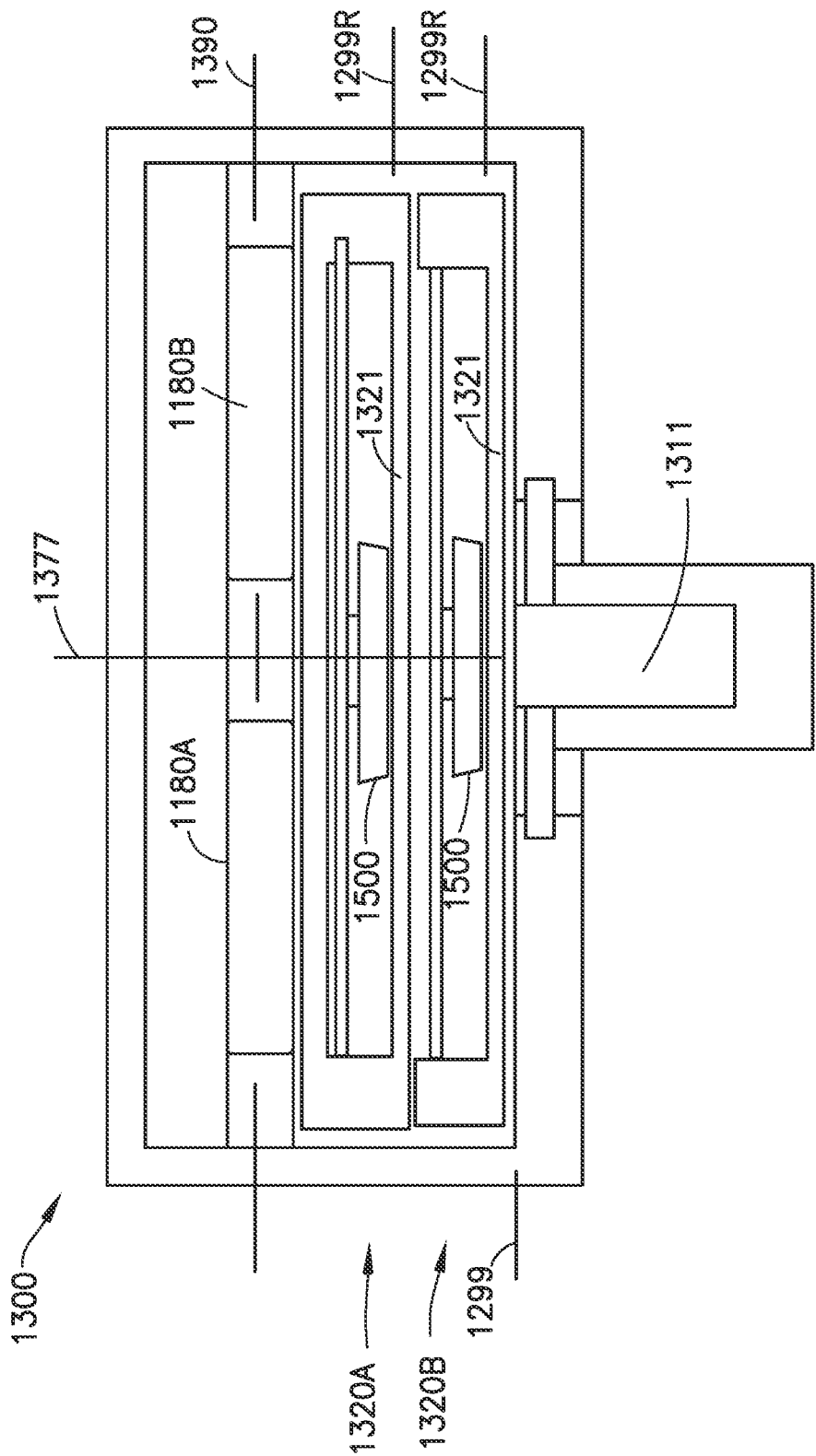

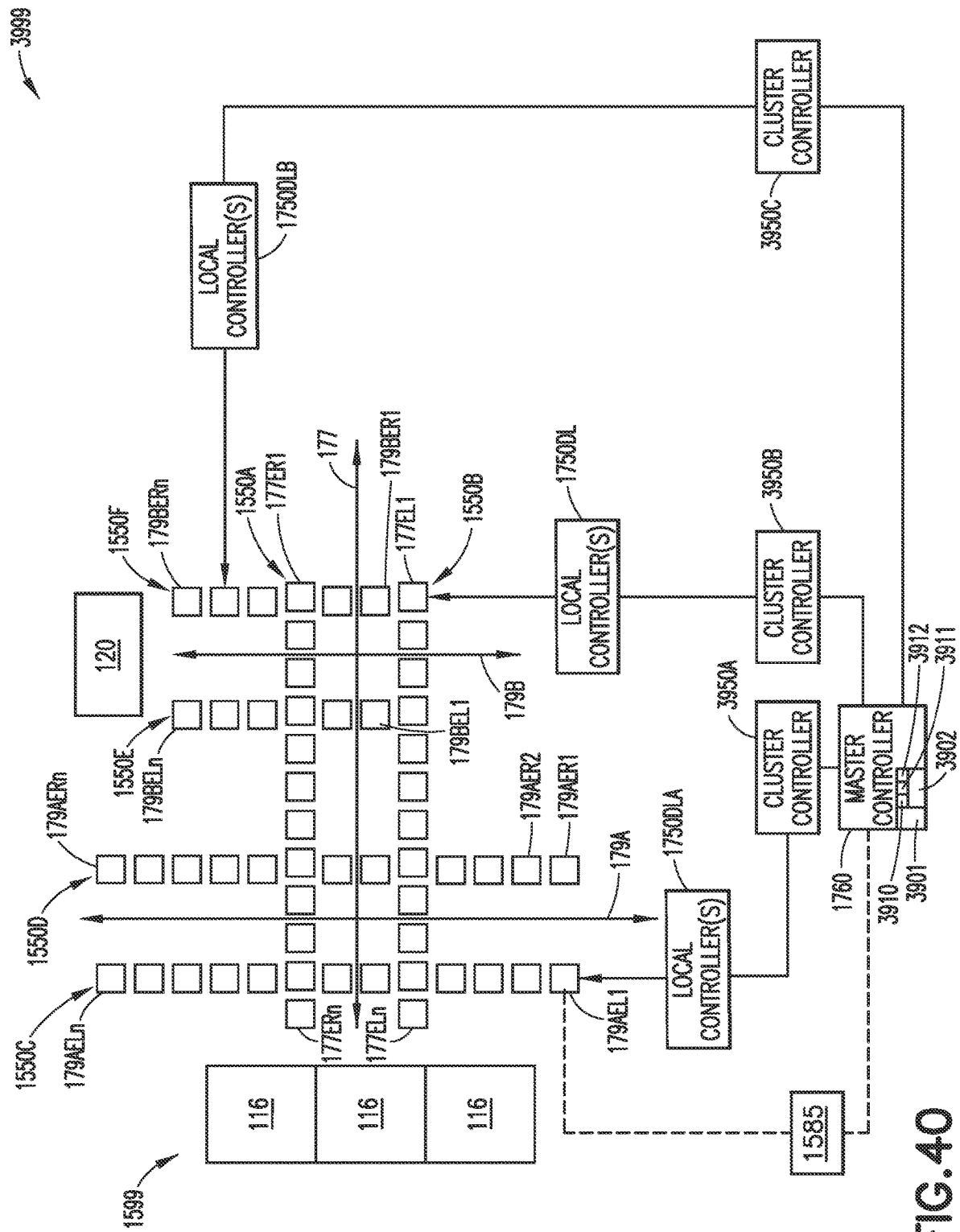

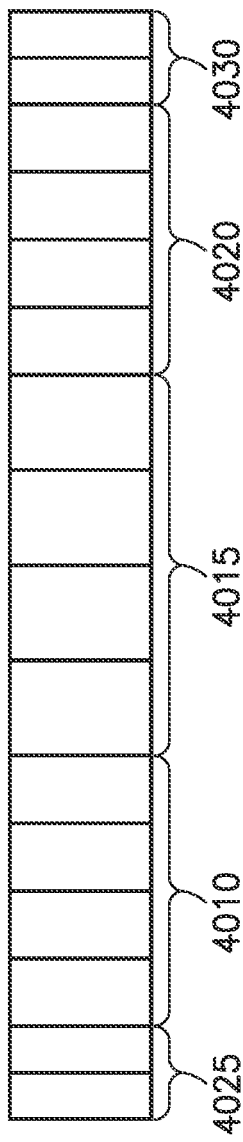
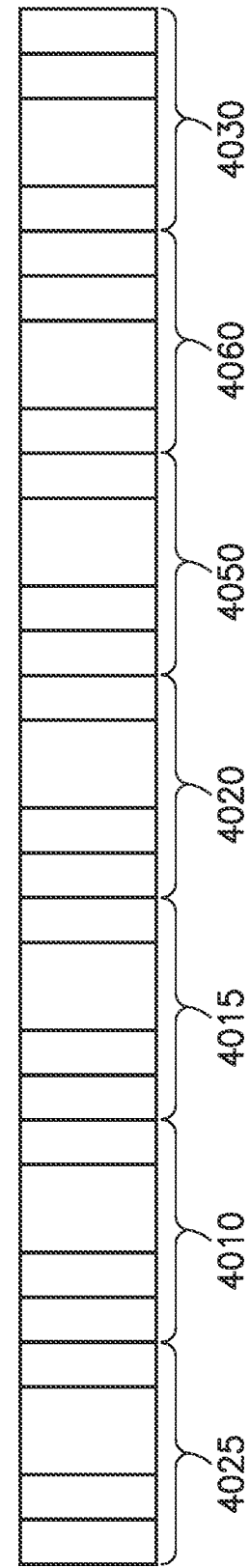
FIG. 41A
FIG. 41B

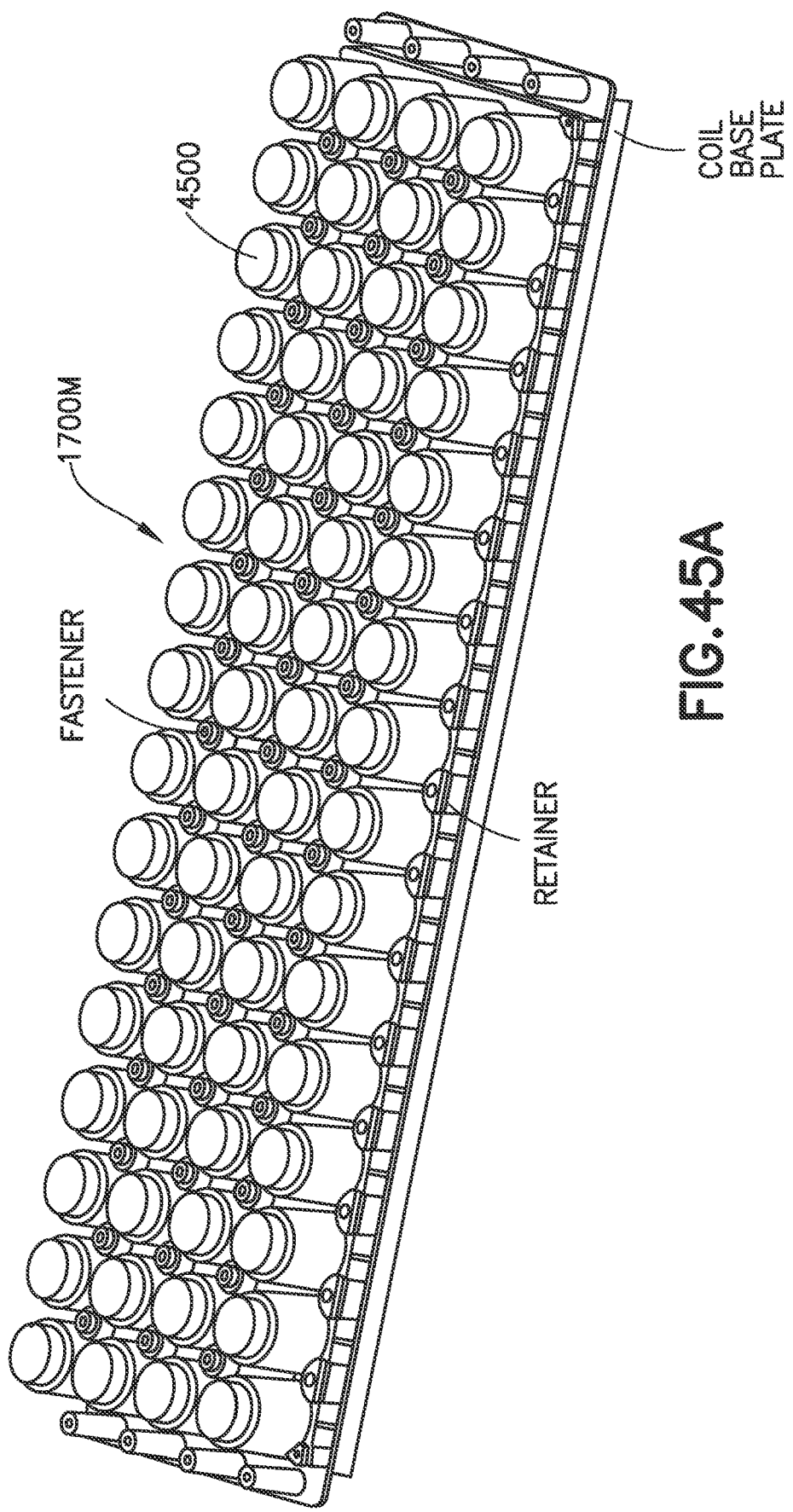

SUBSTRATE PROCESSING APPARATUS

CROSS-REFERENCE TO RELATED APPLICATIONS

This application is a non-provisional of and claims the benefit of U.S. provisional patent application No. 63/273,579 filed on Oct. 29, 2021, the disclosure of which is incorporated herein by reference in its entirety.

BACKGROUND

1. Field

The exemplary embodiment generally relates to substrate processing equipment, and more particularly, to substrate transports of the substrate processing equipment.

2. Brief Description of Related Developments

Semiconductor automation generally comprises a series of building blocks that are required to support the implementation of processes to ultimately achieve predetermined levels of quality and reproducibility in semiconductor chip manufacturing. One component of semiconductor automation is the wafer (also referred to as a substrate) handler that transports the wafer or substrate between load locks and process modules and/or between process modules (e.g., in the case of sequential process tool architectures).

Conventional wafer handlers employed in semiconductor automation generally comprise multi-link robotic manipulators. The multi-link robotic manipulators have end effectors that hold and transport wafers or substrates from one location to another location. To determine the position of an end effector in space, a set of position feedback sensors is employed. The set of position feedback sensors is generally mounted, at least in part, to shafts of actuators that drive the links of the multi-ling robotic manipulator. Robotic kinematic errors, such as mechanical hysteresis, vibration, and thermal expansion can significantly contribute to accuracy errors with respect to the actual location of the end effector in space.

As an alternative to the wafer handlers noted above, magnetically levitated wafer conveyors may be employed where an alternating current magnetic floating apparatus for floating and conveying a conductive floating body or paramagnetic or nonmagnetic metallic material above a line of alternating current electromagnets is provided. The position of these magnetically levitated wafer conveyors is determined by using a network of distributed sensors collocated within the tool the magnetically levitated wafer conveyor operates. This network of distributed sensors and the respective wiring harnesses compete with the electromagnets for space within the tool increasing at least the footprint of the tool. These sensors are also, at least partially, located within a sealed environment in which the floating body moves, which may result in specially machined features being employed in the tool to facilitate placement of the sensors at least partially within the sealed environment or otherwise enable the network of sensors to be integrated with the tool. It is further noted that the network of sensors dedicated to position feedback of the floating body has a cost associated therewith that serves to increase the overall cost of the tool.

BRIEF DESCRIPTION OF THE DRAWINGS

The foregoing aspects and other features of the disclosed embodiment are explained in the following description, taken in connection with the accompanying drawings, wherein:

FIG. 8A is a schematic perspective view of a portion of a substrate handler in accordance with aspects of the disclosed embodiment;

FIG. 12B is a schematic elevation view of the substrate processing apparatus of FIG. 12A in accordance with aspects of the disclosed embodiment;

FIG. 13B is a schematic elevation view of the substrate processing apparatus of FIG. 13A in accordance with aspects of the disclosed embodiment;

FIG. 40 is a schematic illustration of a clustered control architecture in accordance with aspects of the disclose embodiment;

FIG. 41A is a schematic illustration of a PVT frame in accordance with aspects of the disclosed embodiment;

FIG. 41B is a schematic illustration of a PVT-FG frame in accordance with aspects of the disclosed embodiment;

FIGS. 45A, 45B, 45C, and 45D are schematic illustrations of portions of a transport chamber in accordance with aspects of the disclosed embodiment;

DETAILED DESCRIPTION

Figure 1A:
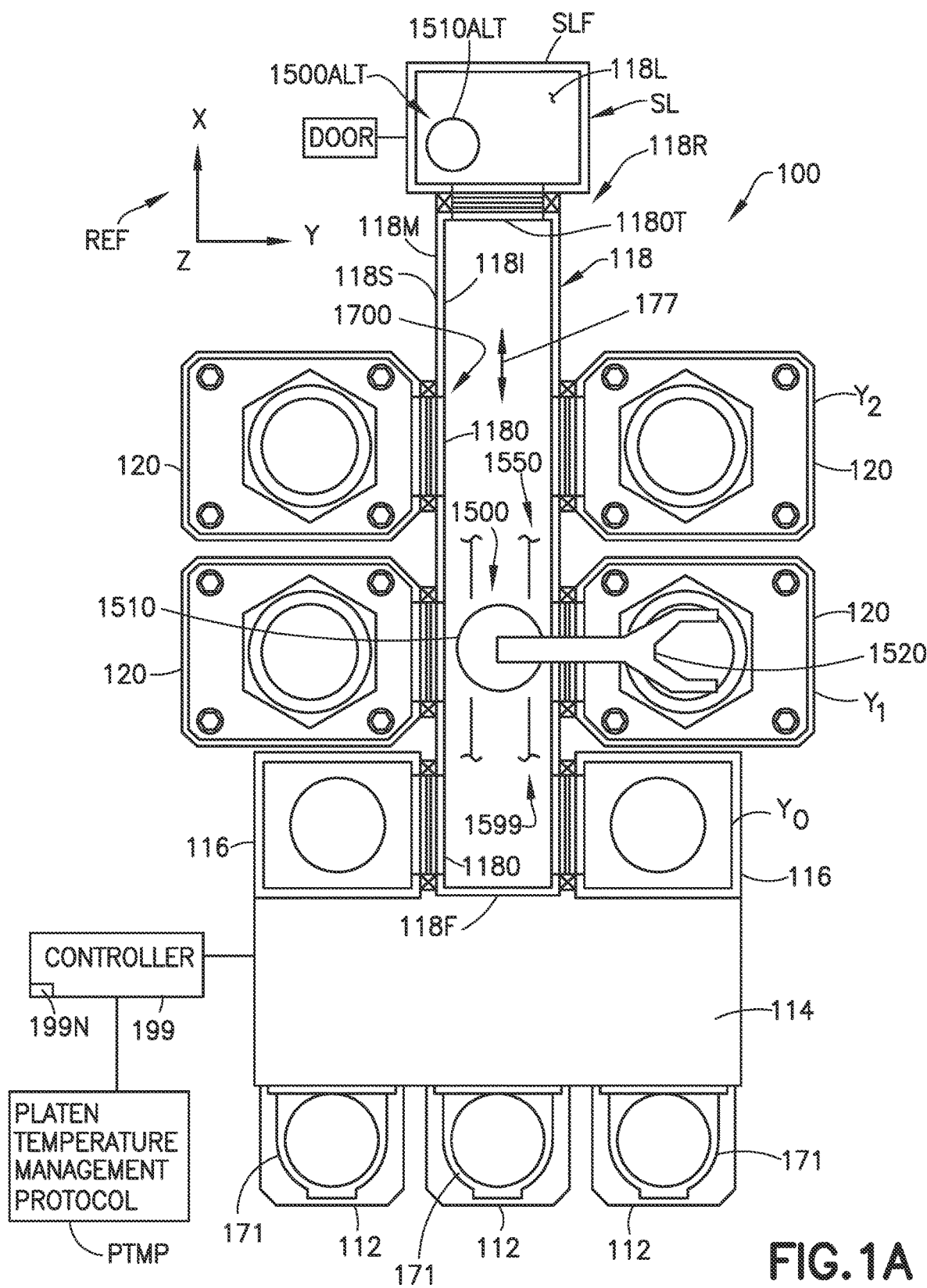
FIG. 1A is a schematic plan view of a substrate processing apparatus incorporating aspects of the disclosed embodiment.

FIGS. 1-14 illustrate exemplary substrate processing apparatus 100, 100A, 200, 300, 400, 500, 800, 900, 1200, 1300 in accordance with aspects of the disclosed embodiment. Although the aspects of the disclosed embodiment will be described with reference to the drawings, it should be understood that the aspects of the disclosed embodiment can be embodied in many forms. In addition, any suitable size, shape or type of elements or materials could be used.

Based on the problems and limitations of conventional substrate processing apparatus noted above, it is desirable to have a wafer (or substrate) handler 1500 that operates within a sealed environment, such as the substrate processing apparatus described herein, where an absolute position of a levitating body or base 1510 (also referred to as a reaction platen) of the wafer (or substrate) handler 1500 is tracked with a feedback apparatus that does not have a network of distributed sensors collocated within the substrate processing apparatus, that does not compete with actuator elements of the wafer handler 1500 for space within the substrate processing apparatus, that lacks sensors located in the sealed environment, and reduces the cost of the wafer handler/substrate processing apparatus compared to substrate processing apparatus noted above that employ tracking the position of the wafer handler with dedicated position feedback sensors. As will be described herein, the aspects of the present disclosure provide for a wafer handler 1500 and substrate processing apparatus that is/are configured to track the absolute positon of the base 1510 of the wafer handler 1500 with actuator coils of the wafer handler 1500. For example, the alternating current voltage and resulting alternating current of the actuator coils are sampled to effect absolute position determination of the base 1510 without employing dedicated position feedback sensors and their associated wiring, complexity, and costs. Referring also to FIGS. 15A-15D, a wafer handler 1500 is part of linear electrical (or electric) machine 1599 (as will be described in greater detail herein and also referred to as an electromagnetic conveyor substrate transport apparatus) included in the substrate processing apparatus of FIGS. 1-14. Suitable examples of linear electrical machines can be found in U.S. patent application Ser. No. 17/180,298 titled "Substrate Processing Apparatus" and filed on Feb. 19, 2021, the disclosure of which is incorporated herein by reference in its entirety. The wafer handler 1500 includes a paramagnetic base 1510 (also referred to as a reaction platen, which in other aspects may be a diamagnetic base, or a base of non-magnetic conductive material, e.g., made of copper, aluminum or other suitable diamagnetic or nonmagnetic material that can induce Eddy currents) that is shaped to effect at least bi-directional linear induction propulsion along a direction of linear tracks 1550 formed by at least one linear induction motor stator 1560 (the at least one linear induction stator being formed by the array of electromagnets 1700 described herein), and independent rotation of the base 1510. The wafer handler 1500 also includes an end-effector 1520 that is rigidly attached to the base 1510 (also referred to herein as a levitating body) and configured to stably hold substrates for transport throughout a respective chamber of a substrate processing apparatus.

The wafer handler 1500 is controlled by actuator control units, as will be described herein so that the configuration of the wafer handler 1500 is not dependent on stroke distances the wafer handler 1500 can cover (or extend). The independence of the wafer handler 1500 configuration 1500 is effected by utilizing a network of actuators 1700 (shown in and described in greater detail with respect to FIGS. 17-28 and 40) that are physically distributed along at least a length of the substrate processing apparatus (such as along a length of a transport chamber 118) as will be described herein. In the aspects of the disclosed embodiment, the actuators 1700 are not tied to any specific substrate handler 1500; rather, the same actuators 1700 (are common to and) can control (and effect position determination of) multiple substrate handlers 1500 concurrently, which reduces cost of ownership of the substrate handlers 1500 as the substrate handlers 1500 may be added to or removed from a substrate processing apparatus without adding additional actuators. Concurrent control and position determination of multiple substrate handlers 1500 with common actuators 1700 is effected by a control system in accordance with the aspects of the disclosed embodiment (described in greater detail below) that is configured to dynamically allocate the excitation phase of each actuator coil unit (also referred to as an electromagnet) of the common actuators 1700 between different excitation phases in a manner that provides continuity of force vectors for performing wafer handler motion in a three-dimensional space with control of up to six degrees of freedom from the common (set) of actuators 1700. As will be described herein, the concurrently controlled substrate handlers 1500 may be controlled in roll, pitch, and/or yaw to allow two or more independently operated substrate handlers 1500 to decrease a distance between the substrate handlers 1500 by tilting each (or at least one) of the substrate handlers 1500 along a rotation axis substantially parallel to the motion thrust direction (see, e.g., FIG. 37).

As noted above, conventional robotic manipulators with articulated links require substantially different mechanical designs as the required stroke of the manipulators is increased in order to reach a larger number of process modules, which increases the cost of the robotic manipulators and may shorten robotic manipulator service intervals. Contrary to conventional substrate handling systems, the aspects of the disclosed embodiment are highly scalable when compared to existing commonly accepted substrate handling solutions (such as those described above) without adding complexity and reliability concerns resultant from an increased number of mechanical components and/or sensors distributed throughout the substrate processing tool for determining a position of the wafer handler 1500.

As will be described in greater detail herein, the aspects of the disclosed embodiment provide for a magnetic levitated substrate transport apparatus based on linear induction technology that is configured to provide lift, lateral stabilization, and propulsion to the wafer handler 1500, while providing self-deterministic absolute position feedback of the wafer handler 1500 by employing the electromagnets (also referred to as actuator coils or coils) of the wafer handler 1500 for position determination. Aspects of the disclosed embodiment also provide for a linear induction motor stator operating in and forming independently controlled linear tracks that are orthogonal or otherwise angled at an orientation between being substantially parallel and substantially orthogonal and/or forming arcuate or rotary paths over a two-dimensional area. As will be described herein, these tracks are formed by an array of electromagnets (e.g., an actuator coil grid or matrix) 1700 (see also FIG. 18) configured to both propel the wafer handler 1500 for wafer transport and effect position determination of the wafer handler 1500. The aspects of the disclosed embodiment provide a coil controller that is configured to generate alternating current at a prescribed frequency and amplitude for each phase of each linear induction motor stator associated with a respective linear track 1550. The propulsion forces provided by the linear tracks are controlled so as to rotate the base 1510, independent of linear movement of the base along the tracks, where the propulsion forces generate a moment load around an axis of rotation of the base 1510. The aspects of the disclosed embodiment also provide for the coil controller being configured, as will be described herein, to sample at least the alternating current and alternating current voltage for determining the absolute position of the wafer handler as described herein.

The aspects of the disclosed embodiment include a control system configured to track a position of the base 1510 and control the phase currents of the independent linear tracks 1550 (e.g., formed by the array of electromagnets 1700) for controlling motion of the base 1510 along a desired propulsion direction along the independent linear tracks 1550. The control system, in accordance with aspects of the disclosed embodiment, also provides for motion of the base 1510 in a lift direction while maintaining lateral stabilization of the base 1510. The control system is configured to generate propulsion forces with the linear tracks 1550 so as to control roll, pitch, and yaw of the substrate handler 1500, where the roll, pitch, and yaw motions of the substrate handler 1500 may be employed to maximize substrate production throughput by adjusting an inclination of the substrate handler 1500 (see, e.g., FIG. 21) depending on a desired acceleration of the substrate handler 1500 in linear and/or rotation directions of motion, so as to increase the acceleration threshold along a thrust direction of the substrate handler 1500.

Referring to FIG. 1A, there is shown a schematic plan view of a substrate processing apparatus 100 incorporating aspects of the disclosed embodiment. The substrate processing apparatus 100 is connected to an environmental front end module (EFEM) 114 which has a number of load ports 112 as shown in FIG. 1A. The load ports 112 are capable of supporting a number of substrate storage canisters 171 such as for example conventional FOUP canisters; though any other suitable type may be provided. The EFEM 114 communicates with the processing apparatus through load locks 116 which are connected to the processing apparatus as will be described further below. The EFEM 114 (which may be open to atmosphere) has a substrate transport apparatus (not shown—but is in some aspects is similar to the linear electrical machine 1599 described herein, e.g., the linear electrical machine described herein may be employed in vacuum and atmospheric environments) capable of transporting substrates from load ports 112 to load locks 116. The EFEM 114 may further include substrate alignment capability, batch handling capability, substrate and carrier identification capability or otherwise. In other aspects, the load locks 116 may interface directly with the load ports 112 as in the case where the load locks have batch handling capability or in the case where the load locks have the ability to transfer wafers directly from the FOUP to the lock. Some examples of such apparatus are disclosed in U.S. Pat. Nos. 6,071,059, 6,375,403, 6,461,094, 5,588,789, 5,613,821, 5,607,276, 5,644,925, 5,954,472, 6,120,229, and 6,869,263 all of which are incorporated by reference herein in their entirety. In other aspects, other load lock options may be provided.

Still referring to FIG. 1A, the processing apparatus 100, may be used for processing semiconductor substrates (e.g. 200 mm, 300 mm, 450 mm, or other suitably sized wafers), panels for flat panel displays, or any other desired kind of substrate, generally comprises transport chamber 118 (which in one aspects holds a sealed atmosphere therein), processing modules 120, and at least one substrate transport apparatus or linear electrical machine 1599. The substrate transport apparatus 1599 in the aspect shown may be integrated with the chamber 118 or coupled to the chamber in any suitable manner as will be described herein. In this aspect, processing modules 120 are mounted on both sides of the chamber 118. In other aspects, processing modules 120 may be mounted on one side of the chamber 118 as shown for example in FIG. 2. In the aspect shown in FIG. 1A, processing modules 120 are mounted opposite each other in rows Y1, Y2 or vertical planes. In other aspects, the processing modules 120 may be staggered from each other on the opposite sides of the transport chamber 118 or stacked in a vertical direction relative to each other. Referring also to FIGS. 15A-15C and 18, the transport apparatus 1599 has substrate handler 1500 that is moved in the chamber 118 to transport substrates between load locks 116 and the processing chambers 120. In the aspect shown, only one substrate handler 1500 is provided; however, in other aspects more than one substrate handler may be provided. As seen in FIG. 1A, the transport chamber 118 (which is subjected to vacuum or an inert atmosphere or simply a clean environment or a combination thereof in its interior) has a configuration, and employs the substrate transport apparatus 1599 that allows the processing modules 120 to be mounted to the chamber 118 in a Cartesian arrangement with processing modules 120 arrayed in substantially parallel vertical planes or rows. This results in the processing apparatus 100 having a more compact footprint than a comparable conventional processing apparatus, such as those described herein. Moreover, the transport chamber 118 may be capable of being provided with any desired length (i.e., the length is scalable) to add any desired number of processing modules 120, as will be described in greater detail below, in order to increase throughput. The transport chamber 118 may also be capable of supporting any desired number of transport apparatus 1599 therein and allowing the transport apparatus 1599 to reach any desired processing chamber 120 coupled to the transport chamber 118 without interfering with each other. This in effect decouples the throughput of the processing apparatus 100 from the handling capacity of the transport apparatus 1599, and hence the processing apparatus 100 throughput becomes processing limited rather than handling limited. Accordingly, throughput can be increased as desired by adding processing modules 120 and corresponding handling capacity on the same platform.

Still referring to FIG. 1A, the transport chamber 118 in this aspect has a general rectangular shape though in other aspects the chamber may have any other suitable shape. The chamber 118 has a slender shape (i.e. length much longer than width) and defines a generally linear transport path for the transport apparatus 1599 therein. The chamber 118 has longitudinal side walls 118S. The side walls 118S have transport openings or ports 1180 (also referred to as substrate pass through openings) formed therethrough. The transport ports 1180 are sized large enough to allow substrates to pass through the ports (which ports can be sealable by valves) into and out of the transport chamber 118. As can be seen in FIG. 1A, the processing modules 120 in this aspect are mounted outside the side walls 118S with each processing module 120 being aligned with a corresponding transport port 1180 in the transport chamber 118. As can be realized, each processing module 120 may be sealed against the sides 118S of the chamber 118 around the periphery of the corresponding transport aperture to maintain the vacuum in the transport chamber. Each processing module 120 may have a valve, controlled by any suitable means, such as controller 199, to close the transport port when desired. The transport ports 1180 may be located in the same horizontal plane. Accordingly, the processing modules on the chamber are also aligned in the same horizontal plane. In other aspects, the transport ports 1180 may be disposed in different horizontal planes. As seen in FIG. 1A, in this aspect, the load locks 116 are mounted to the chamber sides 118S at the two front most transport ports 1180. This allows the load locks 116 to be adjacent the EFEM 14 at the front of the processing apparatus. In other aspects, the load locks 116 may be located at any other transport ports 1180 on the transport chamber 118 such as shown for example in FIG. 2. The hexahedron shape of the transport chamber 118 allows the length of the chamber to be selected as desired in order to mount as many rows of processing modules 120 as desired (for example see FIGS. 1B, 3, 4-7 showing other aspects in which the transport chamber 118 length is such to accommodate any number of processing modules 120).

As noted before, the transport chamber 118 in the aspect shown in FIG. 1A has a substrate transport apparatus 1599 having a single substrate handler 1500. The transport apparatus 1599 is integrated with the chamber 118 to translate substrate handler 1500 back and forth in the chamber 118 between front 118F and back 118R. The substrate handler 1500 of the substrate transport apparatus 1599 has at least one end effector 1520 for holding one or more substrates.

Figure 44A:
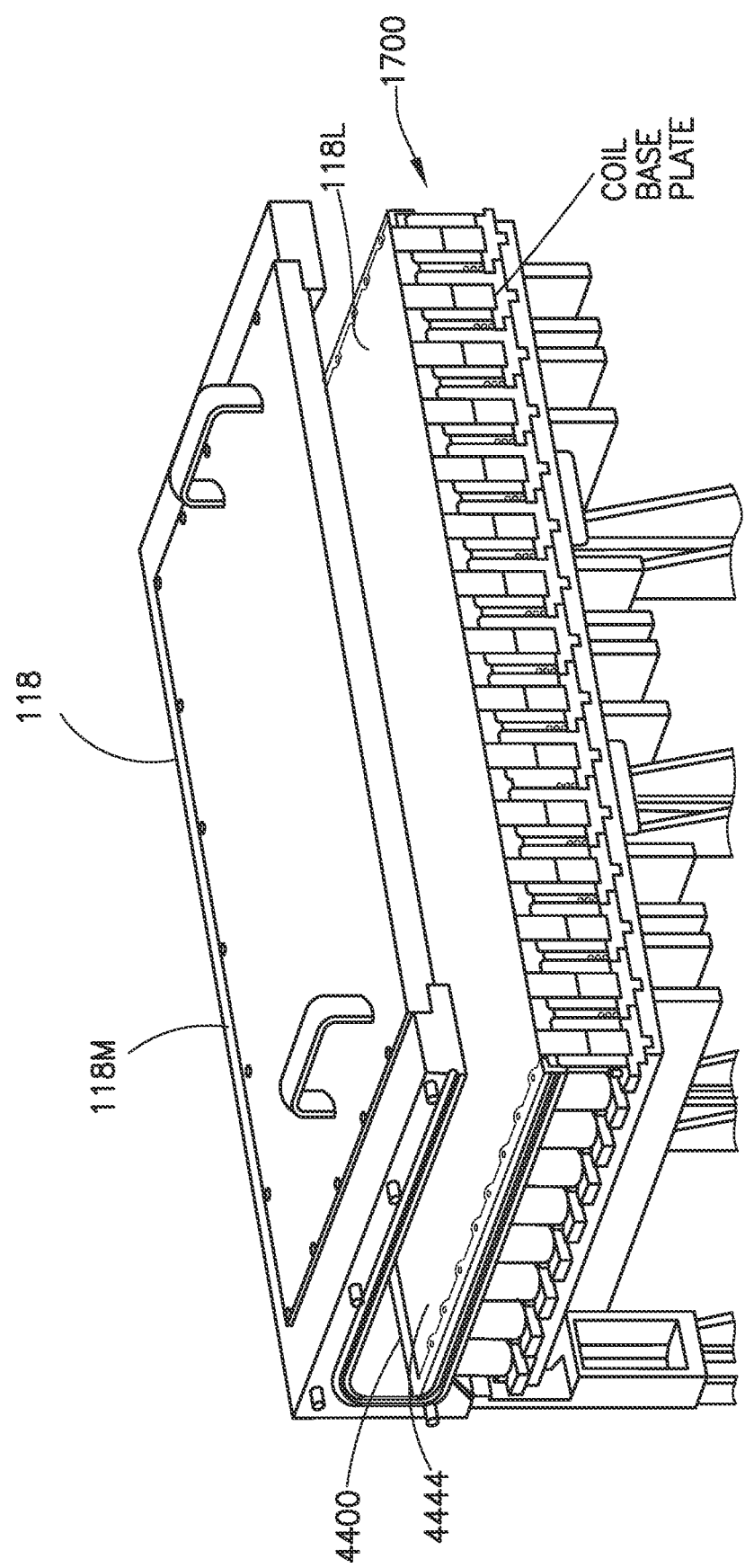
FIGS. 44A, 44B, and 44C are schematic illustrations portions of a transport chamber in accordance with aspects of the disclosed embodiment.
Figure 44B:
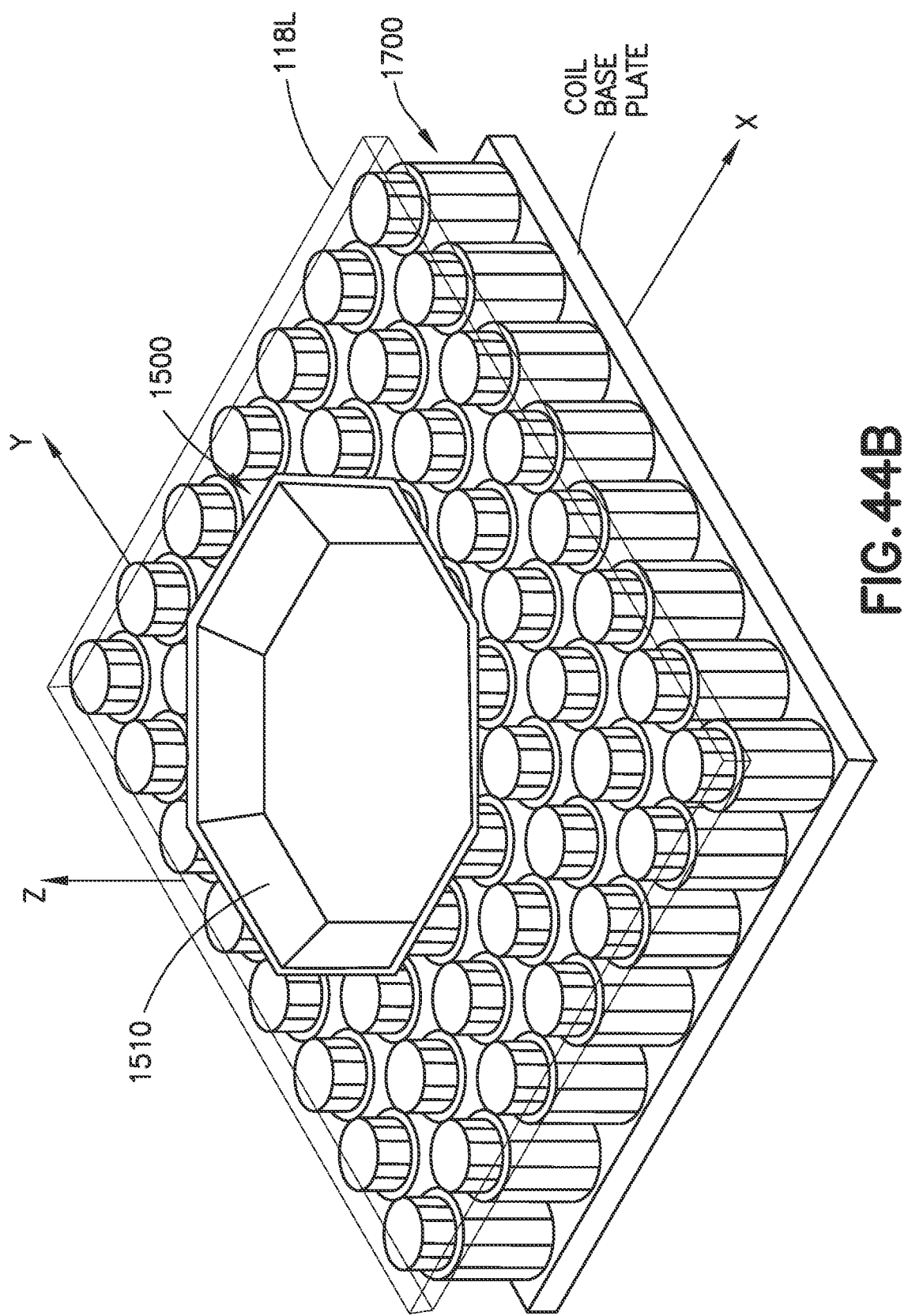
Figure 44C:
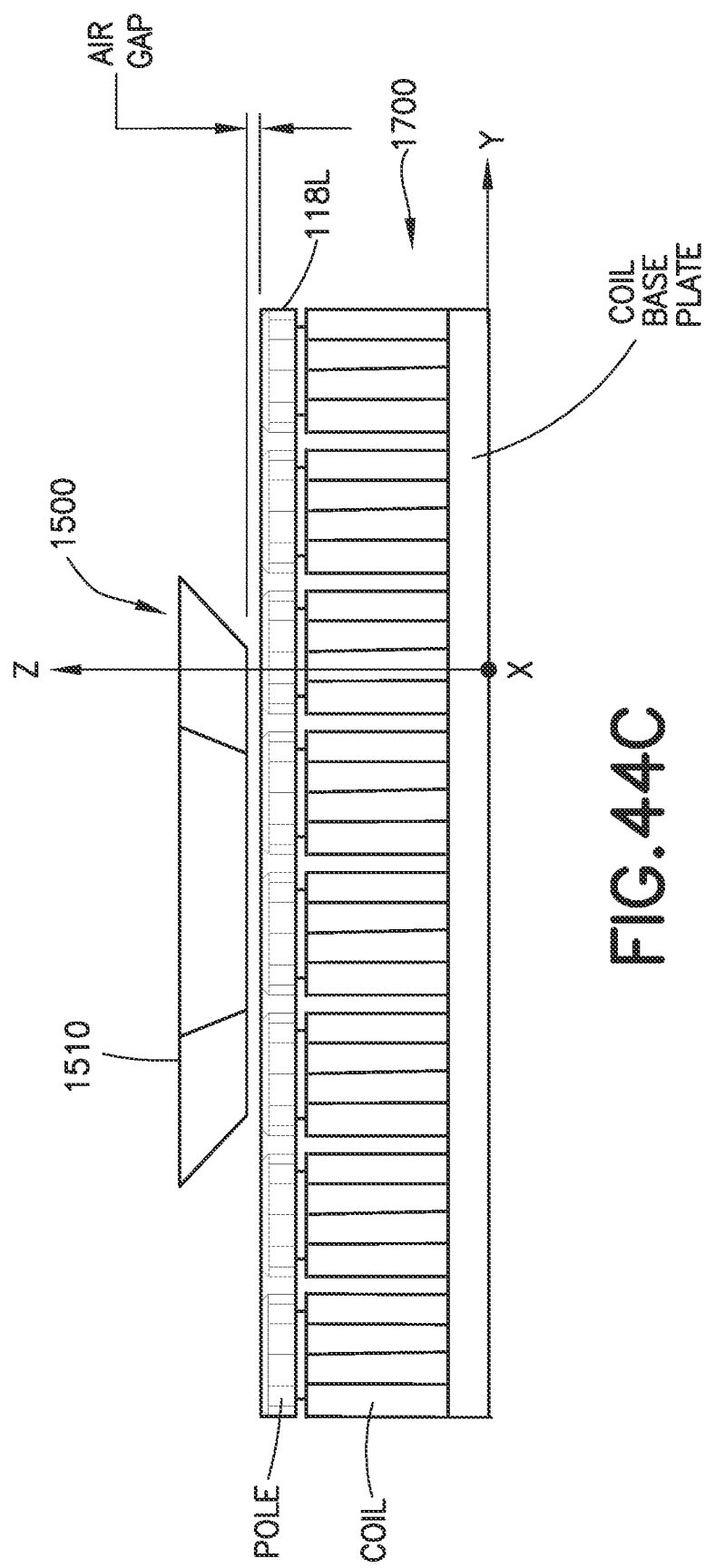

It should be understood that the transport apparatus 1599, shown in FIG. 1A (also referring to FIGS. 44A-44C) is a representative transport apparatus and, includes the substrate handler 1500 (a portion of which is illustrated in FIGS. 44B, 44C for clarity) which is magnetically supported from the linear tracks 1550 formed by the array of electromagnets 1700. The transport apparatus 1599 will be described in greater detail below. The transport chamber 118 may form a frame 118M (see FIG. 1A) with a level reference plane 1299, e.g., that defines or otherwise corresponds (e.g., is substantially parallel) with a wafer transport plane 1290 (see FIG. 12B). The linear tracks 1550 formed by array of electromagnets 1700 may be mounted to the side walls 118S or floor 118L of the transport chamber 118 (where the floor 118L forms a non-magnetic isolation wall between the array of electromagnets 170 and the wafer handler 1500) and may extend the length of the chamber 118. This allows the wafer handler 1500 to traverse the length of the chamber 118. As will be described in greater detail below the array of electromagnets 1700 (also referred to herein as actuators 1700) form the linear tracks 1550 of FIG. 1A, where each of linear tracks 1500 includes a respective array of electromagnets or actuators 1700A-1700n. The array of electromagnets or actuators 1700A-1700n are referred to herein as a network of actuators as in FIGS. 14A, 15A, 15B, 16B, 16C, 17, and 18 (e.g., that form at least one linear induction motor stator 1560—noting that in FIGS. 14A-16C there are two rows of electromagnets illustrated for each drive line 177-180 for clarity of illustration but it should be understood that more than two rows of electromagnets may be provided per drive line as illustrated in FIG. 18 (see also FIGS. 44A-44C), where one or more electromagnets are common to more than one drive line), connected to the transport chamber 118 to form a drive plane 1598 at a predetermined height H relative to the reference plane 1299, the array of electromagnets 1700 (see also FIG. 18) being arranged so that a series of the electromagnets 1700A-1700n define at least one drive line within the drive plane 1598, and each of the electromagnets 1700A-1700n (see FIG. 15B) in the array of electromagnets 1700 being coupled to an alternating current (AC) power source 1585 energizing each electromagnet 1700A-1700n, where the alternating power source is, in one aspect, a three phase (or more) alternating current power source. As noted above (see FIG. 15A), the base or reaction platen 1510 is formed of a paramagnetic, diamagnetic, or non-magnetic conductive material disposed to cooperate with the electromagnets 1700A-1700n of the array of electromagnets 1700 so that excitation of the electromagnets 1700A-1700n with alternating current from the alternating current source 1585 generates levitation forces FZ and propulsion forces FP (see FIG. 21) against the base 1510 that controllably levitate and propel the base 1510 along the at least one drive line 177-180 (see, e.g., FIGS. 1-8), in a controlled attitude relative to the drive plane 1598.

As noted above, the chamber floor 118L forms a non-magnetic isolation wall 4400 (see FIGS. 44A-44C) between the array of electromagnets 1700 and the wafer handler 1500. Here the array of electromagnets 1700 are disposed in an atmospheric environment while the wafer handler 1500 is disposed in a vacuum environment of the transport chamber 118. The non-magnetic isolation wall 4400 (and the chamber floor 118L) is selected so as to have a low electrical conductivity and a high resistivity to minimize the occurrence of Eddy Currents (and minimize magnetic field losses due to the Eddy Currents) while allowing a magnetic field to pass through the non-magnetic isolation wall 4400 to establish a magnetic circuit between the (e.g., coils/poles) of the electromagnets in the array of electromagnets 1700 and the base 1510 of the wafer handler 1500. Suitable examples of materials from which the non-magnetic isolation wall 4400 (and the floor 118L) include materials that are vacuum compatible and have a high resistivity, high stiffness, high yield strength, and high thermal conductivity such as, for example, 300-Series Stainless Steel that conforms with the electrical and magnetic (e.g., non-magnetic) properties noted above. A Suitable example of the 300-series Stainless Steel includes, but is not limited to, 304 Stainless Steel. In one aspect, the chamber floor 118L a separate (i.e., different) material than that of the frame 118M such as to reduce costs of the transport chamber 118 structure. For example, the frame 118M may be constructed of aluminum (or other suitable material) while the floor 118L is constructed of stainless steel (or other suitable material). Other suitable examples of material from which the non-magnetic isolation wall 4400 (and the floor 118L) may be constructed includes, but is not limited to, low conductivity aluminum such as a 6061 series aluminum (e.g., 6061-F, 6061-0, 6061-O, 6061-T4, 6061-T6, and 6061-T9).

With respect to the magnetic circuit formed between the (e.g., coils/poles) of the electromagnets in the array of electromagnets 1700 and the base 1510 of the wafer handler 1500, the base 1510 is constructed of any suitable paramagnetic material. The paramagnetic material of the base 1510 has a low resistivity so as maximize induction of Eddy Currents, a low mass density to minimize weight of the base 1510, and be inert so as to be vacuum compatible and resistant at high temperatures (e.g., such as about 100° C. or more). Suitable examples of materials from which the base 1510 may be constructed include, but are not limited to, 1100 series Aluminum Alloy (such as the 1100, 1100-O, and 1100-H18 Aluminum Alloys), and 6101 series Aluminum Alloy (such as the 6101-T6, 6101-T61, 6101-T63, 6101-T64, and 6101-T65 Aluminum Alloys). It is noted that for atmospheric applications of the transport described herein, the base 1510 may be constructed of copper or any of the other materials described herein for the base 1510.

The poles 4500P (see, e.g., FIGS. 45A-45C) of the electromagnets and the coil base plate are ferromagnetic and have a high magnetic permeability, high magnetic saturation, and high electrical resistivity (e.g., so as to minimize Eddy Currents) so as to maximize levitation efficiency for levitating the base 1510. As described herein, the poles and the coil base plate may be constructed of any suitable soft magnetic composite (SMC) material with a magnetic saturation reaching about 2 Tesla. A suitable example of a soft magnetic composite material being, but not limited to, Hoganas' 700HR 5P.

Figure 50:
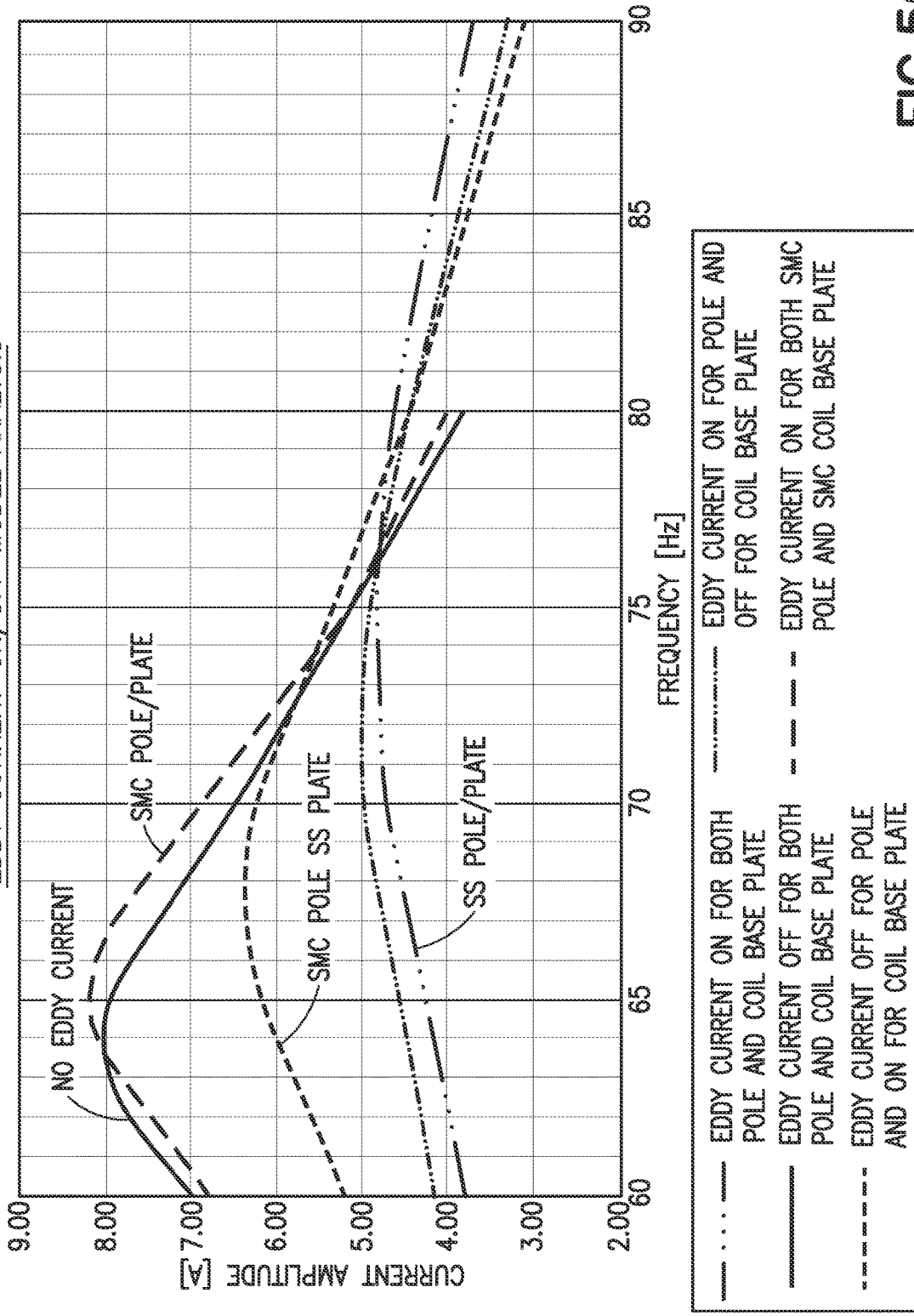
FIG. 50 is an exemplary graph illustrating coil current versus frequency in accordance with aspects of the disclosed embodiment.

Referring also to FIG. 50, an exemplary graph illustrating coil current versus frequency is illustrated with respect to Eddy Current loses. The graph shows finite element electromagnetic model analysis of several materials (e.g., the SMC materials noted above and stainless steel, such as the stainless steels described herein) from which the coil base plate and poles 4500P may be constructed. The graph illustrates modelling conditions where the Eddy Currents are turned off in the poles, the Eddy Currents are turned off in the coil base plate, the Eddy Currents are off in both the poles and the coil base plate, and the Eddy Currents are turned on in both the poles and the coil base plate. The graph illustrates a substantial elimination of Eddy Current loses with both the poles 4500P and the coil base plate constructed of the soft magnetic composite material, e.g., when compared to model conditions with the poles constructed of the SMC material and the coil base plate is constructed of stainless steel and to model conditions with the both the poles and the coil base plate constructed of stainless steel. Here, constructing both the poles and the coil base plate with the soft magnetic composite material provides for maximization of coil current given a predetermined voltage (e.g., in this analysis the peak (maximized) current is about 8.2 A with a voltage of about 43.2V).

Figure 45B:
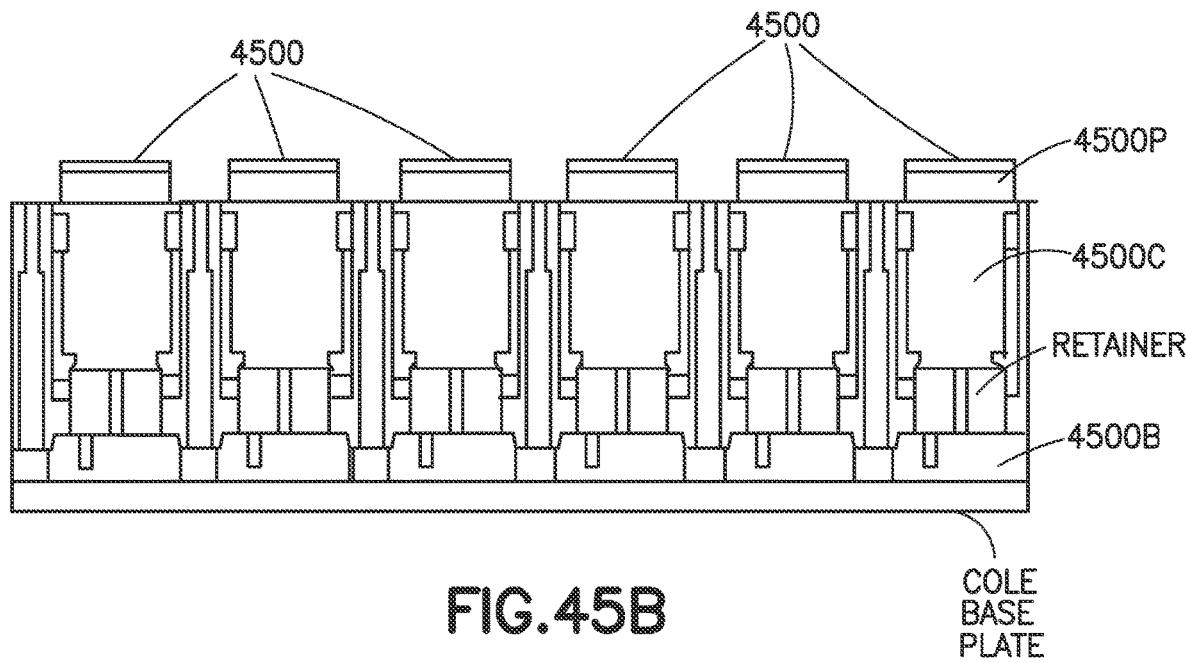
Figures 45C, 45D:
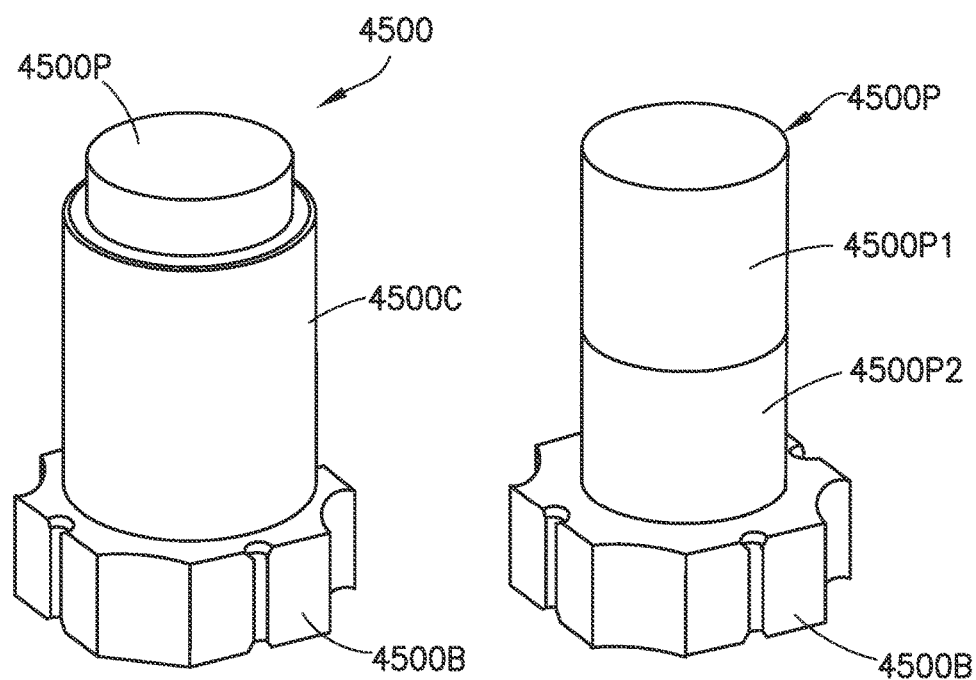

Referring to FIGS. 45A-45C, in one or more aspects, the array of electromagnets 1700 may be modular and include array modules 1700M. The array modules 1700M include electromagnetic elements 4500 that are modularly coupled to the coil base plate in any suitable manner (such as, e.g., with any suitable retainers/fasteners) as illustrated in FIG. 45A. In other aspects, the electromagnetic elements 4500 may be integrally formed with the coil base plate. Each electromagnet element 4500 includes a base 4500B, a coil 4500C, and a pole 4500P. The pole 4500P may be monolithic, or in other aspects, constructed of more than one part 4500P1, 4500P2 that are coupled to each other (illustrated in FIG. 45D) to form a respective pole 4500P. Electrical continuity may be effected between the electromagnetic elements 4500 through abutting contact between adjacent bases 4500B and/or through the coil base plate. The poles 4500P, the base 4500B, and the coil base plate may be constructed of any suitable material such as any suitable soft magnetic composite (SMC) material. Here, each (or one or more) of the array modules 1700M may be removed from the transport chamber 118 for maintenance without disruption of the vacuum integrity/environment within the transport chamber 118 as the array modules are disposed on the atmospheric side of the non-magnetic isolation wall 4400 (e.g., the chamber floor 118L).

Figure 1B:
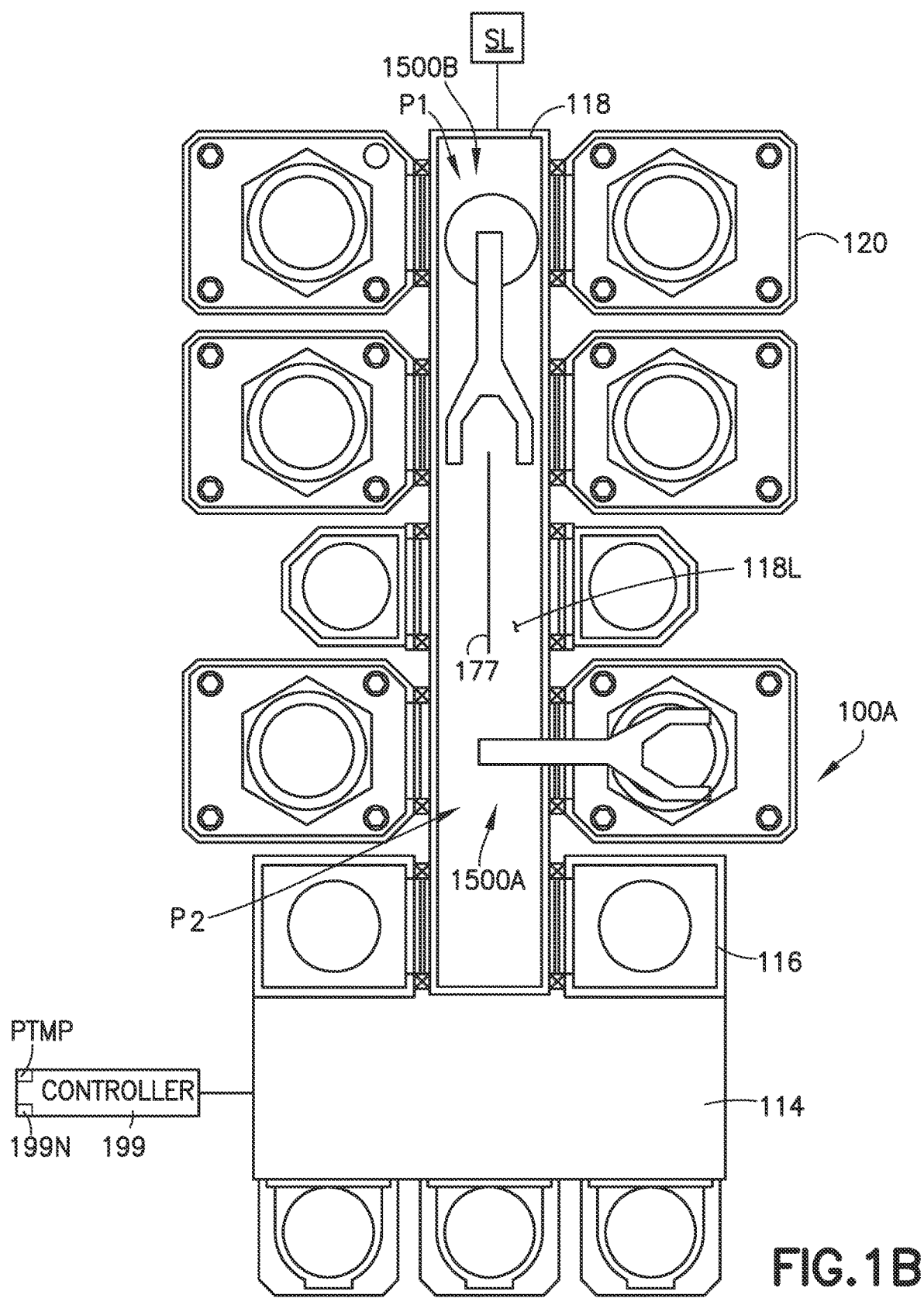
FIG. 1B is a schematic plan view of a substrate processing apparatus incorporating aspects of the disclosed embodiment.
Figure 2:
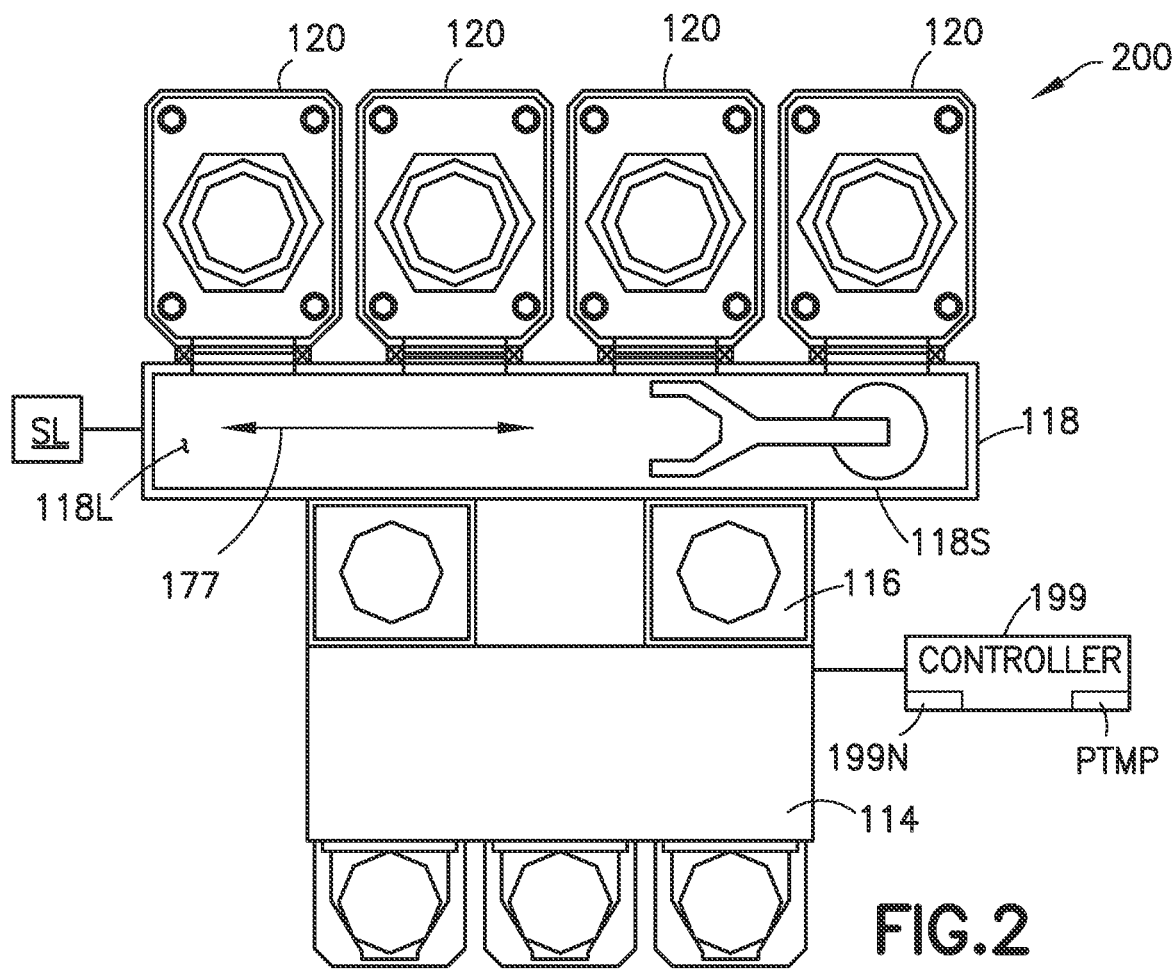
FIG. 2 is a schematic plan view of a substrate processing apparatus incorporating aspects of the disclosed embodiment.
Figure 3:
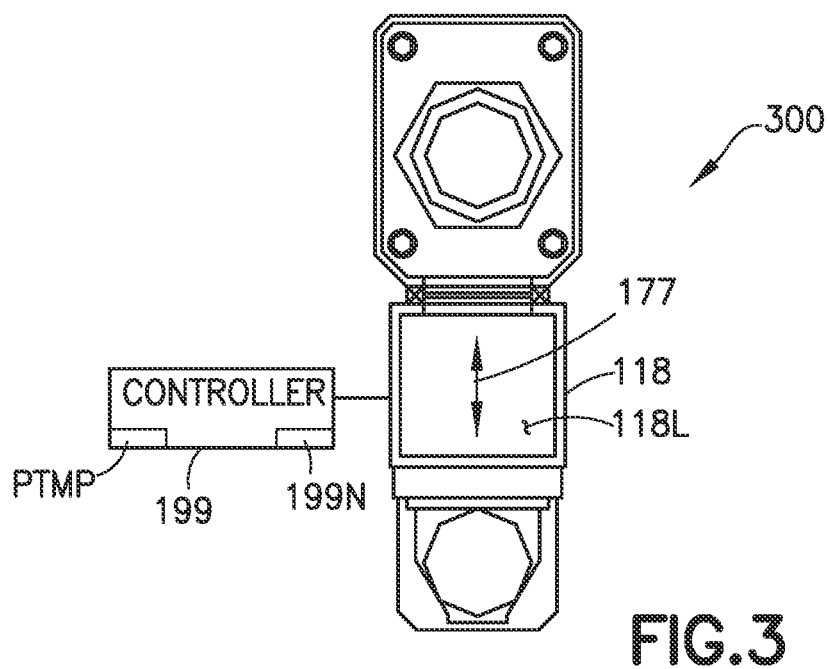
FIG. 3 is a schematic plan view of a substrate processing apparatus incorporating aspects of the disclosed embodiment.
Figure 8:
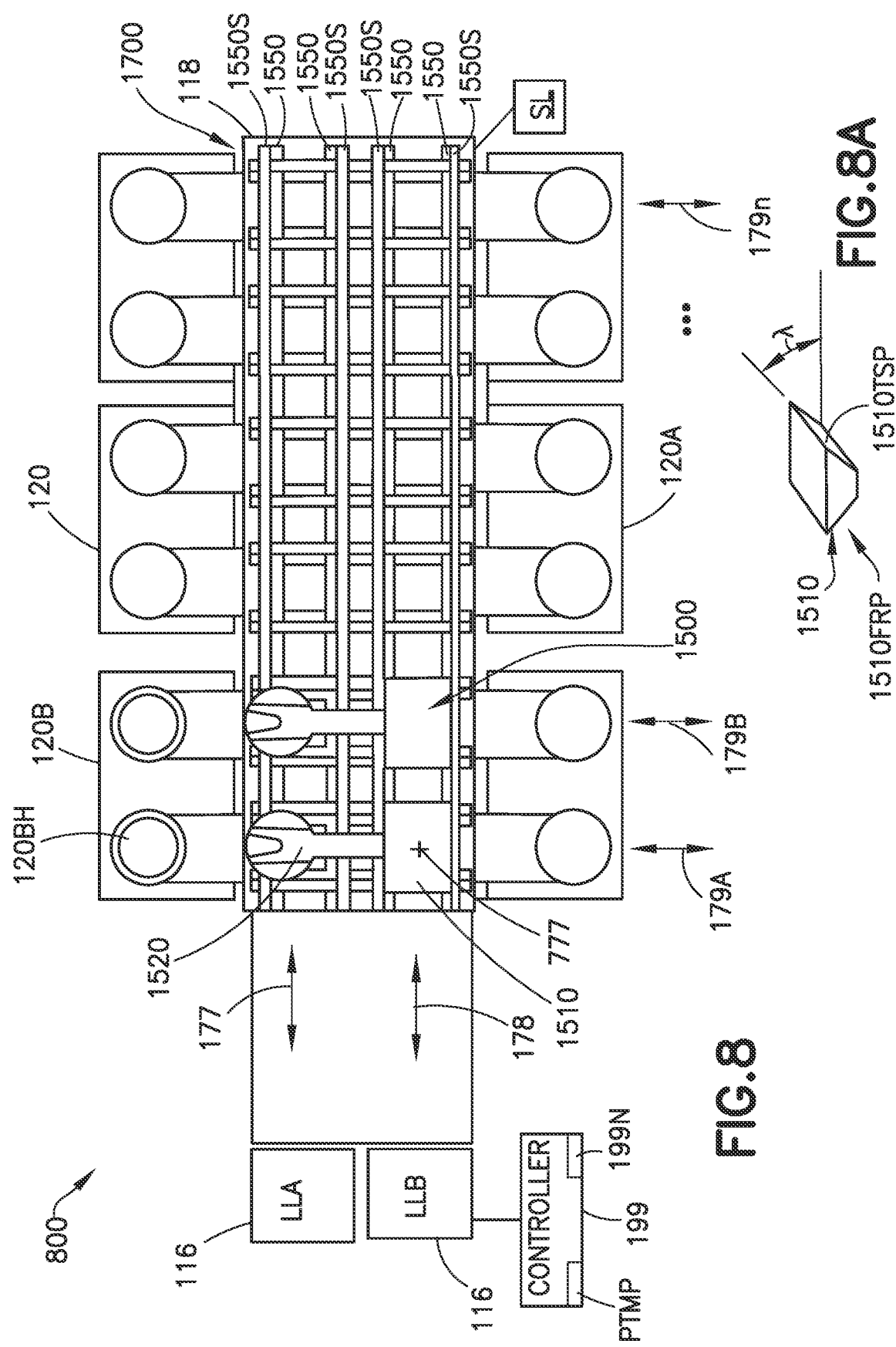
FIG. 8 is a schematic plan view of a substrate processing apparatus incorporating aspects of the disclosed embodiment.
Figure 9:
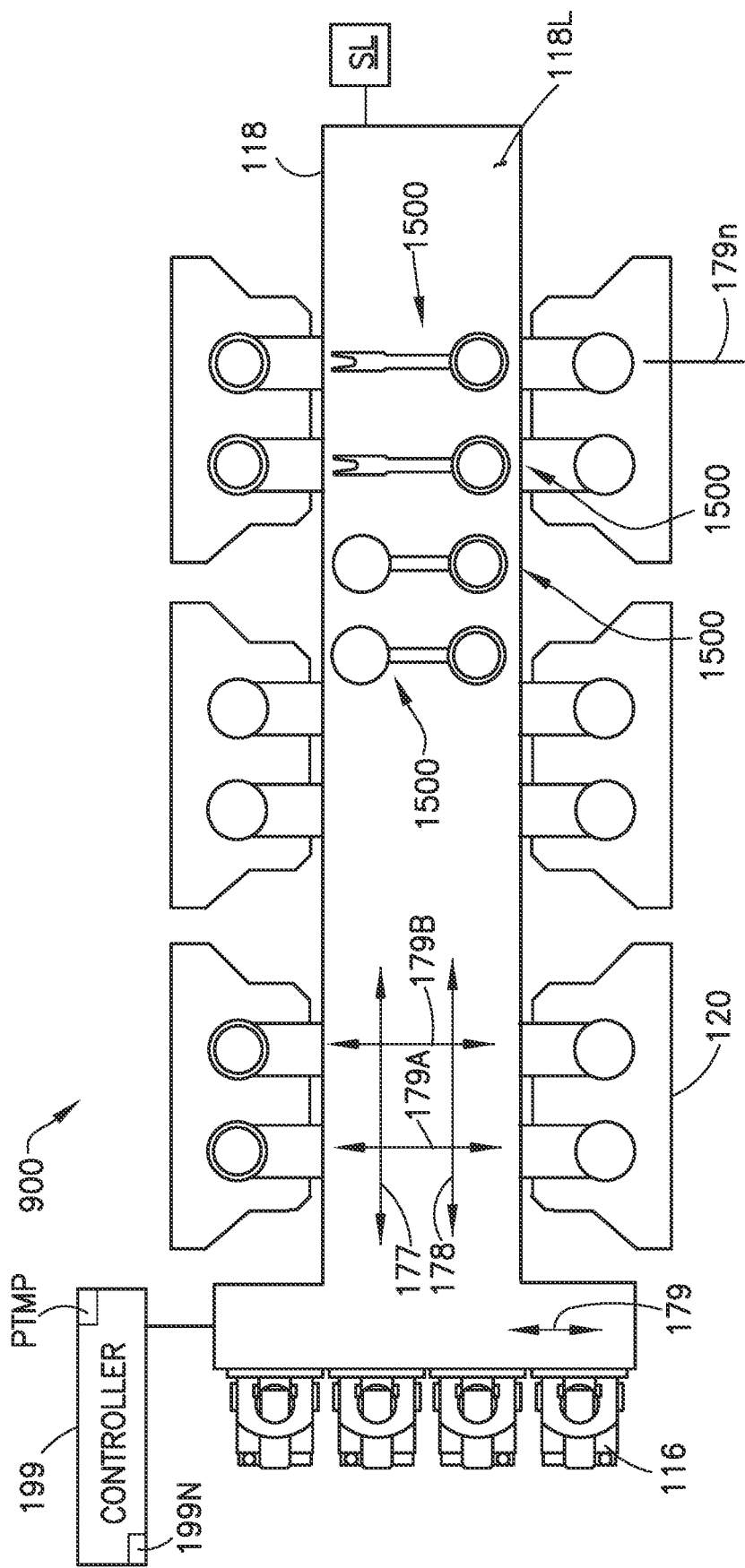
FIG. 9 is a schematic plan view of a substrate processing apparatus incorporating aspects of the disclosed embodiment.
Figure 10:
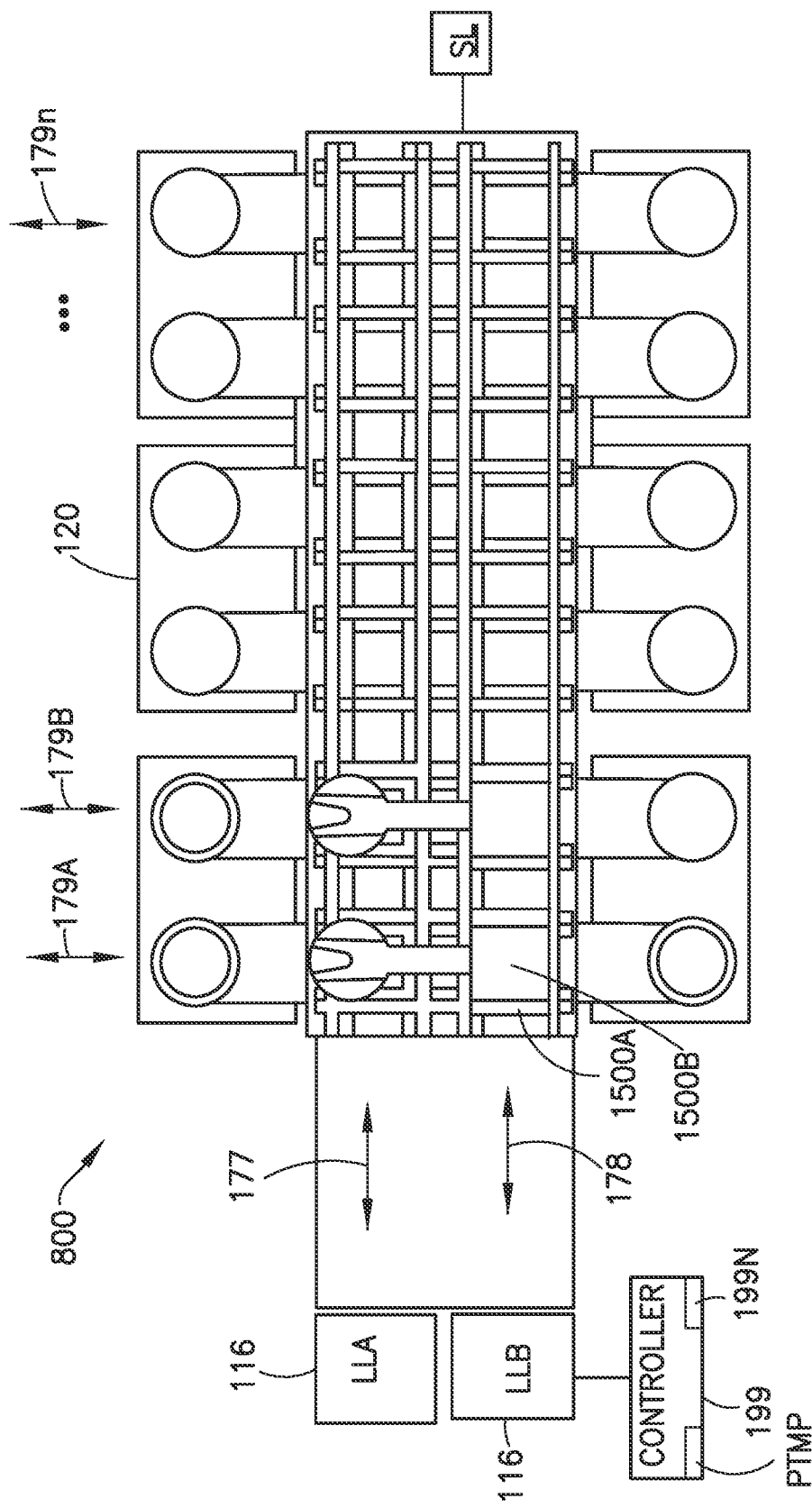
FIG. 10 is a schematic plan view of a substrate processing apparatus incorporating aspects of the disclosed embodiment.

FIG. 1B shows another aspect of a substrate processing apparatus 100A which is generally similar to apparatus 100. In this aspect, the transport chamber 118 has two substrate handlers 1500A, 1500B independently operated by the array of electromagnets 1700 (as in FIG. 16C). The substrate handlers 1500A, 1500B are substantially the same as the substrate handler 1500 previously described. Both of the substrate handlers 1500A, 1500B may be supported from a common array of electromagnets 1700 as described before. The base 1510 of each substrate handler 1500A, 1500B may be driven by the same at least one linear induction motor stator 1560 as will be described herein, by individually controlling each coil element or electromagnet 1700A-1700n (as in FIG. 15B). Thus, as can be realized the end effector 1520 each substrate handler 1500 can be independently moved in linear movement and/or rotation using the at least one linear induction motor stator 1560. However, in this aspect the substrate handlers 1500A, 1500B are not capable of passing each other in the transport chamber 118 as the transport chamber 118 includes but one drive line 177 (compared to transport chambers having multiple substantially parallel drive lines as shown in FIGS. 8-10). Accordingly, the processing modules 120 are positioned along the length of the transport chamber 118 so that the substrate may be transported to be processed in the processing module in a sequence which would avoid the substrate handlers 1500A, 1500B from interfering with each other. For example, processing modules for coating may be located before heating modules, and cooling modules and etching modules may be located last.

However, referring to FIGS. 8-10, the transport chamber 118 may have any suitable width to provide for two or more substantially parallel drive lines 177, 178 (e.g., formed by the array of electromagnets 1700) that extend at least along a portion of a longitudinal length of the transport chamber 118 so that the two substrate handlers 1500A, 1500B pass adjacent each other (akin to a side rail or bypass rail). In the aspects illustrated in FIGS. 8-10 the transport apparatus 1599 has two drive lines 177, 178 but in other aspects any suitable number of substantially parallel longitudinally extending drive lines may be provided.

In accordance with some aspects of the disclosed embodiment, the array of electromagnets 1700 (or at least a portion thereof) may also be used as heater for the wafer handler (e.g., so as to control heating of the reaction platen and/or wafer to a desired predetermined temperature and for a desired predetermined time) as in the case where it is desired to eliminate water vapor (e.g., gas) or potentially pre-heat the wafer/substrate picked from, e.g., a load port en route to a process module or alternatively reduce thermal gradient between the wafer at the process module and the wafer handler end effector. The heating of the wafer handler may be effected with the reaction platen in transit or with the reaction platen held static in a predetermined location/position. Still In accordance with some aspects of the disclosed embodiment, the array of electromagnets 1700 (or at least a portion thereof) may also be used as heaters as in the case where it is desired that the transport chamber 118 be heated for degas as in the case to eliminate water vapor for example. Controlled heating of the transport chamber 118 to a predetermined temperature for a predetermined time may be with the reaction platen static.

In accordance with the aspects of the disclosed embodiment, the controller 199 of the substrate processing apparatus described herein is configured with a predetermined platen temperature management protocol PTMP (see FIG. 1) that effects temperature control (e.g., thermal management) of the base 1510 of the wafer handler 1500. Here, the base 1510 is thermally managed so as to maintain a predetermined levitation efficiency. As may be realized, with the base 1510 levitating, Eddy Currents induced in the base 1510 will generate heat and the temperature of the base 1510 will rise. An increase in temperature of the base 1510 may increase the electrical resistivity of the base 1510, which in turn may reduce the induction of Eddy Currents and the levitation force exerted on the base 1510 by the array of electromagnets 1700. Any suitable controller, such as controller 199 (described herein) is configured with the predetermined platen temperature management protocol PTMP to effect a base 1510 cooling cycle to maintain the base 1510 within a predetermined temperature range (such as below about 100° C.). For example, the predetermined platen temperature management protocol PTMP controls the temperature of the base 1510 vie (e.g., with) conduction from the base 1510 to a thermal sink 4444 (see FIG. 44A which may be the floor 118L or isolation wall 4400) commensurate (e.g., in time) with at least a wafer swap operation of the base 1510 (and the wafer handler 1500 thereof). Here, the controller 199 may activate (or deactivate) the array of electromagnets 1700 (or a portion thereof) so that the base 1510 lowers to seat on (e.g., lands on) the floor 118L of the transport chamber 118 where heat is removed from the base 1510 by the floor 181L via conduction from the base through the floor 118L) (e.g., the isolation wall) towards the atmospheric side of the floor 118L where the coils 4500C, poles 4500P, and coil base plate are disposed.

In one or more aspects, the cooling of the base 1510 may occur opportunistically such as with a wafer exchange operation (e.g., a swapping or transfer of one or more wafers at a wafer holding station as noted above). For example, where wafer handler 1500 includes at least two end effectors 1520, one of the end effectors 1520 waits or sits idle while the another of the at least two end effectors 1520 completes a pick/place operation. With the other end effector 1520 picking/placing the wafer, the idle end effector 1520 is seated on the floor 118L to cool off the base 1510. In other aspects, the controller 199 may command cooling of the base 1510 of the wafer handler 1500 (having one or more end effectors) at any suitable time.

Other thermal management solutions for cooling the base 1510 of the wafer handler 1500 that may be employed with the aspects of the disclosed embodiment include a wafer handler replacement (e.g., the wafer handler 1500 is replaced in its entirety) without disrupting the vacuum environment within the transport chamber 118. For example, a "service lock" SL (see FIG. 1) is substantially similar to load lock 116 but with a floor similar to the transport chamber 118L (so that the wafer handler transitions between the transport chamber and service lock). The service lock SL also has sealable opening 1180T shaped and sized for passage of the wafer handler therethrough.

The service lock SL has a frame SLF that is shaped and sized so that one wafer transport 1500 (and the reaction platen or base 1510 thereof) may be replaced with another wafer transport 1500ALT (and the other reaction platen or base 1510ALT thereof). Here, the other base 1510ALT, is alternative to the base 1510, and is held inactive within the service lock SL so as to be in a cold state, relative to the temperature of the base 1510 in its operative state. Here, the predetermined platen temperature management protocol PTMP includes the other base 1510 (and the wafer handler 1500ALT thereof) being switched to an operative state (so that the base 1510 is levitated) and replacing the base 1510 (and the wafer handler 1500 thereof), at its temperature limits. For example, the wafer handler 1500 is commanded to move into the service lock SL and is placed in an inactive state (so the base 1510 is seated on the floor 118L of the service lock SL. The other wafer handler 1500ALT is placed in an operative state so as to levitate and is commanded to move into the transport chamber 118 for wafer handling/transfer operations.

In other aspects, the service lock SL may be configured to introduce wafers (and/or wafer handlers) into the processing system. For example, the service lock SL may include a door that is shaped and sized so that an operator of the processing system may insert/remove one or more of wafers (for placement on a wafer handler disposed in the service lock SL) and wafer handlers (loaded with a wafer or unloaded) to and from the service lock SL. Here the wafers may be introduced into the processing system without the wafers being transported to the processing system in a FOUP 171.

The service lock SL can be added to or otherwise integrated with the transport chamber 118. Here, a wafer handler 1500 within the isolated environment of the service lock SL provides for the wafer handler 1500 to be periodically (or at any suitable intervals which may be preset or determined based on a temperature of the wafer handler) removed and replaced with another wafer handler 1500ALT that is clean and cooler than the removed wafer handler 1500.

Figure 46:
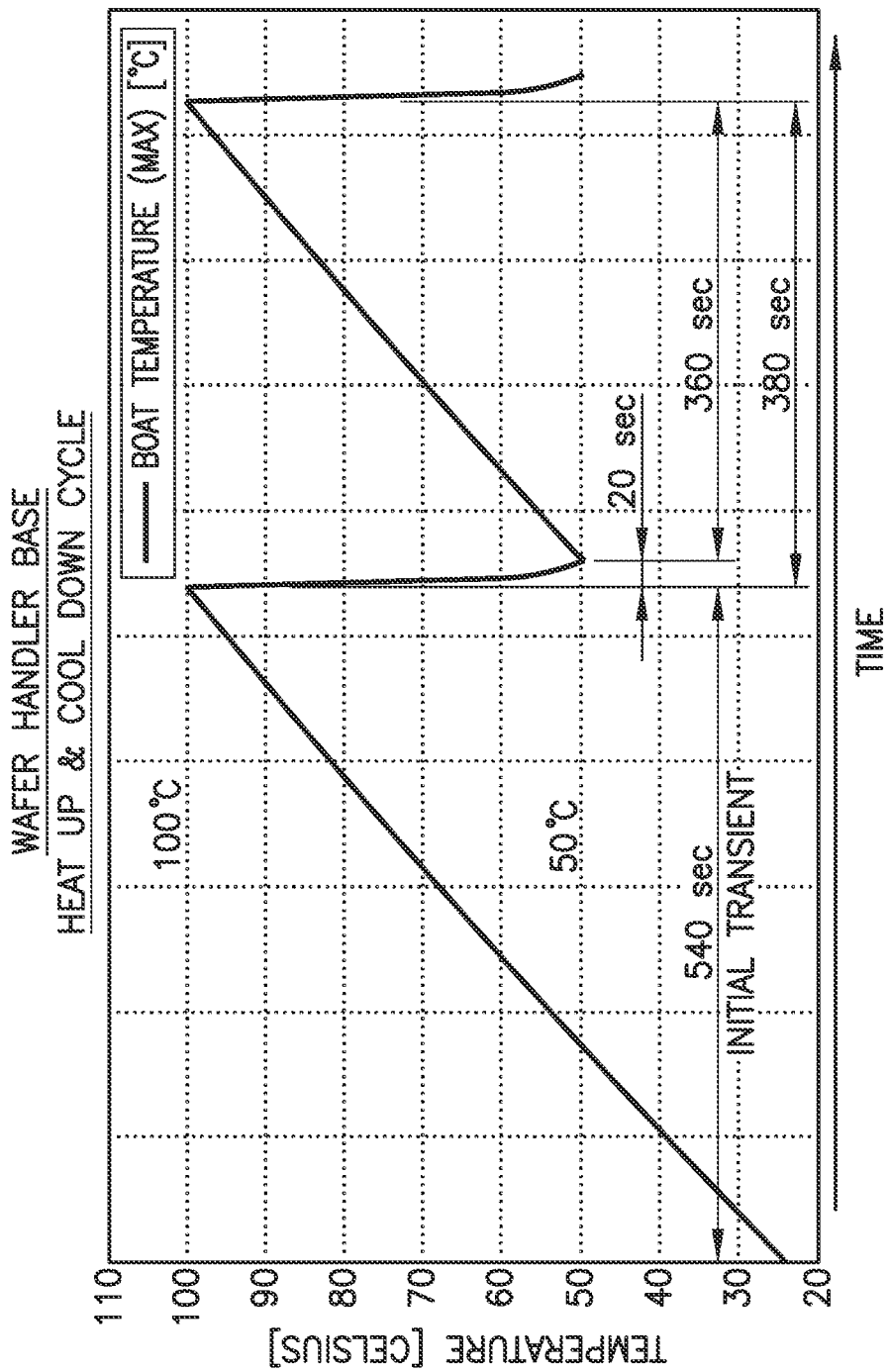
FIG. 46 is an exemplary graph of wafer handler temperature cycling in accordance with aspects of the disclosed embodiment.

FIG. 46 illustrates exemplary vacuum temperature transients of the wafer handler 1500 base 1510 versus time. FIG. 46 illustrates that the base 1510 (and the wafer handler 1500) can operate at over about 90% duty cycle levitation while maintaining the base 1510 within a temperature range of about 50° C. to about 100° C., which maintains the levitation efficiency within a predetermined range.

Figure 4:
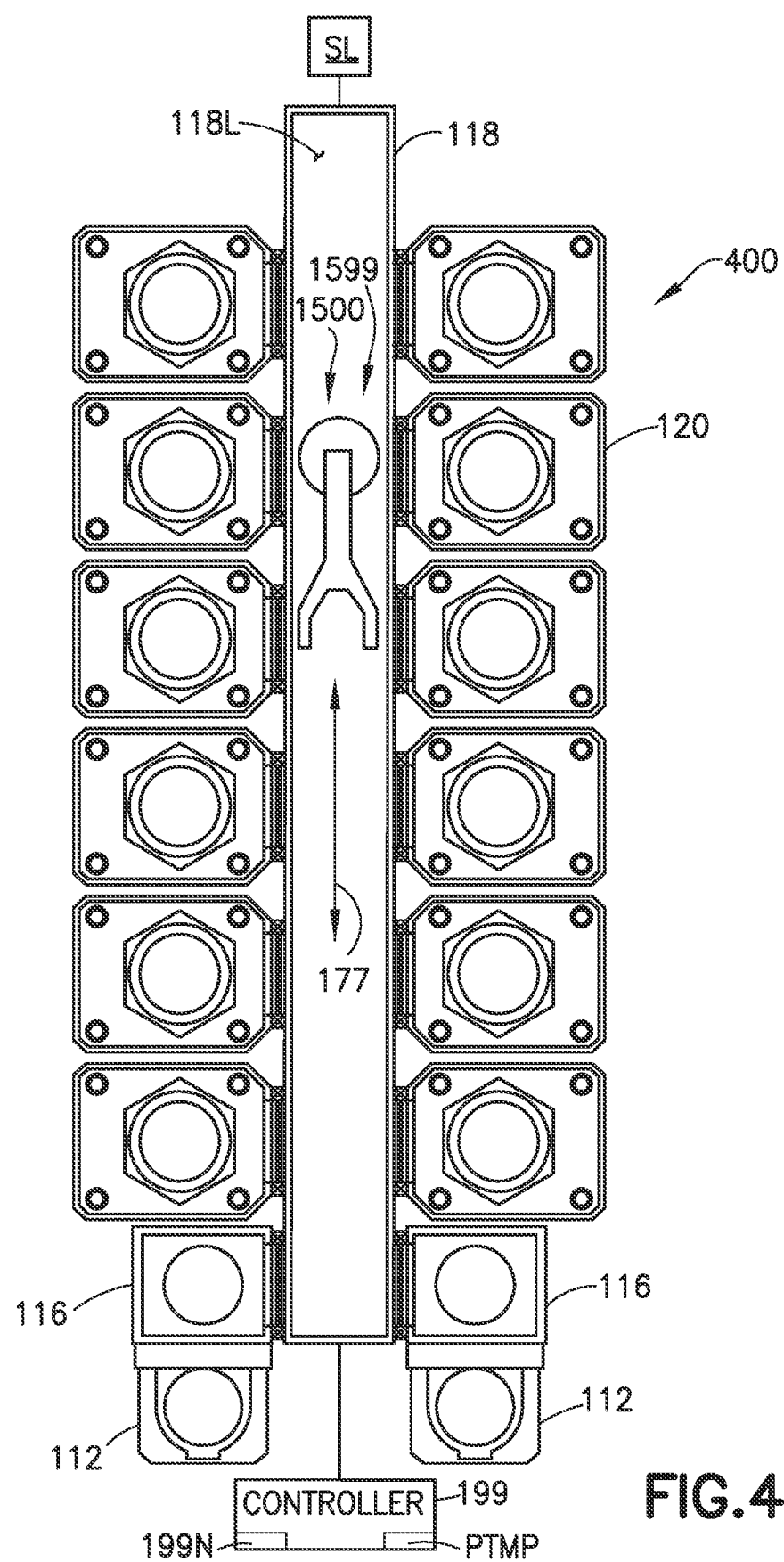
FIG. 4 is a schematic plan view of a substrate processing apparatus incorporating aspects of the disclosed embodiment.
Figure 5:
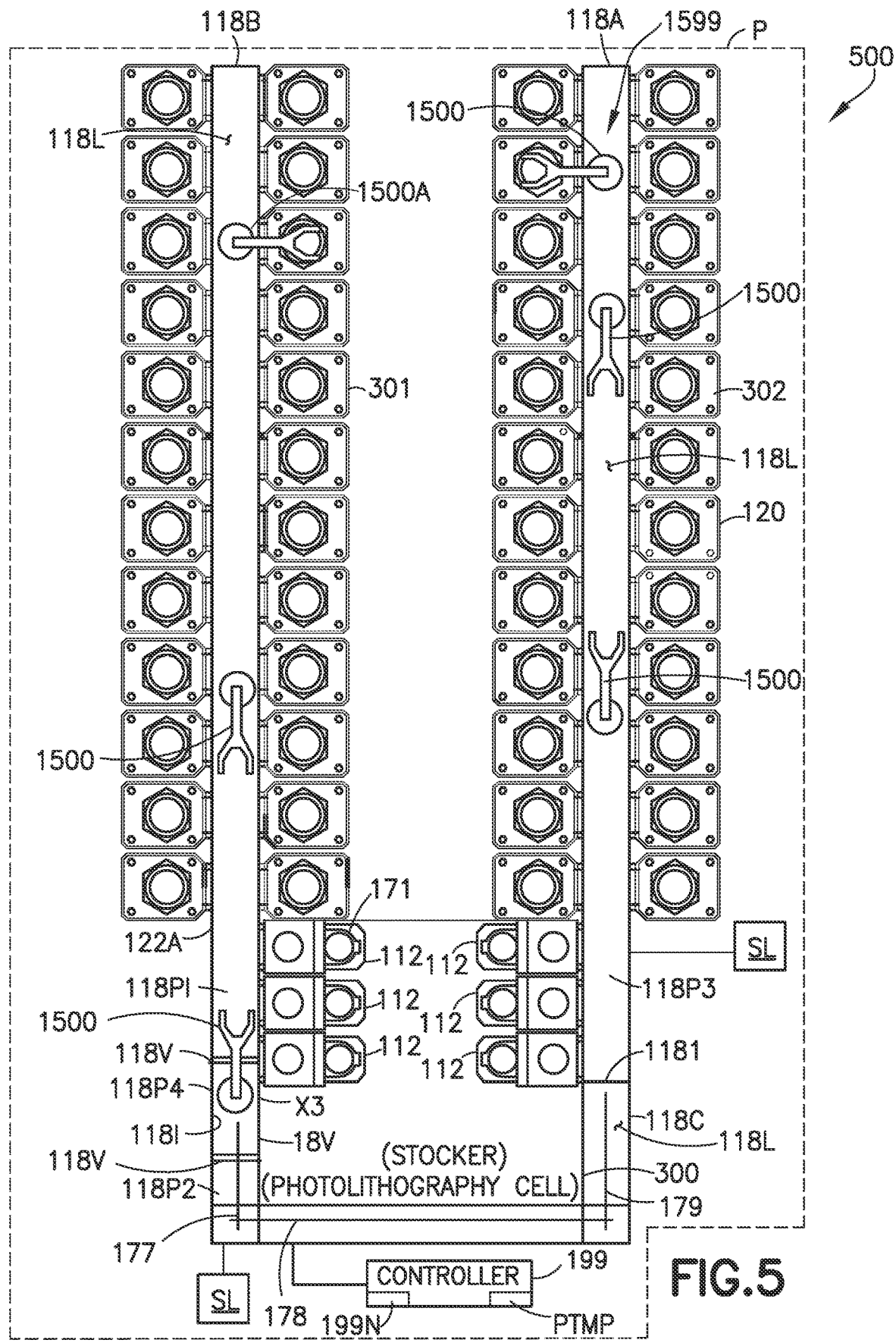
FIG. 5 is a schematic plan view of a substrate processing system incorporating aspects of the disclosed embodiment.
Figure 6:
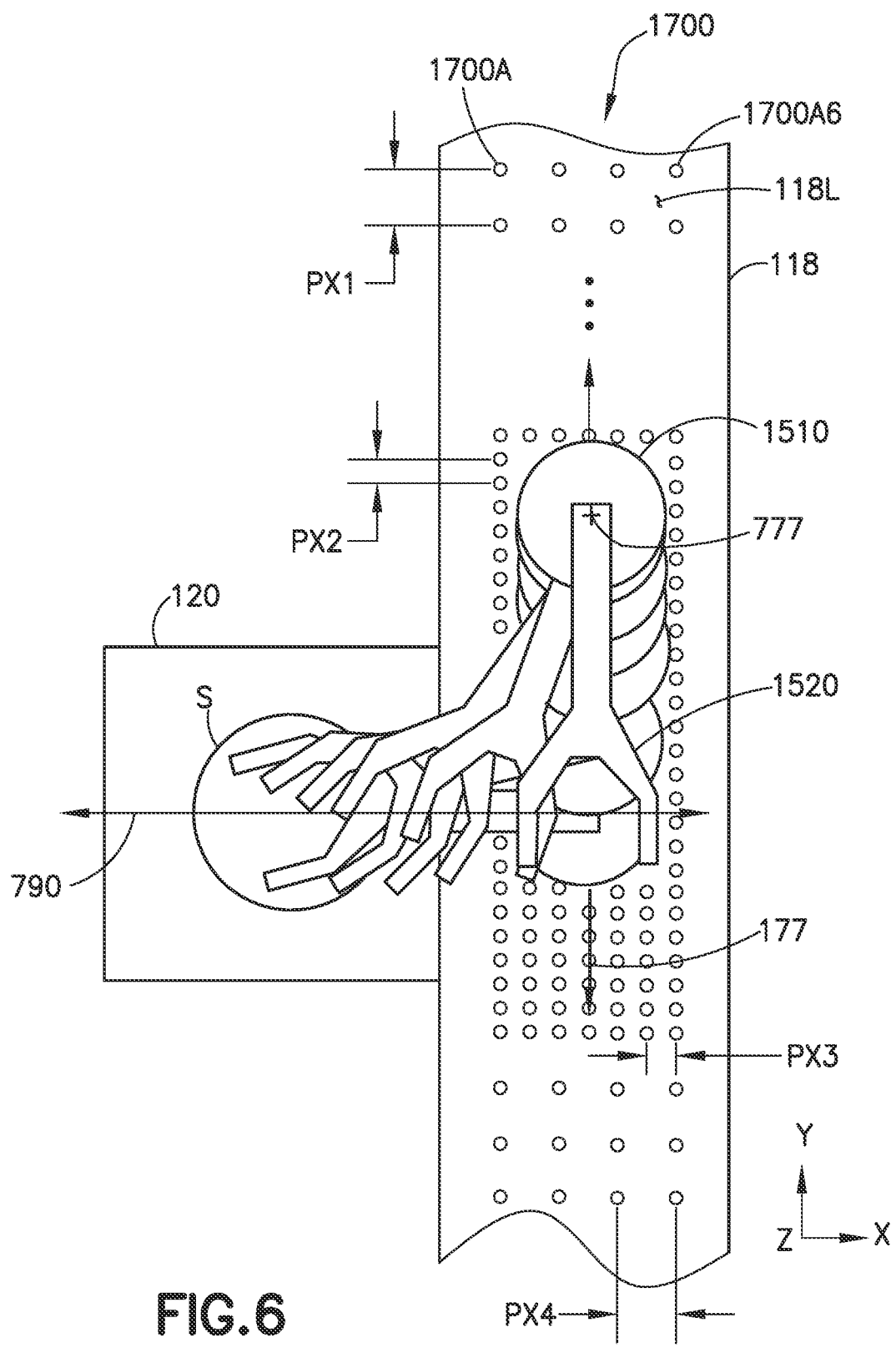
FIG. 6 is an exemplary substrate handler motion of the substrate processing apparatus described herein in accordance with aspects of the disclosed embodiment.

Referring now to FIGS. 4 and 5 there are shown other substrate processing apparatus 400, 500 in accordance with other aspects of the disclosed embodiment. As seen in FIGS. 4 and 5 the transport chamber(s) 118, 118A, 118B, 118C in these aspects is elongated to accommodate additional processing modules 120. The apparatus shown in FIG. 4 has twelve (12) processing modules 120 connected to the transport chamber 118. The processing apparatus 500 in FIG. 5 is illustrated as having two transport chambers 118A, 118B coupled to each other by a bridging chamber 118C that provides for movement of the substrate handlers 1500 between the transport chambers 118A, 118B. Here, each transport chamber 118A, 118B in FIG. 5 has 24 processing modules 120 connected thereto. The numbers of processing modules 120 shown in these aspects are merely exemplary, and the substrate processing apparatus may have any other number of processing modules 120 as previously described. The processing modules 120 in these aspects are disposed along the sides of the respective transport chamber 118A, 118B in a Cartesian arrangement similar to that previously discussed. The number of rows of processing modules 120 in these aspects, however have been greatly increased (e.g. six (6) rows in the apparatus of FIG. 4, and twelve (12) rows in each of the apparatus of FIG. 5). In the aspect shown in FIG. 4, the EFEM may be removed and the load ports 112 may be mated directly to the load locks 116. The transport chambers of the substrate processing apparatus 400, 500 in FIGS. 4, and 5 may have multiple substrate handlers 1500 to handle the substrates between the load locks 116 and the processing chambers 120. The number of substrate handlers 1500 shown is merely exemplary and more or fewer apparatus may be used. The substrate transport apparatus 1599 (a portion of which is illustrated in FIGS. 4 and 5) in these aspects are generally similar to that previously described, comprising the linear tracks 1550 and substrate handler(s) 1500. In the aspects shown in FIGS. 4 and 5, while only a single longitudinal drive line (e.g., drive lines 177, 178, 179 is illustrated in each chamber 118, 118A, 118B, 118C, it should be understood that in other aspects multiple drive lines may longitudinally extend along each chamber 118, 118A, 118B, 118C in a manner substantially similar to that illustrated in FIGS. 8-10. As can be realized, as with the other substrate transport apparatus 100, 100A, 200, 300, 800, 900, 1200, 1300 described herein, the substrate transport apparatus 400, 500 has a controller 199 for controlling the movements of the one or more substrate handlers 1500 of the substrate transport apparatus 1599.

Still referring to FIG. 5, the transport chambers 118A, 118B in this case may be mated directly to a tool 300 (e.g., a stocker, photolithography cell, or other suitable processing tool) where the substrates are delivered to and removed from the tool 300 through chamber 118C.

Figure 7:
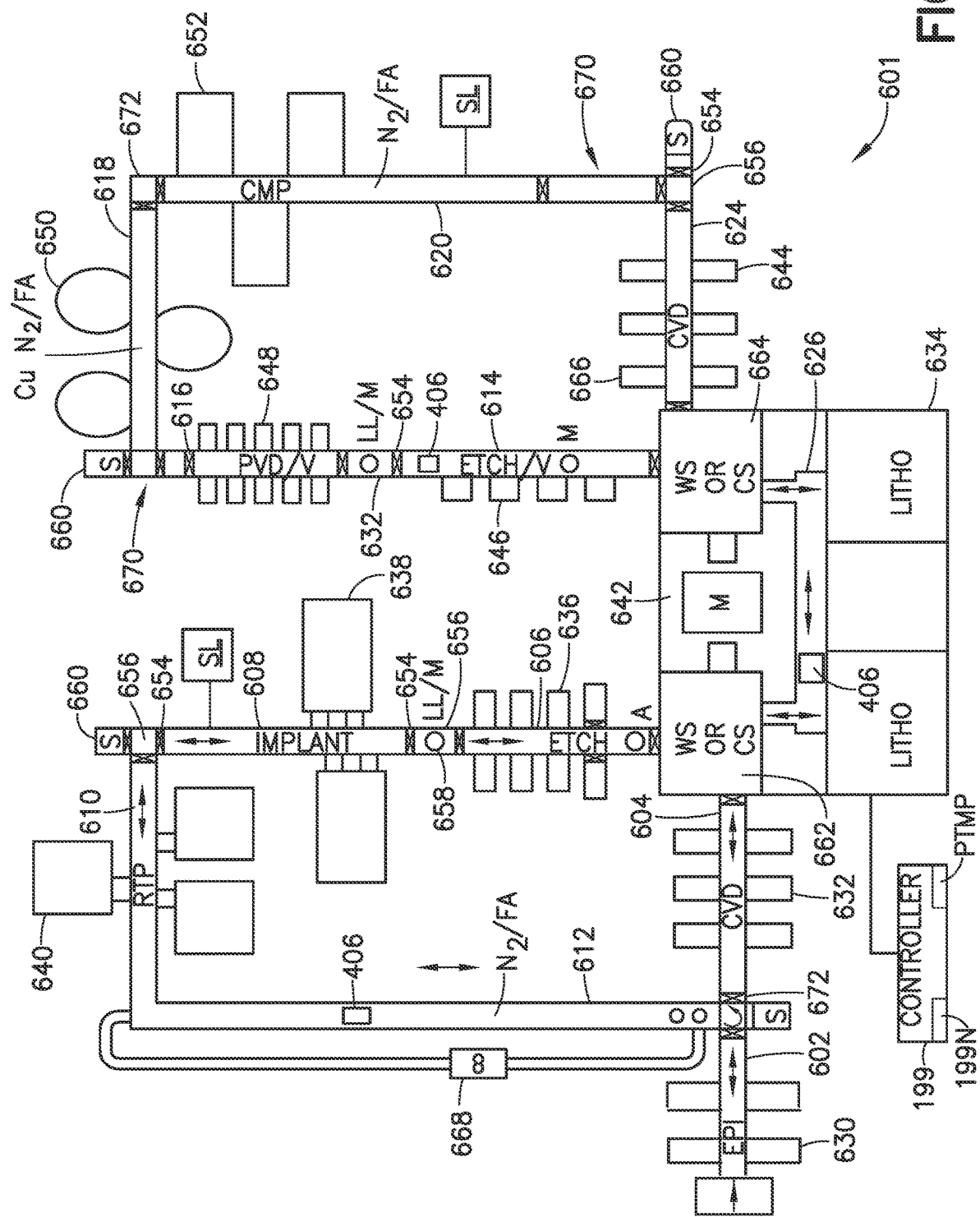
FIG. 7 is a schematic plan view of a substrate processing system incorporating aspects of the disclosed embodiment.

As may be realized from FIGS. 1B, 3 and 4-5 the transport chamber 118 may be extended as desired to run throughout the processing facility P (see FIG. 5, and an example processing facility is illustrated in FIG. 7). As seen in FIG. 5, and as will be described in further detail below, the transport chamber (generally referred to as transport chamber 118) may connect and communicate with various sections or bays 118P1-118P4 in the processing facility P such as for example storage, lithography tool, metal deposition tool or any other suitable tool bays. Bays interconnected by the transport chamber 118 may also be configured as process bays or processes 118P1, 118P3. Each bay has desired tools (e.g. lithography, metal deposition, heat soaking, cleaning) to accomplish a given fabrication process in the semiconductor workpiece. In either case, the transport chamber 118 has processing modules 120, corresponding to the various tools in the facility bays, communicably connected thereto, as previously described, to allow transfer of the semiconductor workpiece between chamber 118 and processing modules 120. Hence, the transport chamber 118 may contain different environmental conditions such as atmospheric, vacuum, ultra-high vacuum (e.g., 10-5 Torr), inert gas, or any other, throughout its length corresponding to the environments of the various processing modules connected to the transport chamber. Accordingly, the section 118P1 of the chamber in a given process or bay or within a portion of the bay, may have for example, one environmental condition (e.g. atmospheric), and another section 118P2, 118P3 of the chamber 118 may have a different environmental condition. As noted before, the section 118P1-118P4 of the chamber 118 with different environments therein may be in different bays of the facility, or may all be in one bay of the facility. FIG. 5 shows the chamber 118 having four sections 118P-118P4 with different environments for example purposes only. The chamber 118 in this aspect may have as many sections with as many different environments as desired.

As seen in FIG. 5, the substrate handlers 1500 in the transport chamber 118 are capable of transiting between sections 118P1-118P4 of the chamber 118 with different environments therein. Hence, as can be realized from FIG. 5, each of the substrate handlers 1500 may with one pick move a semiconductor workpiece from the tool in one process or bay of the processing facility to another tool with a different environment in a different process or bay of the process facility. For example, substrate handler 1500A may pick a substrate in processing module 301, which may be an atmospheric module, lithography, etching, or any other desired processing module in section 118P1, of transport chamber 118. The substrate handler 1500A may then move along drive line 177 (or a drive line substantially parallel thereto where more than one longitudinal drive line are provided) from section 118P1 of the chamber 118 to section 118P3 (e.g., where the other substrate handlers 1500 are controlled to avoid interference with substrate handler 1500A in any suitable manner, such as described herein). In section 118P3, the substrate handler 1500A may place the substrate in processing module 302, which may be any desired processing module.

As can be realized from FIG. 5, the transport chamber 118 may be modular, with chamber modules connected as desired to form the chamber 118 (e.g., formed by the three chamber sections 118A, 118B, 118C, where each chamber section 118A, 118B, 118C may also include one or more chamber modules that are coupled to each other in any suitable manner). Referring also to FIG. 1A, the modules may include internal walls 1181, similar to walls 118F, 118R in FIG. 1A, to segregate sections 118P1-118P4 of the chamber 118. Internal walls 181 may include slot valves, or any other suitable valve allowing one section of the chamber 118P1-118P4 to communicate with one or more adjoining sections. The slot valves 118V, may be sized to allow, one or more substrate handlers 1500 to transit through the valves 18V from one section 118P1-118P4 to another. In this way, the substrate handlers 1500 may move anywhere throughout the chamber 118. The valves 118V may be closed to isolate sections 118P1-1184 of the chamber 118 so that the different sections may contain disparate environments as described before. Further, the internal walls 1181 of the chamber modules may be located to form load locks (see section 118P4) as shown in FIG. 5. The load locks 118P4 (only one is shown in FIG. 5 for example purposes) may be located in chamber 118 as desired and may hold any desired number of substrate handlers 1500 therein.

In the aspect shown in FIG. 5, processes within chamber sections 118A and 118B may be the same processes, for example etch, where the processing apparatus 500 including tool 300 (such as a stocker) are capable of processing substrates without any associated material handling overhead associated with transporting FOUPS from the stocker to individual process modules 120 via an automated material handling system, and transporting individual wafers via EFEM's to the respective processing modules 120. Instead, a robot within the stocker directly transfers FOUPS 171 to the load ports (three load ports are shown per chamber section, more or less could be provided depending on throughput requirements) where the wafers are batch moved into locks and dispatched to their respective process module(s) depending on the desired process and/or throughput required. The chamber sections 118A, 118B or the stocker 300 may further have metrology capability, sorting capability, material identification capability, test capability, inspection capability, etc. as required to effectively process and test substrates.

In the aspect of the disclosed embodiment shown in FIG. 5, more or less chamber sections 118A and 118B may be provided that have different processes, for example etch, CMP, copper deposition, PVD, CVD, etc. where the chamber sections 118A, 118B, etc. in combination with the tool 300 being, for example a photolithography cell are capable of processing substrates without the associated material handling overhead associated with transporting FOUPs from stockers to individual process tool bays and a lithography bay via an automated material handling system, and transporting individual wafers via EFEM's to the respective processing tools. Instead, the automation within the lithography cell directly transfers FOUPS, substrates or material to the load ports 112 (again three load ports are shown per chamber section/process type, noting more or less could be provided depending on throughput requirements) where the substrates are dispatched to their respective process depending on the desired process and/or throughput required. An example of such an alternative is shown in FIG. 7. In this manner, the apparatus in FIG. 5 processes substrates with less cost, lower footprint, less WIP required (compared to the conventional processing systems described herein)— therefor with less inventory and with a quicker turnaround when looking at the time to process a single carrier lot (or "hot lot"), and with a higher degree of contamination control resulting in significant advantages for the fabrication facility operator. The chamber sections 118A, 118B (each of which may be referred to as a tool or tool section) or the tool or cell 300 may further have metrology capability, processing capability, sorting capability, material identification capability, test capability, inspection capability, etc. as required to effectively process and test substrates. As can be realized from FIG. 5, the chamber sections 118A, 118B, and tool 300 may be coupled to share a common controlled environment (e.g. inert atmosphere, or vacuum). This ensures that substrates remain in a controlled environment from tool 300 and throughout the substrate processing apparatus 500. This eliminates use of special environment controls of the FOUPs as in conventional substrate processing apparatus such as those shown in FIGS. 37 and 38.

Referring now to FIG. 7, there is shown an exemplary fabrication facility layout 601 incorporating aspects of the disclosed embodiment that are shown in FIG. 5. Wafer handlers 406, similar to wafer handlers 1500 transport substrates or wafers through process steps within the fabrication facility 601 through transport chambers 602, 604, 606, 608, 610, 612, 614, 616, 618, 620, 624, 626. Process steps may include epitaxial silicon 630, dielectric deposition 632, photolithography 634, etching 636, ion implantation 638, rapid thermal processing 640, metrology 642, dielectric deposition 644, etching 646, metal deposition 648, electroplating 650, chemical mechanical polishing 652. In other aspects, more or less processes may be involved or mixed; such as etch, metal deposition, heating and cooling operations in the same sequence. As noted before, wafer handlers 406 may be capable of carrying a single wafer or multiple wafers and may have transfer capability, such as in the case where wafer handler 406 has the capability to pick a processed wafer and place an unprocessed wafer at the same module. Wafer handlers 406 may travel through isolation valves 654 for direct tool to tool or bay to bay transfer or process to process transfer. Valves 654 may be sealed valves or simply conductance type valves depending upon the pressure differential or gas species difference on either side of a given valve 654. In this manner, wafers or substrates may be transferred from one process step to the next with a single handling step or "one touch". As a result, contamination due to handling is minimized. Examples of such pressure or species difference could be for example, clean air on one side and nitrogen on the other; or roughing pressure vacuum levels on one side and high vacuum on the other; or vacuum on one side and nitrogen on the other. Load locks 656, similar to chambers 118P4 in FIG. 5, may be used to transition between one environment and another; for example between vacuum and nitrogen or argon. In other aspects, other pressures or species may be provided in any number of combinations. Load locks 656 may be capable of transitioning a single wafer handler or multiple wafer handlers in a manner substantially similar to that described herein where a single drive line or multiple substantially parallel and/or orthogonal drive lines are provided. Alternately, substrate(s) may be transferred into load lock 656 on shelves (not shown) or otherwise where the wafer handler 406 is not desired to pass through the valve. Additional features 658 such as alignment modules, metrology modules, cleaning modules, process modules (ex: etch, deposition, polish, etc.), thermal conditioning modules or otherwise, may be incorporated in lock 656 or the transport chambers. Service ports 660 may be provided to remove wafer handlers 406 or wafers from the tool. Wafer or carrier stockers 662, 664 may be provided to store and buffer process and or test wafers. In other aspects, stockers 662, 664 may not be provided, such as where carts are directed to lithography tools directly. Another example is where indexer or wafer storage module 666 is provided on the tool set. Recirculation unit 668 may be provided to circulate and or filter air or the gas species in any given section such as tool section 612. Recirculation unit 668 may have a gas purge, particle filters, chemical filters, temperature control, humidity control or other features to condition the gas species being processed. In a given tool section more or less circulation and or filter or conditioning units may be provided. Isolation stages 670 may be provided to isolate wafer handlers 406 and/or wafers from different processes or tool sections that cannot be cross contaminated. Locks or interconnects 672 may be provided to change wafer handler 406 orientation or direction in the event the wafer handler 406 may pick or place within a generic workspace without an orientation change. In other aspects or methods any suitable combination of process sequences or make up could be provided.

Referring now to FIG. 9, the controller 199 controls the propulsion forces, generated by the array of electromagnets 1700, across the base 1510 so as to impart a controlled yaw moment on the base, yawing the base 1510 about a yaw axis (e.g., axis of rotation 777), substantially normal to the drive plane 1598, from a first predetermined orientation relative to the frame of the chamber 118 (such as where the end effector 1520 is substantially aligned with drive line 177), to a second different predetermined orientation relative to the frame of the chamber 118 (such as where the end effector is extended into process module 120). As may be realized yawing of the base 1510 may be performed in conjunction with propulsion motion of the base 1510 (such as where a single drive line is provided in the chamber 118) or with the base at a predetermined location (such as where the base 1510 is rotated while remaining substantially stationary along the X and Y axes). In one aspect, referring also to FIG. 15C, the controller 199 controls the propulsion forces (e.g., $Fx_{right}$, $Fx_{left}$), generated by the array of electromagnets 1700, so as to impart a moment couple (illustrated in FIG.

15C with movement of the substrate handler 1500 along the X axis) on the base 1510 effecting controlled yaw of the base 1510 so as to effect at least one of positioning and centering of a substrate (also referred to as a wafer payload or payload) on the base 1510 relative to a predetermined substrate holding location (such as a load lock, process module, etc.) of the frame of the chamber 118. As may be realized, pitch (rotation about Y axis) and roll (rotation about X axis) (see FIGS. 15A and 15B) control may be effected with the controller 199 (controlling lift forces Fz across the reaction platen) simultaneously with yaw motion countering dynamic moment coupling and maintaining substantially flat yaw of the wafer holder/reaction platen in the wafer transfer plane.

Where a single drive line 177 is provided in each transport chamber (as illustrated in FIGS. 1A, 1B, 2, 4, and 5) or where access to a process module, such as process module 120A (see FIG. 8) from a drive line 178 closest to the process module 120A (such as when multiple substantially parallel longitudinal drive lines 177, 178 are provided—see FIG. 8), the controller 199 is configured to drive the base 1510 simultaneously in two or more of yaw, pitch, roll, and in propulsion (as described herein) to pick and place substrates from any suitable substrate holding stations (e.g. load locks 116, process modules 120, etc.). For example, the controller 199 is configured to energize the array of electromagnets 1700 as described herein so that the base moves along the drive line 177 and rotates about a base rotation axis 777 so that a substrate seating surface 1520A of the substrate handler 1520 enters a process module 120 or other suitable holding station where the substrate S travels along a substantially straight line path 790 in a predetermined wafer/substrate transfer plane. Referring to FIGS. 8-11, in other aspects, where multiple longitudinal drive lines 177, 178 are provided in the transport chamber 118 the base 1510 may be rotated so that the substrate handler 1520 is aligned with a desired/predetermined substrate holding station prior to entrance into the substrate holding station. For example, the base 1510 may be positioned at an intersection between drive lines 178 and 179A, where drive line 179 provides for extension and retraction of the substrate handler into substrate holding station 120BH of process module 120B (e.g., in a propulsion direction substantially orthogonal (or any suitable angle that enables access to the process module) to the propulsion direction along drive lines 177, 178). The base 1510 may be rotated about rotation axis 777 so that the substrate handler 1520 is aligned with the substrate holding station 120BH and the base may be moved along drive line 179A to move or extend the substrate handler 1520 into the substrate holding station 120BH for picking/placing a substrate(s).

Figure 14:
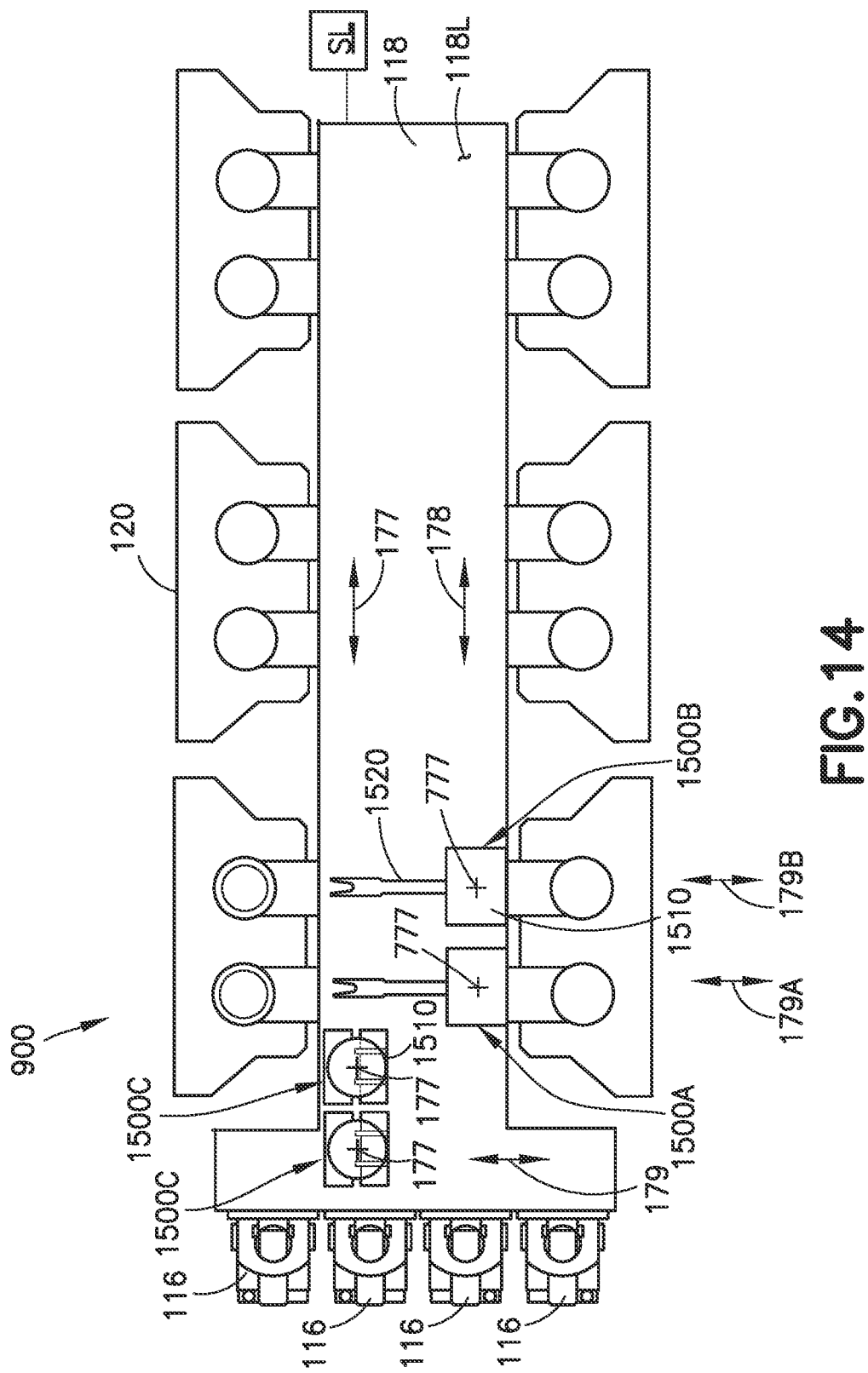
FIG. 14 is a schematic plan view of a substrate processing apparatus incorporating aspects of the disclosed embodiment.
Figure 14A:
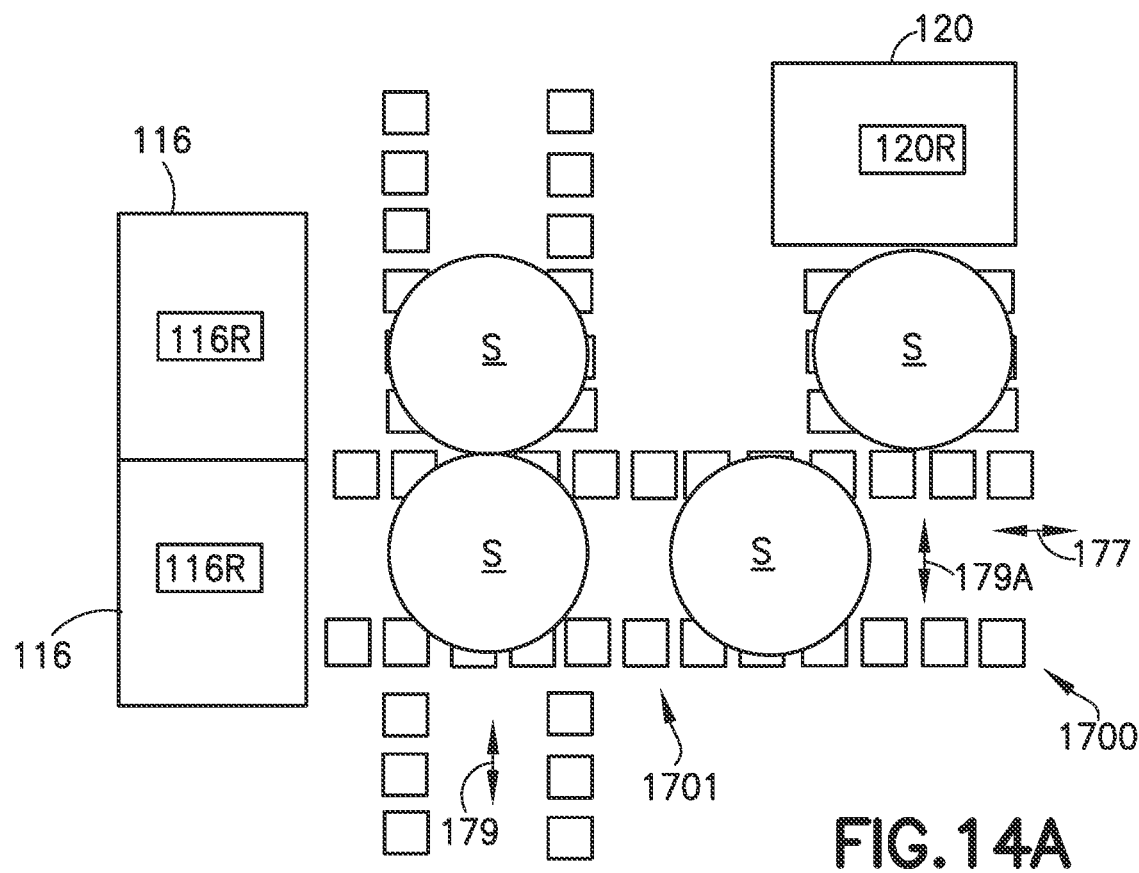
FIG. 14A is a schematic plan view of a portion of the substrate processing apparatus of FIG. 14 in accordance with aspects of the disclosed embodiment.
Figure 14B:
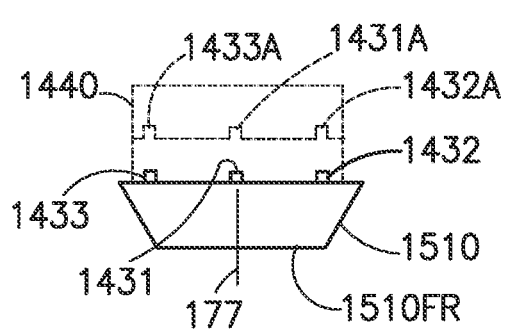
FIG. 14B is a schematic elevation view of a substrate transport cart in accordance with aspects of the disclosed embodiment.
Figure 14C:
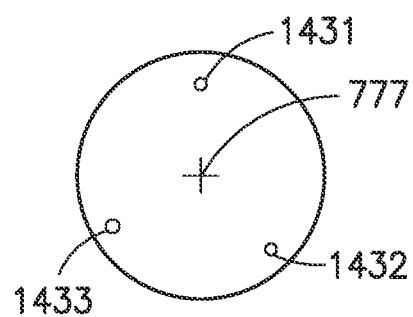
FIG. 14C is a schematic plan view of the substrate transport cart in FIG. 14B in accordance with aspects of the disclosed embodiment.

Referring to FIGS. 14 and 14A-14C, while the substrate handler 1500 has been described as including an end effector 1520, in other aspects one or more substrate handlers may be configured as a cart 1500C that is configured to support one or more substrates on the base 1510. For example, the base 1510 may include one or more substrate supports 1431-1433 configured to stably hold a substrate (e.g., from the bottom or edge grip) so that substrate handlers 1500, 1500A, 1500B or substrate transports within, e.g., a load or other substrate holding station, may transport substrate(s) to and from the substrate supports 1431-1433. In one aspect, the substrate supports 1431-1433 may be configured to substantially center one or more substrates on the base 1510 (i.e., the supports are self-centering supports, that are either passive supports or may be actuated (e.g., piezo-electric) from a suitable power source energized on the reaction platen) so that a center of the substrate(s) is substantially coincident with the axis of rotation 777 of the base. In some aspects, one or more of the carts 1500C may include a substrate support rack 1440 for holding two or more substrates in a stack, where each rack level includes respective substrate supports 1431-1433, 1431A-1433A. Referring to FIGS. 14 and 14A, the carts 1500C may provide an interface between the substrate handlers 1500A, 1500B and the load locks 116 where a transport apparatus 116R (such as a SCARA arm, linear sliding arm, etc.) of the load lock transfers substrate(s) to the cart 1500C and the substrate handlers 1500A, 1500B pick the substrates from the cart and vice versa. In other aspects, where the process module 120 includes a transport apparatus 120R (such as a SCARA arm, linear sliding arm, etc.) the carts 1500C may be employed to transfer substrate(s) to and from the process module 120. While the base 1510 of the carts 1500C (and of the substrate handlers 1500, 1500A, 1500B) are illustrated as having a circular shape when viewed from the top (see FIG. 14C) in other aspects, the base 1510 may have any suitable shape (e.g., square, rectangular, circular, etc. when viewed from the top) that otherwise interfaces with the array of electromagnets 1700 for effecting one or more of linear propulsion, lift, yaw, pitch, roll, and rotation control of the base 1510.

Referring to FIGS. 12A, 12B, 13A, 13B, while the transport chamber 118 has been described above as a longitudinally extended chamber that forms part of a linear processing tool, in other aspects, the transport chamber may have a cluster tool configuration. For example, referring to FIGS. 12A and 12B the transfer chamber 118T1 has a substantially square configuration (although in other aspects the transfer chamber may have any suitable shape such as hexagonal, octagonal, etc.). In this aspect an electrical machine 1599R (substantially similar to the linear electrical machine 1599) is configured as a side-by-side transport apparatus that includes at least two side-by-side substrate handlers 1500A, 1500B that are substantially similar to substrate handler 1500 described herein. The array of electromagnets 1700 in this aspect is configured to move the substrate handlers 1500A, 1500B so that the substrate handlers 1500A, 1500B rotate about common axis of rotation 1277 (such axis being akin to a θ axis of, for example, a conventional SCARA type robot) for changing a direction of "extension and retraction" (the terms extension and retraction are being used herein for convenience noting that the extension and retraction is effected by linear propulsion movement of the substrate handler 1500, 1500A, 1500B along a respective drive line) of the side-by-side transport apparatus. For example, the array of electromagnets 1700 has an arrangement that forms drive lines 177, 178, 179, 180. Here drive lines 177, 178 are spaced from one another and substantially parallel to one other so as to be substantially aligned with a respective transport openings 1180A, 1180F and 1180B, 1180E. The drive lines 179, 180 are substantially orthogonal to drive lines 177, 178 and are spaced from one another and substantially parallel to one other so as to be substantially aligned with a respective transport openings 1180C, 1180H and 1180D, 1180G. The drive lines can be in any suitable pattern (such as arced or curved segments with constant or varying radii) and orientation and the description that follows is for exemplary purposes. The electromagnets 1700A-1700N (illustrated in FIG. 12A but not numbered for clarity of the figure) provide for at least linear propulsion of the substrate handlers 1500A, 1500B through the transport openings 1180A-1180H. In this aspect, the array of electromagnets 1700 also includes rotational electromagnet sub-arrays 1231-1234 that effect, under control of controller 199, with the electromagnets that form the drive lines 177-180 the rotation of the substrate handlers 1500A, 1500B about the common axis of rotation 1277. Alternatively, the electromagnets may form a dense enough and large enough grid without being specifically designated for propulsion or rotation and can perform that function based on the base's 1510 position and the control law of the controller 199. As may be realized, while the substrate handlers 1500A, 1500B may rotate about the common axis of rotation 1277 at the same time, extension and retraction of the substrate handler 1500A, 1500B may be independent of extension and retraction of the other one of the substrate handler 1500A, 1500B. In general, the motion of the substrate handler 1500A, 1500B is independent of each other and the complexity of that motion can range from one degree of freedom to six degrees of freedom.

Figure 12A:
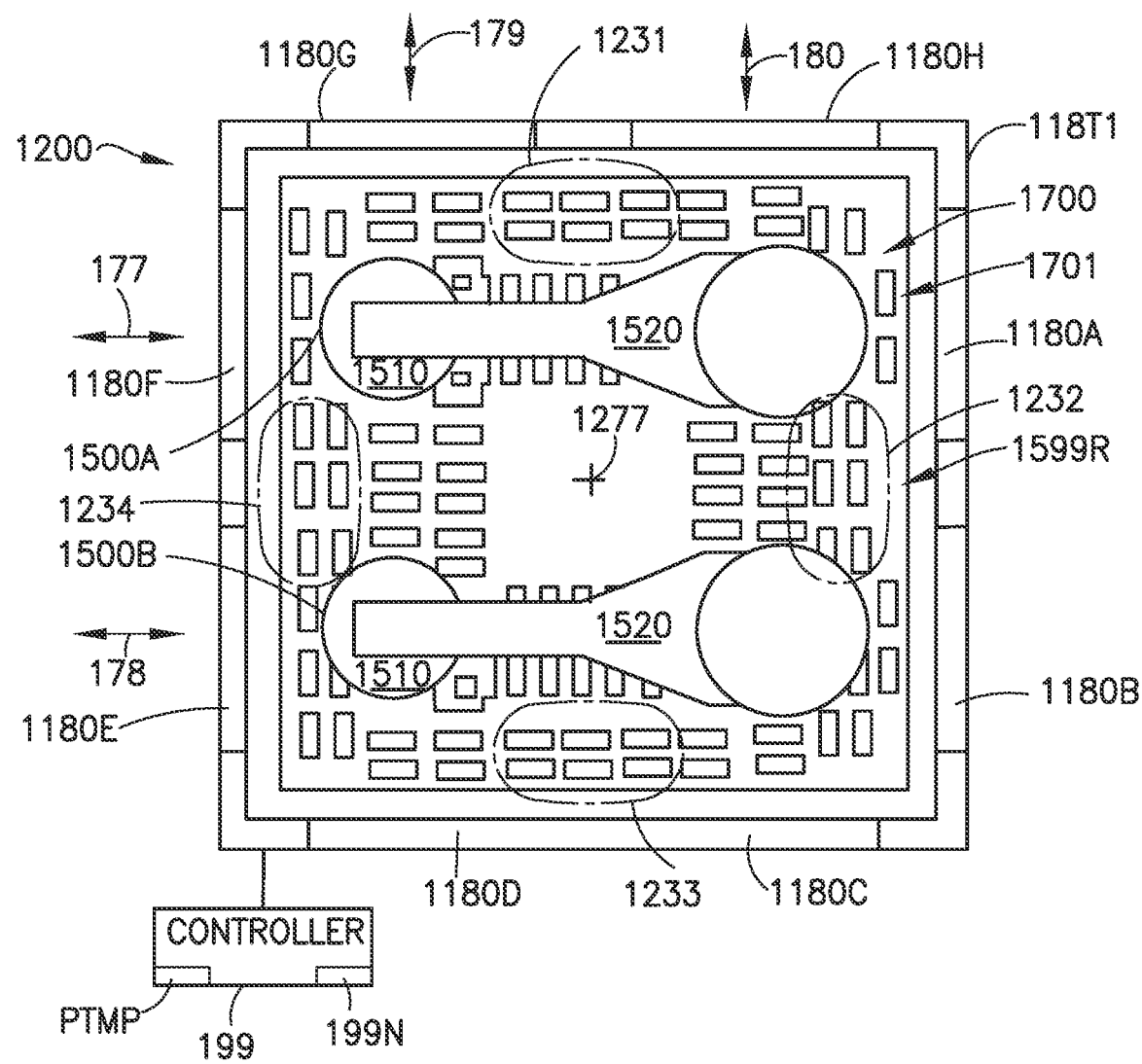
FIG. 12A is a schematic plan view of a substrate processing apparatus incorporating aspects of the disclosed embodiment.

Referring to FIG. 12B, in one aspect, the electrical machine 1599R includes multiple transport levels 1220A, 1220B that are stacked one above the other. In this aspect, each level 1220A, 1220B is formed by a respective level support 1221 each having a respective reference plane 1299R that is substantially parallel with the level reference plane 1299 of the transport chamber 118T1 frame. Each level support 1221 includes an array of electromagnets 1700 substantially similar to that illustrated in FIG. 12A for linearly driving the side-by-side substrate handlers 1500A, 1500B along drive lines 177-180 and rotating the side by side substrate handlers 1500A, 1500B (e.g., with full six degree of freedom control) about the common axis of rotation 1277. Each level support 1221 is coupled to a common Z axis drive 1211 that moves the level supports 1221 and the substrate handlers 1500A, 1500B thereon in the Z direction so as to align the end effectors 1520 of the substrate handlers 1500A, 1500B on the respective level supports 1221 with a substrate transport plane 1290 of the transport openings 1180 of the transport chamber 118T1. The Z axis drive 1211 may be any suitable linear actuator such as a screw drive, electromagnetic drive, pneumatic drive, hydraulic drive, etc.

Figure 13A:
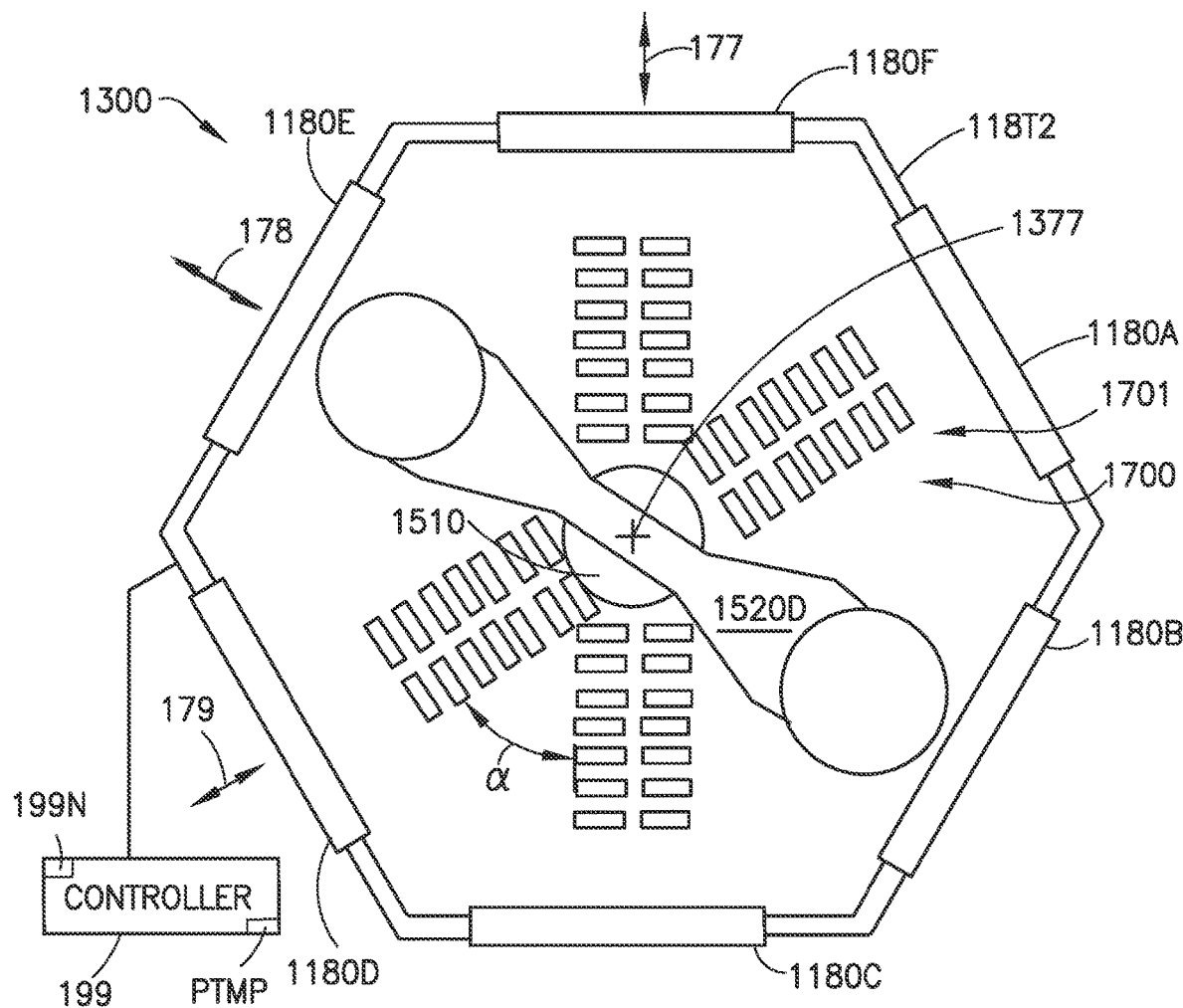
FIG. 13A is a schematic plan view of a substrate processing apparatus incorporating aspects of the disclosed embodiment.

In another aspect referring to FIGS. 13A and 13B the transfer chamber 118T2 has a substantially hexagonal configuration (although in other aspects the transfer chamber may have any suitable shape as noted herein). In this aspect the electrical machine 1599R (substantially similar to the linear electrical machine 1599 of FIG. 15C) is configured as a radial transport apparatus that includes a substrate handler 1500 having a double ended/sided end effector 1520D, as will be described herein (although in other aspects a single ended/sided end effector may be employed). The array of electromagnets 1700 in this aspect is configured to rotate the substrate handler 1500 about axis of rotation 1377 (such axis being akin to a θ axis of, for example, a conventional SCARA type robot) for changing a direction of "extension and retraction" (the terms extension and retraction are being used herein for convenience noting that the extension and retraction is effected by linear propulsion movement of the substrate handler 1500 along a respective drive line), and linearly propel the substrate handler 1500 so as to extend through the transport openings 1180A-1180F. For example, the array of electromagnets 1700 has an arrangement that forms radially offset drive lines 177, 178, 179, where an angle α between adjacent drive lines depends on the number of sides/facets of the transport chamber 118T2 on which the transport openings 1180A-1180F are located. The electromagnets 1700A-1700N (illustrated in FIG. 12A but not numbered for clarity of the figure) provide for at least linear propulsion of the substrate handler 1500 through the transport openings 1180A-1180H and rotation of the substrate handler 1500 about axis of rotation 1377 with full six degree of freedom control so as to maintain linear transport and rotation in a desired attitude in pitch and roll.

Referring to FIG. 13B, in one aspect, the electrical machine 1599R includes multiple transport levels 1320A, 1320B that are stacked one above the other in a manner substantially similar to that described above with respect to FIG. 12B. For example, each level 1320A, 1320B is formed by a respective level support 1321 each having a respective reference plane 1299R that is substantially parallel with the level reference plane 1299 of the transport chamber 118T1 frame. Each level support 1321 includes an array of electromagnets 1700 substantially similar to that illustrated in FIG. 13A for linearly driving (along drive lines 177-179) and rotating (about axis 1377) the substrate handler 1500. Each level support 1321 is coupled to a common Z axis drive 1311 (that is substantially similar to Z-axis drive 1211) that moves the level supports 1321 and the substrate handler 1500 thereon in the Z direction so as to align each of the end effector 1520D of the substrate hander 1500 on the respective level supports 1321 with a substrate transport plane 1390 of the transport openings 1180 of the transport chamber 118T2.

Referring to FIGS. 12B and 13B, the vertical motion provided by the Z actuator 1211 can be used for enabling the wafer handler 1220A or 1220B to perform wafer handoff operations such as pick or place to/from a wafer process station. The supports 1221, 1321 can include a single module (level) with the purpose of providing additional elevation capability to the wafer handler 1220A, 1220B to achieve larger vertical strokes during the wafer handoff operations. For example, in the case of process modules or load locks that have more than one stacked wafer slot, it would be advantageous to have a vertical lift apparatus such as Z-axis actuator 1211, 1311 to be able to reach each of the stacked wafer slots without increase of applied levitation power provided by the electrical machine 1599R.

Referring to FIGS. 12A and 12B, the vertical lift apparatus (or Z-axis actuator) 1211 and level 1221, in another aspect, has dual (or more) separate and independently operable apparatus, e.g., one for each wafer handler 1520. This would give the ability to perform independent vertical strokes for different wafer handlers that can access different slots on at least two independent stations (e.g., process modules, load locks, etc.).

Referring now to FIGS. 15A, 15B, 15C, 16A, 16B, 16C, and 18, the linear electrical machine 1599 will be described in greater detail (again noting that the electrical machine 1599R is substantially similar to the linear electrical machine 1599). Generally, the linear electrical machine 1599 includes a structure (e.g., wafer handler) 1500 without magnets and any moving parts such as bearings, revolute or prismatic joints, metal bands, pulleys, steel cables or belts. As noted above, the structure or wafer handler 1500 includes the base 1510 which is formed of a paramagnetic material, diamagnetic material, or a non-magnetic conductive material. The base 1510 may have any suitable shape and size for cooperating with the electromagnets 1700A-1700n of the array of electromagnets 1700 so as to stably transport substrates S in the manner described herein. In some aspects, as will be described herein, such as where multiple wafer handlers 1500 are employed, the shape and size of the base 1510 defines a unique identification signature that identifies the wafer handler 1500 with respect to absolute position determination of the wafer handler in the manner(s) described herein.

In one aspect, as illustrated in FIGS. 9 and 11-16C the base 1510 is shown with a frusto-conical shape where the tapered side 1510TS of the frustum 1510FR face the array of electromagnets 1700 (although other suitable shapes are operative). Here the tapered side 1510TS of the frusto-conical shape have an angle λ (see FIG. 15B) that is between about 50° and about 60° relative to the planar surfaces of the frustum 1510FR; while in other aspects the angle λ may be greater than about 60° or less than about 50°. In other aspects, the base may have a frusto-pyramidal shape as shown in FIGS. 8, 8A, and 10. Here each side 1510TSP of the frustum 1510FRP have an angle λ (see FIG. 8B) that is between about 50° and about 60° relative to the planar surfaces of the frustum 1510FRP; while in other aspects the angle λ may be greater than about 60° or less than about 50°. While the frusto-pyramidal shape is illustrated as having four sides, in other aspects the frusto-pyramidal shape may have any suitable number of sides, such as, for example, six or eight sides or may be round or have curved sides. In other aspects, the base 1510 may not have a frusto-conical or frusto-pyramidal shape and it may comprise of a planar shape with suitable and asymmetric contour and size in order to be properly controlled by electromagnets 1700.

The end-effector 1520, 1520D may be substantially similar to conventional end effectors; however, as described herein the end effector is rigidly coupled to the base 1510. As an example, the end effector may be a single sided/ended (see end effector 1520) with a single substrate holding location 1520A, a double sided/ended (see end effector 1520D) with two longitudinally spaced apart substrate holding locations 1520A, 1520B, a side-by-side configuration where multiple substrate holding locations are arranged side-by-side (e.g., laterally spaced apart) and supported from a common base so as to extend through side-by-side substrate transport openings, a stacked configuration were multiple substrate holding locations are arranged in a stack one above the other and supported from a common base so as to extend through vertically arrayed substrate transport openings, while in other aspects the end effector may have any suitable configuration. The end effector 1520, 1520D may be made of materials that can one or more of withstand high temperatures, have low mass density, have low thermal expansion, have low thermal conductivity and have low outgassing. A suitable material from which the end effector 1520, 1520D may be constructed is Alumina Oxide (Al$_2$O$_3$), although any suitable material may be used.

In one aspect, the end-effector 1520, 1520D is coupled to the base 1510 with a substantially rigid and unarticulated stanchion 1510S so as to set the end-effector 1520, 1520D at a suitable nominal height H2 relative to, for example, the level reference plane 1299. The substrate handler 1500, as described herein, is moved in space (in at least three degrees of freedom) using electrodynamic levitation principles. The actuation elements (e.g., the array of electromagnets 1700), as shown in FIGS. 15A-15C, 16B, 16C, and 18 include independently controlled coils or electromagnetics 1700A-1700n, 1700A1-1700n1, 1700A2-1700N2, 1700A3-1700n3, 1700A4-1700n4, 1700A5-1700n5 (also referred to herein as coil segments) that generate desired magnetic field that induces thrust and lift force vectors in the base 1510. As will be described herein, the independently controlled coils or electromagnetics 1700A-1700n, 1700A1-1700n1, 1700A2-1700N2, 1700A3-1700n3, 1700A4-1700n4, 1700A5-1700n5 also effect self-deterministic absolute wafer handler position feedback for each wafer handler(s) 1500.

Figure 47A:
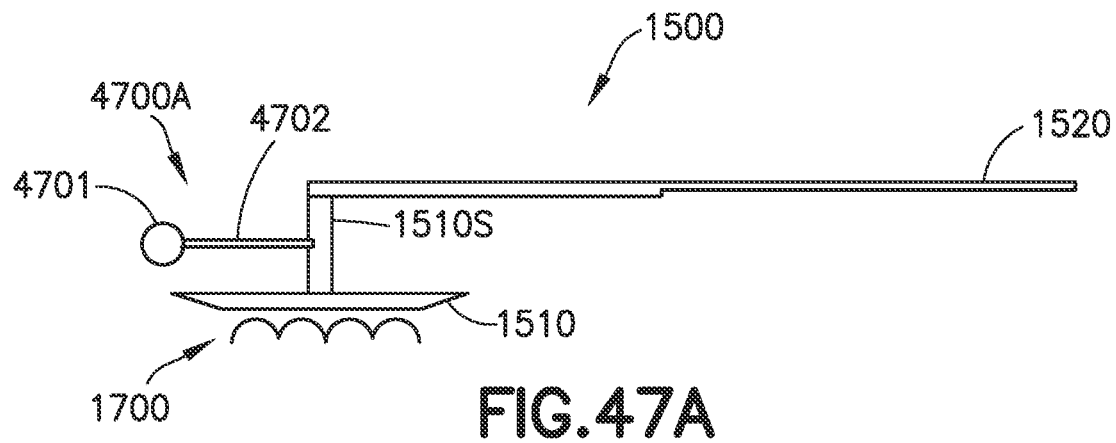
FIGS. 47A, 47B, and 47C are schematic illustrations of a portion of a wafer handler in accordance with aspects of the disclosed embodiment.
Figure 47B:
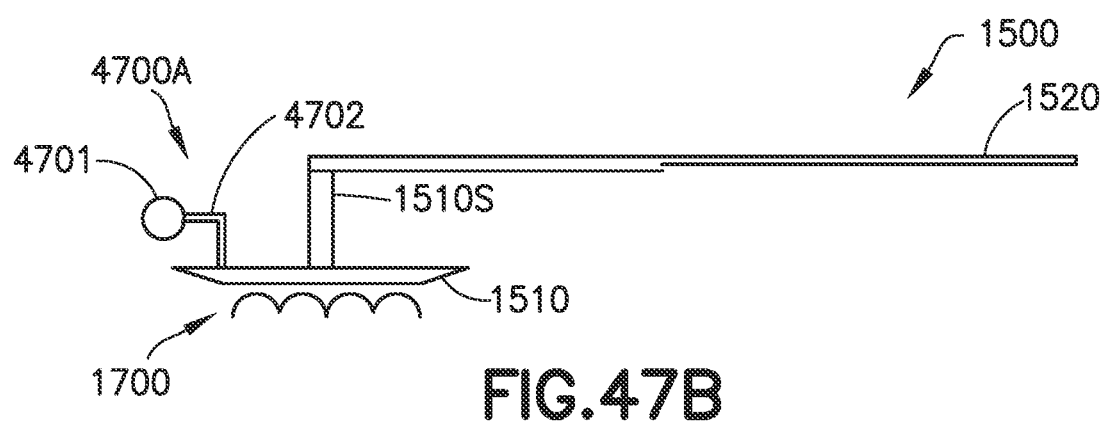
Figure 47C:
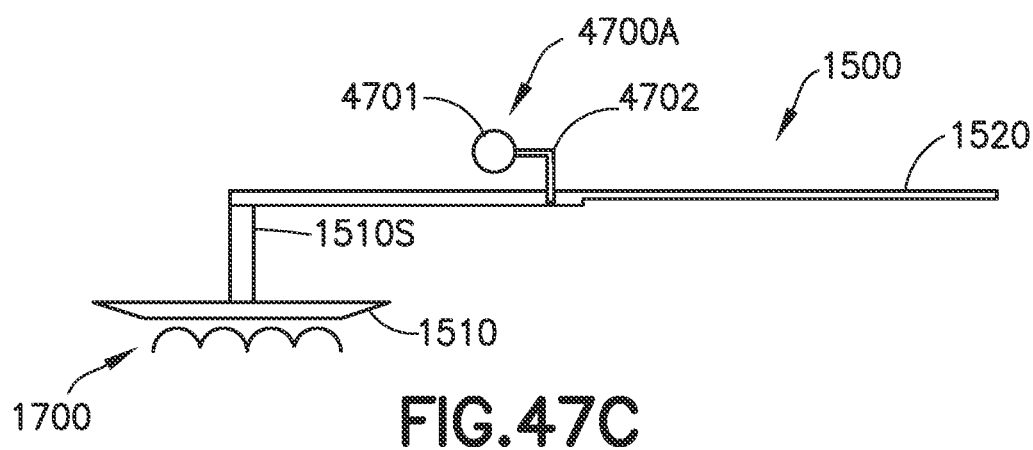
Figure 48A:
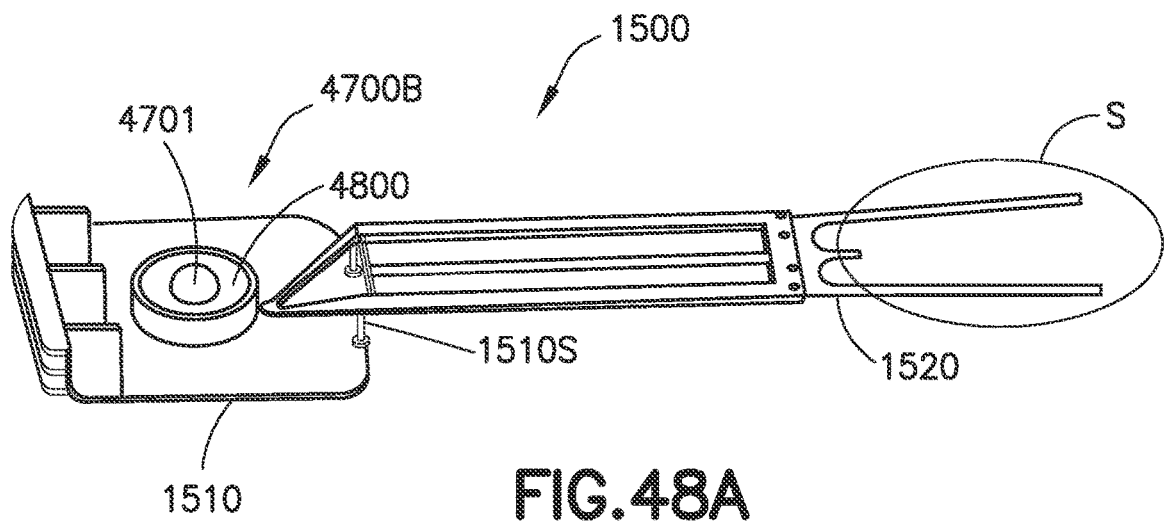
FIGS. 48A, 48B, and 48C are schematic illustrations of a portion of a wafer handler in accordance with aspects of the disclosed embodiment.
Figure 48B:
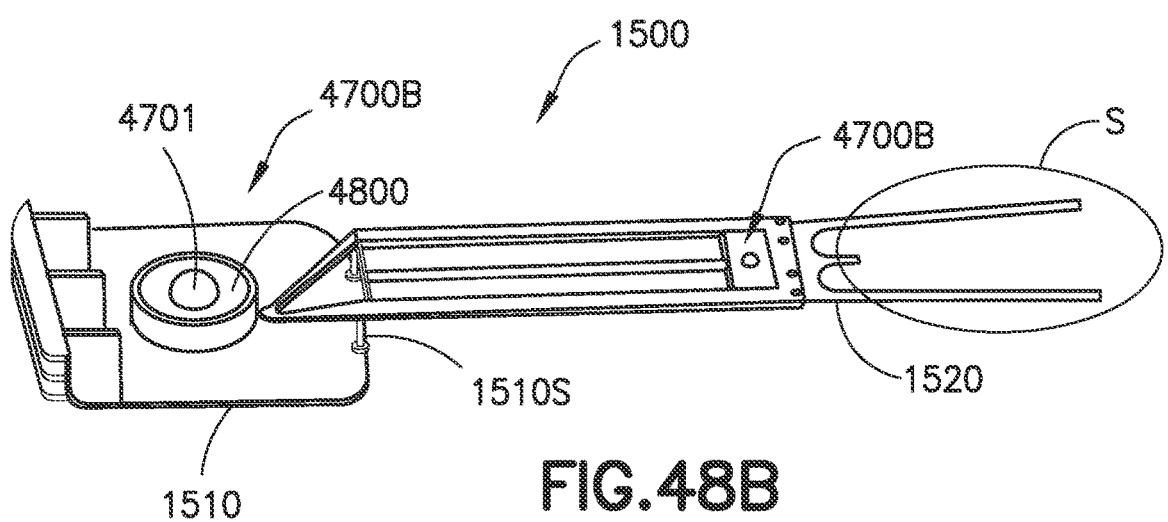
Figure 48C:
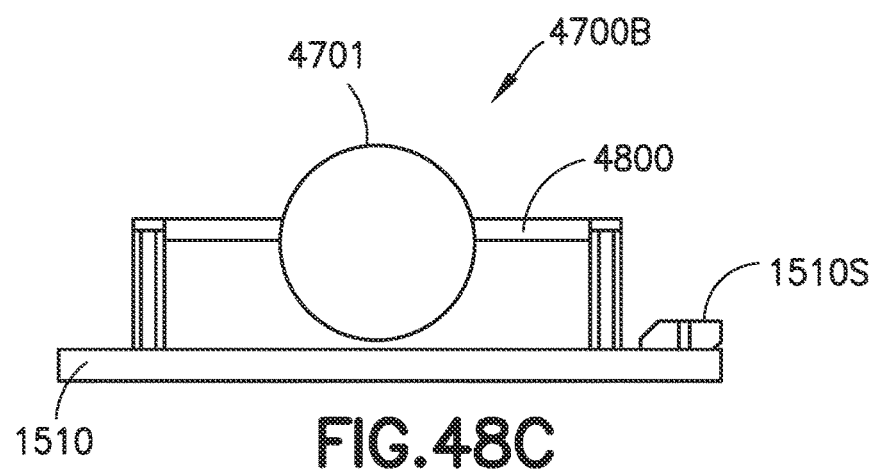

In one or more aspects, referring also to FIGS. 47A, 47B, and 47C, the wafer handler 1500 is configured to suppress vibrations from the base 1510 excitation to the end effector 1520 that is holding a substrate or wafer S. For example, a passive vibration compensator or absorber 4700A, 4700B having a natural frequency mode tuned to compensate for vibration of the base 1510 under levitation propulsion forces so as to effect a substantially vibration free end effector 1520 with respect to the end effector natural vibration frequency modes. Here as described herein, the end effector 1520 is carried by the base 1510. The excitation force on the base 1510 is a result of the alternating current induction of Eddy Currents that generates repulsive forces to maintain the base 1510 at a predetermined levitation air gap above the floor 118L (see, e.g., FIGS. 44A and 44C) of the transport chamber 118. Vibration suppression is effected by the passive vibration absorber 4700A, 4700B of the wafer handler 1500. The passive vibration absorber is coupled to any suitable portion of the wafer handler 1500 such one or more of the base 1510 (see FIGS. 47B and 48A-48C), the stanchion 1510S (see FIG. 47A), and the end effector (see FIGS. 47C and 48B). The passive vibration absorber includes a mass 4701 and a spring 4702, where the mass 4701 is cantilevered from the spring 4702. In other aspects, such as shown in FIGS. 48A-48C) the mass 4701 may be suspended on/within a flexible diaphragm or membrane 4800. The mass 4701, the spring 4702 and the membrane 4800 are constructed of any suitable inert material, such as stainless steel. The mass 4701 may have any suitable shape and is illustrated as being spherical for exemplary purposes. Here, the resonance frequency of the passive vibration absorber 4700A, 4700B is tuned (e.g., via the weight of the mass and the spring stiffness) such that the base 1510 vibration is suppressed and the end effector 1520 remains substantially free of vibrations.

Figure 10A:
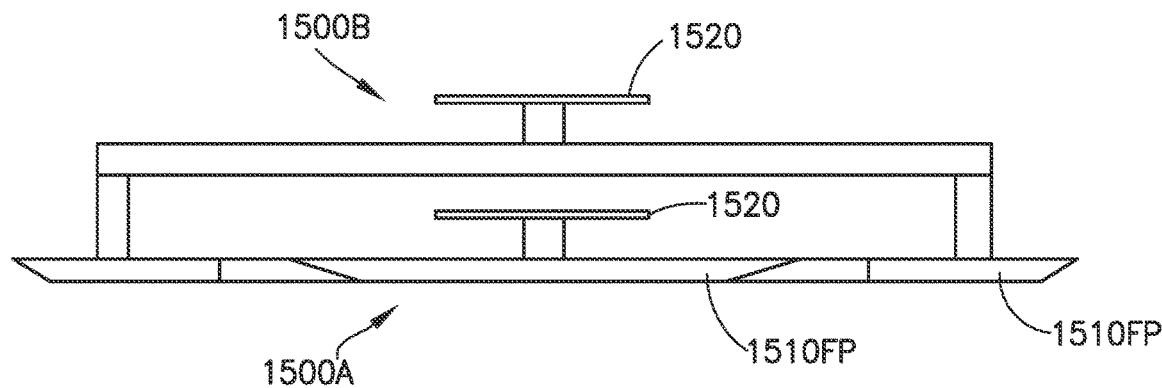
FIG. 10A is a schematic perspective view of a portion of a substrate handler of FIG. 10 in accordance with aspects of the disclosed embodiment.

In some aspects, referring to FIGS. 10, 10A, 11, and 11A, multiple wafer handlers may be nested with respect to each other so as to travel linearly along the drive lines 177-180 as a single unit with the end effectors 1520 of the nested substrate handler disposed in a stack one above the other. For example, referring to FIGS. 10 and 10A the nested bases 1510FP (may be symmetrical as a body of revolution, revolute symmetry e.g., frusto-conical, or bi-symmetrical, e.g., frusto-pyramidal, or a channel shaped cross section of which are illustrated in FIG. 10A) are configured so that one base 1510FP may be inserted into another base 1510FP so as to stack the bases 1510FP in a manner similar to that of stacking cups one inside the other. The bases 1510FP may be configured so that when stacked the vertical space between end effectors 1520 (e.g., when the end effectors 1520 are substantially level with the level reference plane 1299) is substantially the same as a vertical space between stacked substrate holding stations so as to provide for simultaneous picking and placing of substrates by the stacked end effectors 1520. The stacking of the bases 1510FP provides, in one aspect, depending on the levitation forces generated by the array of electromagnets 1700, independent vertical or Z-axis movement of at least one of the bases 1510FP (and the respective substrate handler 1500A, 1500B the base is part of). In this example, the uppermost substrate handler 1500B may be moved in the Z-axis independent of the lowermost substrate handler 1500A; however, when the uppermost substrate handler 1500B is lifted away from the lowermost substrate handler 1500A, the lowermost substrate handler 1500A may also be moved in the Z-axis direction independent of the uppermost substrate handler 1500B. Here, bi-symmetrical bases are interlocked and rotation of the substrate handlers 1500A, 1500B is linked by virtue of the shape of the bases 1510FP so that the substrate handlers 1500A, 1500B rotate in unison. The stackable configuration of the bases 1510FP provides for the stacking of any suitable number of substrate handlers one above the other (in this example two are shown stacked one above the other but in other aspects more than two substrate handlers may be stacked one above the other).

Figure 11A:
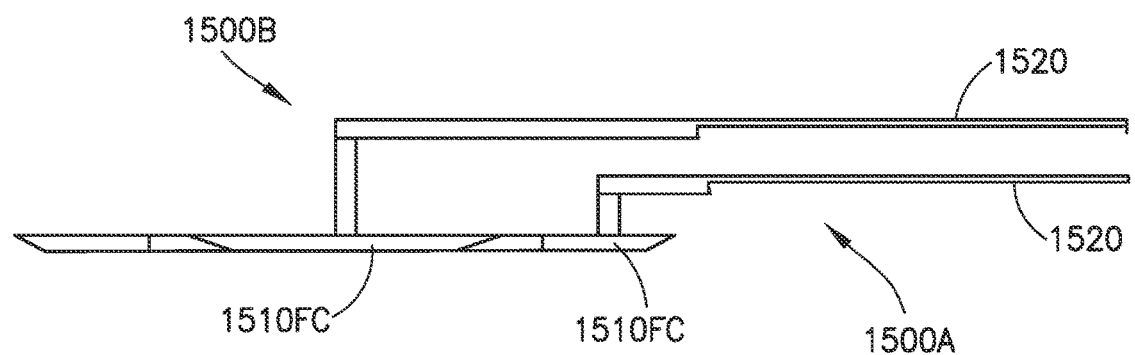
FIG. 11A is a schematic perspective view of a portion of a substrate handler of FIG. 11 in accordance with aspects of the disclosed embodiment.
Figure 11:
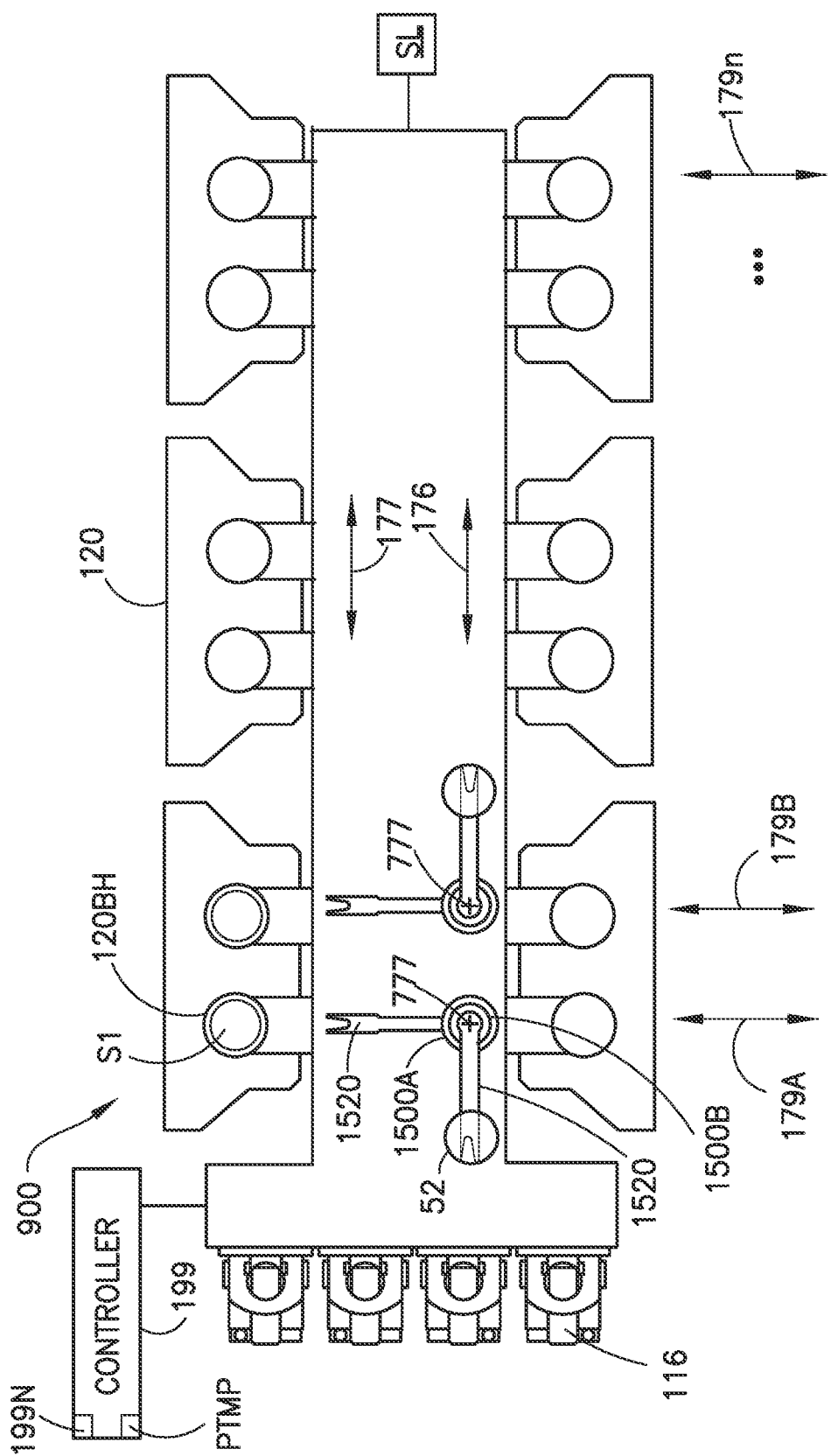
FIG. 11 is a schematic plan view of a substrate processing apparatus incorporating aspects of the disclosed embodiment.

Referring to FIGS. 11 and 11A, the revolute symmetry bases 1510FC may be stacked one above the other, moved in the propulsion direction, and moved relative to each other along the Z-axis in a manner substantially similar to that described above with respect to the frusto-pyramidal bases 1510FP. However, in this aspect, the revolute symmetry shape of the bases 1510FC does not interlock and provides for independent rotation of each substrate handler 1500A, 1500B about substrate handler axis of rotation relative to another of the substrate handlers 1500A, 1500B. Independent rotation of the frusto-conical based substrate handlers 1500A, 1500B effects a fast swapping of substrates from a single substrate holding station such as where end effector 1520 of substrate handler 1500A is aligned with substrate holding station 120BH for picking substrate S1, where end effector 1520 of substrate handler 1500B is rotated to a position so as to not extend into the substrate holding station 120BH. Once the substrate S1 is removed from substrate holding station 120BH by substrate handler 1500A, the positions of the end effectors 1520 of the substrate handlers may be swapped so that end effector 1520 of substrate handler 1500B is aligned with the substrate holding station 120BH for placing substrate S2 at the substrate holding station 120BH while end effector 1520 of substrate handler 1500A is rotated to a position so as to not enter the substrate holding station 120BH. As may be realized, the substrate handlers 1500A, 1500B may be moved along the Z-axis to accommodate the stacked heights of the end effectors relative to a height of the substrate holding station 120BH. Though symmetrical (revolute about one or more axis) bases have been illustrated, in other aspects one or more bases may be asymmetrical or lacking any axis of symmetry.

Figure 15A:
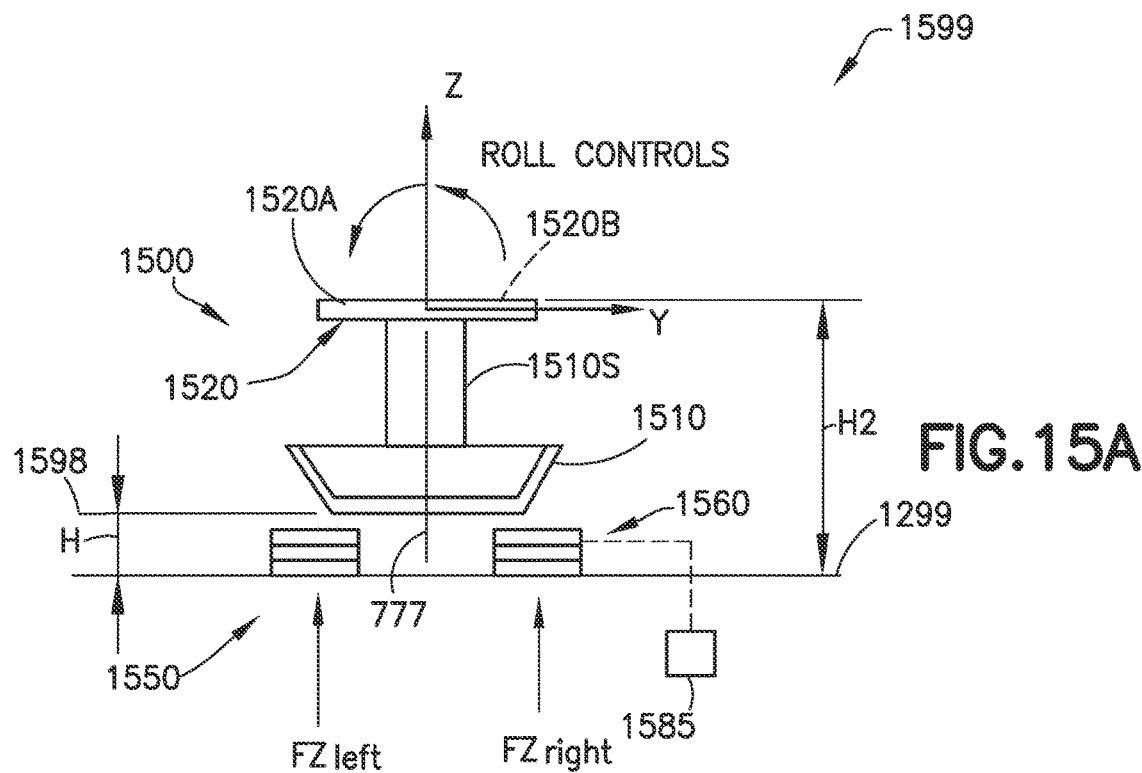
FIG. 15A is a front elevation view of a substrate handler in accordance with aspects of the disclosed embodiment.
Figure 15B:
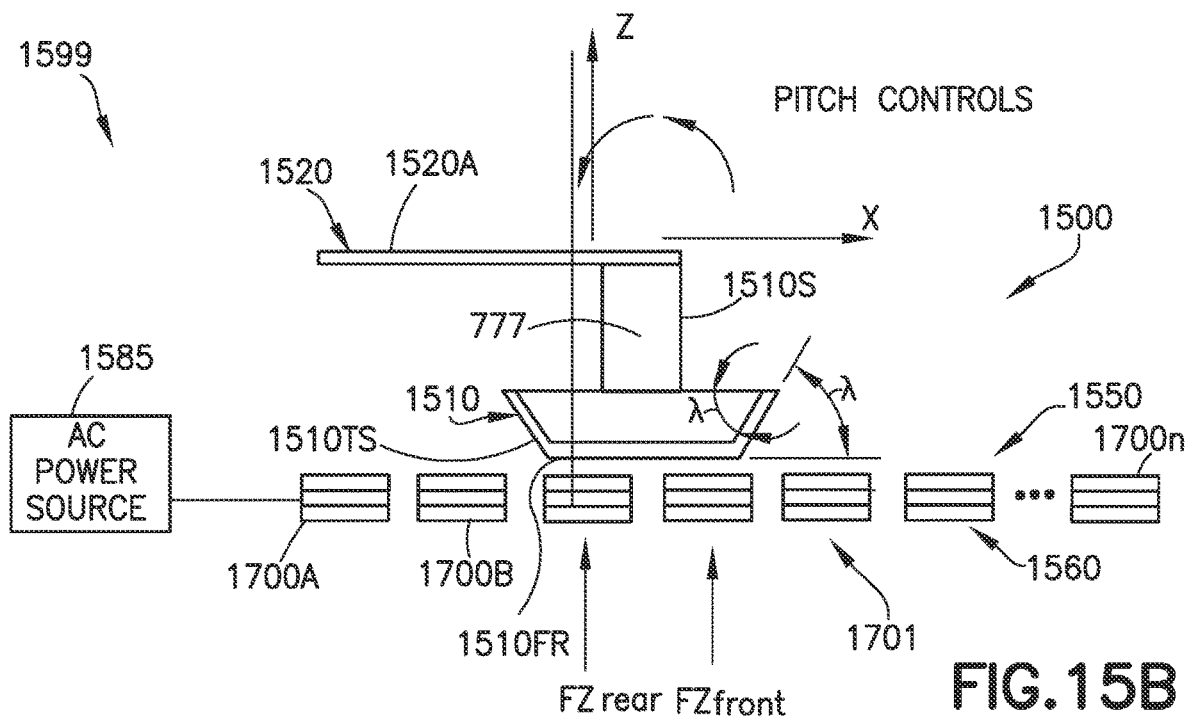
FIG. 15B is a schematic side elevation view of the substrate handler of FIG. 15A in accordance with aspects of the disclosed embodiment.
Figure 15C:
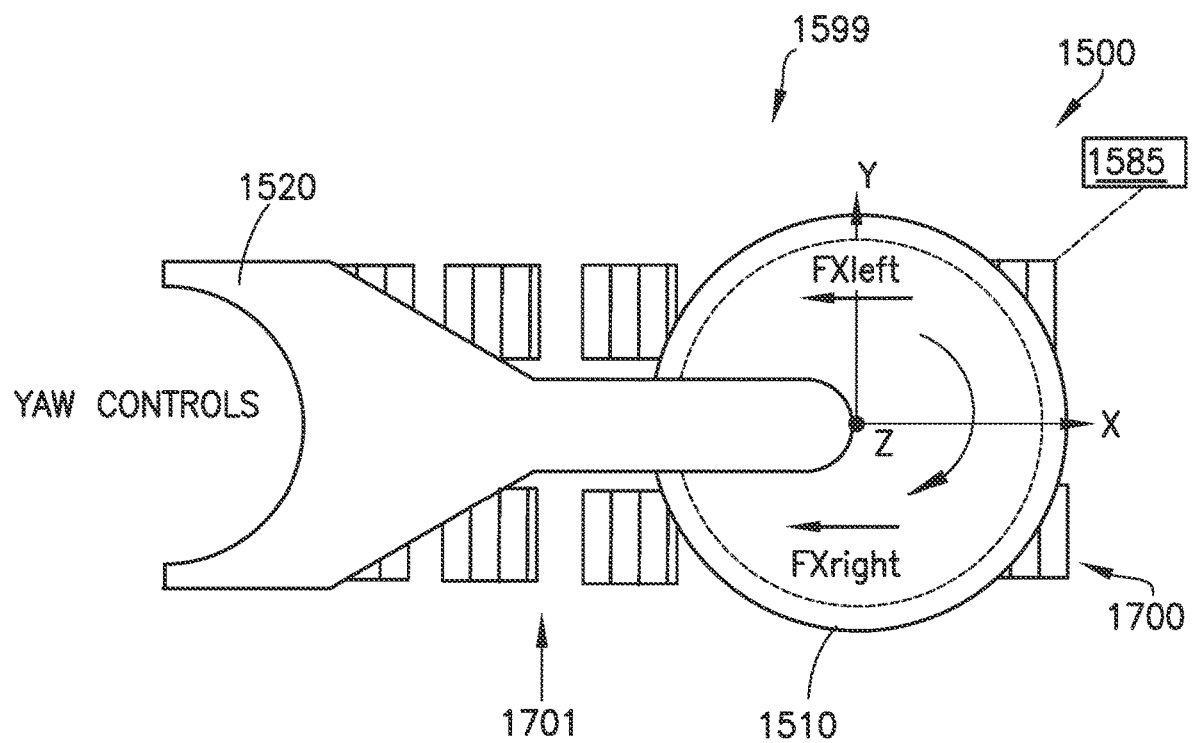
FIG. 15C is a schematic plan view of the substrate handler of FIG. 15A in accordance with aspects of the disclosed embodiment.
Figure 16A:
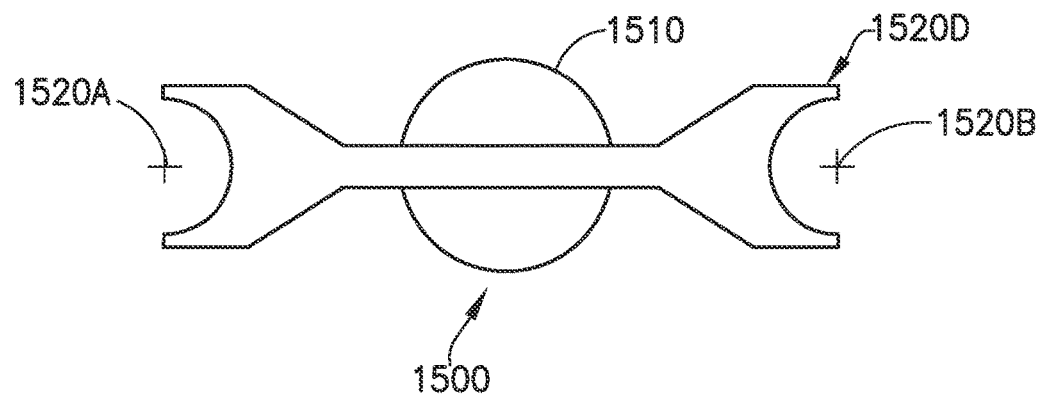
FIG. 16A is a schematic plan view of the substrate handler in accordance with aspects of the disclosed embodiment.
Figure 16B:
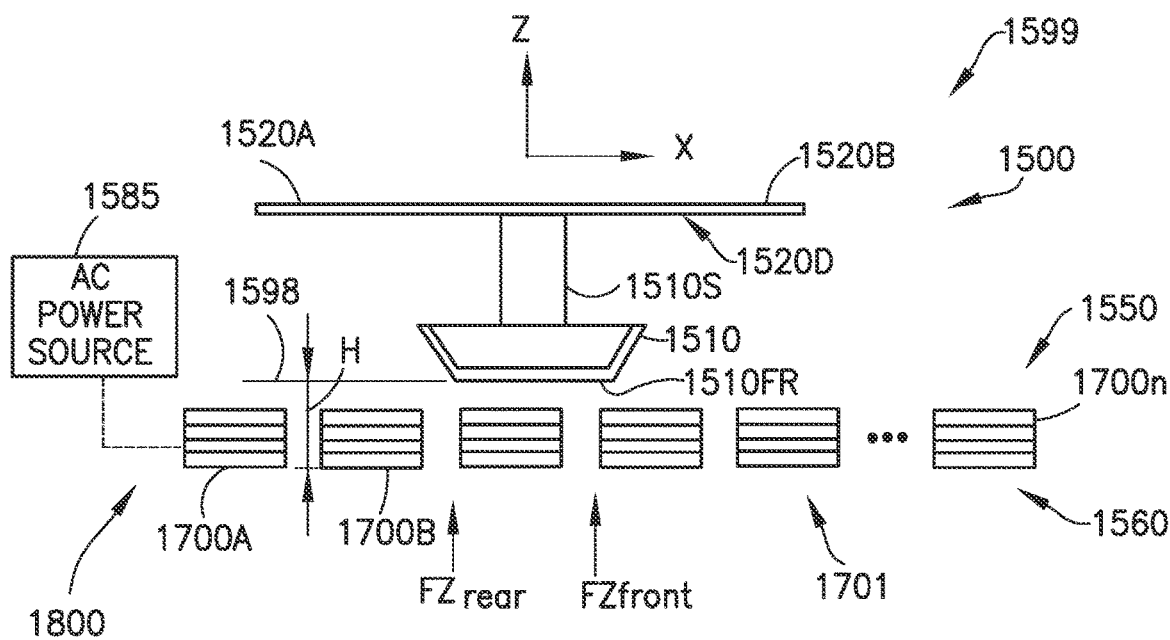
FIG. 16B is a schematic side elevation view of the substrate handler of FIG. 16A in accordance with aspects of the disclosed embodiment.
Figure 16C:
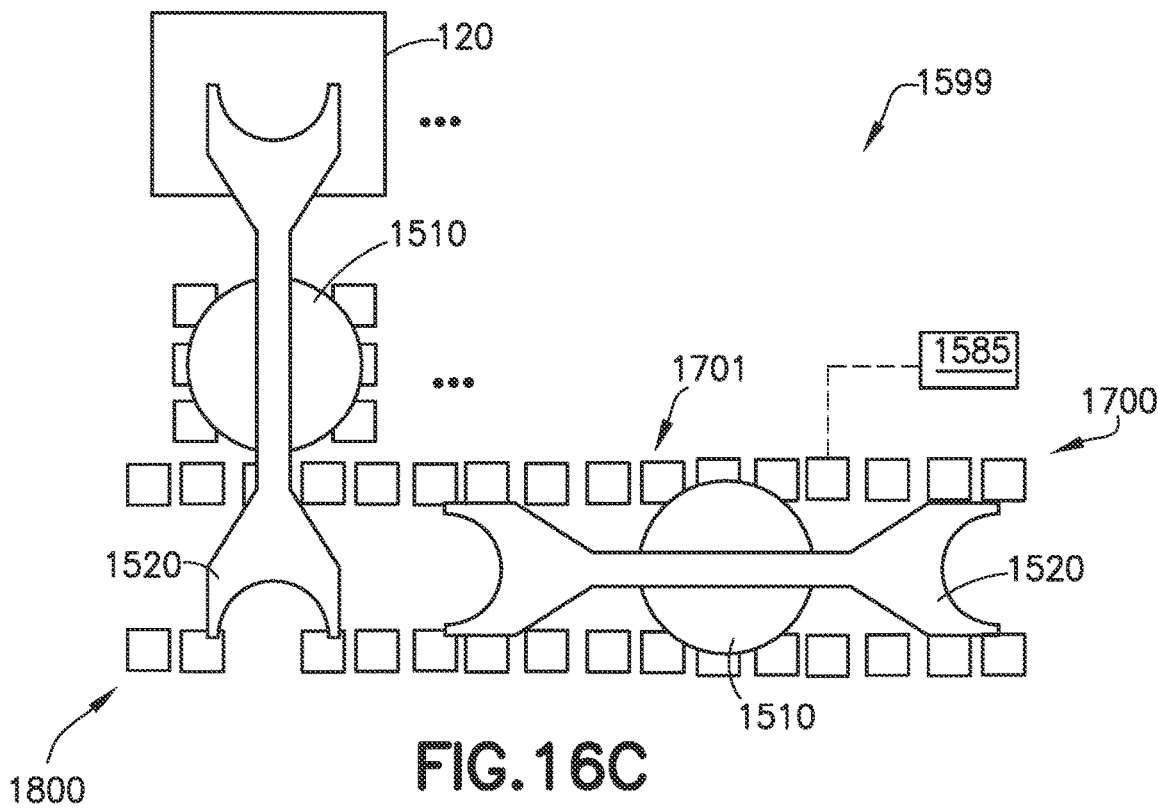
FIG. 16C is a schematic plan view of a portion of a substrate processing apparatus including the substrate handler of FIG. 16A in accordance with aspects of the disclosed embodiment.

As described herein linear propulsion is generally provided by one or more linear tracks 1550 of independently controlled electromagnets 1700A-1700n, 1700A1-1700n1, 1700A2-1700N2, 1700A3-1700n3, 1700A4-1700n4, 1700A5-1700n5. The number of electromagnets 1700A-1700n, 1700A1-1700n1, 1700A2-1700N2, 1700A3-1700n3, 1700A4-1700n4, 1700A5-1700n5. Where there is more than one linear track 1550 the linear tracks 1550 are substantially parallel to each other and are spaced apart from one another depending on dimensions of the base 1510 so as to control all six degrees of freedom (roll, pitch, yaw, and translation in each of the X, Y, Z directions) of the substrate handler in space. For example, as illustrated in FIGS. 15B and 18, the electromagnets 1700A-1700n, 1700A1-1700n1, 1700A2-1700N2, 1700A3-1700n3, 1700A4-1700n4, 1700A5-1700n5 may be spaced apart from each other so that two or more electromagnets 1700A-1700n, 1700A1-1700n1, 1700A2-1700N2, 1700A3-1700n3, 1700A4-1700n4, 1700A5-1700n5 (cooperating so as to form a motor actuator (e.g., the motor primary) 1701 and in combination with the base (e.g., the motor secondary) 1510 the motor) of each parallel linear track 1550 are disposed underneath the base 1510 at all times in the direction of motion of the base 1510 so as to stably levitate and propel the base 1510 (as may be realized, FIGS. 15A, 15B, and 18 schematically illustrate a representative configuration of the system, and are provided to show generally an exemplary representation of the interrelationship between the base 1510 and the electromagnets 1700A-1700n, 1700A1-1700n1, 1700A2-1700N2, 1700A3-1700n3, 1700A4-1700n4, 1700A5-1700n5, and is not intended as limiting in any way.

The size, numbers, and spacing (e.g., pitch) of the electromagnets 1700A-1700n, 1700A1-1700n1, 1700A2-1700N2, 1700A3-1700n3, 1700A4-1700n4, 1700A5-1700n5 in both the X and Y axes may vary, as may the size and shape of the base 1510 in relation to the electromagnets 1700A-1700n, 1700A1-1700n1, 1700A2-1700N2, 1700A3-1700n3, 1700A4-1700n4, 1700A5-1700n5. For example, referring to FIGS. 6 and 18, the spacing between the electromagnets 1700A-1700n, 1700A1-1700n1, 1700A2-1700N2, 1700A3-1700n3, 1700A4-1700n4, 1700A5-1700n5 may vary between pitch PX1 and pitch PX2 where the pitch PX2 is smaller than pitch PX1 and provides for greater definition of movement of the base 1510 and wafer handler 1500. Here, the larger pitch (or greater distance between electromagnets) such as pitch PX1 is employed for long movements of the wafer handler 1500 where position location of the wafer handler 1500 is to be grossly known. In areas where picking and placing of substrates S occurs (or other areas where wafer handler position is to be known with increased position definition/accuracy), such as at the process module 120, the spacing or pitch PX2 between the electromagnets is decreased to provide a higher electromagnet density that effects greater definition of position location of the wafer handler 1500 (compared to the definition of position location provided by electromagnets spaced apart by the larger pitch PX1) so that the wafer handler 1500 picks and places substrates S at the process module 120 with sub-micron position accuracy. In the examples illustrated the pitch PX of the electromagnets 1700A-1700n, 1700A1-1700n1, 1700A2-1700N2, 1700A3-1700n3, 1700A4-1700n4, 1700A5-1700n5 is shown as varying in the X direction along the longitudinal length of the transport chamber 118 to provide varying degrees of wafer handler position accuracy; however, the pitch of the electromagnets 1700A-1700n, 1700A1-1700n1, 1700A2-1700N2, 1700A3-1700n3, 1700A4-1700n4, 1700A5-1700n5 may also vary in the Y direction (see pitches PX3 and PX4) along a lateral width of the transport chamber 118 so as to provide increased accuracy with respect to wafer handler 1500 rotations and/or Z axis height movements. For example, in the areas where picking and placing of substrates S occurs (or other areas where wafer handler position is to be known with increased position definition/accuracy) the pitch between electromagnets may be a decreased pitch PX3 compared to a pitch between the electromagnets in the areas of long motions (e.g., motions between substrate holding stations) where wafer handler rotations and Z height motions are not desired.

In one aspect, as illustrated in FIGS. 8 and 18, the array of electromagnets 1700 may also include stabilization tracks 1550S disposed laterally outward of the tracks 1550. In FIG. 18 the stabilization tracks 1550S may be formed by one or more rows of the electromagnets 1700A-1700n, 1700A1-1700n1, 1700A2-1700N2, 1700A3-1700n3, 1700A4-1700n4, 1700A5-1700n5. The stabilization tracks may be substantially similar to the tracks 1550 and are configured to provide additional stabilization of the base 1510 through the generation of additional lift and/or propulsion forces (e.g., in addition to the lift and propulsion forces generated by electromagnets of the parallel linear tracks 1550) that act on the base 1510. The result is a substrate handler 1500 that can move along a direction of the tracks 1550 (i.e., the propulsion direction) while changing orientation in one or more of roll, pitch and yaw. According to magnetic induction principles where the electromagnets 1700A-1700n, 1700A1-

1700n1, 1700A2-1700N2, 1700A3-1700n3, 1700A4-1700n4, 1700A5-1700n5 are akin to the "primary" and the base 1510 corresponds to the "secondary" where electrical currents are induced by means of Eddy current effects.

Figure 17:
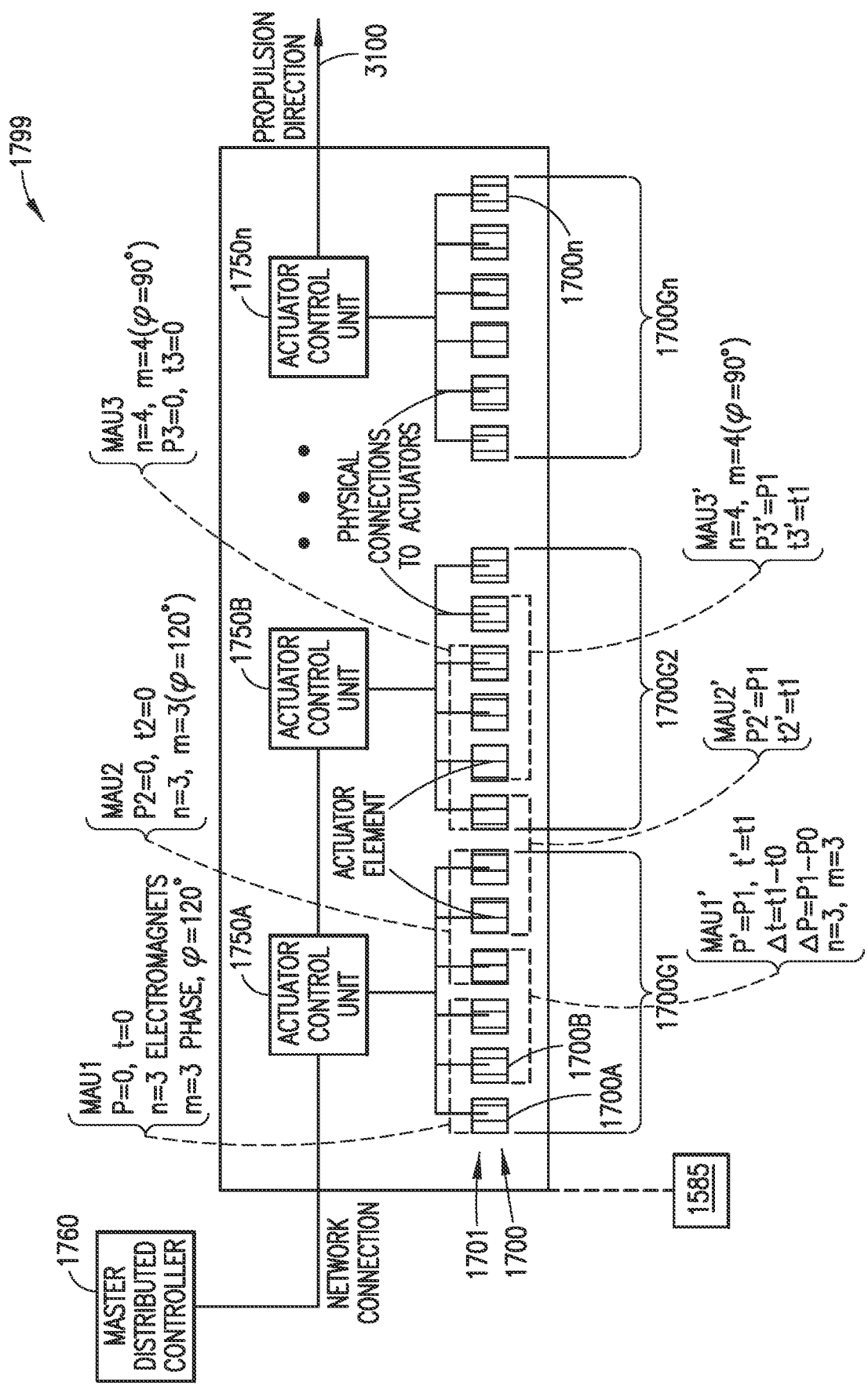
FIG. 17 is a schematic illustration of an exemplary actuator control system network in accordance with aspects of the disclosed embodiment.
Figure 18:
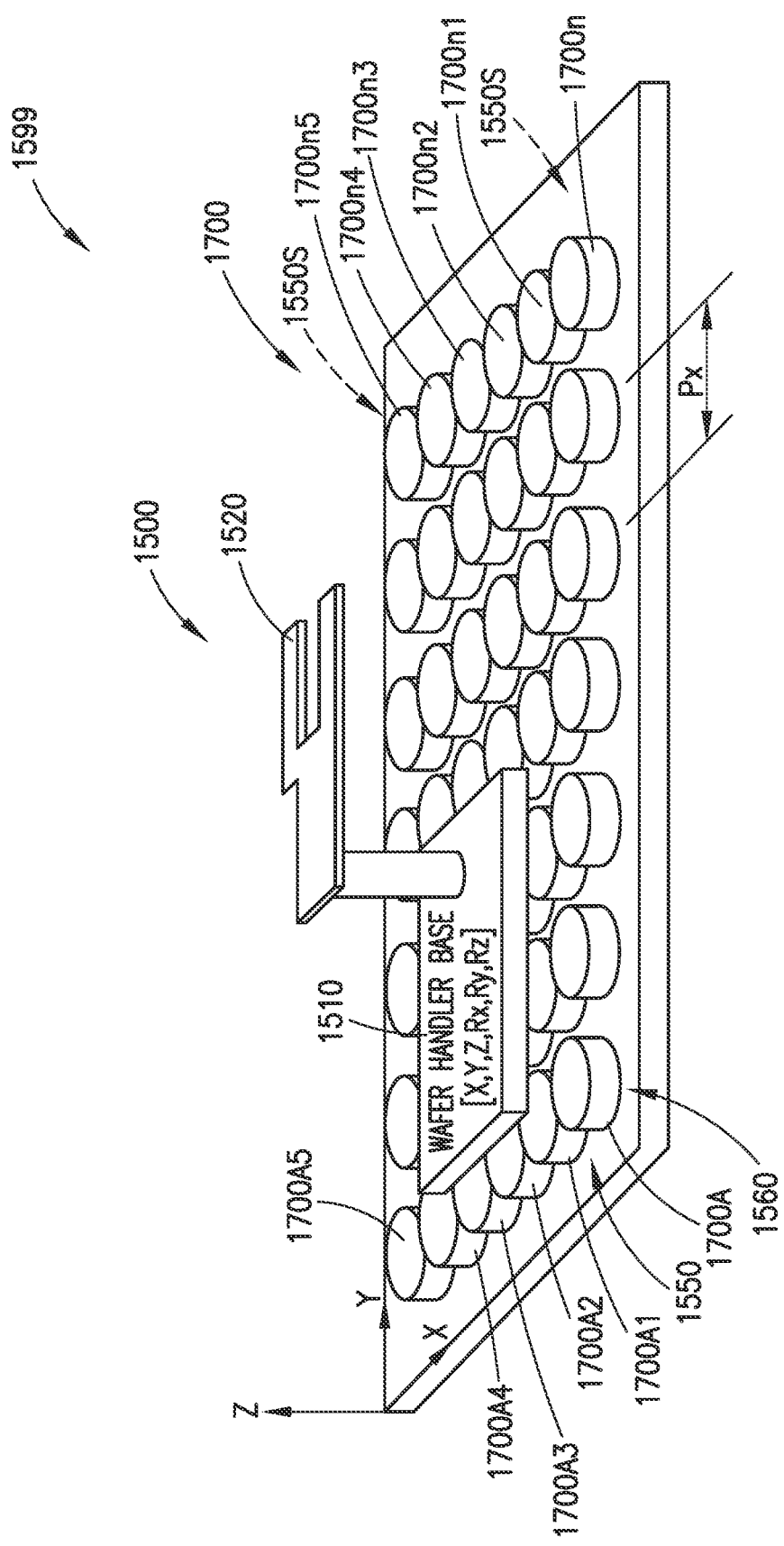
FIG. 18 is a schematic perspective illustration of a portion of a substrate processing apparatus in accordance with aspects of the disclosed embodiment.
Figure 20:
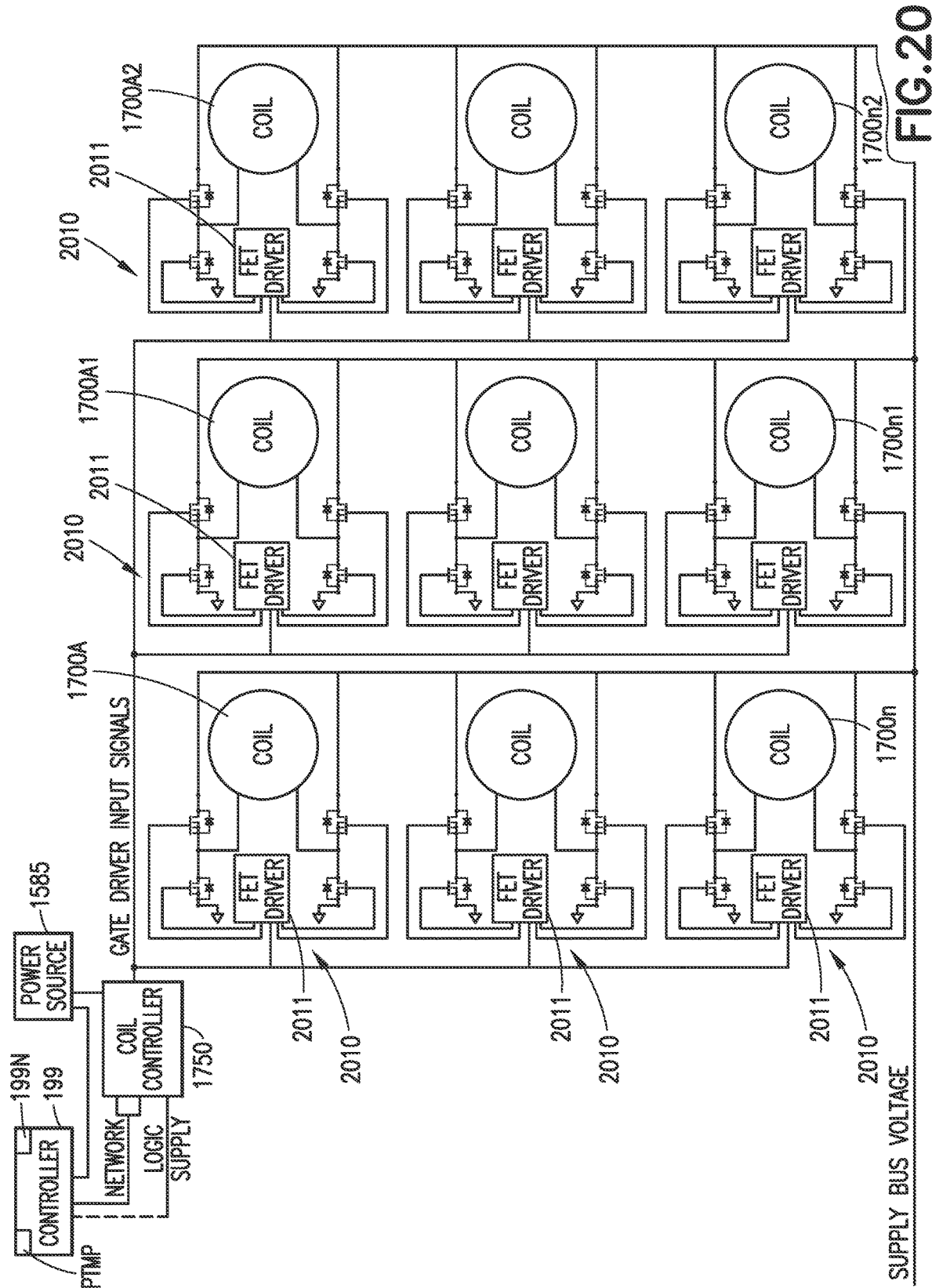
FIG. 20 is an exemplary schematic diagram of a driver circuit for electromagnets of a substrate processing apparatus in accordance with aspects of the disclosed embodiment.

FIGS. 17 and 20 illustrate an actuator control system network 1799 (which may be part of or communicably coupled to controller 199), in accordance with an aspect of the disclosed embodiment, configured to effect individual control of each electromagnet 1700A-1700n, 1700A1-1700n1, 1700A2-1700N2, 1700A3-1700n3, 1700A4-1700n4, 1700A5-1700n5 to provide the desired force components and degrees of freedom described and illustrated with respect to FIGS. 15A-16C. In one aspect, the actuator control system is configured so that the electromagnets 1700A-1700n, 1700A1-1700nl, 1700A2-1700N2, 1700A3-1700n3, 1700A4-1700n4, 1700A5-1700n5 form motor actuator units (collectively referred to as the motor actuator), each motor actuator unit having m number of electromagnets/coils cooperating to form the motor (where m is a dynamically selectable number of two or more electromagnets forming one or more of the motor actuator units as will be described further below). The actuator control system network 1799 is thus a scalable motion control system that has a clustered architecture with at least a master controller 1760 and distributed local drive controllers 1750A-1750n as will be described in greater detail below. In this aspect, groups of electromagnets 1700G1-1700Gn are coupled to a respective local drive controller 1750A-1750n that is configured to control the electrical currents on electromagnets 1700A-1700n, 1700A1-1700nl, 1700A2-1700N2, 1700A3-1700n3, 1700A4-1700n4, 1700A5-1700n5 within the respective group of electromagnets 1700G1-1700Gn. The local drive controller 1750A-1750n can be a "slave" in a network that is connected to a master controller 1760 that is configured to specify the desired forces (e.g., thrust and lift) for each individual electromagnet 1700A-1700n, 1700A1-1700nl, 1700A2-1700N2, 1700A3-1700n3, 1700A4-1700n4, 1700A5-1700n5 to effect the desired motion of the wafer handler 1500 in space. The drive controllers 1750A-1750n, illustrated generally as drive controller 1750 in FIG. 20 (where FIG. 20 illustrates a drive controller and its respective group of electromagnets 1700G1-1700Gn) are coupled to the respective electromagnets 1700A-1700n by an amplifier drive circuit 2010 as will be described herein.

As will also be described herein, the electromagnets 1700A-1700n, 1700A1-1700n1, 1700A2-1700N2, 1700A3-1700n3, 1700A4-1700n4, 1700A5-1700n5 can be physical electromagnets/coils that can be dynamically configured when it comes to the respective "phase" definitions of each coil with respect to "phase" definitions of the other electromagnets/coils of the given motor actuator unit so that the position of the given motor actuator unit (formed of cooperative excitation phases of the motor under propulsion) may be deemed as moving virtually in unison with the base propulsion, though the physical electromagnets/coils are fixed (e.g., static) as will be described further below. This provides continuity in the desired force vectors for motion control of the substrate handler.

Figure 19:
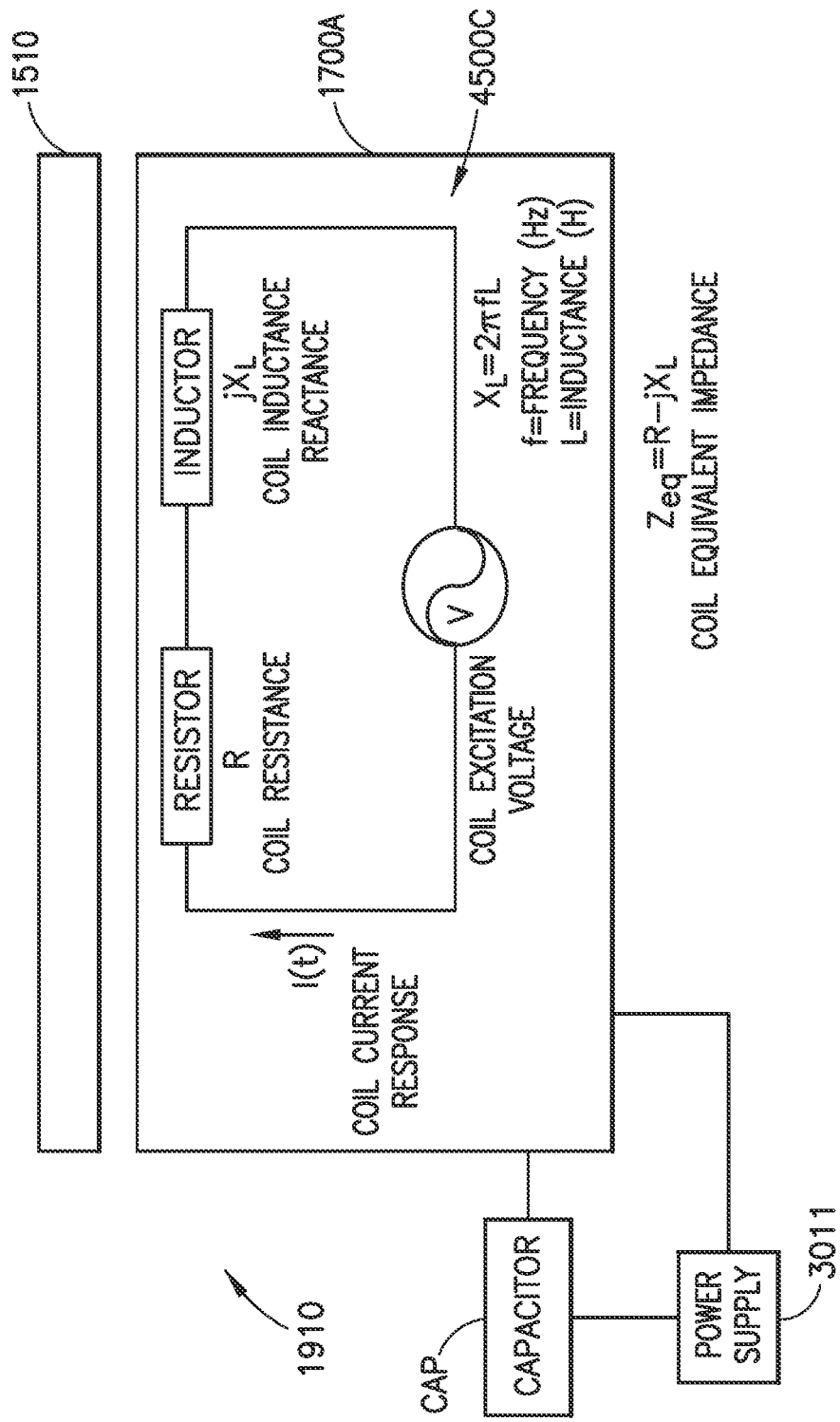
FIG. 19 is an exemplary schematic electric circuit diagram of an electromagnet of a substrate processing apparatus in accordance with aspects of the disclosed embodiment.
Figure 23:
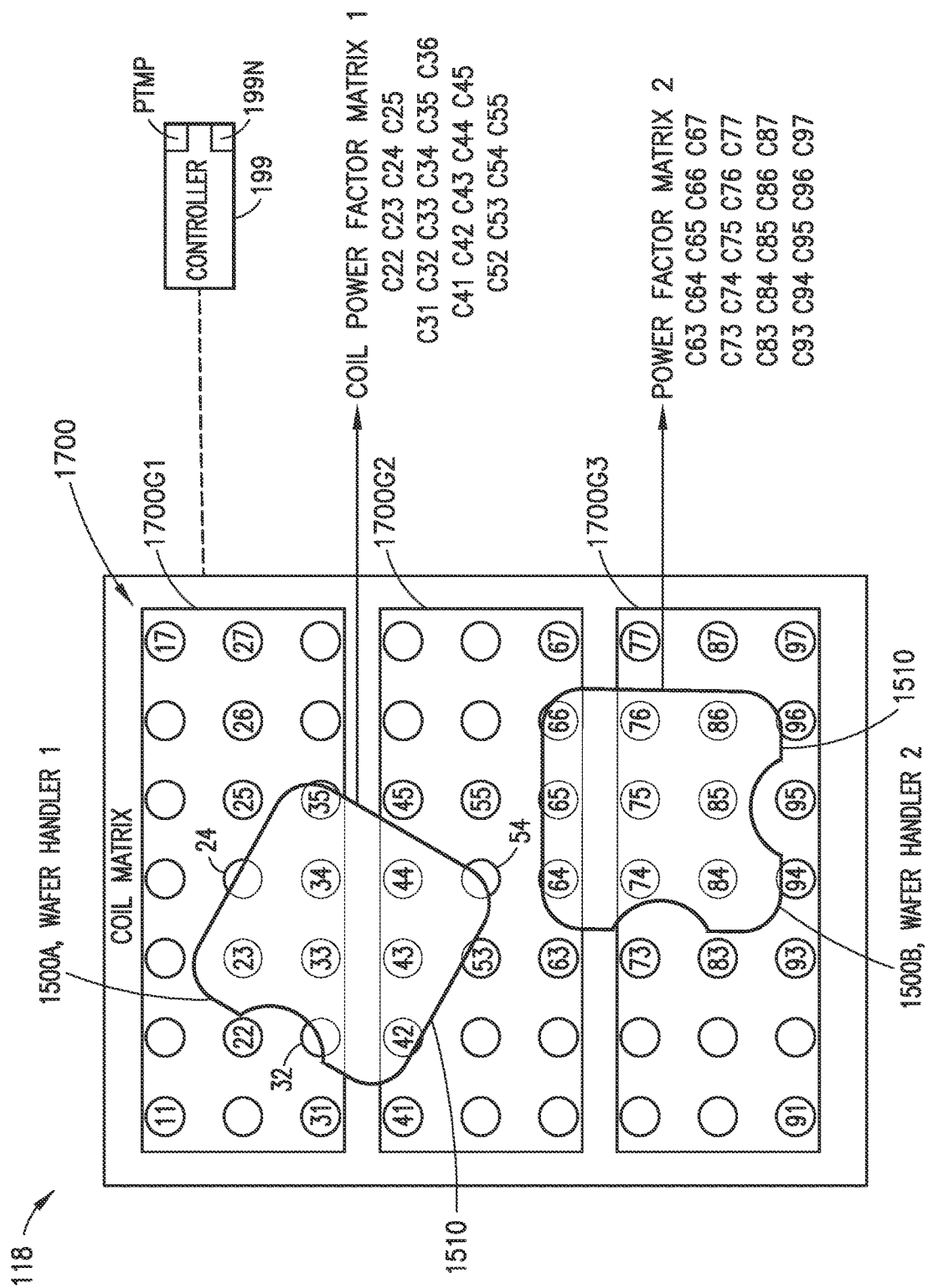
FIG. 23 is a schematic illustration of power factor patterns/matrices, of the electromagnet array of FIG. 22, corresponding to respective wafer handlers in accordance with aspects of the disclosed embodiment.

In accordance with aspects of the disclosed embodiment, and referring to FIGS. 18 and 19, the controller 199 is operably coupled to the array of electromagnets 1700 and the alternating current power source 1585 and configured to sequentially excite the electromagnets 1700A-1700n, 1700A1-1700n1, 1700A2-1700N2, 1700A3-1700n3, 1700A4-1700n4, 1700A5-1700n5 with multiphase alternating current with a predetermined excitation characteristic (such as, e.g., inductance, a phase lag/amplitude, and/or power factor as will be described herein—see also FIGS. 23 and 25A) so that each reaction platen or base 1510 (of the wafer handler 1500 or cart 1500C) is levitated and propelled with up to six degrees of freedom. Here, as will be described in greater detail herein, the controller 199 is configured so as to determine reaction platen position feedback, in at least one degree of freedom from the up to six degrees of freedom, from variance in the predetermined excitation characteristic of the alternating current of at least one electromagnet 1700A-1700n, 1700A1-1700n1, 1700A2-1700N2, 1700A3-1700n3, 1700A4-1700n4, 1700A5-1700n5 effecting levitation or propulsion of the base 1510. The variance in the predetermined excitation characteristic defines self-deterministic reaction platen position feedback of each of the at least one electromagnet 1700A-1700n, 1700A1-1700n1, 1700A2-1700N2, 1700A3-1700n3, 1700A4-1700n4, 1700A5-1700n5, of the array of electromagnets 1700, effecting levitation or propulsion of the base 1510.

As described herein, the array of electromagnets 1700 includes electromagnets 1700A-1700n, 1700A1-1700n1, 1700A2-1700N2, 1700A3-1700n3, 1700A4-1700n4, 1700A5-1700n5 configured to produce levitation and propulsion forces that drive, under control of controller 199, the wafer handler 1500 along a predetermined trajectory through the transport chamber 118. To drive the wafer handler 1500 along the predetermined trajectory the controller 199 is configured to determine a real time spatial position (e.g., in one or more of the up to six degrees of freedom X, Y, Z, Rx, Ry, Rz) of the wafer handler 1500. Here absolute position feedback of the wafer handler 1500 is determined by the controller 199 (or any other suitable controller such as included in the actuator control system network 1799) based on the effects of magnetic induction on the interaction between the base 1510 of the wafer handler 1500 (or cart 1500C) and each electromagnet (e.g., actuator) 1700A-1700n, 1700A1-1700n1, 1700A2-1700N2, 1700A3-1700n3, 1700A4-1700n4, 1700A5-1700n5. For example, as can be seen in FIG. 19, the base 1510 and each electromagnet create a magnetic circuit 1910 (only electromagnet 1700A is shown in FIG. 19 for illustrative purposes only and a similar circuit is formed with the other electromagnets 1700A-1700n, 1700A1-1700n1, 1700A2-1700N2, 1700A3-1700n3, 1700A4-1700n4, 1700A5-1700n5 when the base 1510 passes over and is driven by the other electromagnets) that effects the levitation and propulsion of the base 1510 by the electromagnet 1700A. Each electromagnet 1700A (again noting electromagnet 1700A is used for exemplary purposes only and that the other electromagnets 1700A-1700n, 1700A1-1700n1, 1700A2-1700N2, 1700A3-1700n3, 1700A4-1700n4, 1700A5-1700n5 are substantially similar) has a resistance R and an inductance L. An input voltage V of the electromagnet 1700A is, as described herein, a multiphase alternating current voltage with a predetermined amplitude and frequency that is applied to a predetermined electromagnet 1700A-1700n, 1700A1-1700n1, 1700A2-1700N2, 1700A3-1700n3, 1700A4-1700n4, 1700A5-1700n5 for driving the base 1510 as described herein, where the predetermined electromagnet 1700A-1700n, 1700A1-1700n1, 1700A2-1700N2, 1700A3-1700n3, 1700A4-1700n4, 1700A5-1700n5 has a known location within the transport chamber 118. As may be realized, the resulting current I through electromagnet 1700A is determined by a dynamic response of the circuit 1910 to the input voltage. For a given input voltage V at a given time t, the respective current I in the electromagnet 1700A can be determined with the following equation:

$$V(t) = R\,I(t) + L\,dI(t)/dt \qquad [\text{eq. 1}]$$

where, R is the resistance of the electromagnet 1700A and L is the inductance of the electromagnet 1700A.

Referring also to FIG. 20, each of the electromagnets 1700A-1700n, 1700A1-1700n1, 1700A2-1700N2, 1700A3-1700n3, 1700A4-1700n4, 1700A5-1700n5 of the array of electromagnets 1700 is communicably coupled to an amplifier driver circuit 2010. The amplifier driver circuit 2010 includes a field-effect transistor 2011 and is configured to provide feedback of the respective electric current I flowing through a respective electromagnet 1700A-1700n, 1700A1-1700n1, 1700A2-1700N2, 1700A3-1700n3, 1700A4-1700n4, 1700A5-1700n5.

As, may be realized, the current I flowing through the electromagnet 1700A lags (in time) the input voltage V (e.g., phase lag). The phase lag can be expressed in the voltage drop across the inductor L of the electromagnet 1700A as:

$$dI(t)/dt \qquad \text{[eq. 2]}$$

Figure 21A:
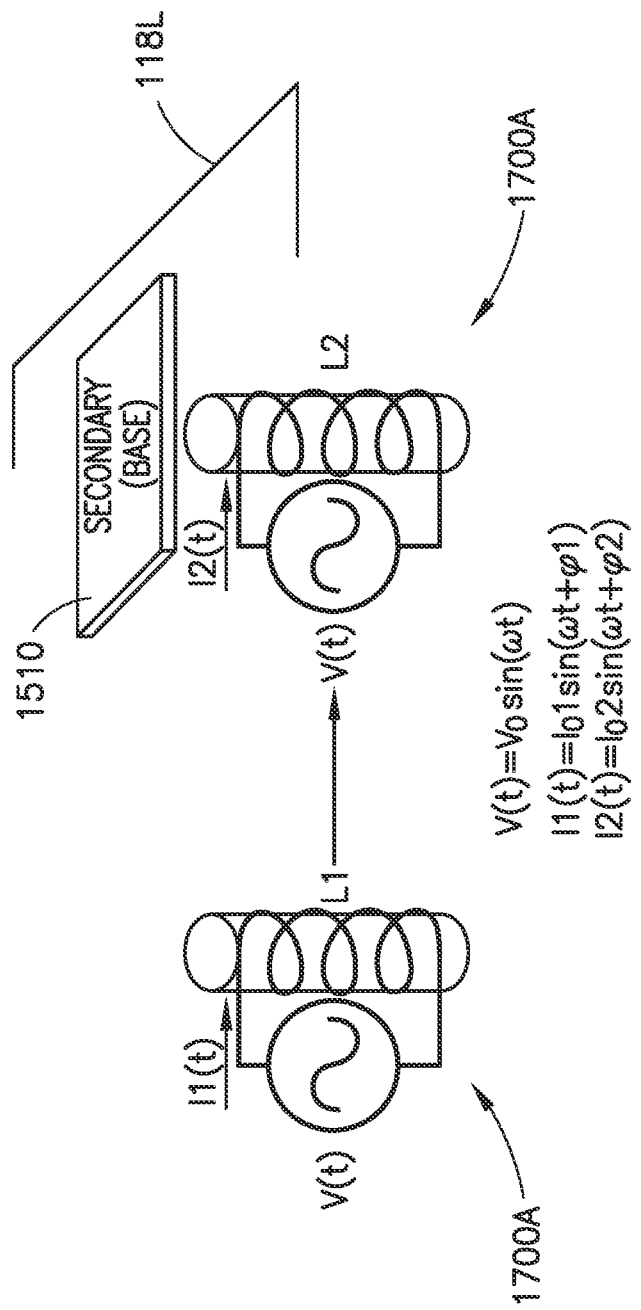
FIG. 21A is a schematic illustration of a response of an electromagnet to presence of a wafer handler in a substrate processing apparatus in accordance with aspects of the disclosed embodiment.

Referring to FIGS. 18, 19, and 21A-21C, the amount of phase lag (e.g., between the excitation voltage V and the current I of the electromagnet 1700A) depends on the resistance R and the inductance L of the magnetic circuit 1910. An electric circuit representation of the electromagnet 1700A is illustrated in FIG. 21A with the electromagnet 1700A under an alternating input voltage excitation without the base disposed adjacent the electromagnet 1700A (i.e., the left side of FIG. 21A) and with the base 1510 disposed adjacent the electromagnet 1700A (i.e., the right side of FIG. 21A). It is noted that the base 1510 is disposed above the electromagnet 1700A with a predetermined air gap distance for exemplary purposes but in other aspects the base 1510 may be magnetically suspended by the electromagnets in any suitable manner. Here, the alternating current voltage V generates a respective alternating current I with a lagged response (e.g., lagged behind the voltage V in time) as a function of the inductance L of the electromagnet 1700A. The periodic voltage V(t) through the electromagnet 1700A can be expressed as follows:

$$V(t)=V_0 \sin(\omega t) \qquad \text{[eq. 3]}$$

where $V_0$ is the voltage amplitude and G is the angular frequency. The periodic current I(t) can be expressed as follows without the presence of the base 1510 adjacent the electromagnet 1700A:

$$I1(t)=I_0 1 \sin(\omega t+\phi 1) \qquad \text{[eq. 4]}$$

and as follows with the base 1510 present adjacent the electromagnet 1700:

$$I2(t)=I_0 2 \sin(\omega t+\phi 2) \qquad \text{[eq. 5]}$$

where $I_0$ is the current amplitude and $\phi 1$ and $\phi 1$ are the respective magnetic fluxes. As may be realized, the current I responses between the electric circuit on the left side of FIG. 21A (e.g., without the base 1510 adjacent the electromagnet 1700A) and the electric circuit on the right side of FIG. 21A (e.g., with the base 1510 adjacent the electromagnet 1700A) are substantially different because the inductance L is affected by the presence of the base 1510 due to the induction of Eddy currents that impact the magnetic field generated by the electromagnet 1700A.

Referring to FIGS. 17 and 20, the local controller 1750, 1750A-1750n commands excitation of the electromagnet 1700A with an input voltage V and is configured to determine the resultant electromagnet current I in any suitable manner (such as by being programmed to execute equations 4 and 5 above or by being configured to measure the current in the electromagnet 1700A in any suitable manner). Knowing the input voltage V and the resultant electromagnet current I the local controller 1750, 1750A-1750n determines the phase lag between the voltage V and current I; and based on the phase lag the local controller 1750 determines if the base 1510 or any portion thereof is located adjacent the electromagnet 1700A. Here, the amount of phase lag is employed to quantify the relative position of the base 1510 with each of the electromagnets 1700A-1700n, 1700A1-1700n1, 1700A2-1700N2, 1700A3-1700n3, 1700A4-1700n4, 1700A5-1700n5.

Figure 21B:
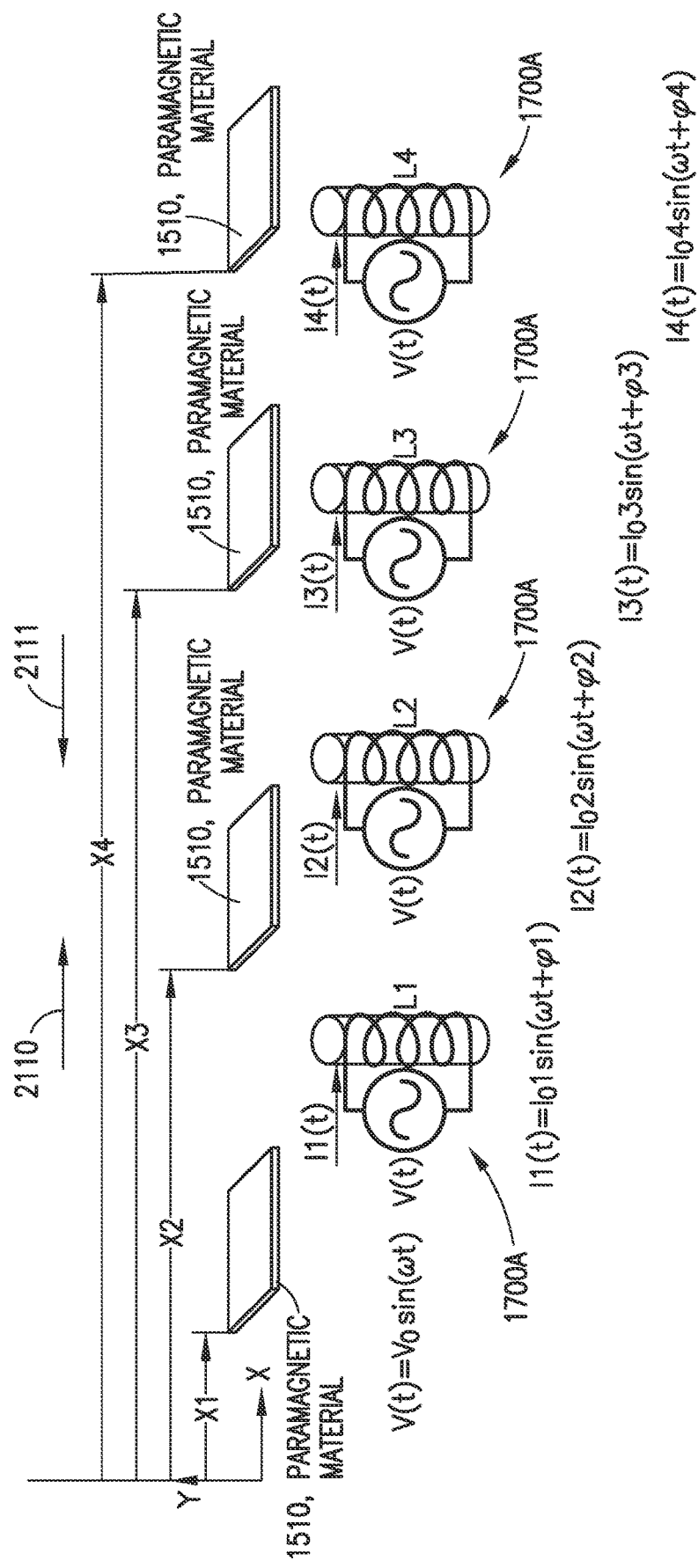
FIG. 21B is a schematic illustration of a response of an electromagnet to presence of a wafer handler in a substrate processing apparatus in accordance with aspects of the disclosed embodiment.

FIG. 21B is an exemplary illustration of the base at different locations X1-X4 relative to, e.g., electromagnet 1700A along a unidimensional path 2110 (although in other aspects the path may be multidimensional). An equation representing the current I1(t), 12(t), 13(t), 14(t) for each respective location 1-X4 is provided in FIG. 21B. For exemplary purposes the input voltage V may be considered substantially constant. As the base 1510 moves relative to the electromagnet 1700A, the respective current I response changes at least in phase (and may also change in amplitude). Based on the change in phase of the current I, the measured current I response and the given input voltage V are correlated with the position X1-X4 of the base 1510 along the path 2110. For example, the correlation of the measured current I response and the given input voltage V with the position X1-X4 of the base 1510 may be expressed in terms of a change in the mutual inductance L of the electromagnet 1700A. The mutual inductance L between the electromagnet 1700A and the base 1710 can be expressed as follows:

$$L(x) = L_s + \frac{1}{I^2}\int_{-a}^{a}dx\int_{-b}^{b}dy B_c(x, y)T(x, y) \qquad \text{[eq. 6]}$$

Where $L_s$ is the electromagnet self-inductance, I is the electromagnet current, a is the base 1510 half-length, b is the base 1510 half-width, x and y are the base 1510 location in space, $B_c$ is the magnetic flux density at the electromagnet, and T(x, y) is a linear combination of basic functions.

Figure 21C:
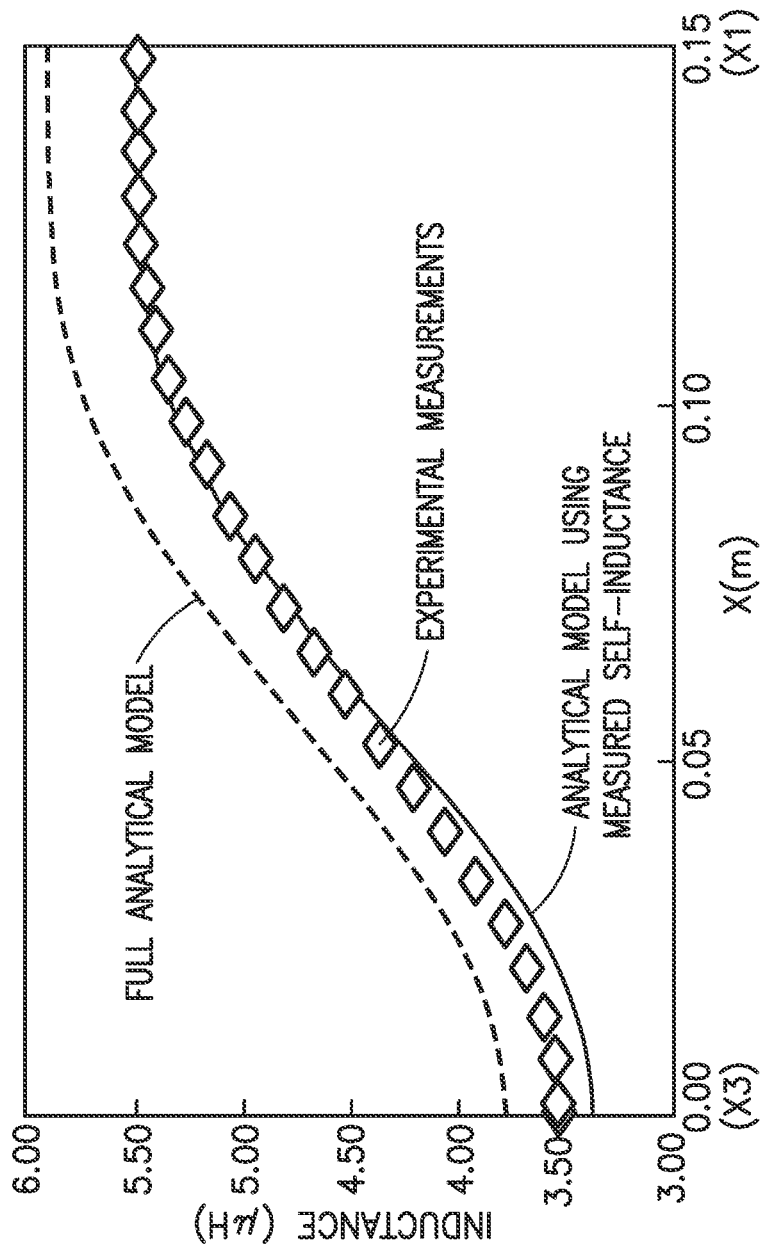
FIG. 21C is an exemplary graph illustrating electromagnet/wafer handler base inductance versus position of the wafer handler base in accordance with aspects of the disclosed embodiment.

With reference to FIG. 21B, the relationship between the mutual inductance L and the position X of the base 1510 is illustrated in FIG. 21C. It is noted that the location X=3 in FIG. 21B (with the base 1510 located substantially directly over or fully covers the electromagnet 1700A) is illustrated as location X=0 in FIG. 21C. As the location of the base 1510 changes from X3 to X1 (the base is moving along path 2111 in FIG. 21B) the base 1510 moves out of alignment with the electromagnet 1700A causing the mutual inductance L to increase. The mutual inductance L reaches a maximum value when the base 1510 completely clears the electromagnet 1700A, such as when the base is at location X1 (see FIG. 21B) relative to the electromagnet 1700A.

Figure 49A:
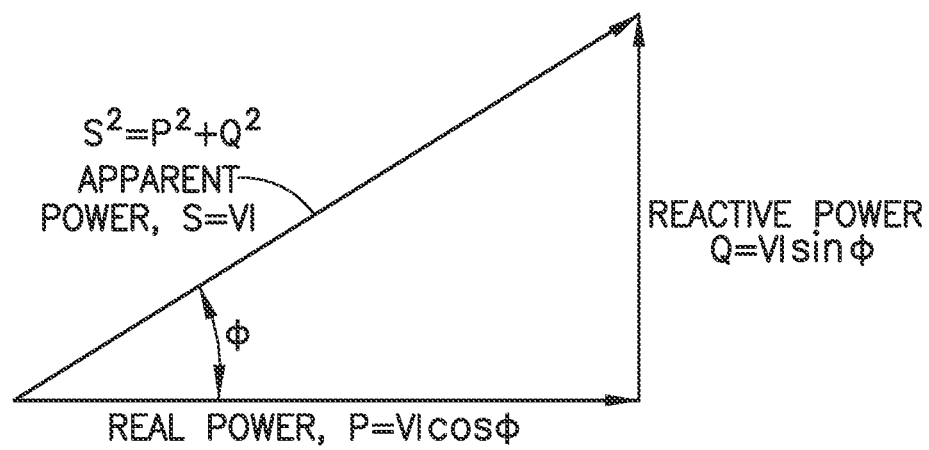
FIGS. 49A and 49B are exemplary graphs illustrating relationships between coil variables in accordance with aspects of the disclosed embodiment.
Figure 49B:
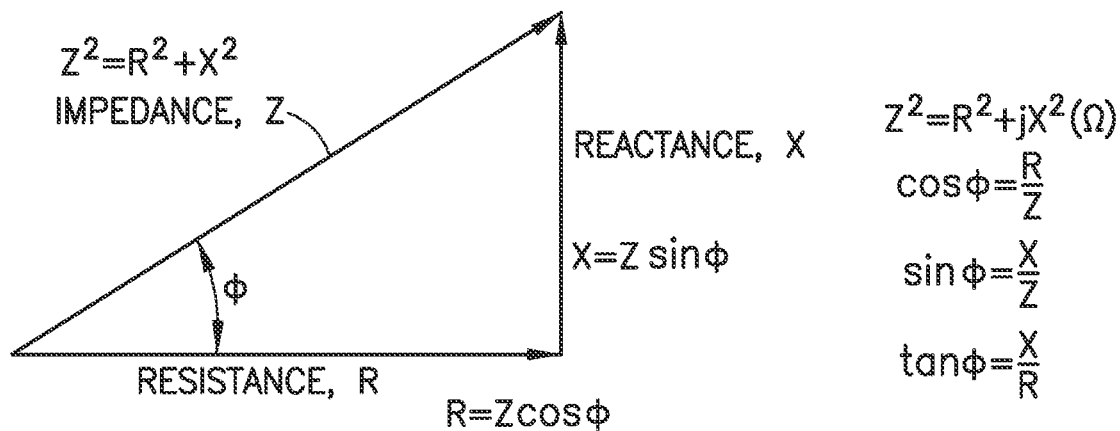

As described above, inductance is utilized to identify the location of the base 1510 in space for exemplary purposes only. Referring also to FIGS. 19, 49A and 49B, any suitable variables may be employed to identify the location of the base 1510 in space. For example, the circuit 1910 in FIG. 19 has an inherent characteristic that may be leveraged to provide a self-deterministic position feedback solution of the reaction platen. Here, the relationship between the voltage and the current may be out of phase due to the reactive load caused by the inductor (coil). The power (e.g., apparent power) to drive current through the coil 4500C is higher than the power (e.g., the real power) dissipated through the coil 4500C itself as illustrated in FIG. 49A. The apparent power is supplied by the power supply (such as current amplification power supply units 3011 or any other suitable power supply) to drive a predetermined alternating current through the coil 4500C. The real power shown in FIG. 49A is dissipated through the coil resistance and the reactive power is the load resulting from the inductive reactance of the coil 4500C.

The relationship between the coil resistance and the inductive reactance is illustrated in FIG. 49B. The impedance Z is the equivalent load on the power supply (such as current amplification power supply units 3011 or any other suitable power supply). The angle $\Phi$ is the phase difference between the coil AC voltage and the respective AC current. Where the impedance reactance is larger than the coil resistance, the angle $\Phi$ may be close to or approached about 90° in which case substantially no current passes through the coil 4500C, resulting in a lack of levitation of the base 1510. The measure of such efficiency is called the power factor (PF), which is defined as the cosine of the angle $\Phi$ (i.e. PF=cos $\Phi$).

To maximize the levitation efficiency, the power factor is maximized to be or approaches about 1 (e.g., as close to 1 as possible), where the angle $\Phi$ is (or approaches) zero. To maximize the power factor, a capacitor CAP may be added in series with the coil 4500C. The capacitor CAP has a reactance effect that may negate the inductive reactance imposed by the coil 4500C. The reactance of each of the capacitor CAP and coil 4500C is a function of the AC frequency imposed by the voltage. Here reactance of the capacitor CAP is substantially the same in magnitude as the respective inductive reactance of the coil 4500C to maximize the levitation efficiency of the base 1510. The relationship between the inductive reactance $X_L$ and capacitance reactance $X_C$ is as follows:

$$X_L = 2\pi FL \qquad [eq.\ 7]$$

$$X_C = \frac{1}{2\pi FC} \qquad [eq.\ 8]$$

noting that F is the frequency and due to capacitance selection $X_C = X_L$, where $$2\pi FL = \frac{1}{2\pi FC} \qquad [eq.\ 9]$$

$$\text{and } C = \frac{1}{4\pi^4 FL} \qquad [eq.\ 10]$$

where C is the selected capacitance. As described herein, the power factor (PF) of each coil 4500C may be used to identify the absolute position of the base 1510. Another example of a coil variable that may be employed for absolute position decoding of the base 1510 is the coil impedance Z (see FIG. 49B) where the impedance can be determined as the RMS (root mean square) ratios of the of the AC voltage and AC current at each respective coil 4500C, where $$Z = \frac{RMS(V)}{RMS(I)} \qquad [eq.\ 11]$$

As can be seen above, the coil 4500C variables inductance I, power factor PF, and impedance Z are examples of metrics (e.g., excitation characteristics) that determine the position of the base 1510 and define the self-deterministic reaction platen or base 1510 pose feedback. Other metrics may also be used such as those defined by machine learning and data analytics techniques, such as the neural network 199N.

Still referring to FIGS. 21A-21C, the aspects of the disclosed embodiment employ the array of electromagnets 1700 to magnetically levitate the wafer handler 1500 with electromagnetic induction. As described herein, the aspects of the disclosed embodiment separate the array of electromagnets 1700 from the wafer handler 1500 with a non-magnetic isolation wall (such as the floor 118L of the transport chamber 118, or where the array of electromagnets 1700 are located on lateral sides of the transport chamber 118 the side walls form the non-magnetic isolation wall). Examples of suitable materials from which the non-magnetic isolation wall is constructed include, but are not limited to, the 300-series stainless steel (as described herein), the low conductivity aluminum such as an 6061 series aluminum (as described herein), or any other suitable non-magnetic material). Here, the non-magnetic isolation wall facilitates the induction of Eddy currents on the base 1510 (located within the sealed environment of the transport chamber 118) from the alternating magnetic field generated by the array of electromagnets 1700. The voltage V applied to the electromagnets 1700A-1700n, 1700A1-1700n1, 1700A2-1700N2, 1700A3-1700n3, 1700A4-1700n4, 1700A5-1700n5 and the respective currents I are employed by the local controllers 1750A-1750n (or the controller 199) to determine the absolute position of the wafer handler 1700 in a reference frame (X, Y, Z—see, e.g., FIG. 1A) of the transport chamber 118 without employing additional sensing technology (e.g., dedicated position sensors) that increase both the size and cost of the transport chamber 118. As described herein, and also referring to FIG. 20, the local controllers 1750 are coupled to the respective electromagnets 1700A-1700n, 1700A1-1700n1, 1700A2-1700N2, 1700A3-1700n3, 1700A4-1700n4, 1700A5-1700n5 by the amplifier drive circuit 2010. This amplifier drive circuit includes a current sensor (such as in the field-effect transistor 2011) that effects measurement of the current I in the respective electromagnet 1700A-1700n, 1700A1-1700n1, 1700A2-1700N2, 1700A3-1700n3, 1700A4-1700n4, 1700A5-1700n5. Accordingly, the voltage V and the current I are known and the local controllers 1750A-1750n (or controller 199) can effect absolute position determination of the wafer handler 1500 as described herein without integration of dedicated position sensors, associated hardware, and controls in (or on) the transport chamber 118. Here, the aspects of the disclosed embodiment support absolute position detection of the wafer handler 1500 over long motions of the wafer handler 1500 within a linear tool (or cluster tool) with the cost savings obtained from exclusion of dedicated wafer handler position sensors.

Figure 22:
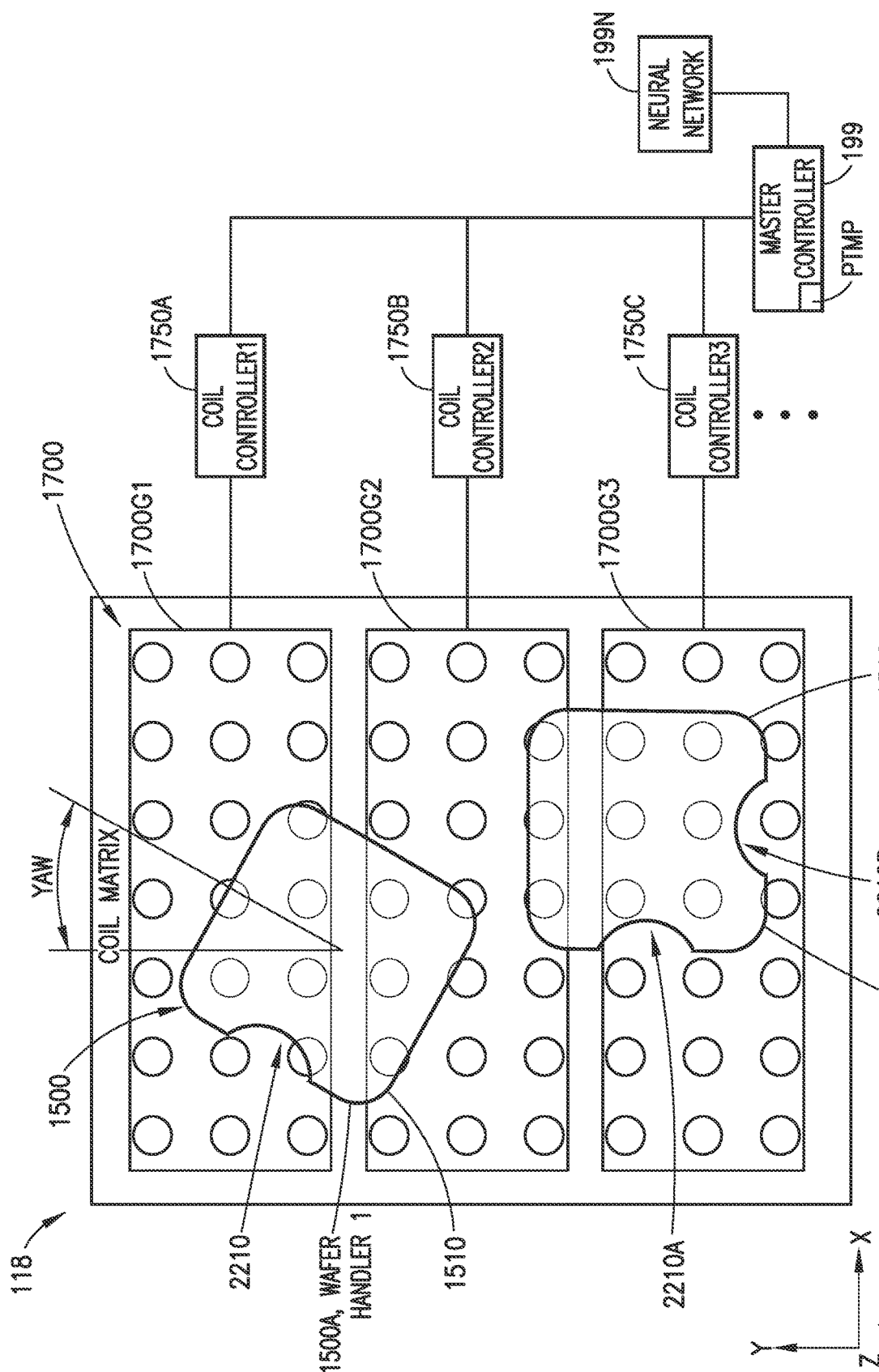
FIG. 22 is a schematic illustration of an electromagnet control system and electromagnet array of a substrate processing apparatus in accordance with aspects of the disclosed embodiment.
Figure 24:
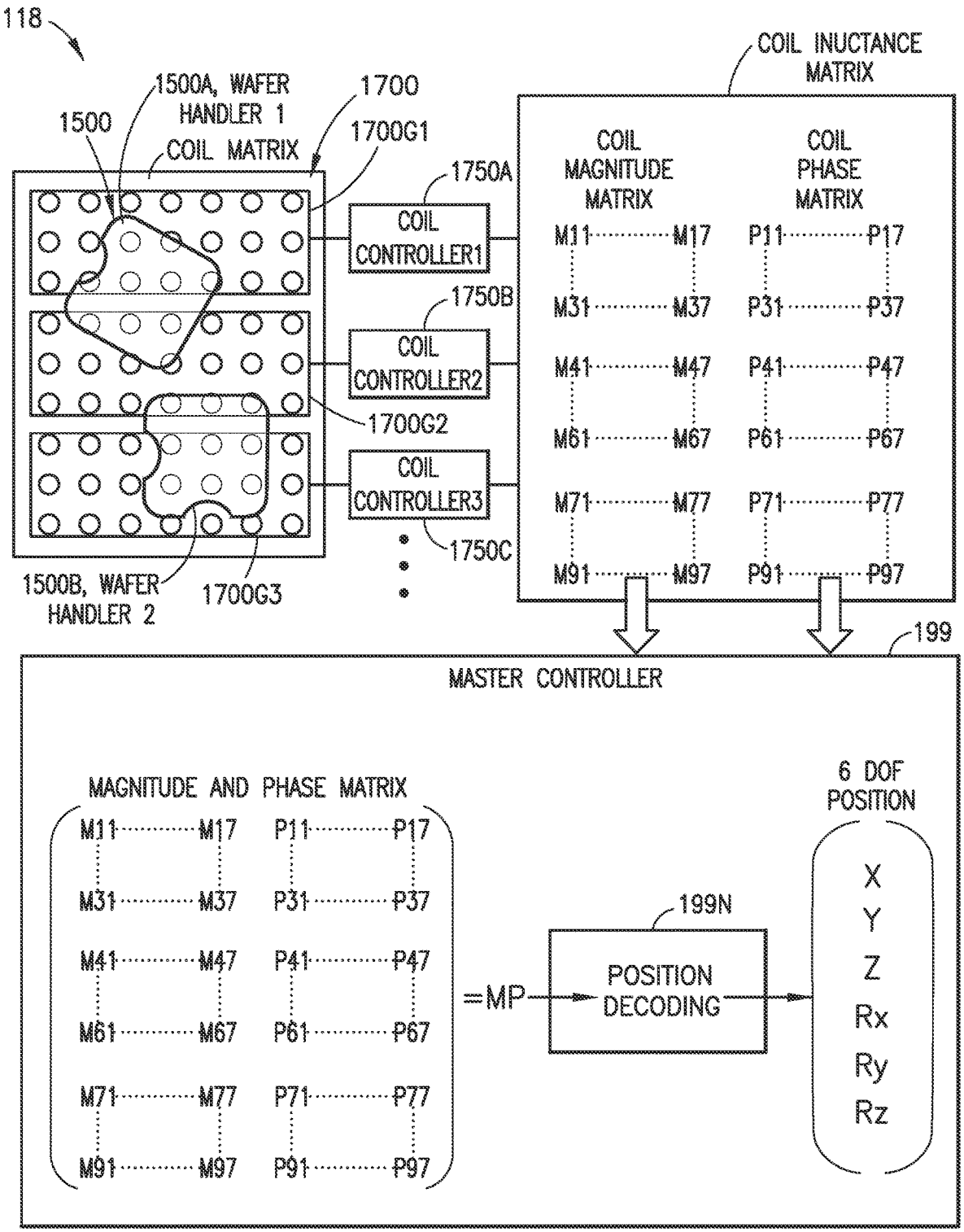
FIG. 24 is an exemplary illustration of a transformation of electromagnet measurements, of the electromagnet array of FIG. 22, to spatial position of a wafer handler in accordance with aspects of the disclosed embodiment.
Figure 28:
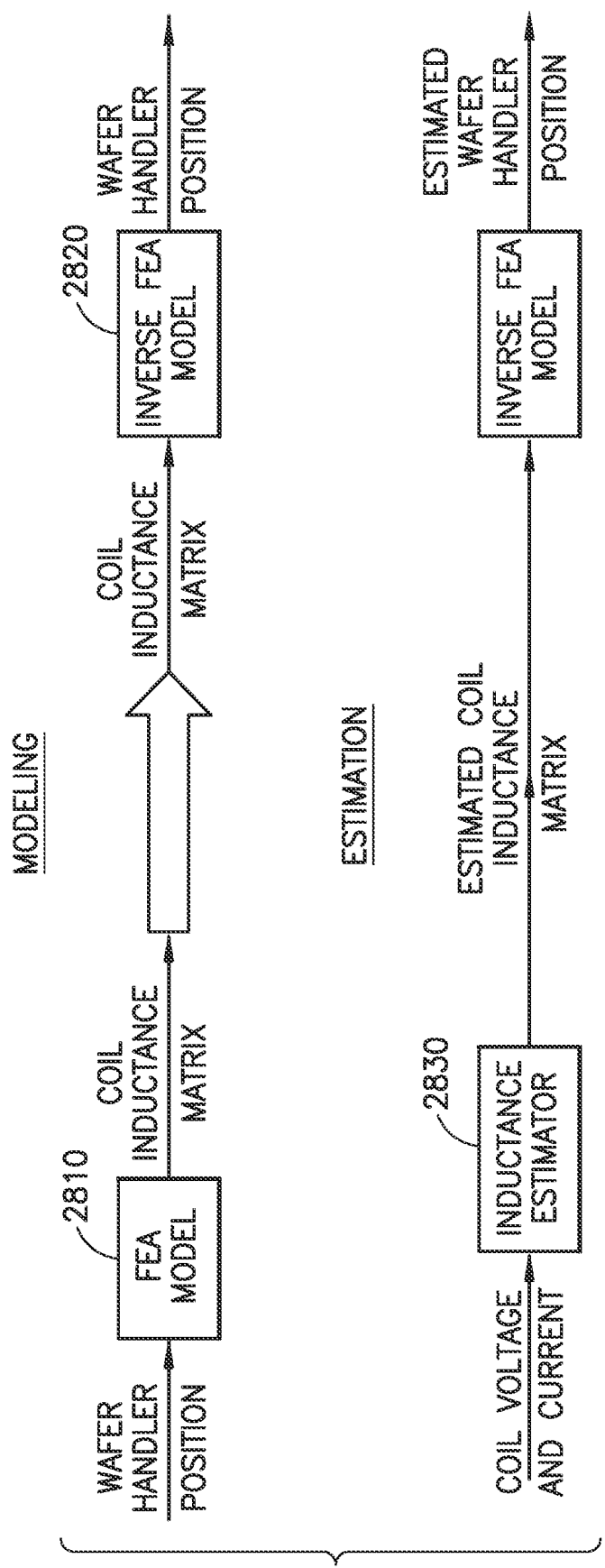
FIG. 28 is an exemplary block diagram of an induction based position determination in accordance with aspects of the disclosed embodiment.

Referring to FIG. 28, as well as FIGS. 22-24, the local controllers 1750A-1750n (or the controller 199, such as where the local controller conveys the voltage V and current I to the controller 199 for position determination) are configured with any suitable strategy for position determination of the wafer handler 1500 within the transport chamber 118. As an exemplary position determination strategy, the controller 199 or controllers 1750A-1750n include a finite element model (FEA) configured to provide a matrix of coil inductances based on the position of the wafer handler 1510 within the transport chamber 118. Here, a multidimensional table (referred to as a forward position-inductance table and represented as FEA model 2810 in FIG.

28) is generated that relates each wafer handler 1510 spatial position in the array of electromagnets 1700 to the respective inductances of the electromagnets in the array of electromagnets 1700. The respective inductances of the electromagnets in the array of electromagnets 1700 may be referred to as a coil inductance matrix that is associated with a given six degree of freedom position of the base 1510 of the wafer handler 1500. An inverse position inductance table (represented in FIG. 28 as inverse FEA model 2820) is generated from the forward position-inductance table 2810. The inverse position inductance table 2820 is configured to effect determination of the wafer handler 1500 position based on the coil induction matrix. As described above, other variables or their combinations can be employed in addition to the coil inductance, such as the power factor PF and impedance Z.

To determine the position of the wafer handler 1500 in the transport chamber 118, the controller 199 (or local controllers 1750A-1750n) includes an inductance estimator 2830 configured to estimate the real time inductances of the elements of the coil induction matrix based on the voltages and currents of the electromagnets in the array of electromagnets 1700. The inductance estimator 2830 is configured to estimate the real time inductances L of the electromagnets in the array of electromagnets 1700 based on the alternating current voltages V and currents I (as determined/measured by the amplifier drive circuit as described herein). As an example, to determine the real time inductances L, the voltage V and current I in each electromagnet in the array of electromagnets 1700 can be expressed as in equation 1 above; however, it may be more practical to express the relationship between the voltage V and current I in terms of the Root-Mean-Square (RMS) values of the voltage V and current I flowing through any given electromagnet in the array of electromagnets 1700 as follows:

$$V_{RMS} = Z \, I_{RMS} \quad [\text{eq. 12}]$$

where $V_{RMS}$ is the RMS of the alternating current voltage at the electromagnet terminals imposed by the local controller 1750, 1750A-1750n; IMs is the RMS of the alternating current measured by the local controller 1750, 1750A-1750n (such as by the amplifier drive circuit 2010—see FIG. 20) at the respective electromagnet; Z is the electromagnet impedance in ohms; R is the resistance of the electromagnet in ohms; $X_L$ is equal to $2\pi f L$ and is the inductive reactance of the electromagnet in ohms; f is the frequency of the alternating current signals in Hertz; and L is the inductance of the electromagnet. Accordingly, the inductance of any given electromagnet can be measured or estimated as:

$$L = \frac{\sqrt{\left[\left(\frac{V_{RMS}}{I_{RMS}}\right)^2 - R^2\right]}}{2\pi f} \quad [\text{eq. 13}]$$

Referring still to FIGS. 22-24, as described herein the aspects of the disclosed embodiment may be employed to locate the position of multiple wafer handlers 1500A, 1500B in the same or common transport chamber 118. As described with respect to FIGS. 17 and 20 herein, each local controller 1750A-1750n is communicably coupled to a respective group 1700G1-1700Gn (only a portion of each group is illustrated in the FIGS.) of electromagnets 1700A-1700n, 1700A1-1700n1, 1700A2-1700N2, 1700A3-1700n3, 1700A4-1700n4, 1700A5-1700n5 in the array of electromagnets 1700. The locations of each of the electromagnets 1700A-1700n, 1700A1-1700n1, 1700A2-1700N2, 1700A3-1700n3, 1700A4-1700n4, 1700A5-1700n5 are known relative to the reference frame REF (X, Y, Z) of the transport chamber 118 (or of the processing tool to which the transport chamber 118 is a part). As noted herein, the local controllers 1750A-1750n are communicably coupled to (master/central) controller 199 in any suitable manner (e.g. wired connection or wireless connection), where the controller 199 (or the master distributed controller 1760) is configured to monitor and control the condition (e.g., energization state) of each electromagnet 1700A-1700n, 1700A1-1700n1, 1700A2-1700N2, 1700A3-1700n3, 1700A4-1700n4, 1700A5-1700n5 of the array of electromagnets 1700.

As an example, the controller 199 (or master distributed controller 1760) defines the alternating current voltage V excitation for the electromagnets of the array of electromagnets 1700 while requesting, from the local controllers 1750A-1750n, the voltage-current phase measurements from each electromagnet of the array of electromagnets 1700. The controller 199 determines from the voltage-current phase measurements the position of the base 1510 of the wafer handler 1500 within the transport chamber 118 in the manner described above as well as determines control commands to effect a desired level of levitation and propulsion of the wafer handler 1500 along a predetermined trajectory. Here, the local controller 1750A-1750n substantially continuously measure at least the voltage-current phase, and in some aspects the amplitude ratio, of the respective electromagnets 1700A-1700n, 1700A1-1700n1, 1700A2-1700N2, 1700A3-1700n3, 1700A4-1700n4, 1700A5-1700n5. The measured voltage-current phase, and in some aspects the amplitude ratio are transmitted from the local controllers 1750A-1750n to the controller 199 so that the controller 199 builds a feedback matrix that can be input into a matrix transformation whose output can be the six degrees of freedom spatial position of the wafer handler 1500 within the transport chamber 118.

As noted herein, the base 1510 of each wafer handler 1500 may have a unique size and shape that effects a unique electromagnet measurement matrix for a given unique position within the transport chamber 118 relative to the entire array of electromagnets 1700. For example, the base 1510 of the wafer handler 1500A may have one fiducial 2210 while the base 1510 of the wafer handler 1500B has two fiducials 2210A, 2210B. The different number of fiducials (and the locations of the fiducials) provide for unique identification of each wafer handler 1500A, 1500B along, for example, the drive plane 1598 (see at least FIGS. 15A and 16B) as well as for a respective yaw angle orientation relative to the array of electromagnets 1700, based on the phase lag of each electromagnet 1700A-1700n, 1700A1-1700n1, 1700A2-1700N2, 1700A3-1700n3, 1700A4-1700n4, 1700A5-1700n5 interacting with the base 1510. Here, to effect the unique identification of each wafer handler 1500A, 1500B the base 1510 overlaps a suitable number of electromagnets such that a unique pattern of electromagnet measurements (e.g., voltage and/or current magnitude and/or phases) is obtained for each wafer handler 1500A, 1500B and associated with the unique position of the respective wafer handler 1500A, 1500B. For exemplary purposes only, at least six electromagnets sense the position of the base 1510 so as to provide a predetermined overlap with the base 1510 so as to unique identify the base 1510 and to provide motion continuity along the (multidimensional) drive plane 1598 (see at least FIGS. 15A and 16B). It should be understood that in other aspects, more or less than six electromagnets sense the position of the base 1510 so as to provide a predetermined overlap with the base 1510 and to provide motion continuity along the (multidimensional) drive plane 1598.

Still referring to FIGS. 22-24 and also to FIG. 28, the transformation of the measured phase lag (and in some aspects the amplitude) of each electromagnet 1700A-1700n, 1700A1-1700n1, 1700A2-1700N2, 1700A3-1700n3, 1700A4-1700n4, 1700A5-1700n5 to the position of the wafer handler 1500 may be effected by a machine learning algorithm such as a neural network that is designed and trained with any suitable machine learning techniques. For example, as described herein, the mutual inductance for each electromagnet 1700A-1700n, 1700A1-1700n1, 1700A2-1700N2, 1700A3-1700n3, 1700A4-1700n4, 1700A5-1700n5 can be measured as described herein. The neural network 199N is trained to uniquely correlate the coil inductance matrix (see FIG. 28) with the position of the wafer handler 1500 within the transport chamber 118. FIG. 24 is an exemplary illustration of the implementation of the neural network to transform the coil inductance matrix (which may include a coil magnitude matrix and coil phase matrix) to the position of the wafer handler 1500.

Referring to FIG. 23, in addition to or in lieu of employment of the phase lag to effect position determination of the wafer handler 1500, 1500A, 1500B, a power factor for each electromagnet in the array of electromagnets 1700 may be employed for position determination of the wafer handler 1500, 1500A, 1500B. The power factor is a measure of efficiency of an inductive load in alternating current circuits, such as the circuit created between the electromagnets in the array of electromagnets 1700 and the base 1510 of the wafer handler 1500A<1500B. As described herein, as the base 1510 approaches an electromagnet 1700A-1700n, 1700A1-1700n1, 1700A2-1700N2, 1700A3-1700n3, 1700A4-1700n4, 1700A5-1700n5, the respective inductance L of that electromagnet 1700A-1700n, 1700A1-1700n1, 1700A2-1700N2, 1700A3-1700n3, 1700A4-1700n4, 1700A5-1700n5 changes as a result of, e.g., the induction of Eddy currents on the base 1510. The change in the electromagnet inductance L effects a change in the associated reactance and the resultant overall impedance of the circuit formed between the electromagnet and the base 1510. This change in impedance directly affects the respective power factor (or efficiency) associated with the electromagnet.

In the aspect illustrated in FIG. 23, the controller 199 is configured to monitor at least the power factors of the electromagnets 1700A-1700n, 1700A1-1700n1, 1700A2-1700N2, 1700A3-1700n3, 1700A4-1700n4, 1700A5-1700n5 in the array of electromagnets 1700 to generate a real time power factor matrix that represents a spatial efficiency of the entire array of electromagnets 1700. As above, the shape/size of the base 1510 of each wafer handler 1500A, 1500B provides for uniquely identifying (e.g., through a respective unique power factor signature, e.g., a unique electromagnet power factor pattern) the location of the wafer handler 1500A, 1500B relative to the array of electromagnets 1700 within the transport chamber 118. As can be seen in FIG. 23, each electromagnet in the array of electromagnets has a power factor where a respective matrix of power factors (e.g., a respective power factor matrix) is employed by the controller 199 as an input to a position decoding algorithm (e.g., of the controller 199, such as the neural network described herein) to determine the location of the wafer handler(s) 1500A, 1500A in a manner similar to that described above, where the variance in a power factor of any given electromagnet of the array of electromagnets is indicative of a proximity of the base 1510 relative to the given electromagnet. For exemplary purposes only, as can be seen in FIG. 23, the power factor matrix for wafer handler 1500A includes the power factors (e.g., CXX where XX is the identity of an electromagnet where as a non-limiting example, C22 is the power factor for electromagnet 22) C22-C25, C31-C36, C41-C45, and C52-C55 corresponding to electromagnets 22-25, 31-36, 42-45, and 52-55 of the array of electromagnets 1700 interacting with the base 1510 of wafer handler 1500A. The power factor matrix for wafer handler 1500B includes the power factors C63-C67, C73-C77, C83-C87, and C93-C97 corresponding to electromagnets 63-67, 73-77, 83-87, and 93-97 of the array of electromagnets 1700 interacting with the base 1510 of wafer handler 1500B. In a manner similar to that noted above, the neural network 199N is trained to correlate the power factors for the electromagnets of the array of electromagnets 1700 with a position of the respective wafer handler 1500A, 1500B relative to the array of electromagnets so as to determine the absolute position of the respective wafer handler 1500A, 1500B within the transport chamber 118.

Figure 25:
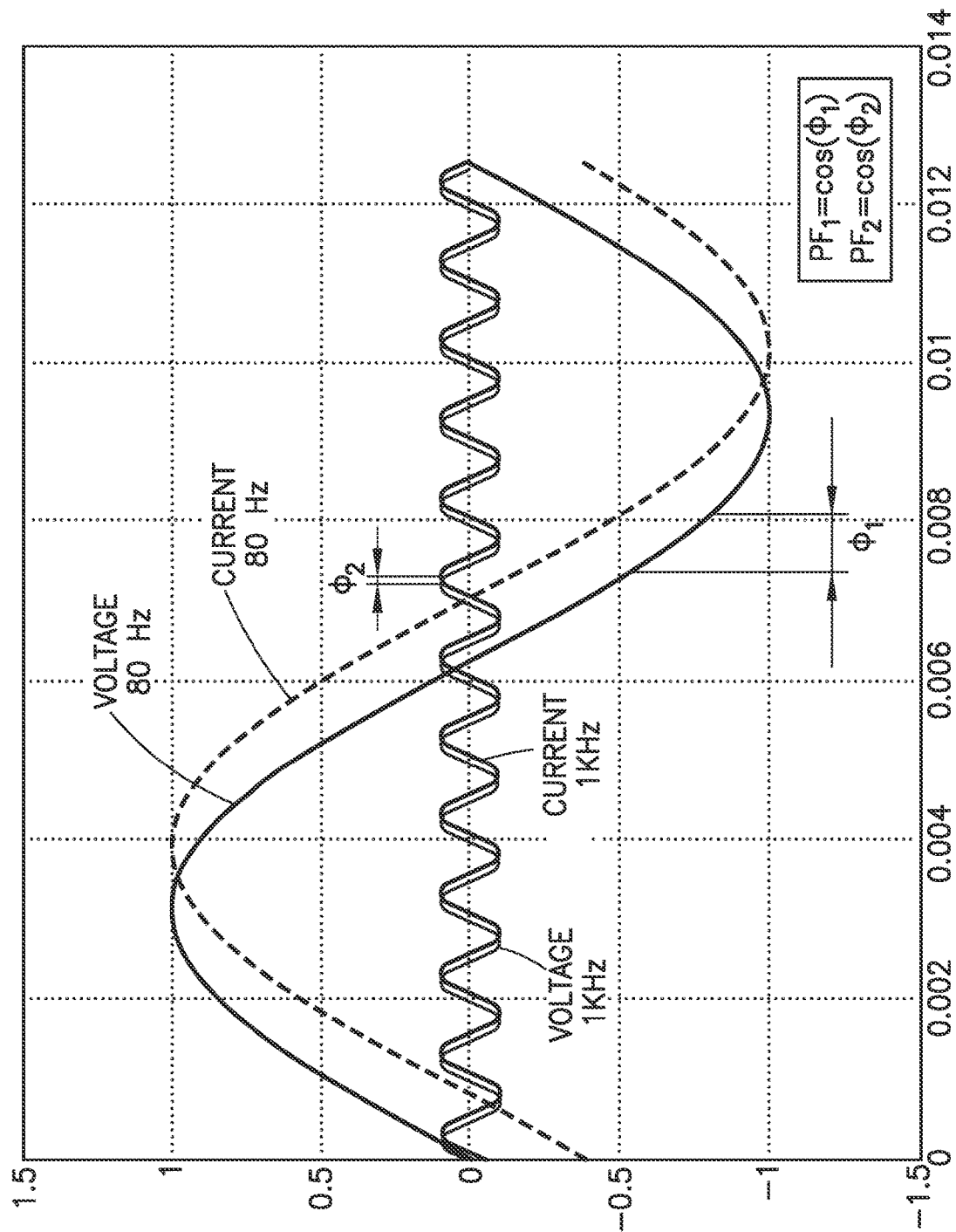
FIG. 25 is a schematic illustration of a multi-frequency alternating current and alternating current voltage for electromagnets in an array of electromagnets for effecting position determination, levitation, and propulsion of a wafer handler in accordance with aspects of the disclosed embodiment.

Referring to FIGS. 22 and 25, in accordance with the aspects of the disclosed embodiment, the predetermined excitation characteristic (such as, e.g., inductance, phase lag/amplitude, and/or power factor as described herein) may be obtained by the controller from a unique and substantially constant alternating current frequency that does not match a fundamental alternating current frequency that effects generation of the levitation and propulsion forces of the array of electromagnets 1700. For exemplary purposes only, the electromagnets of the array of electromagnets 1700 operate at a substantially fixed alternating current frequency of about 80 Hz to effect levitation and propulsion of the wafer handler 1500A, 1500B. The controller 199 is in one or more aspects configured to determine the position/location of the wafer handlers 1500A, 1500B based on one or more of the inductance, phase lag/amplitude, and/or power factor as determined with the alternating current voltage and alternating current at the about 80 Hz frequency; while in other aspects, the controller effects superimposing of a second frequency (such as for example a voltage and current at about 1 KHz) to the fundamental frequency of about 80 Hz as illustrated in FIG. 25, where the controller 199 is configured to determine the position/location of the wafer handlers 1500A, 1500B based on one or more of the inductance, phase lag/amplitude, and/or power factor as determined with the alternating current voltage and alternating current at the about 1 KHz frequency; while in still other aspects the controller 199 is configured to determine the position/location of the wafer handlers 1500A, 1500B based on one or more of the inductance, phase lag/amplitude, and/or power factor as determined with the alternating current voltage and alternating current at both the about 80 Hz frequency and the about 1 KHz frequency (e.g., where determinations made at one of the frequencies is used to verify determinations made at another of the frequencies). The second frequency is separate and distinct from the fundamental frequency so as to decouple position feedback determination from levitation and propulsion of at least one base 1510 (also referred to as a reaction platen) as described herein.

As can be seen in FIG. 25, exemplary power factor determinations are provided for both the about 80 Hz frequency and the about 1 KHz frequency. Here, the power factor ($PF_1$) at the about 80 Hz frequency is expressed as:

$$PF_1 = \cos(\phi_1) \qquad [\text{eq. 14}]$$

and the power factor (PF$_2$) at the about 1 KHz frequency is expressed as:

$$PF_2 = \cos(\phi_2) \quad \text{[eq. 15]}$$

where $\phi_1$ and $\phi_2$ are the phase lag for the about 80 Hz and the about 1 KHz frequencies respectively. It is noted that any suitable frequencies may be employed for levitation/propulsion of the wafer handler 1500A, 1500B and position determinations of the wafer handler 1500A, 1500B. The superimposing of the second frequency on the fundamental frequency for position determination/feedback of the wafer handler 1500A, 1500B decouples the position determination/feedback from the fundamental frequency (i.e., decouples position determination/feedback from levitation and propulsion). The position determination frequency (e.g., the superimposed frequency) may be chosen to be a frequency that is high enough such that the frequency provides for position feedback determination (e.g., via determination of the power factor, inductance, and/or phase lag/amplitude) with a smaller latency/delay compared to that of the fundamental frequency. Using the examples of an about 80 Hz fundamental frequency and an about 1 KHz second frequency the power factor calculation (see equations 9 and 10 above) latency would be about 0.0125 sec (e.g., ⅛₀ Hz) and 0.001 sec (⅟₁₀₀₀ Hz) respectively.

Figure 26:
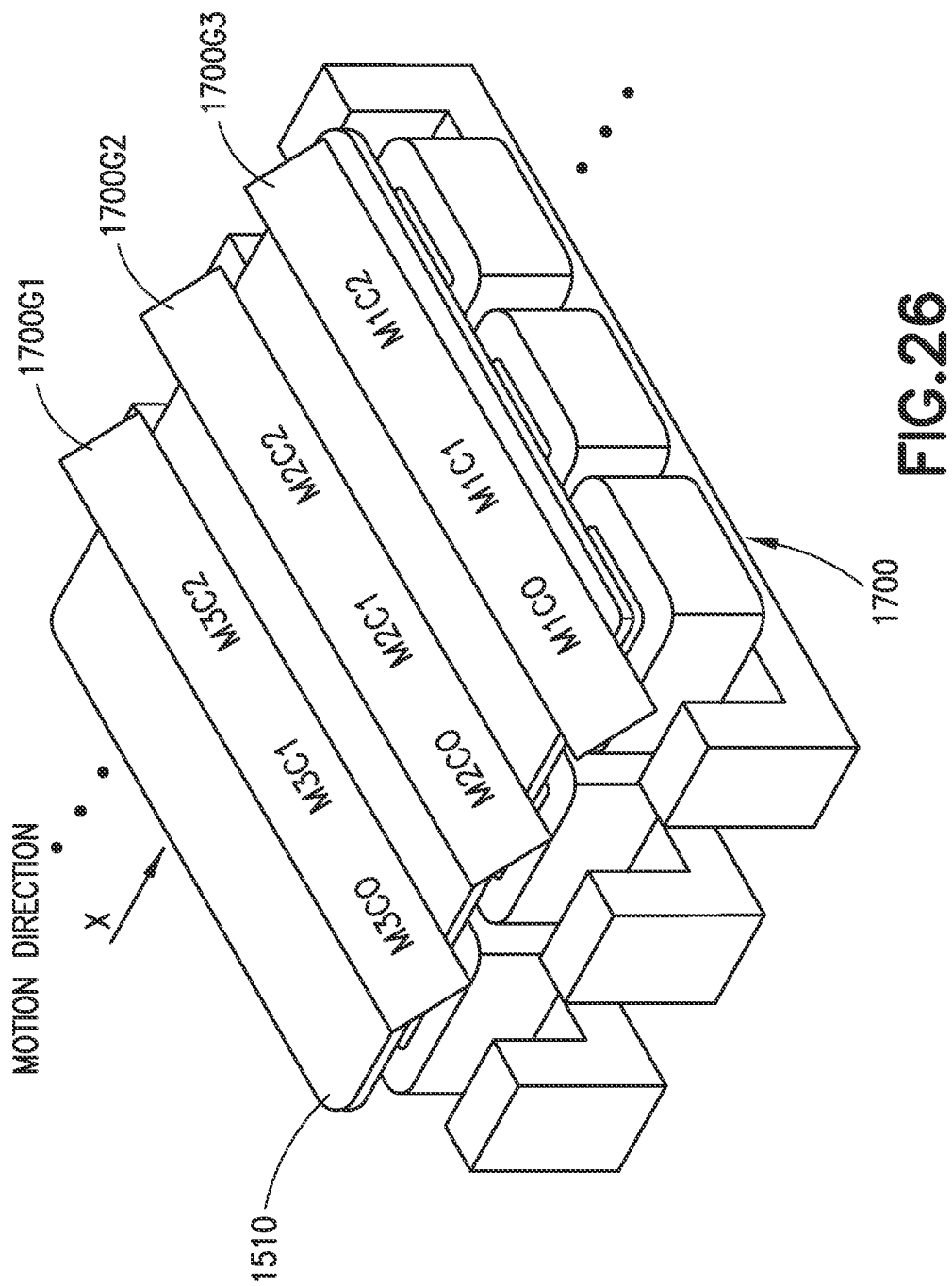
FIGS. 26 and 27 respectively illustrate a base of a wafer handler positioned adjacent an array of electromagnets and a power factor variation of the array of electromagnets based on position of the base in accordance with aspects of the disclosed embodiment.
Figure 27:
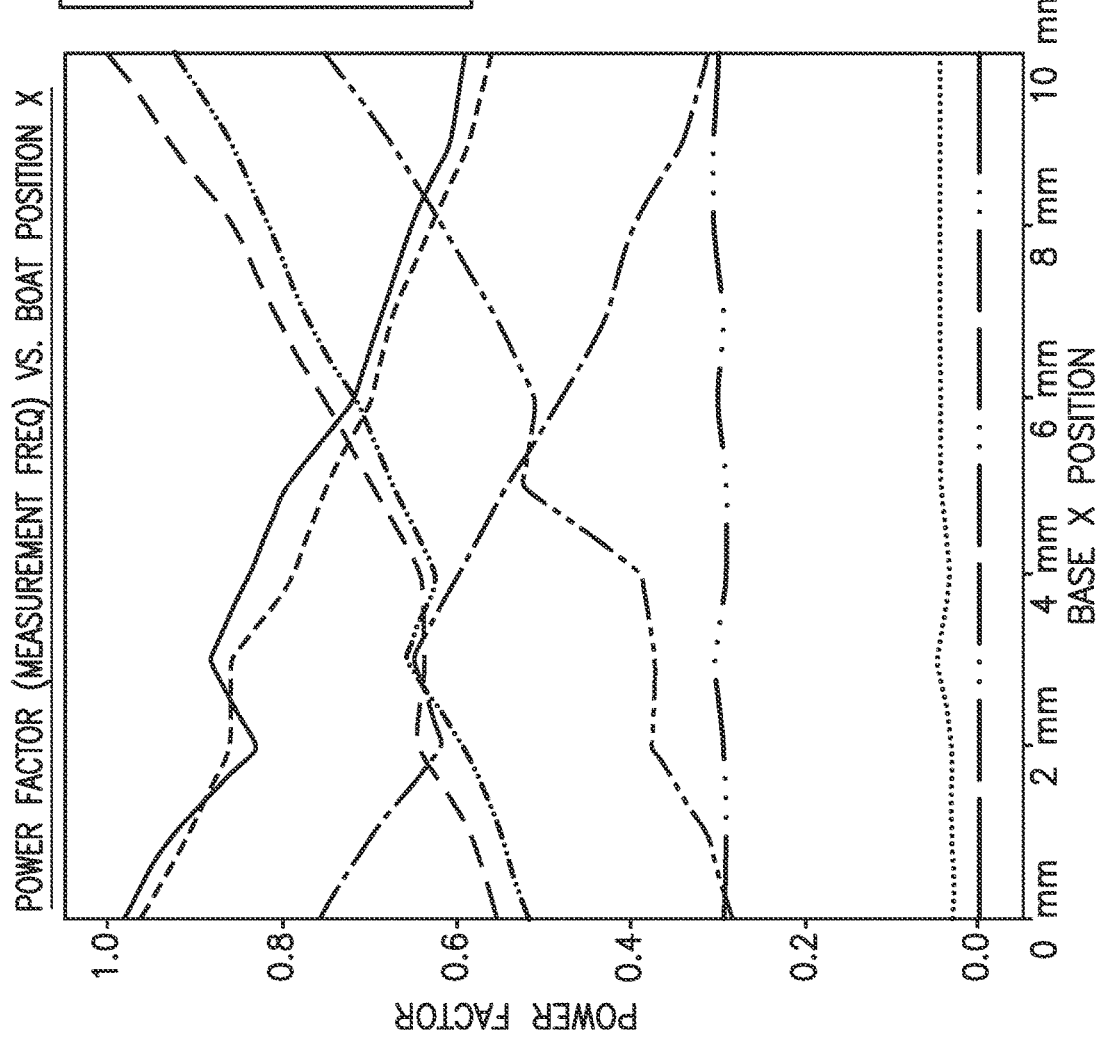

Referring to FIGS. 26 and 27, an experimental data set is provided and illustrates a dependency between the position of the base 1510 of the wafer handler 1500 and the respective power factors of the electromagnets in the array of electromagnets 1700. Here, the electromagnets are identified as M1C0-M1C2, M2C0-M2C2, and M3C0-M3C2 but are otherwise substantially similar to the electromagnets 1700A-1700$n$, 1700A1-1700$n$1, 1700A2-1700N2, 1700A3-1700$n$3, 1700A4-1700$n$4, 1700A5-1700$n$5 described herein. Also, the array of electromagnets 1700 is illustrated as having nine electromagnets for exemplary purposes only and may have more (or less) than nine electromagnets. As can be seen in FIGS. 26 and 27, at each X position of the base 1510, there is a unique set of power factors that uniquely correlate with the X position of the base 1510. For example, as the base 1510 moves towards the positive X direction indicated in FIG. 26, the front (or leading) row of power factors (e.g., corresponding to electromagnets M1C0-M1C2 in the X position illustrated in FIG. 26) decrease while the rear (or trailing) row of power factors (e.g., corresponding to electromagnets M3C0-M3C2 in the X position illustrated in FIG. 26) increase. The decrease in the leading row of power factors and the increase in the trailing row power factors occurs based on changes in the electromagnet M1C0-M1C2, M3C0-M3C2 that result from the changes in the magnetic circuit that, where the changes in the magnetic circuit are effected by the presence and position of the base 1510. The controller 199 (or one or more of controllers 1750, 1750A-1750$n$, 1760) is configured to determine/decode the location of the base 1510 (and of the wafer handler 1500) along the X axis based on the vector of power factors from the electromagnets in the array of electromagnets 1700. As may be realized, vectors of power factors may also be employed for determination of the base 1510 (and wafer handler 1500) location along the Y axis in addition to or in lieu of the determining the location along the X axis (e., such as where the array of electromagnets 1700 provides for multidimensional X-Y movement of the base 1510).

In a manner similar to that described herein, the controller 199 (or one or more of controllers 1750, 1750A-1750$n$, 1760) is configured to determine the Z position (e.g., amount of levitation or lift) of the base 1510 (and the wafer handler 1500) based on the changes in inductance, a phase lag/amplitude, and/or power factor. For example, the values for the inductance, a phase lag/amplitude, and/or power factor are known the controller with the base 1510 travelling along the drive plane. As the lift of the base 1510 increases (the distance between the base 1510 and the electromagnets in the Z direction increases) the affect the base 1510 has on the inductance, a phase lag/amplitude, and/or power factor may decrease. Likewise, as the lift of the base 1510 decreases (the distance between the base 1510 and the electromagnets in the Z direction decreases) the affect the base 1510 has on the inductance, a phase lag/amplitude, and/or power factor may increase.

In the aspects of the disclosed embodiment, the controller 199 is configured, in a manner similar to that described herein, to correlate the increase or decrease in the inductance, a phase lag/amplitude, and/or power factor with the Z position of the base 1510 (and the wafer handler 1500) so as to determine the Z position of the base 1510 in the Z direction. In a manner similar to that described herein, as the base 1510 moves further away in the Z direction from any given electromagnet the power factor of the given electromagnet increases, and the closer the base 1510 moves in the Z direction towards the given electromagnet the power factor of the given electromagnet decreases. These changes in the power factor with respect to the movement of the base 1510 towards and away from the electromagnets in the array of electromagnets may be correlated with the height of the base 1510 above the drive plane 1598 in the controller 199 (and/or other controllers described herein) in a manner similar to that described above with respect to movement of the base 1510 along the X (or Y) axis. With reference to FIG. 18, it is noted that the electromagnets between the edges of the base 1510 (i.e., the electromagnets substantially covered by the base 1510 and not affected by changes induced by base edge transition over the electromagnet) may be employed for Z axis position determination while the leading and trailing electromagnets may be employed for X-Y position determination (see also FIG. 26 where electromagnet M2C1 is substantially completely covered by the base 1510 so as to have a known power factor, inductance, and/or phase lag with the base travelling at the predetermined height H of the drive plane 1598, which known power factor, inductance, and/or phase lag is employed as a reference for Z height determination; however, in other aspects, any of the electromagnets may provide for a combined determination of X and/or Y positioning as well as Z positioning where the controller 199 is programmed to correlate the increase or decrease in the inductance, a phase lag/amplitude, and/or power factor that effects the Z position of the base 1510 with the increase or decrease in the inductance, phase lag/amplitude, and/or power factor with the X and/or Y position of the base 1510.

As can be seen above, the aspects of the disclosed embodiment provide for self-deterministic base (reaction platen) absolute position feedback/determination of the base 1510 (and wafer handler 1500) in the X, Y, and/or Z directions by employing the electromagnets of the array of electromagnets 1700 for position determination. The aspects of the disclosed embodiment also provide for the yaw/angular position determination of the base 1510 (and wafer handler 1500) with the electromagnets of the array of electromagnets 1700. Here, the position determination structure/features of the disclosed embodiment are in situ with (e.g., are one and the same with) the levitation and drive electromagnets so as to form a self-deterministic reaction platen (absolute) position feedback system that provides a more compact transport chamber 118 compared to substrate/wafer transport systems employing dedicated sensors for position determination of the wafer handler.

Referring to FIG. 40, a control system network 3999 that has a clustered architecture representative of the actuator control system network 1799 will be described. In the example illustrated in FIG. 40, there are three drive lines 177, 179A, 179B, each having respective array of electromagnets forming respective tracks 1550A-1550F (though shown as linear, may be arcuate). For example, drive line 177 is formed by tracks 1550A and 1550B having electromagnets 177ER1-177ERn and 177EL1-177ELn. Drive line 179A is formed by tracks 1550C and 1550D having electromagnets 179AER1-179AERn and 179AEL1-179AELn. Drive line 179B is formed by tracks 1550E and 1550F having electromagnets 179BER1-179BERn and 179BEL1-179BELn. The configuration of the electrical machine illustrated in FIG. 40 is exemplary and may have any other suitable configuration.

In FIG. 40 the control system network includes the master controller 1760, cluster controllers 3950A-3950C and local controllers 1750DL, 1750DLA, 1750DLB. Local controller 1750DL corresponds to drive line 177, local controller 1750DLA corresponds to drive line 179A, and local controller 1750DLB corresponds to drive line 179B. Each of the local controller(s) 1750DL, 1750DLA, 1750DLB is substantially similar to distributed local drive controllers 1750A-1750n so that each drive line 177, 179A, 179B includes a distributed arrangement of local drive controllers 1750A-1750n as described above with respect to FIG. 17 for controlling respective groups 1700G1-1700Gn of electromagnets 1700A-1700n.

In one aspect, as shown in FIG. 40 each of the local controllers 1750DL, 1750DLA, 1750DLB is connected (e.g., through a wireless and/or wired connection) to a respective cluster controller 3950A-3950C. For example, each of the local controllers 1750DL of drive line 177 are coupled to cluster controller 3950B, each of the local controllers 1750DLA of drive line 179A are coupled to cluster controller 3950A, and each of the local controllers 1750DLB of drive line 179B are coupled to cluster controller 3950C. In other aspects, the local controllers may be connected (e.g., through a wireless or wired connection) directly to the master controller 1760 as shown in FIG. 17). In still other aspects, the local controllers may be connected (e.g., through a wireless or wired connection) to both the master controller 1760 and the respective cluster controller 3950A-3950C to provide redundant substantially failsafe control of the local controllers.

Each of the cluster controllers 3950A-3950C are connected (e.g., through a wireless or wired connection) to the master controller 1760. Each of the master controller 1760, cluster controllers 3950A-3950C, and local controllers 1750DL, 1750DLA, 1750DLB includes any suitable processors and non-transitory computer program code to effect motion control and/or position determination of the substrate handlers 1500 as described herein. The master controller 1760 supervises the overall operation of the control system network 3999, each of the cluster controllers 3950A-3950C supervises the operations of the respective local controllers 1750DL, 1750DLA, 1750DLB, and each local controller 1750DL, 1750DLA, 1750DLB is utilized to drive the electromagnets and/or provide position feedback (of a substrate handler 1500) corresponding to the respective drive lines 177, 179A, 179B.

The clustered architecture provides the features of a centralized control network and the features of a distributed control network where required, within the network topology. The architecture as disclosed herein is advantageous because clusters may be distributed where required within the network, and each cluster controller 3950A-3950C is capable of providing highly centralized control within the cluster it manages. Network traffic associated with highly centralized control is generally confined within each cluster and local controllers 1750DL, 1750DLA, 1750DLB, where the cluster and local controllers 1750DL, 1750DLA, 1750DLB may be located close to electromagnets to which they control, reducing problems associated with power and signal cabling. In addition, the clustered architecture allows for direct control of the local controllers 1750DL, 1750DLA, 1750DLB by the master controller 1760 where required. Furthermore, because intense network traffic is generally confined within the clusters, and the clusters are capable of a high level of control, the architecture may accommodate a large number of clusters. Thus, the architecture provides a high level of scalability and allows for an efficient distribution of controllers. It is noted that while a clustered control architecture is described above, clustered architecture is merely an example of a suitable control architecture, although any suitable control architecture may be employed.

In another aspect of the disclosed embodiment, the local controllers 1750DL, 1750DLA, 1750DLB shown in FIG. 40 can be directly connected to the master controller 1760. In this aspect, the master controller software is responsible for (e.g., the master controller is configured to control) several aspects of the real time control of the wafer handler's motion and the local controllers would be responsible (e.g., configured for) all low level feedback and actuation aspects of the control architecture.

Still referring to FIG. 40 and also to FIGS. 15A-16C, in accordance with aspects of the disclosed embodiment, the processor 3901 of the master controller 1760 is programmed with a dynamic model 3910 of the base 1510 (e.g., the dynamic model is stored in any suitable memory 3902 accessible by the processor 3901) with a payload (e.g., substrate(s) S) thereon and without a payload. The processor 3901 is also programmed with a dynamic model 3911 of frictional forces p between the substrate S and the end effector 1520. A form factor 3912 of the machine electronics (e.g., number of electromagnets, spacing between electromagnets, number of drive lines and their respective orientations, propulsion to lift relationship, etc.) relative to the base 1510 may also be stored in memory 3902 and accessible by the processor 3901.

The master controller 1760 is programmed or otherwise configured to determine kinematic motion of the base 1510 from an initial substrate handler pose to a final substrate handler pose. The master controller 1760 is also programmed or otherwise configured to determine the kinematics of attitude/yaw control (in three degrees of freedom—pitch, roll, yaw) related to the determined kinematic motion. In one aspect, the kinematic motion and the kinematics of attitude/yaw are determined e.g., using one or more of dynamic model 3910, dynamic model 3911 and form factor 3912 in combination with a predetermined substrate process recipe (e.g., where and when the substrate is to be transferred and what process is to be performed on the substrate).

One method for controlling a machine such as the electrical machines described herein is to calculate a trajectory for each of propulsion (along the X and/or Y axes), lift (along the Z axis), roll, pitch, yaw. Such trajectories can be conveniently defined by a series of position, velocity and time values grouped into frames, referred to as PVT frames.

FIG. 41A shows an exemplary PVT frame 4005. The PVT frame 4005 includes position data 4010 (which may include start location (X,Y,Z), end location (X,Y,Z), and attitude (roll, pitch, yaw), velocity data 4015, and time data 4020. In one aspect the data is in binary format grouped together in one or more bytes. In another aspect each of the position data 4010, velocity data 4015, and time data 4020 occupies four bytes (while in other aspects the each of the position data 4010, velocity data 4015, and time data 4020 occupies more or less than four bytes). PVT frame 4005 may optionally include header information 4025 and trailing information 4030, both of which may include identification, parity, error correction, or other types of data. PVT frame 4005 may include additional data of varying lengths or amounts between or among the header, position, velocity, time, and trailing data. It should be noted that the PVT frame 4005 is not limited to any particular length. In other aspects, the PVT frame is either reduced to a PT frame or a P frame only. The communication from the master controller 1760 to the cluster/local controllers 1750DL, 1750DLA, 1750DLB, 1850DL, 1850DLA, 1850DLB may include different sets of values, which are peripherally related to the desired motion, for example, these values could be frequencies, phase offsets, current values and/or voltage values of the electromagnets/coil under control. The master controller 1760 implements the desired algorithmic transformation, calculates and streams via the motion network such quantities (effectively to every coil through an hierarchical scheme of cluster and local controllers).

It is a feature of the aspects of the disclosed embodiment to use these series of values as inputs for the dynamic models 3910, 3911 of the controlled electrical machine to calculate theoretical lift forces and propulsion forces to be applied by predetermined electromagnets 1700A-1700*n* so that the base 1510 follows the desired trajectory. It is also a feature of the aspects of the disclosed embodiment to use elements of the dynamic models 3910, 3911 to scale feedback control signals used by the local controllers 1750DL, 1750DLA, 1750DLB for each electromagnet under their control.

The lift forces, propulsion forces, and scaling terms may advantageously account for non linearities and dynamic cross coupling among individual drive lines 177, 179A, 179B. The lift forces, propulsion forces may be referred to herein as feedforward terms and the scaling term may be referred to as a gain term.

Using the electrical machine 1599 shown in FIG. 40 (also referring to FIGS. 15A-16C) as an example, the master controller 1760 may generate a trajectory for each drive line 177, 179A, 179B, along which a substrate handler 1500 is to travel, in terms of a commanded position, velocity and acceleration. Using an inverse kinematic model of one or more of the base 1510 and/or frictional forces μ, the master controller 1760 may utilize the trajectory information to generate corresponding feedforward, and gain terms. These terms may be grouped together with the trajectory information in frames specific to each drive line 177, 179A, 179B, referred to as PVT-FG frames. FIG. 41B illustrates an exemplary PVT-FG frame 4095. PVT-FG frame 4095 includes optional header 4025, position data 4010, velocity data 4015, time data 4020, and optional trailing information 4030, similar to PVT frame 4005. In addition, PVT-FG frame 4095 includes at least one feedforward term 4050 and at least one gain term 4060. The data may be in binary format grouped together in one or more bytes. In one aspect of the PVT-FG frame 4095 the position data 4010, velocity data 4015, time data 4020, feedforward term 4050, and gain term 460 each occupy four bytes (while in other aspects they may each occupy more or less than four bytes). Similar to PVT frame 4005, PVT-FG frame 4095 may include other data of varying lengths or amounts, distributed among or between the various terms.

The PVT-FG frames may (or in other aspects the PVT frames) then be distributed over the control system network 3999. The cluster controllers 3950A-3950C, receive the data, and may interpolate between two consecutive frames to obtain an instantaneous position, velocity, feedforward term and gain value, and utilize this information to effect control of the substrate handler 1500. For example, each cluster controller 3950A-3950C employs the PVT-FG frames (or in some aspects the PVT frames), or other suitable information/commands, from the master controller 1760 to generate the propulsion forces Fx (propulsion force along the X axis), Fy (propulsion force along the Y axis), and lift force Fz (along the Z axis) to effect one or more of levelling, propulsion, and three degree of freedom attitude control (e.g., roll, pitch, yaw) of the substrate handler 1500 and base 1510 thereof. In some aspects, the form factor 3912 of the machine electronics may be programmed at the cluster controller 3950A-3950C level, rather than or in addition to being programmed in the master controller 1760, where the form factor is used to establish the lift to propulsion relationship(s), and with the data provided by the master controller 1760 to generate the lift and propulsion forces noted above. In other aspects, the cluster controllers 3950A-3950C and local controllers 1750DL, 1750DLA, 1750DLB may receive corresponding data from the master controller 1760, and utilize the data to control the electromagnets 1700A-1700*n* and movement of the substrate handler 1500 along one of more of the drive lines 177, 179A, 179B.

The cluster controllers 3950A-3950C (or alternatively the local controllers 1750DL, 1750DLA, 1750DLB) command electromagnet 1700A-1700*n* modulation, which commands are sent to and received by the respective local controllers 1750DL, 1750DLA, 1750DLB, to effect one or more of dynamic phase allocation and the creation of virtual multi-phase motor actuator/position units as described in greater detail herein.

Figure 29A:
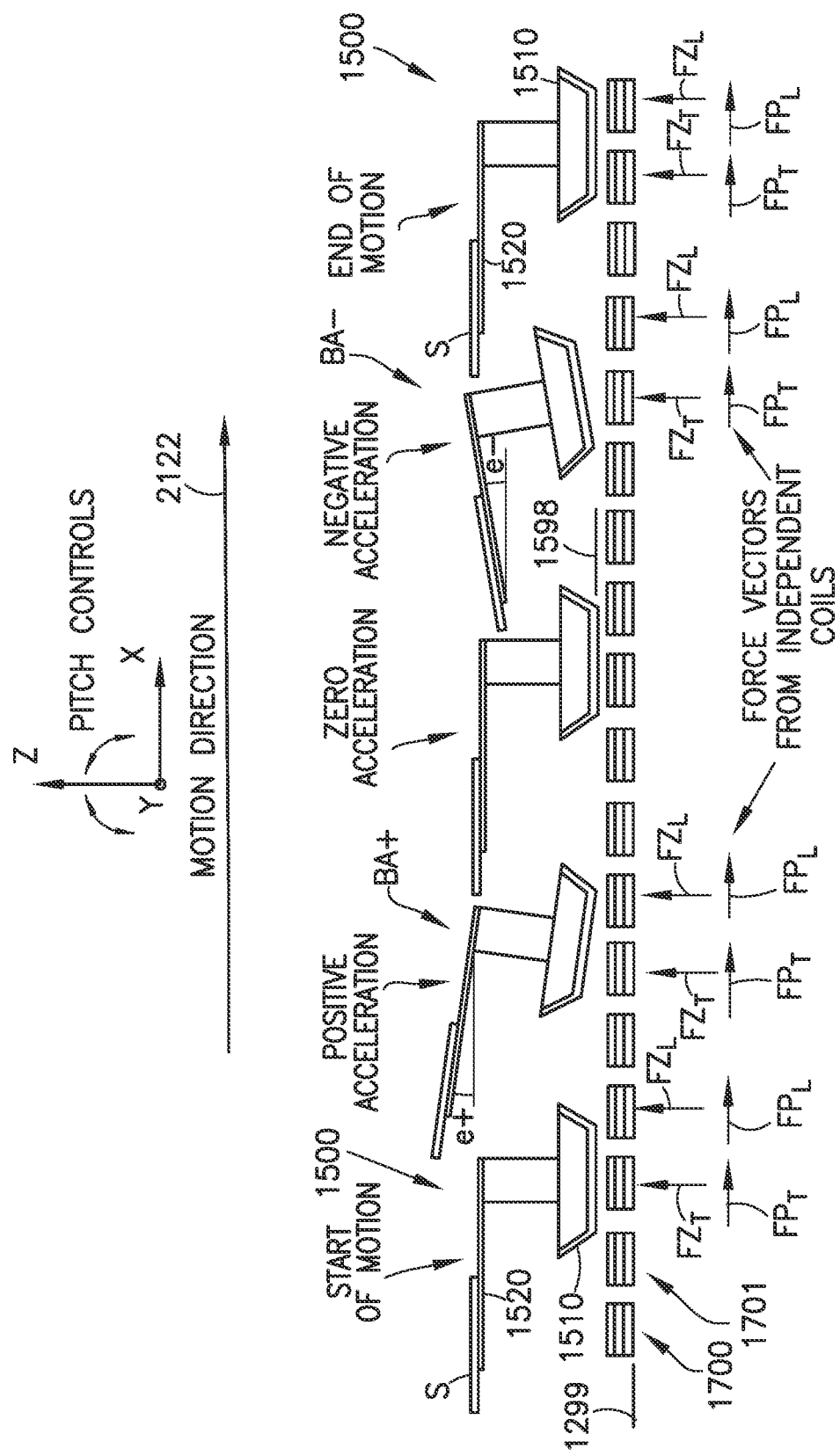
FIG. 29A is a schematic illustration of an exemplary motion control of a substrate handler in accordance with aspects of the disclosed embodiment.

FIG. 29A illustrates an exemplary controlled motion(s) of the substrate handler 1500 in accordance with aspects of the disclosed embodiment with respect to increased substrate handler throughput while carrying a substrate S. Here, the controller 199 controls the levitation forces (e.g., $FZ_T$, $FZ_L$), generated by the array of electromagnets 1700, so as to impart differential levitation forces (illustrated in FIG. 21) across the base 1510 that effect a controlled inclination (e.g., e+ or e−) of the base 1510, relative to the drive plane 1598, that controls a predetermined reaction platen attitude in at least one of pitch (shown in FIGS. 15B, 29A and 35) and roll (shown in FIGS. 15A and 37). In one aspect, the controller 199 controls the levitation forces (e.g., $FZ_T$, $FZ_L$), generated by the array of electromagnets 1700 of the motor actuator units (that are virtually moving), so as to effect a predetermined bias attitude BA+ or BA− of the base 1510, relative to the drive plane 1598, that imparts a bias reaction force F2 (FIG. 31), from a base payload seating surface (e.g., such as a substrate seating surface 1520SS (FIGS. 31, 33A, 33B) of the end effector 1520 or a seating surface defined by substrate supports of cart 1431-1433 of cart 1500C) on a substrate S supported by the base seating surface, in a direction countering payload inertial force arising from acceleration of the reaction platen along the drive plane 1598. The controller 199 is configured to determine acceleration of the base 1510 (and the substrate handler thereof) along the drive plane 1598 at least from changes in the position of the base 1510 as determined based on changes in predetermined excitation characteristic (such as, e.g., inductance, phase lag/amplitude, and/or power factor—as described herein), and in response to the acceleration determine, control the bias attitude of the base 1510 to provide the predetermined bias attitude countering the payload inertial force arising from the acceleration of the base 1510. In other aspects the controller 199 may apply a predefined acceleration from commanded trajectory for bias attitude control. Here, the controller 199 controls excitation of the electromagnets 1700A-1700n of the virtually moving motor actuator units of the array of electromagnets 1700 so as to set the bias attitude BA+ or BA- to bias the base 1510 against inertial forces tending to displace a substrate S, seated against the base 1510 (e.g., on an end effector 1520 thereof or substrate supports 1431-1433 thereof), relative to the base 1510 along a seat between the substrate S and the base 1510 (see, e.g., FIGS. 23, 25A, 25B).

As an example of countering payload inertial forces, starting at the left-hand side of FIG. 29A, a substrate handler 1500 (which may be any of the substrate handlers described herein) is depicted at a starting point of a motion in direction 2122 in FIG. 29A. As the substrate handler begins to move, a set of propulsion force vectors FP and lift force vectors FZ are generated by the Control System (e.g., the actuator control system network 1799 which may be part of controller 199) so as to cause the substrate handler 1500 to accelerate in the motion direction with an increased Pitch angle e+ (e.g., the end effector 1520 is tilted in, e.g., a clockwise direction). To effect the increased pitch angle e+ the lift force vectors FZ are generated so that a magnitude of a trailing lift force vector $FZ_T$ is larger than a magnitude of a leading lift force vector $FZ_L$ (where leading and trailing are in reference to the motion direction). As the substrate handler reaches approximately its halfway point towards the end of the motion (e.g., such as where there is substantially zero acceleration of the substrate handler 1500), the pitch angle e+ is reduced in magnitude so that the tilted orientation of the end effector 1520 is reversed from the clockwise orientation to zero (e.g., substantially parallel with the level reference plane 1299—the trailing lift force vector FZr and the leading lift force vector $FZ_L$ are substantially equal). At this point in the trajectory, the substrate handler 1500 motion begins a deceleration stage where the pitch angle e- is decreased so that the end effector 1520 pitches to a counter clockwise orientation. To effect the decreased pitch angle e- the lift force vectors FZ are generated so that the magnitude of the trailing lift force vector $FZ_T$ is less than a magnitude of the leading lift force vector $FZ_L$). As the substrate handler 1500 reaches its final destination, the pitch angle e- is increased to zero so that the tilted orientation of the end effector 1520 is substantially parallel with the level reference plane 1299, as in the start of the motion.

Figure 29B:
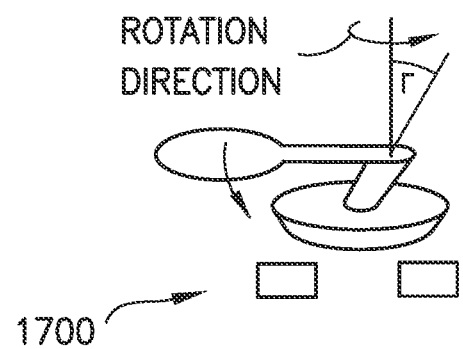
FIG. 29B is a schematic perspective illustration of a substrate handler motion in accordance with aspects of the disclosed embodiment.

As may be realized, while the pitch of the end effector is increased or decreased to account for acceleration and deceleration of the substrate handler 1500 substantially without slippage of the substrate S relative to the end effector while travelling along a substantially straight/linear path (such as along drive lines 177-180), in other aspects, the roll r and/or pitch e of the substrate handler 1500 may be increased or decreased to provide for higher rotational accelerations of the substrate handler 1500 (such as about one or more of axes 777, 1277, 1377 in a manner substantially similar to that described above with respect to the linear motion (see FIG. 29B which illustrates rolling of the end effector in rotation direction with roll control as shown in FIG. 15A where lift force vector $FZ_{left}$ is greater than lift force vector $FZ_{right}$).

Figure 30:
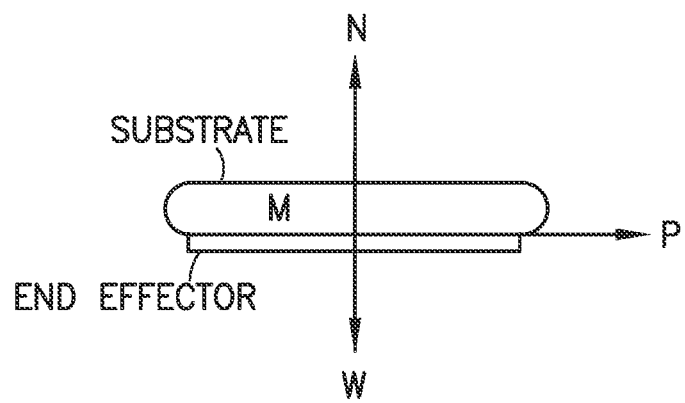
FIG. 30 is a free body force diagram with respect to a maximum allowed acceleration with conventional substrate transport apparatus.

The motion control illustrated in FIG. 29A effects a substantially faster substrate motion transport (e.g., provides for higher accelerations substantially without substrate slippage relative to the end effector) when compared to conventional substrate transport where the end effector is parallel with the wafer transfer plane throughout end effector motion. As an example, if the pitch angle e of FIG. 29A is set to be zero (as with conventional substrate transports) during the entire motion then the maximum allowable propulsion acceleration is limited to the static coefficient of friction (p) between the substrate S and a contact surface of the end effector 1520. This is illustrated in FIG. 30, which constitutes the typical use case in a conventional substrate transport where the substrate S is held by its back side in contact with the end-effector. As it can be seen in FIG. 30, the maximum acceleration imposed to the substrate S is μg before wafer slippage takes place. Where "g" is the acceleration of gravity (about 9.8 m/S²), μ is the coefficient of friction, M is the mass of the substrate, W is the weight of the substrate, and N is the normal force.

Figure 31:
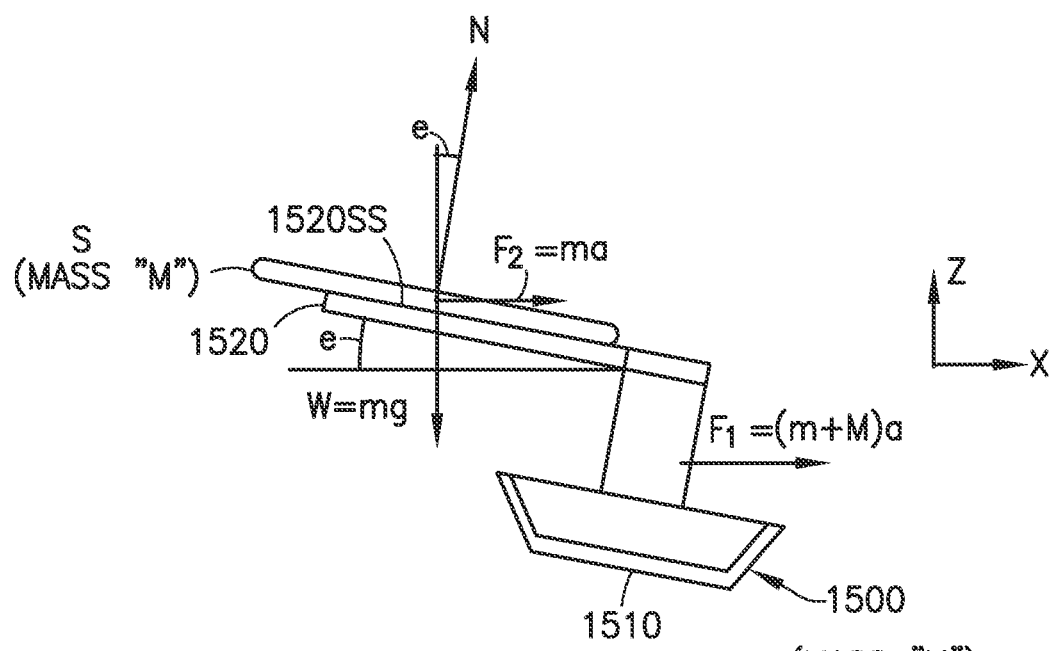
FIG. 31 is a free body force diagram illustrating an effect of pitch angle on acceleration of a substrate handler with respect to substrate slippage in accordance with aspects of the disclosed embodiment.
Figure 32A:
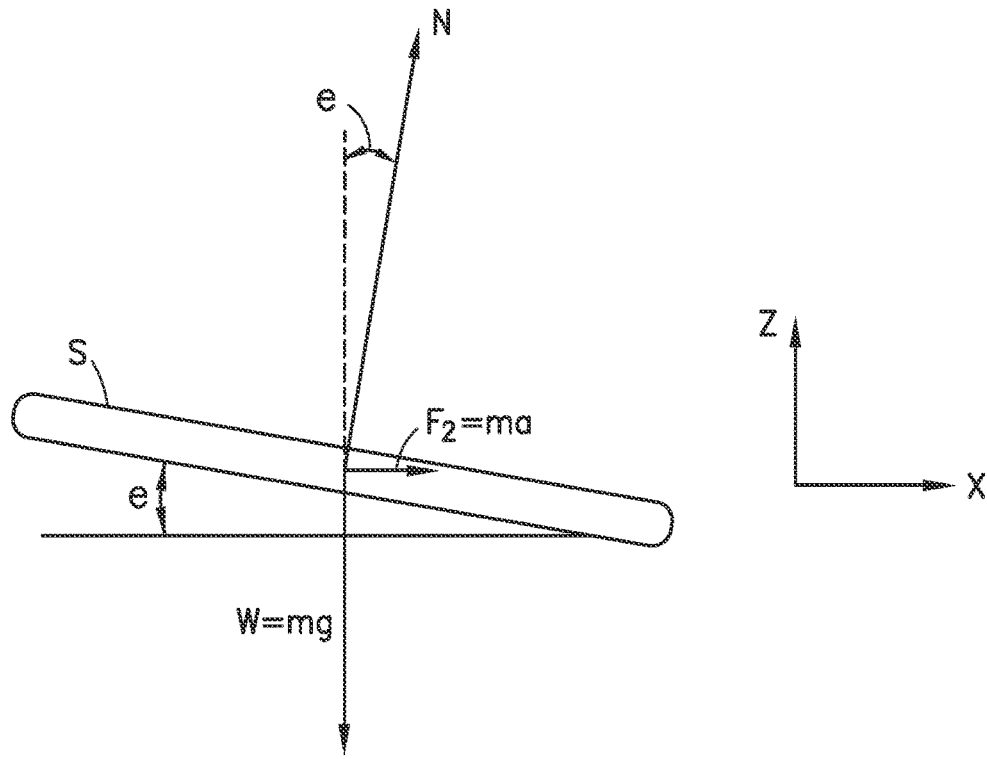
FIG. 32A is a free body force diagram of a substrate illustrating the effects of pitch angle, without friction, on substrate slippage in accordance with aspects of the disclosed embodiment.
Figure 32B:
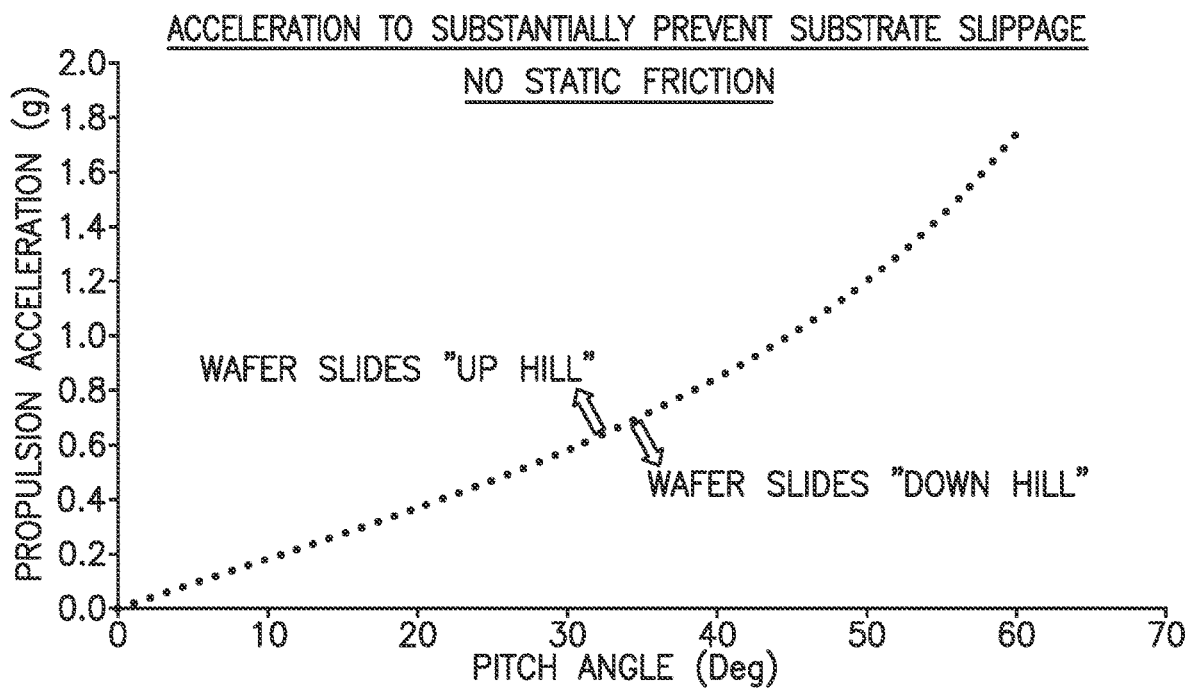
FIG. 32B is an exemplary graph illustrating propulsion acceleration in relation to pitch angle, without friction, with respect to substrate slippage in accordance with aspects of the disclosed embodiment.

FIG. 31 illustrates the case where the substrate S (having a mass m) is carried by substrate handler 1500 (having a mass M) with a pitch angle e while the substrate handler 1500 is accelerated in the X direction. The force diagrams in FIG. 31 illustrate the dynamics of the motion of the substrate S and substrate handler 1500. In FIG. 31, the substrate hander 1500 is accelerated along the propulsion direction X with acceleration a. As a result, the force at the substrate handler is represented by the variable F1. The acceleration a along the X direction, impacts the reaction (normal) force N on the substrate S in a way that once added to the weight of the substrate W yields a resultant wafer force F2. It is possible to relate the angle e and the acceleration a in such a way that the substrate S substantially does not slip relative to the end effector 1520 of the substrate handler 1500. To substantially prevent wafer slippage, two situations can be considered for the sake of clarity. First, it is assumed that there is no friction between the substrate and the end effector 1520. FIG. 32A illustrates a free body diagram of the substrate S on the end effector 1520 in the absence of friction μ. As can be seen in FIG. 32A, despite the absence of friction μ, an acceleration a can be determined in terms of the pitch angle e such that the substrate mass m is traveling along the X direction. This relation is expressed by equation 16 below:

$$a = g \tan e \quad \text{[eq. 16]}$$

where g is the acceleration of gravity (9.8 m/s²). FIG. 32B illustrates wafer slippage regions in terms of the pitch angle e. It is noted that the substrate S will slip relative to the end effector 1520 without friction μ if the pitch angle e is substantially zero. The curve illustrated in FIG. 32B represents the desired pitch angle "e" to keep the substrate S moving at an acceleration "a" along the X direction without slippage. Alternatively, the same curve of FIG. 32B can be interpreted as the demanded acceleration "a" of the substrate handler 1500 to prevent the substrate S from slipping while moving along the X direction with the pitch angle "e". Deviation from the curve illustrated in FIG. 32B will cause the substrate S to slide either "downhill" or "uphill" (where the terms downhill and uphill are used for convenience relative to the pitch) relative to the end effector 1520 depending on the acceleration value.

Figure 33A:
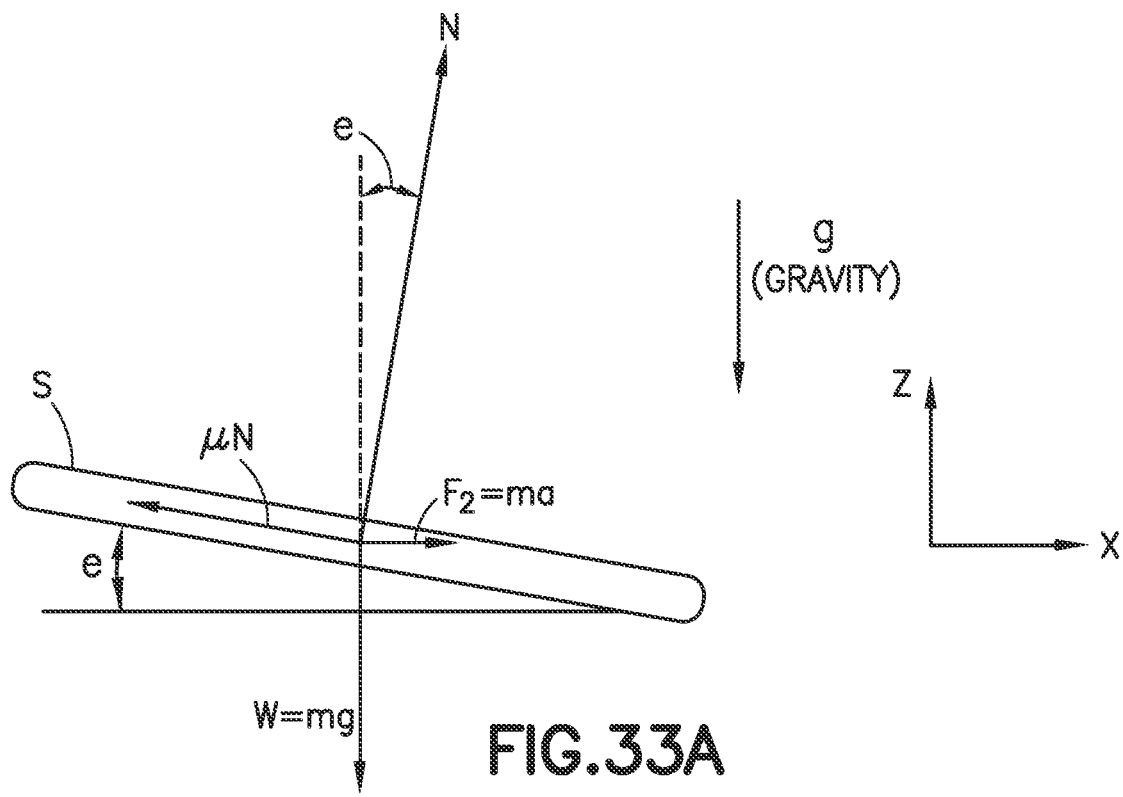
FIG. 33A is a free body force diagram of a substrate illustrating the effects of pitch angle, with friction, on substrate slippage in accordance with aspects of the disclosed embodiment.
Figure 33B:
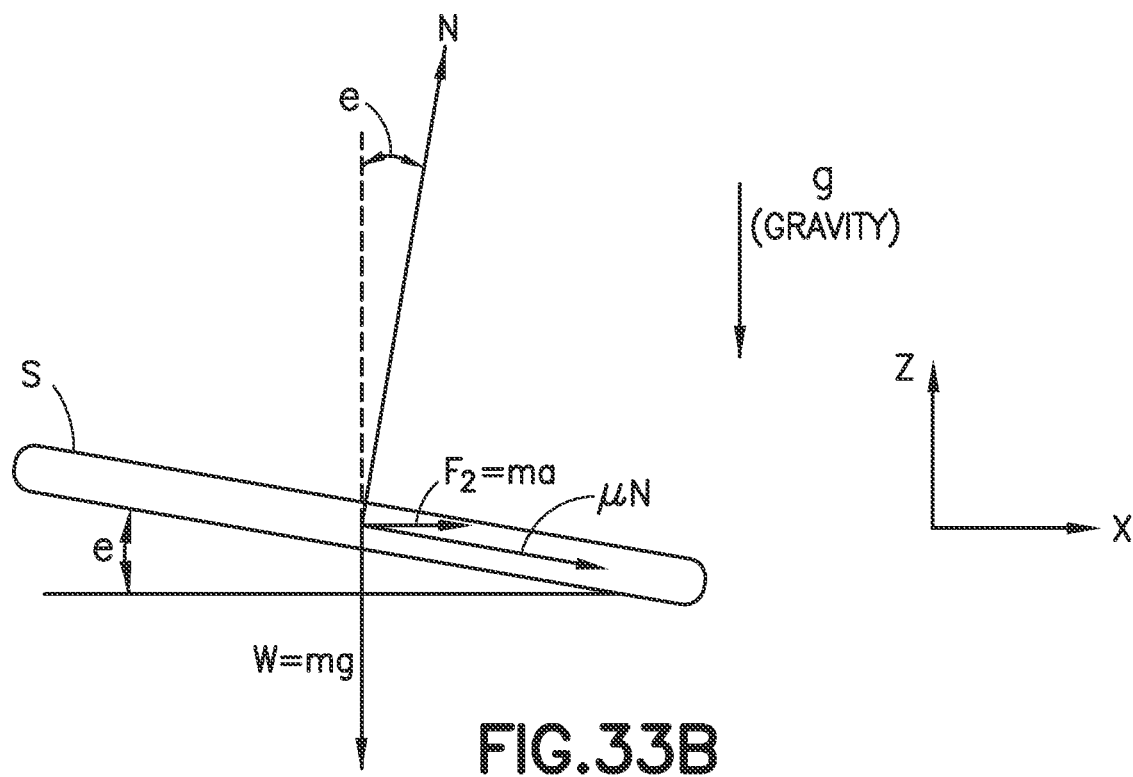
FIG. 33B is a free body force diagram of a substrate illustrating the effects of pitch angle, with friction, on substrate slippage in accordance with aspects of the disclosed embodiment.

FIGS. 33A and 33B show the effect of a non-zero static friction coefficient μ on the relation between acceleration a and pitch angle e. For example, FIG. 33A illustrates a minimum propulsion acceleration before slippage of the substrate S relative to the end effector 1520 takes place. In this case, the friction force direction points "uphill" to substantially prevent the wafer mass m from sliding "downhill" (again relative to the direction of pitch). Here, the "slowest" expected acceleration to prevent wafer slippage is calculated as:

$$a_{min}=[-\mu+\tan e]/[1+\mu \tan e] \qquad [\text{eq. 17}]$$

FIG. 33B, illustrates the case for the maximum (e.g., fastest) expected propulsion acceleration a before slippage of the substrate S relative to the end effector 1520. In this case, the friction force direction points "downhill" to substantially prevent the wafer mass m from sliding "uphill" (again relative to the direction of pitch). Here, the "fastest" expected acceleration a is calculated as:

$$a_{max}=[\mu+\tan e]/[1-\mu \tan e] \qquad [\text{eq. 18}]$$

Consequently, in the presence of a non-zero static friction coefficient μ the propulsion acceleration a should stay within the limits below in order to prevent substrate S slippage, for a given pitch angle:

$$a_{min}<a<a_{max} \qquad [\text{eq. 19}]$$

Figure 34:
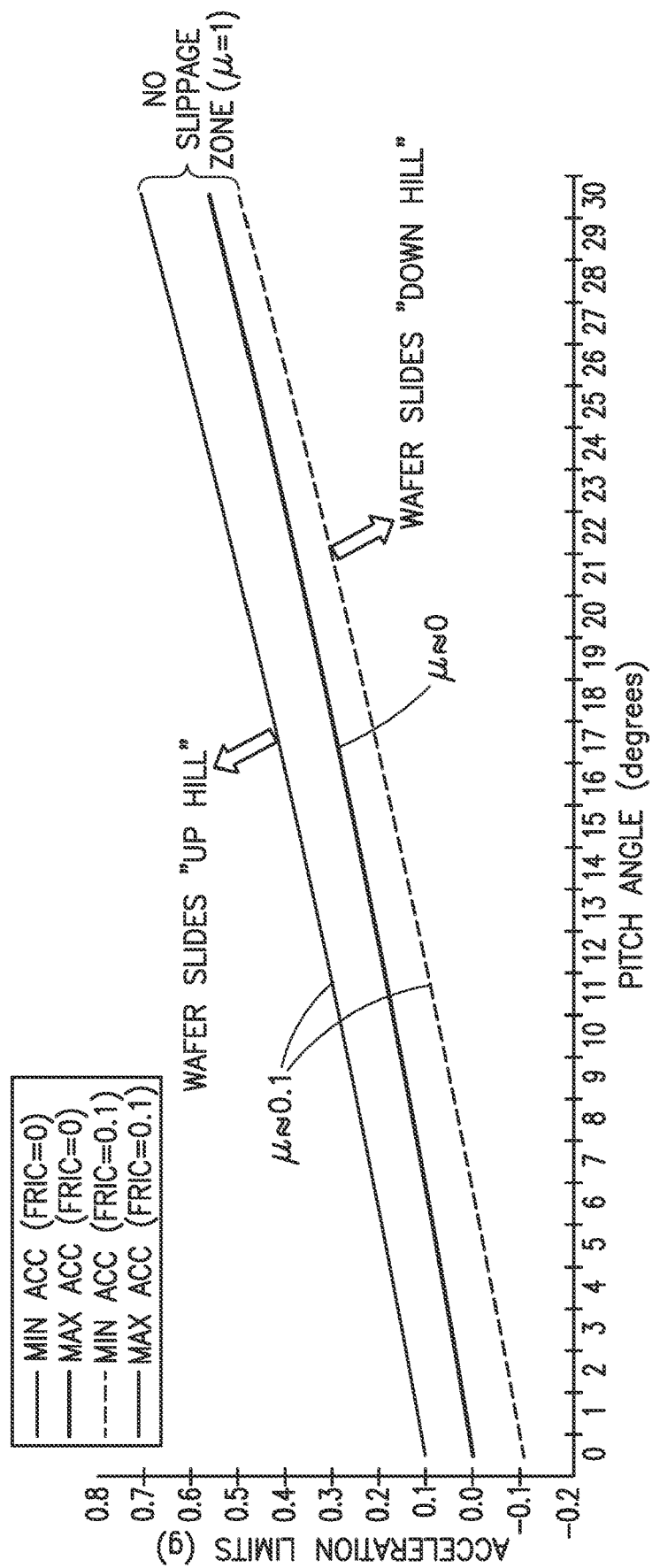
FIG. 34 is an exemplary graph illustrating acceleration limits in relation to pitch angle, with friction, with respect to substrate slippage in accordance with aspects of the disclosed embodiment.

FIG. 34 provides an example of the dependency between acceleration a and pitch angle e for a static coefficient of μ that is about 0.1, which is a typical value for substrate handlers used in high temperature applications. The curve of FIG. 32B is repeated in FIG. 34 under the case of μ equal to about 0. The region between the top and bottom curves (μ equal to about 0.1) represents a non-slippage region (e.g., a region of acceleration for a given pitch angle where the substrate slippage relative to the end effector substantially does not occur). The areas outside this region may have wafer slippage either in the upwards of downwards direction relative to the substrate handler inclination (i.e., pitch angle e). In the example of FIG. 34, the maximum acceleration with a substantially zero pitch angle is about 0.1 g which is the fastest acceleration that conventional substrate handlers can provide for typical high temperature applications. If the pitch angle e is set to about 16 degrees of inclination, the substrate can be transported at accelerations as high as 0.4 g using the same end effector material (as in conventional substrate handlers) which constitutes a substantial throughput improvement compared to the conventional substrate handlers. The pitch angle e can be set according to a predetermined acceleration in order to maximize throughput such as depicted in FIG. 29A.

Figure 35:
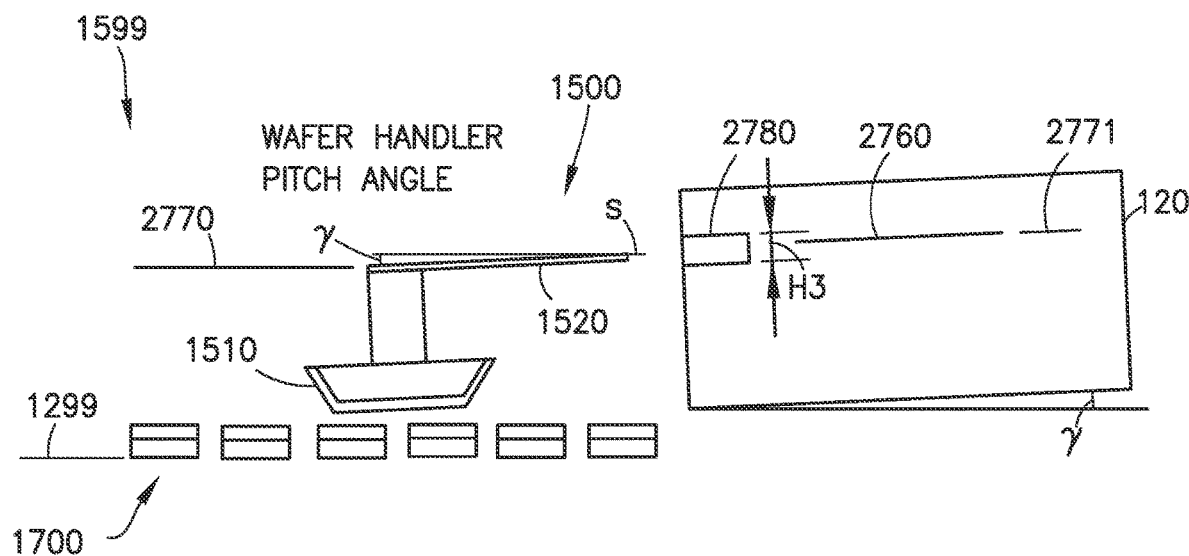
FIG. 35 is a schematic elevation view of a substrate handler illustrating pitch control of the substrate handler in accordance with aspects of the disclosed embodiment.

FIG. 35 illustrates active control of the substrate handler 1500 orientation in roll, pitch, and yaw with respect to leveling of the substrate handler 1500 relative to a substrate station, such as process module 120. Mechanical deflection imposes challenges on entering and exiting process module openings 2780 which are becoming increasingly smaller in height H3 due to the need of optimizing process module 120 process times. Conventional substrate transports generally suffer from the inherent potential of mechanical deflection due to the presence of articulated links with bearings that add weight and decrease stiffness, noting that compensating for the end-effector orientation as the wafer goes through the process module opening 2780 may not be practical. In these cases, it is becoming increasingly difficult to be able to comply with more restrictive mechanical deflection constraints. The aspects of the disclosed embodiment provide a solution to mechanical deflection that dynamically compensates for any mechanical deflection by controlling the substrate handler orientation in space, relative to the level reference plane (e.g., by adjusting the roll, pitch and yaw angles as described herein) such that a substrate passes through the process module opening 2780 substantially without contact between the substrate S and the opening 2780 and substantially without contact between the end effector 1520 and the opening 2780.

FIGS. 15A-16C illustrate the controlled adjustment, by the local drive controller(s) 1750A-1750n (and based on the position determination of the wafer handler 1500 as described herein), of the roll and yaw angles of the substrate handler 1500 in addition to the pitch angle. Referring also to FIG. 35, the controlled adjustment of each of the roll, yaw, and pitch angles (e.g., by differentially varying at least the lift force vectors acting on the base 1510 as described herein) effects leveling a position of the substrate handler 1500 at any suitable substrate holding station such as a process module 120 so that a plane 2770 of the substrate S (and end effector 1520 on which the substrate S is supported) is substantially the same as a plane 2771 defined by the substrate holding station 120 substrate support surface 2760. In some aspects, the roll, yaw, and pitch angles are adjusted independent of each other. The controlled adjustment of the substrate handler 1500 orientation angles (e.g., roll, pitch, and yaw) also provides for compensation of mechanical deflection of the end effector 1520 due to, for example, the substrate loading as well as the weight of the substrate handler 1500 structure.

Figure 36:
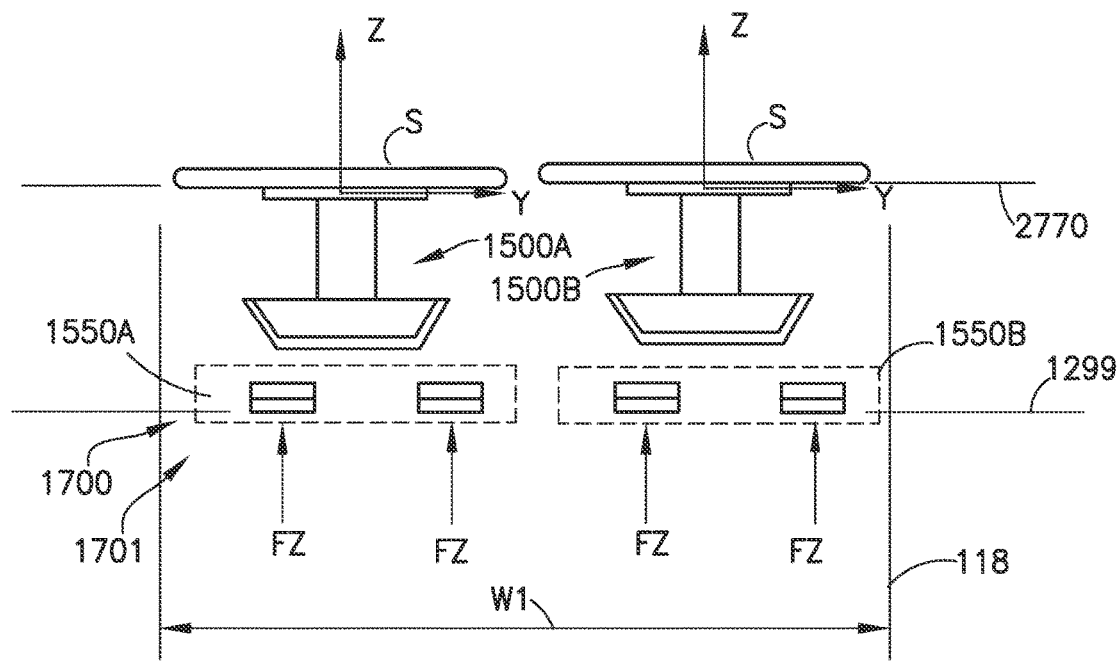
FIG. 36 is a schematic elevation view of one substrate handler passing by another substrate handler within a transport chamber in accordance with aspects of the disclosed embodiment.
Figure 37:
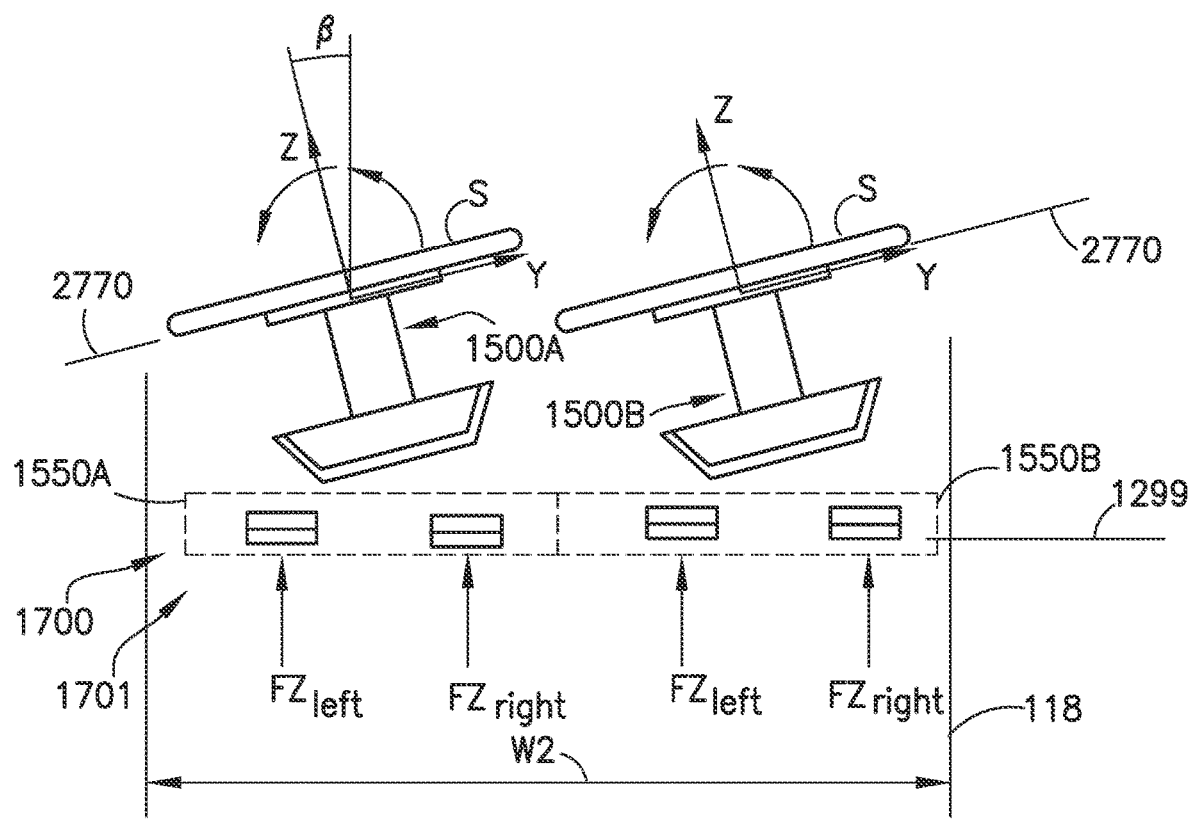
FIG. 37 is a schematic elevation view of one substrate handler passing by another substrate handler within a transport chamber in accordance with aspects of the disclosed embodiment.

Referring to FIGS. 8-11 and 36 and 37, as described above, in some aspects multiple drive lines 177, 178 are provided so as to extend longitudinally along a length of the transport chamber 118 to provide passage of one substrate handler 1500 by another substrate handler along the longitudinal direction of the transport chamber 118. FIG. 36 illustrates passage of two substrate handlers 1500A, 1500B past one another with substrate handler 1500A traveling along an inbound track 1550A and with substrate handler 1500B travelling along an outbound track 1550B. Here each of the substrate handlers 1500A, 1500B have roll, pith, and yaw angles so that the plane 2770 of the end effector 1520 (and substrate s held thereon) is substantially parallel (i.e., level) with the level reference plane 1299. Here, with the end effectors 1520 level, the transport chamber 118 has a lateral width W1. However, in accordance with aspects of the disclosed embodiment, the width of the transport chamber 118 may be minimized or otherwise reduced from lateral width W1 to lateral width W2 by adjusting one or more of the roll, the pitch, and the yaw of the substrate handlers 1500A, 1500B as they pass one another along the length of the transport chamber 118. For example, as illustrated in FIG. 37 the roll angle of each substrate handler 1500A, 1500B may be adjusted to a predetermined angle β relative to the level reference plane 1299 to avoid contact between the substrate handlers 1500A, 1500B as they move past one another during a period of time that both substrate handlers 1500A, 1500B would otherwise occupy the same space. The predetermined roll angle β may depend on end effector configuration (e.g., so that the substrate S does not slip relative to the end effector). As may be realized it advantageous to have control of the roll, pitch, and/or yaw angles of each substrate handler 1500 in order to reduce a footprint of the transport chamber 118 that houses the wafer handling automation, where the reduced footprint at least increases tool density on the fabrication facility floor and decreases pump down times of the transport chamber which may result in increased throughput.

Figure 38:
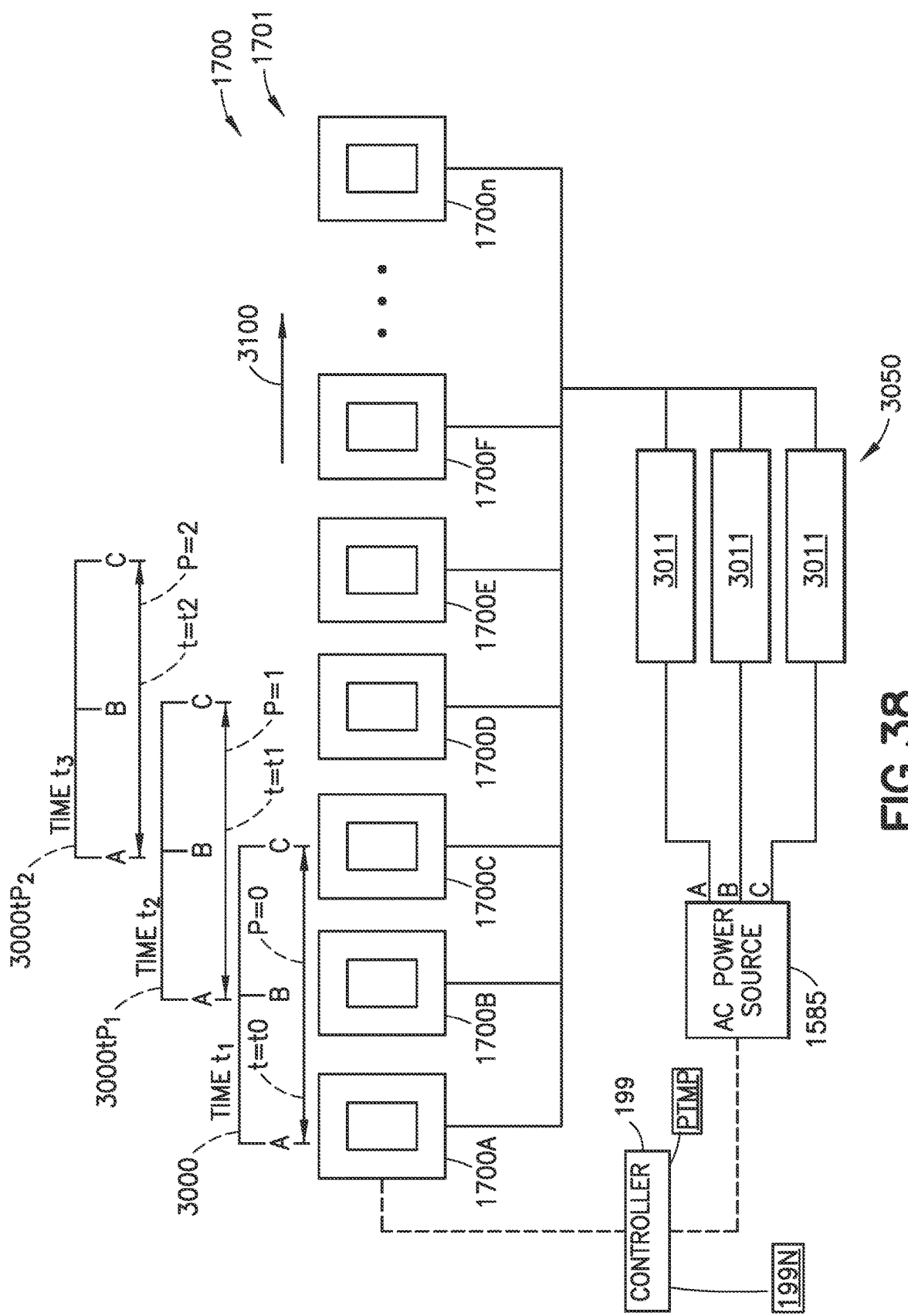
FIG. 38 is a schematic illustration of a portion of the actuator control system network showing dynamic phase allocation in accordance with aspects of the disclosed embodiment.

Referring now to FIGS. 17 and 38, an exemplary control of the array of electromagnets 1700 will be described where dynamic phase allocation is employed. As described herein, the controller 199 (which in one aspect is a clustered or master controller as described herein—see FIG. 40) is operably coupled to the array of electromagnets 1700 and the alternating current power source 1585 (the power source may be any suitable type and can be direct current in which case the controller driving circuit will modulate that to desired frequency/phase for as many alternating current power phases as desired) and configured so as to sequentially excite the electromagnets 1700A-1700n with multi-phase alternating current so that the base 1510 of a substrate handler 1500 is levitated and propelled with at least one of attitude control and yaw control with a common set of the electromagnets 1700A-1700n (such as those electromagnets of a respective drive line 177-180). As noted above, the controller 199 is configured to sequentially excite the electromagnets 1700A-1700n cooperating in multi-phase alternating current excitation that form motor actuator units 1701 corresponding to the position of the base 1510 as determined based on the changes in the excitation characteristic (e.g., inductance, a phase lag/amplitude, and/or power factor) as described herein. The number n (an integer in the example of three or more, though in other aspects may be two or more) of electromagnets 1700A-1700n of each motor actuator unit 1701 as well as the location (static) of the respective n electromagnets 1700A-1700n of each motor actuator unit 1701 are dynamically selectable by the controller 199 in effecting lift and propulsion of the base (secondary) 1510 at any given time throughout operation of the motor actuator. Each of the electromagnets 1700A-1700n generates, from excitation with common multiphase alternating current having a single common frequency per phase, both the separately controllable levitation and the propulsion forces against the base 1510 so as to control the base 1510 with up to six independent degrees of freedom including at least one of attitude and yaw at least with the base 1510 levitated. The common single frequency per phase of each phase (here respective phases A, B, C) may be selectably variable from different desired excitation frequencies so that levitation and propulsion forces generated by the motor actuation unit 1701 enable substantially independent control of the base 1510 in each of the up to six independent degrees of freedom. In one aspect, the controller 199 controls the roll, pitch, and yaw angles generated by the array of electromagnets 1700A-1700n arranged in the respective motor actuator units 1701, including at least the attitude with the base 1510 levitated and propelled so as to move relative to the array of electromagnets 1700 along the at least one drive line 177-180 from a first predetermined position P1 (see FIG. 1B) with respect to the frame of the chamber 118 to a second different predetermined position P2 (see FIG. 1B) with respect to the frame of the chamber 118. In one aspect, the controller 199 controls the roll, pitch, and yaw angles generated by the array of electromagnets 1700, including at least the base 1510 attitude and the base 1510 yaw with the base 1510 levitated and stationary relative to the array of electromagnets 1700 in a predetermined position (such as position P2 in FIG. 1B) along the at least one drive line 177-180 with respect to the frame of the chamber 118.

Figure 39A:
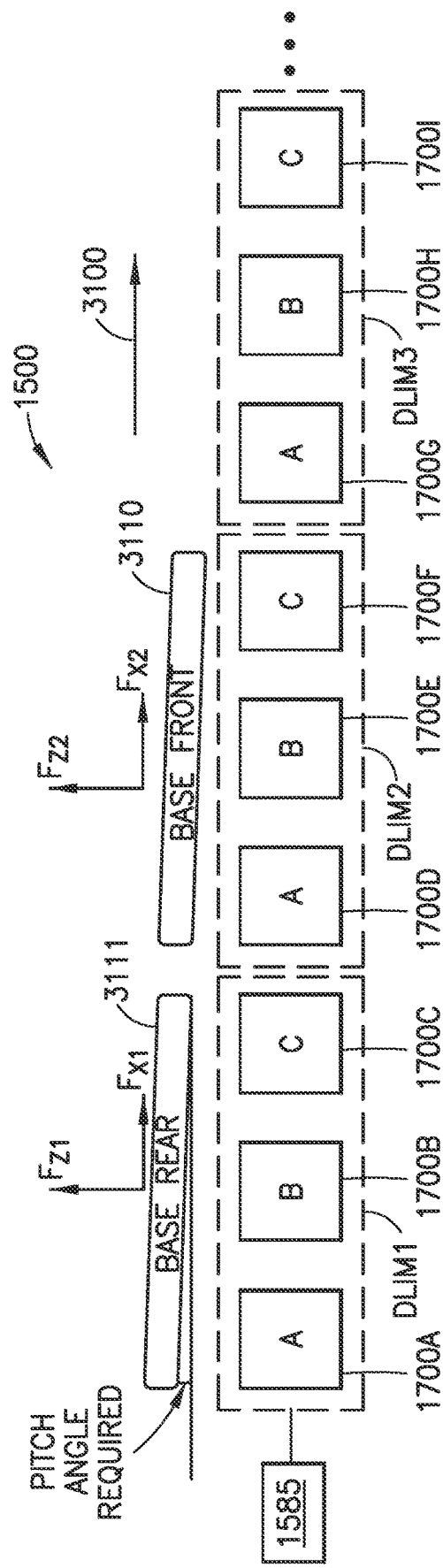
FIGS. 39A and 39B illustrate tilt control of a portion of a substrate handler utilizing the actuator control system network with dynamic phase allocation and virtual multiphase actuator units in accordance with aspects of the disclosed embodiment.
Figure 39B:
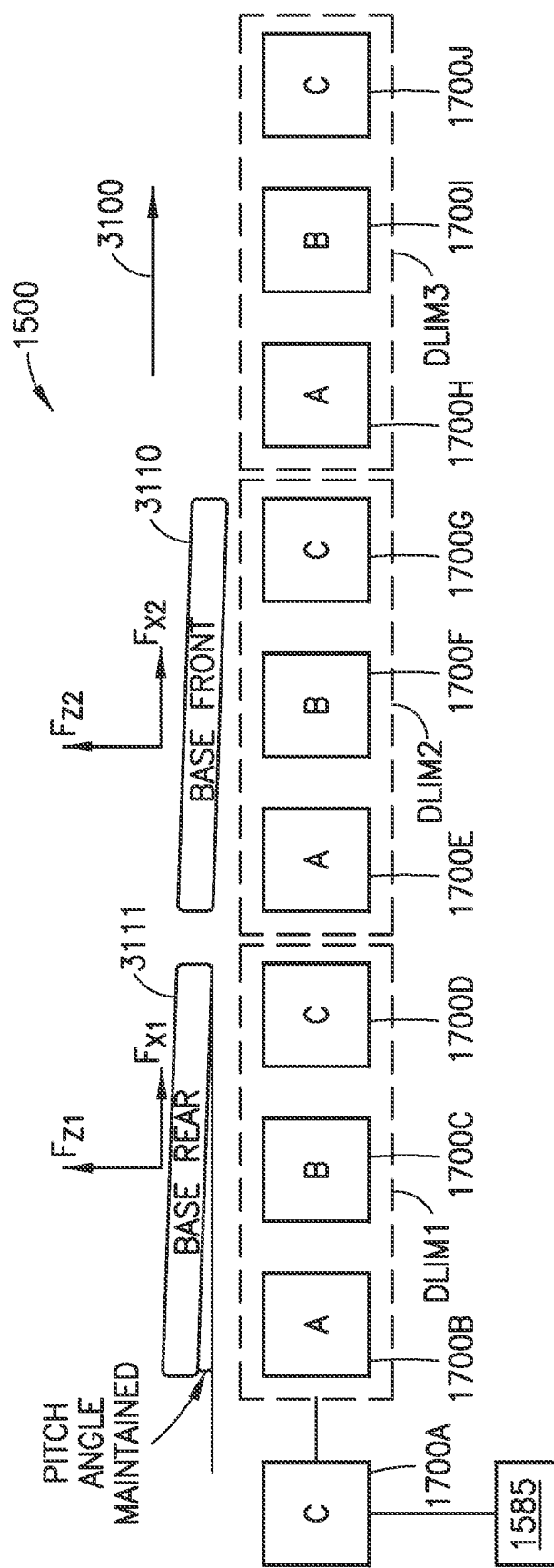

FIGS. 39A and 39B illustrate an example where each electromagnet (or coil unit) 1700A-1700n is grouped so as to define a motor actuator unit 1701 having a dynamically selected number of electromagnets, for example three electromagnets (n=3) and three corresponding phases (m=3) with an electrical angle between the phases of 1200 (see also FIG. 17) is also dynamically associated with the three different phases A, B, C so that association of each phase A, B, C with the corresponding static electromagnet 1700A-1700n comports with the dynamic state of the motor actuation unit 1701. Accordingly, with the electromagnets of the motor actuator unit 1701 propelling the base 1510 (and sensing the position of the base 1510) (e.g., along direction 3100) each phase A, B, C respectively changes or moves from one static electromagnet to another (i.e., rolling the designation or allocation of the respective phases to consecutive electromagnets 1700A-1700n so as to generate a virtual (motion) multi-phase actuator/position sensing unit 3000, 3000$t$P$_1$, 3000$t$P$_2$ of each of the linear electrical machine 1599 and the electrical machine 1599R proceeding in the direction of motion 3100 commensurate with motion of the base 1510 generated by the excitation of the electromagnets 1700A-1700n corresponding to the virtual motion multi-phase actuation unit 3000, 3000$t$P$_1$, 3000$t$P$_2$. This dynamic relationship or association producing the virtual motion multi-phase actuator unit 3000, 3000$t$P$_1$, 3000$t$P$_2$ between coil units and phase will be referred to here for convenience as "dynamic phase allocation" wherein the virtual motion of the representative virtual motion multi-phase actuator unit 3000, 3000$t$P$_1$, 3000$t$P$_2$ effecting propulsion of the base 1510 is illustrated schematically in FIG. 38 (see also FIG. 17). Here the virtual motion multi-phase actuator/position sensing unit (or "MAU" in FIG. 17) 3000 has dynamically selected three electromagnets and associated phases A, B, C, shown in an initial (representative) position P=0 at time t=t0. The respective excitation of the virtual motion multi-phase actuator unit 3000 electromagnets generate propulsion forces that move the platen/base 1510 between t1 and t2 (see also FIGS. 39A and 39B). Here, as shown, at P=0 and t=t0, electromagnets 1700A-1700C are grouped to form virtual motion multi-phase actuator unit 3000, and are respectively associated with phases A, B, C. Coincident with generation of propulsion forces Fx, respective excitation of virtual motion multi-phase actuator unit 3000 electromagnets 1700A-1700C generate separately controllable lift forces Fy with a controlled variable height relative to the platen/base 1510, that simultaneously lifts and effect tilt adjustment of the platen/base 1510 simultaneously with propulsion (see FIGS. 39A and 39B). As may be realized, under effect of the lift Fy and propulsion Fx forces imparted by the respective electromagnets 1700A-1700C of the virtual motion multi-phase actuator unit 3000 at time t=t0 and position P=0 the platen/base 1510 moves (relative to the transfer chamber and hence the static electromagnets 1700A-1700C) with a predetermined lift and tilt. To maintain steady state tilt of the platen/base 1510 during motion away from the group of electromagnets 1700A-1700C (defining virtual motion multi-phase actuator unit 3000 at P=0 and T=T0) the controller 199 and circuitry 3050, of the respective electromagnets of the electromagnet array 1700A-1700n, are configured to dynamically "move" (or "change") the allocation of the respective phases A, B, C (from the initial virtual motion multi-phase actuator unit 3000 at P=0 and t=t0) commensurate with the travel of the platen/base 1510 at time t=t1 and position P=1 to corresponding electromagnets 1700B-1700D that now define virtual motion multi-phase actuator unit 3000$t$P1 disposed at position P=1 at time t=t1, and subsequently allocation of the respective phases A, B, C (from the virtual motion multi-phase actuator unit 3000$t$P1 at P=1 and t=t1) commensurate with the travel of the platen/base 1510 at time t=t2 and position P=2 to corresponding electromagnets 1700C-1700E that now define virtual motion multi-phase actuator unit 3000*t*P2 disposed at position P=2 at time t=t2, and so on. Dynamic phase allocation is repeated throughout platen/base 1510 motion so that the phase distribution with respect to the platen, and excitation by respective phases (here A, B, C) of the platen/base 1510 remain substantially steady state throughout motion of the platen/base 1510.

The virtual multi-phase actuator/position sensing unit 3000, 3000*t*P$_1$, 3000*t*P$_2$ may comprise a series of electromagnets 1700A-1700*n* of the array of electromagnets 1700 coupled to at least the multiphase alternating current power source 1585 that define at least one drive line 177-180 within the drive plane 1598, where electromagnets 1700A-1700*n* in the series of electromagnets 1700A-1700*n* are dynamically grouped into at least one multiphase actuator unit DLIM1, DLIM2, DLIM3, and each of the at least one multiphase actuator unit DLIM1, DLIM2, DLIM3 being coupled to at least the multiphase alternating current power source 1585. In this case, on initiating propulsion (effecting motion of the base/secondary) by excitation of corresponding electromagnet groups of the motor actuation unit at an initial position (P=0, t=0) the definition of phases A, B, C and the associated "motors" (e.g., DLIM1, DLIM2, DLIM3) are changing in space and time (Pi, ti), as described above, in order to maintain substantially steady state force vectors FZ1, FZ2, FX1, FX2 imparted on the base 1510 throughout the range of motion, that provide a desired substantially steady state or constant tilt orientation of the substrate handler 1500 throughout the range of motion. As noted herein, an exemplary actuator control system network 1799 configured to effect dynamic phase allocation is described with respect to FIG. 17. As can be seen in FIGS. 39A and 39B, the dynamic phase allocation is controlled by the controller 199 so that the respective electromagnets 1700A-1700*n* grouped into corresponding motor actuation units (such as described herein) energized by the multiphase alternating current A, B, C present, with respect to the base 1510 (represented by the front portion 3110 and rear portion 3111), a substantially steady state multiphase distribution across respective electromagnets 1700A-1700*n* of the virtually moving at least one multiphase actuator unit DLIM1, DLIM2, DLIM3. It is noted that the phase currents A, B, C are illustrated within respective electromagnets 1700A-1700*n* and the phase current distribution across the at least one multiphase actuator unit DLIM1, DLIM2, DLIM3 remains constant or steady state with respect to the base 1510 (e.g., as an example of steady state note phase current A remains at the trailing end of the rear portion 3111, phase current C remains at the leading end of the rear portion 3111, and phase current B remains in the center of the rear portion 3111 throughout movement of the base 1510 and the at least one (virtually moving) multiphase actuator unit DLIM1, DLIM2, DLIM3 in the direction 3100).

Figure 39C:
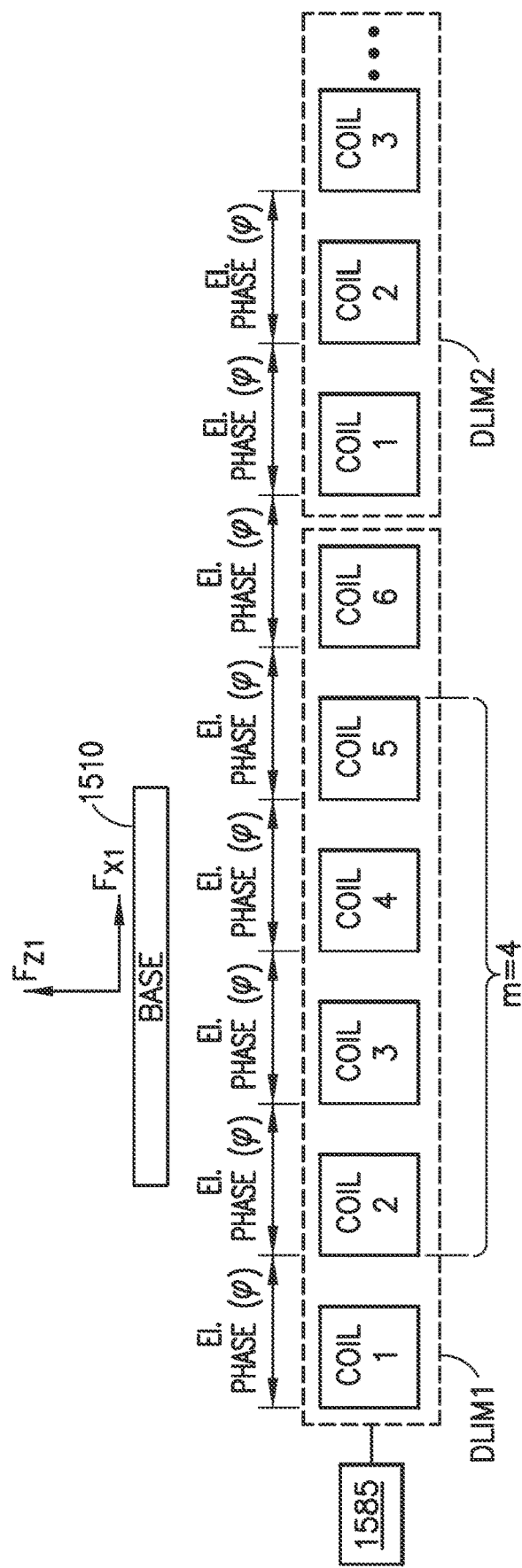
FIG. 39C illustrates electrical phase angle control with the actuator control system network to effect independent propulsion and lift control of a substrate handler in accordance with aspects of the disclosed embodiment.

In greater detail of dynamic phase allocation, FIG. 38 depicts at time t1 electromagnets 1700A, 1700B, 1700C which are respectively defined as phases A, B, C (FIGS. 38 and 39A) which generate a spatial force vector(s) that provides separately controllable lift and propulsion forces of a predetermined wafer handler 1500 (i.e., a wafer handler identified by its unique signature as determined by the predetermined excitation characteristic (such as, e.g., a phase lag) of the electromagnets and selected for movement by the controller 199). As the substrate handler 1500 moves in space (e.g., along the drive line associated with the array of electromagnets 1700), at time t2 electromagnets 1700B, 1700C, 1700D respectively become phases A, B, C (FIGS. 38 and 39B). As the substrate handler 1500 continues to travel along the drive line (which in this example is in direction 3100 as shown in FIGS. 39A, 39B, and 39C), at time t3 phases A, B, C are associated with electromagnets 1700C, 1700D, 1700E, respectively. This dynamic phase allocation effects continuous spatial and time control of the force vectors that maintain propulsion, lift, and orientation of the predetermined substrate handler 1500. In one aspect, the alternating current power source 1585 is coupled to each of the electromagnets 1700A-1700*n* of the array of electromagnets 1700 through any suitable signal conditioning circuitry 3050 which may include current amplification power supply units 3011 or any other suitable signal processing. The phase A, B, C currents are transmitted to each of the local drive controllers 1750A-1750*n* which, under control of or in response to instruction from, master controller 1760 provide a specified one of the phase A, B, C currents to the respective electromagnets in the manner noted above to effect dynamic phase allocation.

As described herein, the base 1510 (FIG. 16B) of a substrate handler cooperates with the electromagnets 1700A-1700*n* of the at least one multiphase actuator unit (FIG. 39A) DLIM, DLIM2, DLIM3 so that excitation of the electromagnets 1700A-1700*n* with alternating current generates levitation and propulsion forces against the base 1510 that controllably levitate and propel the base 1510 along the at least one drive line 177-180, in a controlled attitude relative to the drive plane 1598. The controller 199 (which in some aspects includes at least the master controller 1760 and any controller subordinate to the master controller such as the local drive controllers 1750A-1750*n*; however in other aspects the controller may have any suitable configuration), is operable coupled to the alternating current power source 1585 and the array of electromagnets 1700. The alternating current power source 1585 may include any suitable associated circuitry 3050 through which the alternating current power source 1585 is connected to the array of electromagnets 1700. The alternating current power source 1585 is controlled by the local drive controllers or any other suitable controller such as the master controller 1760. Typical control parameters for the alternating current power source comprise of signal amplitude, signal frequency, and phase shift relative to a reference coil unit. Other types of control parameters may be defined. As used herein the "phase" A, B, C as illustrated in FIG. 38 is similar to a particular coil in a multi-phase electrical motor; however, the each of the phase definitions (such as A, B, C in FIG. 38) is not physically tied to any particular coil.

As described before, and now referring to FIG. 39C in one aspect, controlling propulsion and levitation simultaneously and separately (so that propulsion forces and lift forces are separately controllable in full, so that control of each may be deemed independent of one another though both forces are effected by excitation with common multiphase alternating current having a single common frequency per phase, the common frequency per phase is selectably variable from different desired frequencies) may be effected by a variant of the dynamic phase allocation described herein, where one or more dynamic linear motor (DLIM) may include a selectable n number of phases associated with electromagnets defining the virtual motion multi-phase actuator unit, where n can be an integer larger than three. The number n of electromagnets defining the virtual motion multi-phase actuator unit may be dynamically selected, for example, for effecting different moves of the platen/base 1510 depending on kinematic characteristics of the desired move. Here the excitation frequency commonly applied per phase of the virtual motion multi-phase actuator unit is selected by the controller 199 so as to generate desired kinematic performance and control of the platen/base 1510. Here, the phase control algorithm maintains the same electrical phase angle difference between the phases (e.g., electromagnets of the motor), as shown in FIG. 39C. The electrical phase difference is calculated relative to a reference phase or relative to each phase. The electrical phase angle difference p between phases may have a range so as to produce positive and negative values of propulsion forces while maintaining levitation. Depending on the value of the electrical phase angle difference (p the number of electromagnets within a respective dynamic linear motor varies. Here, the boundary between DLIM1 (illustrated for exemplary purposes with 6 electromagnets) and DLIM2 as shown in FIG. 32C is dynamic. In another aspect of the dynamic linear motor electromagnet/phase allocation, not all electromagnets of a dynamic linear motor need to be energized at the same time. Referring to DLIM 1, only m (in this example m=4) electromagnets out of all n (in this example n=6) electromagnets of dynamic linear motor DLIM1 (where m is the number of electromagnets covered by the base (or secondary)) are energized to effect lift and propulsion of the base 1510, while the other electromagnets of the n electromagnets of the dynamic linear motor DLIM1 can be turned off.

Figure 42:
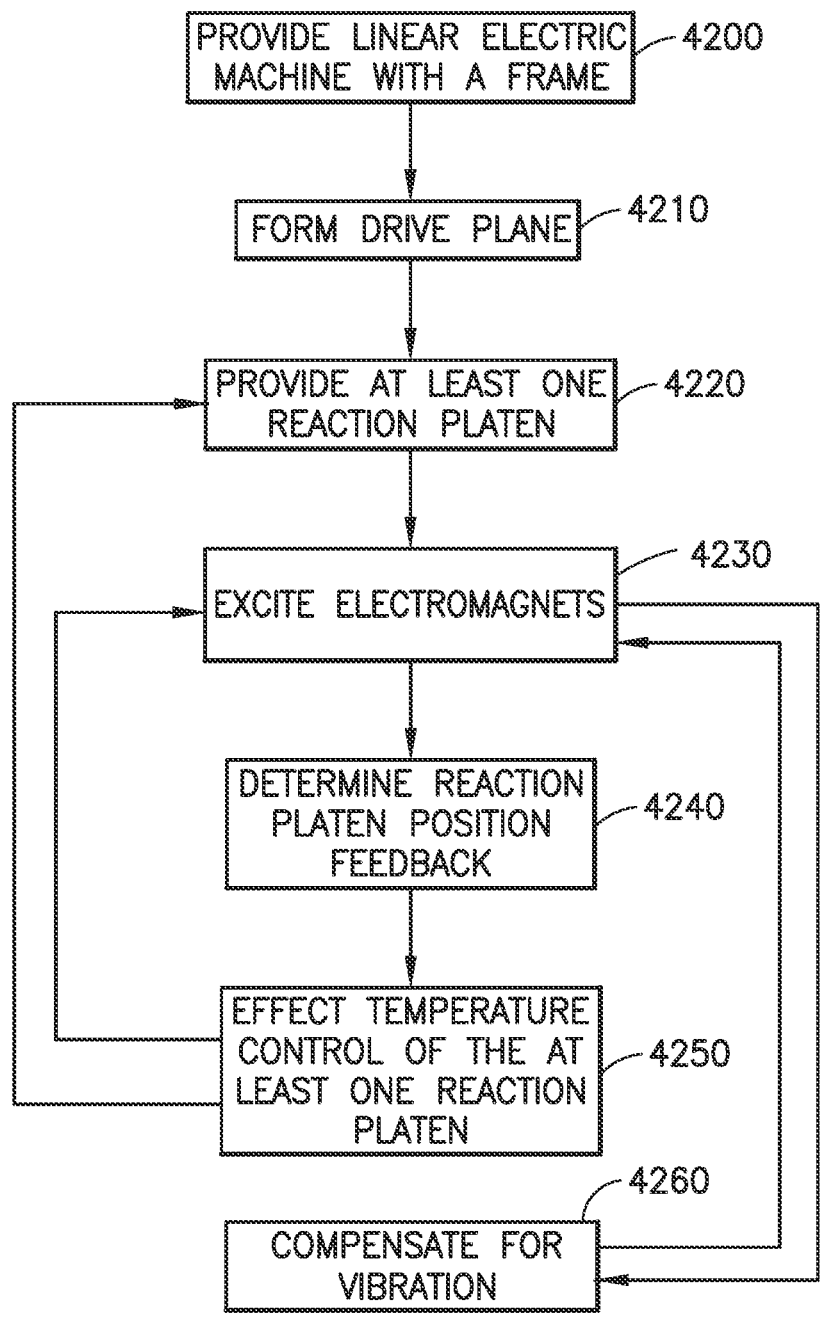
FIG. 42 is a flow chart of an exemplary method in accordance with aspects of the disclosed embodiment.

Referring to FIGS. 1A-28 and 42 an exemplary method for a linear electrical machine (such as those described herein) will be described. In accordance with the method, the linear electrical machine 1599 is provided with a frame 118M (FIG. 42, Block 4200) having a level reference plane 1299. A drive plane 1598, with an array of electromagnets 1700 connected to the frame 118M, is formed (FIG. 42, Block 4210) at a predetermined height H relative to the level reference plane 1299. The array of electromagnets 1700 is arranged so that a series of electromagnets 1700A-1700n, 1700A1-1700n1, 1700A2-1700N2, 1700A3-1700n3, 1700A4-1700n4, 1700A5-1700n5 of the array of electromagnets 1700 define at least one drive line (e.g., such as one or more of drive lines 177-180) within the drive plane 1598, and each of the electromagnets 1700A-1700n, 1700A1-1700n1, 1700A2-1700N2, 1700A3-1700n3, 1700A4-1700n4, 1700A5-1700n5 being coupled to an alternating current power source 1585 energizing each electromagnet 1700A-1700n, 1700A1-1700n1, 1700A2-1700N2, 1700A3-1700n3, 1700A4-1700n4, 1700A5-1700n5. At least one reaction platen 1510 (also referred to as a base) of paramagnetic, diamagnetic, or non-magnetic conductive material is provided (FIG. 42, Block 4220) and is disposed to cooperate with the electromagnets 1700A-1700n, 1700A1-1700n1, 1700A2-1700N2, 1700A3-1700n3, 1700A4-1700n4, 1700A5-1700n5 of the array of electromagnets 1700. The electromagnets 1700A-1700n, 1700A1-1700n1, 1700A2-1700N2, 1700A3-1700n3, 1700A4-1700n4, 1700A5-1700n5 are excited (FIG. 42, Block 4230) with alternating current to generate levitation and propulsion forces against the reaction platen 1510 that controllably levitate and propel the reaction platen 1510 along the at least one drive line 177-180, in a controlled attitude relative to the drive plane 1598 where the electromagnets 1700A-1700n, 1700A1-1700n1, 1700A2-1700N2, 1700A3-1700n3, 1700A4-1700n4, 1700A5-1700n5 are sequentially excited, with a controller (such as one or more of controllers 199, 1750, 1750A-1750n or other controller as described herein) operably coupled to the array of electromagnets 1700 and the alternating current power source, with multiphase alternating current with a predetermined excitation characteristic (e.g., inductance, phase lag/amplitude, and/or power factor as described herein) so that each reaction platen 1510 is levitated and propelled with up to six degrees of freedom. As described herein, vibration of the at least one reaction platen 1510 is compensated for with the passive vibration compensator or absorber 4700A, 4700B. The reaction platen position feedback is determined with the controller (such as with one or more of those controllers described herein) (FIG. 42, Block 4240), in at least one degree of freedom from the up to six degrees of freedom, from variance in the predetermined excitation characteristic of the alternating current of at least one electromagnet 1700A-1700n, 1700A1-1700n1, 1700A2-1700N2, 1700A3-1700n3, 1700A4-1700n4, 1700A5-1700n5 effecting levitation or propulsion of the reaction platen 1510. The variance in the predetermined characteristic defines self-deterministic reaction platen position feedback of each of the at least one electromagnet 1700A-1700n, 1700A1-1700n1, 1700A2-1700N2, 1700A3-1700n3, 1700A4-1700n4, 1700A5-1700n5, of the array of electromagnets 1700, effecting levitation or propulsion of the reaction platen 1510. As described herein, vibration of the base 1510 is compensated for (FIG. 42, Block 4260) so that the end effector (and any wafers thereon) are substantially free of vibrations induced by the excitation of the electromagnets and levitation of the base 1510. Temperature control of the reaction platen 1510 may also be effected (FIG. 42, Block 4250) where the at least one reaction platen 1510 is seated on the floor 118L of the transport chamber 118 and/or the at least one reaction platen 1510 is replaced with another reaction platen 1510ALT via the service lock SL.

Figure 43:
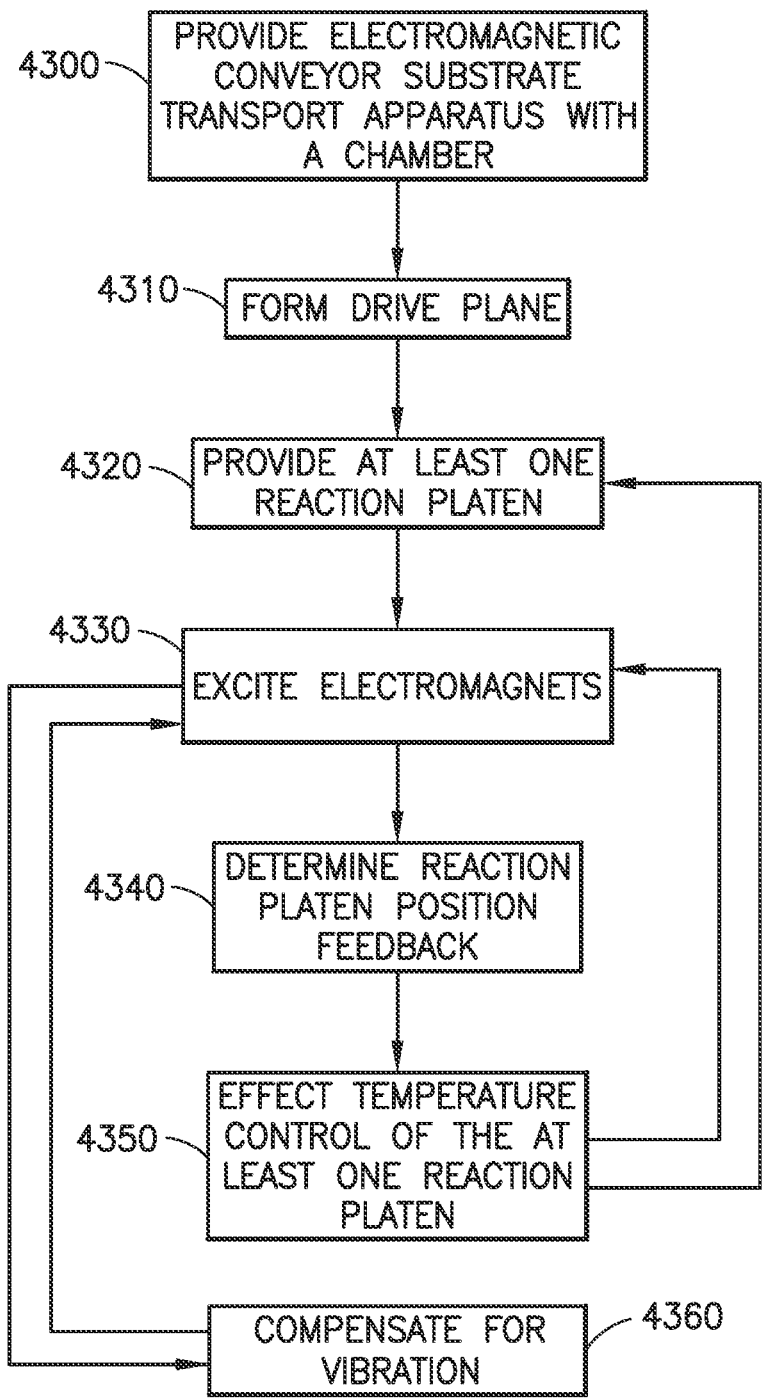
FIG. 43 is a flow chart of an exemplary method in accordance with aspects of the disclosed embodiment.

Referring to FIGS. 1A-28 and 43 an exemplary method for a linear electrical machine (such as those described herein) will be described. In accordance with the method, the electromagnetic conveyor substrate transport apparatus 1599 is provided with a chamber 118 (FIG. 43, Block 4300) configured to hold a sealed atmosphere therein. The chamber 118 has a level reference plane 1299 and at least one substrate pass through opening 1180 for transferring a substrate in and out of the chamber 118 through the opening 1180. A drive plane 1598 is formed (FIG. 43, Block 4310) with an array of electromagnets 1700 connected to the chamber 118 at a predetermined height H relative to the level reference plane 1299. The array of electromagnets 1700 is arranged so that a series of electromagnets 1700A-1700n, 1700A1-1700n1, 1700A2-1700N2, 1700A3-1700n3, 1700A4-1700n4, 1700A5-1700n5 of the array of electromagnets 1700 define at least one drive line (e.g., such as one or more of drive lines 177-180) within the drive plane 1598. The electromagnets in the series of electromagnets 1700A-1700n, 1700A1-1700n1, 1700A2-1700N2, 1700A3-1700n3, 1700A4-1700n4, 1700A5-1700n5 are grouped into at least one multiphase actuator unit, and each of the at least one multiphase actuator unit being coupled to a multiphase alternating current power source 1585. At least one reaction platen of paramagnetic, diamagnetic, or non-magnetic conductive material is provided (FIG. 43, Block 4320) and is disposed to cooperate with the electromagnets 1700A-1700n, 1700A1-1700n1, 1700A2-1700N2, 1700A3-1700n3, 1700A4-1700n4, 1700A5-1700n5 of the at least one multiphase actuator unit. The electromagnets 1700A-1700n, 1700A1-1700n1, 1700A2-1700N2, 1700A3-1700n3, 1700A4-1700n4, 1700A5-1700n5 are excited (FIG. 43, Block 4330) with alternating current to generate levitation and propulsion forces against the reaction platen 1510 that controllably levitate and propel the reaction platen 1510 along the at least one drive line 177-180, in a controlled attitude relative to the drive plane 1598. The electromagnets 1700A-1700n, 1700A1-1700n1, 1700A2-1700N2, 1700A3-1700n3, 1700A4-1700n4, 1700A5-1700n5 are sequentially excited, with a controller (such as those controller described herein) operably coupled to the array of electromagnets 1700 and alternating current power source 1585, with multiphase alternating current with a predetermined excitation characteristic so that the at least one reaction platen 1510 is levitated and propelled. As described herein, vibration of the at least one reaction platen 1510 is compensated for with the passive vibration compensator or absorber 4700A, 4700B. Reaction platen position feedback is determined with the controller (such as those controllers described herein) (FIG. 43, Block 4340) from variance in the predetermined excitation characteristic of the alternating current of at least one electromagnet 1700A-1700n, 1700A1-1700n1, 1700A2-1700N2, 1700A3-1700n3, 1700A4-1700n4, 1700A5-1700n5 of the at least one multiphase actuator unit effecting levitation and propulsion of the at least one reaction platen 1510. The variance in the predetermined characteristic defines self-deterministic reaction platen position feedback of each of the electromagnets 1700A-1700n, 1700A1-1700n1, 1700A2-1700N2, 1700A3-1700n3, 1700A4-1700n4, 1700A5-1700n5 of the at least one multiphase actuator unit effecting levitation and propulsion of the at least one reaction platen 1510. As described herein, vibration of the base 1510 is compensated for (FIG. 43, Block 4360) so that the end effector (and any wafers thereon) are substantially free of vibrations induced by the excitation of the electromagnets and levitation of the base 1510. Temperature control of the reaction platen 1510 may also be effected (FIG. 43, Block 4350) where the at least one reaction platen 1510 is seated on the floor 118L of the transport chamber 118 and/or the at least one reaction platen 1510 is replaced with another reaction platen 1510ALT via the service lock SL.

Figure 51:
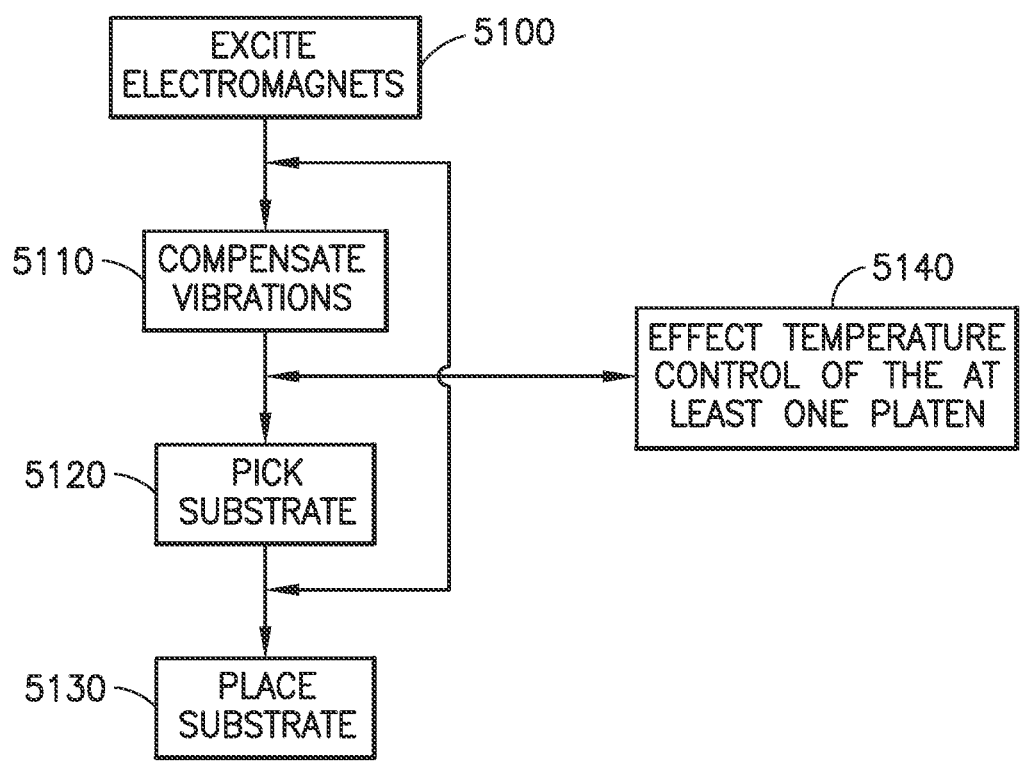
FIG. 51 is an exemplary flow diagram of a substrate transfer in accordance with aspects of the disclosed embodiment.

Referring now to FIG. 51, and exemplary substrate S transfer operation will be described. It is noted that the substrate transfer operation described herein is applicable to the above-described each of the above described aspects of the disclosed embodiments. In the substrate transfer operation the electromagnets 1700A-1700n, 1700A1-1700n1, 1700A2-1700N2, 1700A3-1700n3, 1700A4-1700n4, 1700A5-1700n5 are excited (FIG. 51, Block 5100) in the manner described above with respect to FIG. 42, Block 4230 and/or FIG. 43, Block 4330 so that the base 1510 of the wafer handler 1500-1500B is levitated. With the base 1510 of the wafer handler 1500-1500B levitated, vibrations induced in the base 1510 from the levitation are compensated for (FIG. 51, Block 5110), as described above with respect to any one or more of FIGS. 47A-48C (see also FIG. 42, Block 4260 and FIG. 43, Block 4360) so that the end effector 1520 and any substrate S held thereon are substantially free of vibrations. The wafer handler 1500-1500B is moved along one or more transport paths (as described herein) so as to pick one or more substrates S from any suitable substrate holding station(s) described herein (FIG. 51, Block 5120). The wafer handler 1500-1500B is moved along the one or more transport paths to position the substrate S for placement at the same or a different substrate holding station (FIG. 51, Block 5130). Placement of the substrates may be effected with the wafer handler 1500-1500B being configured with a single end effector 1520 (see, e.g., for exemplary purposes only, at least FIG. 1A), a double sided/ended end effector 1520 (see, see, e.g., for exemplary purposes only, at least FIGS. 13A and 16A-16C), or with multiple end effectors 1520A, 1520B (see, e.g., for exemplary purposes only, at least FIGS. 10A-11A). As described herein, the temperature of the base 1510 may be monitored in any suitable manner (e.g., such as with wireless temperature sensors mounted on the base 1510, optical temperature sensors positioned to detect the base 1510 temperature as the wafer handler 1500-1500B moves through a transport chamber, etc.) so as to effect temperature control of the base 1510 (FIG. 51, Block 5140) of the wafer handler 1500-1500B in the manner described above with respect to FIG. 46 (see also FIG. 42, Block 4250 and/or FIG. 43, Block 4350). Temperature control of the base 1510 may be effected when the wafer handler 1500-1500B is idle (e.g., not holding a substrate such as between wafer transfers or during a fast swapping of substrates), or in other aspects with the wafer handler 1500-1500B holding a substrate.

In accordance with one or more aspects of the disclosed embodiment a linear electrical machine comprises: a frame with a level reference plane; an array of electromagnets, connected to the frame to form a drive plane at a predetermined height relative to the level reference plane, the array of electromagnets being arranged so that a series of electromagnets of the array of electromagnets define at least one drive line within the drive plane, and each of the electromagnets being coupled to an alternating current power source energizing each electromagnet; at least one reaction platen of paramagnetic, diamagnetic, or non-magnetic conductive material disposed to cooperate with the electromagnets of the array of electromagnets so that excitation of the electromagnets with alternating current generates levitation and propulsion forces against the reaction platen that controllably levitate and propel the reaction platen along the at least one drive line, in a controlled attitude relative to the drive plane; and a controller operably coupled to the array of electromagnets and the alternating current power source and configured so as to sequentially excite the electromagnets with multiphase alternating current with a predetermined excitation characteristic so that each reaction platen is levitated and propelled with up to six degrees of freedom, wherein the controller is configured so as to determine reaction platen position feedback, in at least one degree of freedom from the up to six degrees of freedom, from variance in the predetermined excitation characteristic of the alternating current of at least one electromagnet effecting levitation or propulsion of the reaction platen, wherein the variance in the predetermined excitation characteristic defines self-deterministic reaction platen position feedback of each of the at least one electromagnet, of the array of electromagnets, effecting levitation or propulsion of the reaction platen.

In accordance with one or more aspects of the disclosed embodiment the six degrees of freedom include at least one of attitude control and yaw control, the at least one of the attitude control and the yaw control are effected with a common set of electromagnets of the array of electromagnets, where each electromagnet generates, from excitation with common multiphase alternating current having a single common frequency per phase, both the levitation and the propulsion forces against the reaction platen so as to control the reaction platen with the up to six degrees of freedom including at least one of reaction platen attitude and reaction platen yaw at least with the reaction platen levitated.

In accordance with one or more aspects of the disclosed embodiment the self-deterministic reaction platen position feedback is an absolute position feedback.

In accordance with one or more aspects of the disclosed embodiment the predetermined excitation characteristic is one or more of inductance, a power factor, an impedance, and a lag between voltage and current of the multiphase alternating current.

In accordance with one or more aspects of the disclosed embodiment the at least one reaction platen comprises more than one reaction platen, each of the more than one reaction platen having a corresponding shape that defines a respective power factor signature; and the controller is configured to determine a position of each reaction platen based on the respective power factor signature.

In accordance with one or more aspects of the disclosed embodiment a frequency is superimposed on a fundamental frequency of a voltage generated by the alternating current power source, the frequency being separate and distinct from the fundamental frequency so as to decouple position feedback determination from levitation and propulsion of the at least one reaction platen.

In accordance with one or more aspects of the disclosed embodiment the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the frame to a second different predetermined position with respect to the frame.

In accordance with one or more aspects of the disclosed embodiment the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the frame.

In accordance with one or more aspects of the disclosed embodiment the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the frame, to a second different predetermined orientation relative to the frame.

In accordance with one or more aspects of the disclosed embodiment the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the frame.

In accordance with one or more aspects of the disclosed embodiment the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the controller is configured to determine acceleration of the reaction platen along the drive plane at least from the variance in the predetermined excitation characteristic, and in response to the acceleration determined, control a bias attitude of the reaction platen to provide the predetermined bias attitude countering the payload inertial force arising from the acceleration of the reaction platen.

In accordance with one or more aspects of the disclosed embodiment the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment the controller is configured with a predetermined reaction platen temperature management protocol effecting temperature control of the at least one reaction platen.

In accordance with one or more aspects of the disclosed embodiment the predetermined reaction platen temperature management protocol controls a temperature of the at least one reaction platen via conduction from the at least one reaction platen to a thermal sink commensurate at least with a wafer swap operation of the at least one reaction platen.

In accordance with one or more aspects of the disclosed embodiment the linear electrical machine further includes at least another reaction platen, that is alternate to the at least one reaction platen, and held inactive so as to be in a cold state, relative to the at least one reaction platen in its operative state, and the predetermined reaction platen temperature management protocol includes the at least another reaction platen being switched to an operative state and replacing the at least one reaction platen, at its temperature limit, with the at least another reaction platen.

In accordance with one or more aspects of the disclosed embodiment the linear electrical machine further includes a passive vibration compensator having a natural frequency mode tuned to compensate for vibration of the at least one reaction platen under levitation propulsion forces so as to effect a substantially vibration free end effector with respect to the end effector natural vibration frequency modes, wherein the at least one reaction platen includes a respective end effector.

In accordance with one or more aspects of the disclosed embodiment an electromagnetic conveyor substrate transport apparatus comprises: a chamber configured to hold a sealed atmosphere therein, and having a level reference plane and at least one substrate pass through opening for transferring a substrate in and out of the chamber through the opening; an array of electromagnets, connected to the chamber to form a drive plane at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source; at least one reaction platen of paramagnetic, diamagnetic, or non-magnetic conductive material disposed to cooperate with the electromagnets of the at least one multiphase actuator unit so that excitation of the electromagnets with alternating current generates levitation and propulsion forces against the reaction platen that controllably levitate and propel the reaction platen along the at least one drive line, in a controlled attitude relative to the drive plane; and a controller operably coupled to the array of electromagnets and alternating current power source and configured so as to sequentially excite the electromagnets with multiphase alternating current with a predetermined excitation characteristic so that the at least one reaction platen is levitated and propelled, wherein the controller is configured so as to determine reaction platen position feedback from variance in the predetermined excitation characteristic of the alternating current of at least one electromagnet of the at least one multiphase actuator unit effecting levitation and propulsion of the at least one reaction platen, wherein the variance in the predetermined characteristic defines self-deterministic reaction platen position feedback of each of the electromagnets of the at least one multiphase actuator unit effecting levitation and propulsion of the at least one reaction platen.

In accordance with one or more aspects of the disclosed embodiment each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

In accordance with one or more aspects of the disclosed embodiment the self-deterministic reaction platen position feedback is an absolute position feedback.

In accordance with one or more aspects of the disclosed embodiment the predetermined excitation characteristic is one or more of inductance, a power factor, an impedance, and a lag between voltage and current of the multiphase alternating current.

In accordance with one or more aspects of the disclosed embodiment the at least one reaction platen comprises more than one reaction platen, each of the more than one reaction platen having a corresponding shape that defines a respective power factor signature; and the controller is configured to determine a position of each reaction platen based on the respective power factor signature.

In accordance with one or more aspects of the disclosed embodiment a frequency is superimposed on a fundamental frequency of a voltage generated by the multiphase alternating current power source, the frequency being separate and distinct from the fundamental frequency so as to decouple position feedback determination from levitation and propulsion of the at least one reaction platen.

In accordance with one or more aspects of the disclosed embodiment the reaction platen is levitated and propelled with up to six degrees of freedom including at least one of attitude and yaw control with the virtually moving at least one multiphase actuator unit.

In accordance with one or more aspects of the disclosed embodiment the controller controls the up to six degrees of freedom, generated by the array of electromagnets, including at least the reaction platen attitude with the reaction platen levitated and propelled so as to move relative to the array of electromagnets along the at least one drive line from a first predetermined position with respect to the chamber to a second different predetermined position with respect to the chamber.

In accordance with one or more aspects of the disclosed embodiment the controller controls the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the chamber.

In accordance with one or more aspects of the disclosed embodiment the dynamic phase allocation is controlled so that the virtually moving at least one multiphase actuator unit moves virtually along the drive line substantially coincident with reaction platen movement along the drive line from propulsion by the virtually moving at least one multiphase actuator unit.

In accordance with one or more aspects of the disclosed embodiment the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

In accordance with one or more aspects of the disclosed embodiment the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

In accordance with one or more aspects of the disclosed embodiment the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the controller is configured to determine acceleration of the reaction platen along the drive plane at least from the variance in the predetermined excitation characteristic, and in response to the acceleration determined, control a bias attitude of the reaction platen to provide the predetermined bias attitude countering the payload inertial force arising from the acceleration of the reaction platen.

In accordance with one or more aspects of the disclosed embodiment the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment the dynamic phase allocation is controlled so that the respective electromagnets energized by the multiphase alternating current present, with respect to the reaction platen, a substantially steady state multiphase distribution across respective electromagnets of the virtually moving at least one multiphase actuator unit.

In accordance with one or more aspects of the disclosed embodiment the controller is configured with a predetermined reaction platen temperature management protocol effecting temperature control of the at least one reaction platen.

In accordance with one or more aspects of the disclosed embodiment the predetermined reaction platen temperature management protocol controls a temperature of the at least one reaction platen via conduction from the at least one reaction platen to a thermal sink commensurate at least with a wafer swap operation of the at least one reaction platen.

In accordance with one or more aspects of the disclosed embodiment the linear electrical machine further includes at least another reaction platen, that is alternate to the at least one reaction platen, and held inactive so as to be in a cold state, relative to the at least one reaction platen in its operative state, and the predetermined reaction platen temperature management protocol includes the at least another reaction platen being switched to an operative state and replacing the at least one reaction platen, at its temperature limit, with the at least another reaction platen.

In accordance with one or more aspects of the disclosed embodiment the linear electrical machine further includes a passive vibration compensator having a natural frequency mode tuned to compensate for vibration of the at least one reaction platen under levitation propulsion forces so as to effect a substantially vibration free end effector with respect to the end effector natural vibration frequency modes, wherein the at least one reaction platen includes a respective end effector.

In accordance with one or more aspects of the disclosed embodiment a method for a linear electrical machine is provided. The method comprises: providing the linear electrical machine with a frame having a level reference plane; forming a drive plane, with an array of electromagnets connected to the frame, at a predetermined height relative to the level reference plane, the array of electromagnets being arranged so that a series of electromagnets of the array of electromagnets define at least one drive line within the drive plane, and each of the electromagnets being coupled to an alternating current power source energizing each electromagnet; providing at least one reaction platen of paramagnetic, diamagnetic, or non-magnetic conductive material disposed to cooperate with the electromagnets of the array of electromagnets; exciting the electromagnets with alternating current to generate levitation and propulsion forces against the reaction platen that controllably levitate and propel the reaction platen along the at least one drive line, in a controlled attitude relative to the drive plane where the electromagnets are sequentially excited, with a controller operably coupled to the array of electromagnets and the alternating current power source, with multiphase alternating current with a predetermined excitation characteristic so that each reaction platen is levitated and propelled with up to six degrees of freedom; and determining, with the controller, reaction platen position feedback, in at least one degree of freedom from the up to six degrees of freedom, from variance in the predetermined excitation characteristic of the alternating current of at least one electromagnet effecting levitation or propulsion of the reaction platen, wherein the variance in the predetermined characteristic defines self-deterministic reaction platen position feedback of each of the at least one electromagnet, of the array of electromagnets, effecting levitation or propulsion of the reaction platen.

In accordance with one or more aspects of the disclosed embodiment the six degrees of freedom include at least one of attitude control and yaw control, the at least one of the attitude control and the yaw control are effected with a common set of electromagnets of the array of electromagnets, where each electromagnet generates, from excitation with common multiphase alternating current having a single common frequency per phase, both the levitation and the propulsion forces against the reaction platen so as to control the reaction platen with the up to six degrees of freedom including at least one of reaction platen attitude and reaction platen yaw at least with the reaction platen levitated.

In accordance with one or more aspects of the disclosed embodiment the self-deterministic reaction platen position feedback is an absolute position feedback.

In accordance with one or more aspects of the disclosed embodiment the predetermined excitation characteristic is one or more of inductance, a power factor, an impedance, and a lag between voltage and current of the multiphase alternating current.

In accordance with one or more aspects of the disclosed embodiment the at least one reaction platen comprises more than one reaction platen and each of the more than one reaction platen has a corresponding shape that defines a respective power factor signature, the method further comprises: determining, with the controller, a position of each reaction platen based on the respective power factor signature.

In accordance with one or more aspects of the disclosed embodiment the method further comprises: superimposing a frequency on a fundamental frequency of a voltage generated by the alternating current power source, the frequency being separate and distinct from the fundamental frequency so as to decouple position feedback determination from levitation and propulsion of the at least one reaction platen.

In accordance with one or more aspects of the disclosed embodiment the method further comprises: controlling, with the controller, the up to six degrees of freedom, generated by the array of electromagnets, including at least the reaction platen attitude with the reaction platen levitated and propelled so as to move relative to the array of electromagnets along the at least one drive line from a first predetermined position with respect to the frame to a second different predetermined position with respect to the frame.

In accordance with one or more aspects of the disclosed embodiment the method further comprises: controlling, with the controller, the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the frame.

In accordance with one or more aspects of the disclosed embodiment the method further comprises: controlling, with the controller, the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the frame, to a second different predetermined orientation relative to the frame.

In accordance with one or more aspects of the disclosed embodiment the method further comprises: controlling, with the controller, the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the frame.

In accordance with one or more aspects of the disclosed embodiment the method further comprises: controlling, with the controller, the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the method further comprises: controlling, with the controller, the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the method further comprises: determining, with the controller, acceleration of the reaction platen along the drive plane at least from the variance in the predetermined excitation characteristic, and in response to the acceleration determined, control a bias attitude of the reaction platen to provide the predetermined bias attitude countering the payload inertial force arising from the acceleration of the reaction platen.

In accordance with one or more aspects of the disclosed embodiment the method further comprises: controlling, with the controller, excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment the controller is configured with a predetermined reaction platen temperature management protocol effecting temperature control of the at least one reaction platen.

In accordance with one or more aspects of the disclosed embodiment the predetermined reaction platen temperature management protocol controls a temperature of the at least one reaction platen via conduction from the at least one reaction platen to a thermal sink commensurate at least with a wafer swap operation of the at least one reaction platen.

In accordance with one or more aspects of the disclosed embodiment at least another reaction platen, that is alternate to the at least one reaction platen, is held inactive so as to be in a cold state, relative to the at least one reaction platen in its operative state, and the predetermined reaction platen temperature management protocol includes switching the at least another reaction platen to an operative state and replacing the at least one reaction platen, at its temperature limit, with the at least another reaction platen.

In accordance with one or more aspects of the disclosed embodiment the method further includes compensating for vibration of the at least one reaction platen under levitation propulsion forces with a passive vibration compensator, having a natural frequency mode tuned to compensate for the vibration of the at least one reaction platen, so as to effect a substantially vibration free end effector with respect to the end effector natural vibration frequency modes, wherein the at least one reaction platen includes a respective end effector.

In accordance with one or more aspects of the disclosed embodiment a method for an electromagnetic conveyor substrate transport apparatus is provided. The method comprises: providing the electromagnetic conveyor substrate transport apparatus with a chamber configured to hold a sealed atmosphere therein, and having a level reference plane and at least one substrate pass through opening for transferring a substrate in and out of the chamber through the opening; forming a drive plane with an array of electromagnets connected to the chamber at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source; providing at least one reaction platen of paramagnetic, diamagnetic, or non-magnetic conductive material disposed to cooperate with the electromagnets of the at least one multiphase actuator unit; exciting the electromagnets with alternating current to generate levitation and propulsion forces against the reaction platen that controllably levitate and propel the reaction platen along the at least one drive line, in a controlled attitude relative to the drive plane, where the electromagnets are sequentially excited, with a controller operably coupled to the array of electromagnets and alternating current power source, with multiphase alternating current with a predetermined excitation characteristic so that the at least one reaction platen is levitated and propelled; and determining, with the controller, reaction platen position feedback from variance in the predetermined excitation characteristic of the alternating current of at least one electromagnet of the at least one multiphase actuator unit effecting levitation and propulsion of the at least one reaction platen, wherein the variance in the predetermined characteristic defines self-deterministic reaction platen position feedback of each of the electromagnets of the at least one multiphase actuator unit effecting levitation and propulsion of the at least one reaction platen.

In accordance with one or more aspects of the disclosed embodiment each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

In accordance with one or more aspects of the disclosed embodiment the self-deterministic reaction platen position feedback is an absolute position feedback.

In accordance with one or more aspects of the disclosed embodiment the predetermined excitation characteristic is one or more of an inductance, a power factor and, a lag between voltage and current of the multiphase alternating current.

In accordance with one or more aspects of the disclosed embodiment the at least one reaction platen comprises more than one reaction platen, each of the more than one reaction platen having a corresponding shape that defines a respective power factor signature, the method further comprises: determining, with the controller, a position of each reaction platen based on the respective power factor signature.

In accordance with one or more aspects of the disclosed embodiment the method further comprises: superimposing a frequency on a fundamental frequency of a voltage generated by the multiphase alternating current power source, the frequency being separate and distinct from the fundamental frequency so as to decouple position feedback determination from levitation and propulsion of the at least one reaction platen.

In accordance with one or more aspects of the disclosed embodiment the reaction platen is levitated and propelled with up to six degrees of freedom including at least one of attitude and yaw control with the virtually moving at least one multiphase actuator unit.

In accordance with one or more aspects of the disclosed embodiment the method further comprises: controlling with the controller, the up to six degrees of freedom, generated by the array of electromagnets, including at least the reaction platen attitude with the reaction platen levitated and propelled so as to move relative to the array of electromagnets along the at least one drive line from a first predetermined position with respect to the chamber to a second different predetermined position with respect to the chamber.

In accordance with one or more aspects of the disclosed embodiment the method further comprises: controlling, with the controller, the up to six degrees of freedom, generated by the array of electromagnets, including at least the reaction platen attitude and the reaction platen yaw with the reaction platen levitated and stationary relative to the array of electromagnets in a predetermined position along the at least one drive line with respect to the chamber.

In accordance with one or more aspects of the disclosed embodiment the method further comprises: controlling the dynamic phase allocation so that the virtually moving at least one multiphase actuator unit moves virtually along the drive line substantially coincident with reaction platen movement along the drive line from propulsion by the virtually moving at least one multiphase actuator unit.

In accordance with one or more aspects of the disclosed embodiment the method further comprises: controlling, with the controller, the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

In accordance with one or more aspects of the disclosed embodiment the method further comprises: controlling, with the controller, the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

In accordance with one or more aspects of the disclosed embodiment the method further comprises: controlling, with the controller, the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

In accordance with one or more aspects of the disclosed embodiment the method further comprises: controlling, with the controller, the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

In accordance with one or more aspects of the disclosed embodiment the method further comprises: determining, with the controller, acceleration of the reaction platen along the drive plane at least from the variance in the predetermined excitation characteristic, and in response to the acceleration determined, control a bias attitude of the reaction platen to provide the predetermined bias attitude countering the payload inertial force arising from the acceleration of the reaction platen.

In accordance with one or more aspects of the disclosed embodiment the method further comprises: controlling, with the controller, excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

In accordance with one or more aspects of the disclosed embodiment the dynamic phase allocation is controlled so that the respective electromagnets energized by the multiphase alternating current present, with respect to the reaction platen, a substantially steady state multiphase distribution across respective electromagnets of the virtually moving at least one multiphase actuator unit.

In accordance with one or more aspects of the disclosed embodiment the controller is configured with a predetermined reaction platen temperature management protocol effecting temperature control of the at least one reaction platen.

In accordance with one or more aspects of the disclosed embodiment the predetermined reaction platen temperature management protocol controls a temperature of the at least one reaction platen via conduction from the at least one reaction platen to a thermal sink commensurate at least with a wafer swap operation of the at least one reaction platen.

In accordance with one or more aspects of the disclosed embodiment at least another reaction platen, that is alternate to the at least one reaction platen, is held inactive so as to be in a cold state, relative to the at least one reaction platen in its operative state, and the predetermined reaction platen temperature management protocol includes switching the at least another reaction platen to an operative state and replacing the at least one reaction platen, at its temperature limit, with the at least another reaction platen.

In accordance with one or more aspects of the disclosed embodiment method further includes compensating for vibration of the at least one reaction platen under levitation propulsion forces with a passive vibration compensator, having a natural frequency mode tuned to compensate for the vibration of the at least one reaction platen, so as to effect a substantially vibration free end effector with respect to the end effector natural vibration frequency modes, wherein the at least one reaction platen includes a respective end effector.

It should be understood that the foregoing description is only illustrative of the aspects of the disclosed embodiment. Various alternatives and modifications can be devised by those skilled in the art without departing from the aspects of the disclosed embodiment. Accordingly, the aspects of the disclosed embodiment are intended to embrace all such alternatives, modifications and variances that fall within the scope of any claims appended hereto. Further, the mere fact that different features are recited in mutually different dependent or independent claims does not indicate that a combination of these features cannot be advantageously used, such a combination remaining within the scope of the aspects of the present disclosure.

What is claimed is:

1. A linear electrical machine comprising:
a frame with a level reference plane;
an array of electromagnets, connected to the frame to form a drive plane at a predetermined height relative to the level reference plane, the array of electromagnets being arranged so that a series of electromagnets of the array of electromagnets define at least one drive line within the drive plane, and each of the electromagnets being coupled to a multiphase alternating current power source energizing each electromagnet;
at least one reaction platen of paramagnetic, diamagnetic, or non-magnetic conductive material disposed to cooperate with the electromagnets of the array of electromagnets so that excitation of the electromagnets with multiphase alternating current generates levitation and propulsion forces against the reaction platen that controllably levitate and propel the reaction platen along the at least one drive line, in a controlled attitude relative to the drive plane; and
a controller operably coupled to the array of electromagnets and the multiphase alternating current power source and configured so as to sequentially excite the electromagnets with the multiphase alternating current with a predetermined excitation characteristic so that each reaction platen has six degrees of freedom reaction platen control and is levitated and propelled with at least four degrees of freedom from the six degrees of freedom reaction platen control, wherein the controller is configured so as to determine reaction platen position feedback, in at least one degree of freedom from the six degrees of freedom reaction platen control, from variance in the predetermined excitation characteristic of the alternating current of at least one electromagnet effecting levitation or propulsion of the reaction platen, wherein the variance in the predetermined excitation characteristic defines self-deterministic reaction platen position feedback of each of the at least one electromagnet, of the array of electromagnets, effecting levitation or propulsion of the reaction platen.

2. The linear electric machine of claim 1, wherein the six degrees of freedom include at least one of attitude control and yaw control, the at least one of the attitude control and the yaw control are effected with a common set of electromagnets of the array of electromagnets, where each electromagnet generates, from excitation with common multiphase alternating current having a single common frequency per phase, both the levitation and the propulsion forces against the reaction platen so as to control the reaction platen with the up to six at least four degrees of freedom including at least one of reaction platen attitude and reaction platen yaw at least with the reaction platen levitated.

3. The linear electric machine of claim 1, wherein the self-deterministic reaction platen position feedback is an absolute position feedback.

4. The linear electric machine of claim 1, wherein the predetermined excitation characteristic is one or more of inductance, a power factor, and a lag between voltage and current of the multiphase alternating current.

5. The linear electric machine of claim 1, wherein:
the at least one reaction platen comprises more than one reaction platen, each of the more than one reaction platen having a corresponding shape that defines a respective power factor signature; and
the controller is configured to determine a position of each reaction platen based on the respective power factor signature.

6. The linear electrical machine of claim 1, wherein a frequency is superimposed on a fundamental frequency of a voltage generated by the multiphase alternating current power source, the frequency being separate and distinct from the fundamental frequency so as to decouple position feedback determination from levitation and propulsion of the at least one reaction platen.

7. The linear electrical machine of claim 1, wherein the controller controls the at least four degrees of freedom, generated by the array of electromagnets, including at least the reaction platen attitude with the reaction platen levitated and propelled so as to move relative to the array of electromagnets along the at least one drive line from a first predetermined position with respect to the frame to a second different predetermined position with respect to the frame.

8. The linear electrical machine of claim 1, wherein the controller controls the at least four degrees of freedom, generated by the array of electromagnets, including at least the reaction platen attitude and the reaction platen yaw with the reaction platen levitated and stationary relative to the array of electromagnets in a predetermined position along the at least one drive line with respect to the frame.

9. The linear electrical machine of claim 1, wherein the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the frame, to a second different predetermined orientation relative to the frame.

10. The linear electrical machine of claim 1, wherein the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the frame.

11. The linear electrical machine of claim 1, wherein the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

12. The linear electrical machine of claim 1, wherein the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

13. The linear electrical machine of claim 1, wherein the controller controls excitation of the electromagnets of the array of electromagnets so as to set the reaction platen attitude to bias the reaction platen against inertial forces tending to displace a payload, seated against the reaction platen, relative to the reaction platen along a seat between the payload and the reaction platen.

14. The linear electrical machine of claim 1, further comprising a passive vibration compensator having a natural frequency mode tuned to compensate for vibration of the at least one reaction platen under levitation propulsion forces so as to effect a substantially vibration free end effector with respect to the end effector natural vibration frequency modes, wherein the at least one reaction platen includes a respective end effector.

15. An electromagnetic conveyor substrate transport apparatus comprising:
- a chamber configured to hold a sealed atmosphere therein, and having a level reference plane and at least one substrate pass through opening for transferring a substrate in and out of the chamber through the opening;
- an array of electromagnets, connected to the chamber to form a drive plane at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source;
- at least one reaction platen of paramagnetic, diamagnetic, or non-magnetic conductive material disposed to cooperate with the electromagnets of the at least one multiphase actuator unit so that excitation of the electromagnets with multiphase alternating current generates levitation and propulsion forces against the reaction platen that controllably levitate and propel the reaction platen along the at least one drive line, in a controlled attitude relative to the drive plane; and
- a controller operably coupled to the array of electromagnets and multiphase alternating current power source and configured so as to sequentially excite the electromagnets with the multiphase alternating current with a predetermined excitation characteristic so that the at least one reaction platen has six degrees of freedom reaction platen control and is levitated and propelled with at least four degrees of freedom from the six degrees of freedom reaction platen control, wherein the controller is configured so as to determine reaction platen position feedback from variance in the predetermined excitation characteristic of the multiphase alternating current of at least one electromagnet of the at least one multiphase actuator unit effecting levitation and propulsion of the at least one reaction platen, wherein the variance in the predetermined characteristic defines self-deterministic reaction platen position feedback of each of the electromagnets of the at least one multiphase actuator unit effecting levitation and propulsion of the at least one reaction platen.

16. The electromagnetic conveyor substrate transport apparatus of claim 15, wherein each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

17. The electromagnetic conveyor substrate transport apparatus of claim 16, wherein the dynamic phase allocation is controlled so that the virtually moving at least one multiphase actuator unit moves virtually along the drive line substantially coincident with reaction platen movement along the drive line from propulsion by the virtually moving at least one multiphase actuator unit.

18. The electromagnetic conveyor substrate transport apparatus of claim 16, wherein the dynamic phase allocation is controlled so that the respective electromagnets energized by the multiphase alternating current present, with respect to the reaction platen, a substantially steady state multiphase distribution across respective electromagnets of the virtually moving at least one multiphase actuator unit.

19. The electromagnetic conveyor substrate transport apparatus of claim 15, wherein a frequency is superimposed on a fundamental frequency of a voltage generated by the multiphase alternating current power source, the frequency being separate and distinct from the fundamental frequency so as to decouple position feedback determination from levitation and propulsion of the at least one reaction platen.

20. The electromagnetic conveyor substrate transport apparatus of claim 15, wherein the controller controls the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

21. The electromagnetic conveyor substrate transport apparatus of claim 15, wherein the controller controls the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

22. The electromagnetic conveyor substrate transport apparatus of claim 15, wherein the controller controls the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

23. The electromagnetic conveyor substrate transport apparatus of claim 15, wherein the controller controls the levitation forces, generated by the array of electromagnets, so as to effect a predetermined bias attitude of the reaction platen, relative to the drive plane, that imparts a bias reaction force, from a reaction platen payload seating surface on a payload supported by the reaction platen seating surface, in a direction countering payload inertial force arising from acceleration of the reaction platen along the drive plane.

24. A method for a linear electrical machine, the method comprising:
- providing the linear electrical machine with a frame having a level reference plane;
- forming a drive plane, with an array of electromagnets connected to the frame, at a predetermined height relative to the level reference plane, the array of electromagnets being arranged so that a series of electromagnets of the array of electromagnets define at least one drive line within the drive plane, and each of the electromagnets being coupled to a multiphase alternating current power source energizing each electromagnet;
- providing at least one reaction platen of paramagnetic, diamagnetic, or non-magnetic conductive material disposed to cooperate with the electromagnets of the array of electromagnets;

exciting the electromagnets with alternating current to generate levitation and propulsion forces against the reaction platen that controllably levitate and propel the reaction platen along the at least one drive line, in a controlled attitude relative to the drive plane where the electromagnets are sequentially excited, with a controller operably coupled to the array of electromagnets and the alternating current power source, with multiphase alternating current with a predetermined excitation characteristic so that each reaction platen has six degrees of freedom reaction platen control and is levitated and propelled with at least four degrees of freedom from the six degrees of freedom reaction platen control; and determining, with the controller, reaction platen position feedback, in at least one degree of freedom from the at least four degrees of freedom reaction platen control, from variance in the predetermined excitation characteristic of the alternating current of at least one electromagnet effecting levitation or propulsion of the reaction platen, wherein the variance in the predetermined characteristic defines self-deterministic reaction platen position feedback of each of the at least one electromagnet, of the array of electromagnets, effecting levitation or propulsion of the reaction platen.

25. The method of claim 24, wherein the six degrees of freedom include at least one of attitude control and yaw control, the at least one of the attitude control and the yaw control are effected with a common set of electromagnets of the array of electromagnets, where each electromagnet generates, from excitation with common multiphase alternating current having a single common frequency per phase, both the levitation and the propulsion forces against the reaction platen so as to control the reaction platen with the at least four degrees of freedom including at least one of reaction platen attitude and reaction platen yaw at least with the reaction platen levitated.

26. The method of claim 24, wherein the self-deterministic reaction platen position feedback is an absolute position feedback.

27. The method of claim 24, wherein the predetermined excitation characteristic is one or more of inductance, a power factor, and a lag between voltage and current of the multiphase alternating current.

28. The method of claim 24, further comprising:
superimposing a frequency on a fundamental frequency of a voltage generated by the multiphase alternating current power source, the frequency being separate and distinct from the fundamental frequency so as to decouple position feedback determination from levitation and propulsion of the at least one reaction platen.

29. The method of claim 24, further comprising:
controlling, with the controller, the at least four degrees of freedom, generated by the array of electromagnets, including at least the reaction platen attitude with the reaction platen levitated and propelled so as to move relative to the array of electromagnets along the at least one drive line from a first predetermined position with respect to the frame to a second different predetermined position with respect to the frame.

30. A method for an electromagnetic conveyor substrate transport apparatus, the method comprising:
providing the electromagnetic conveyor substrate transport apparatus with a chamber configured to hold a sealed atmosphere therein, and having a level reference plane and at least one substrate pass through opening for transferring a substrate in and out of the chamber through the opening;

forming a drive plane with an array of electromagnets connected to the chamber at a predetermined height relative to the level reference plane, the array of electromagnets being arranged so that a series of electromagnets of the array of electromagnets define at least one drive line within the drive plane, electromagnets in the series of electromagnets being grouped into at least one multiphase actuator unit, and each of the at least one multiphase actuator unit being coupled to a multiphase alternating current power source;

providing at least one reaction platen of paramagnetic, diamagnetic, or non-magnetic conductive material disposed to cooperate with the electromagnets of the at least one multiphase actuator unit;

exciting the electromagnets with multiphase alternating current to generate levitation and propulsion forces against the reaction platen that controllably levitate and propel the reaction platen along the at least one drive line, in a controlled attitude relative to the drive plane, where the electromagnets are sequentially excited, with a controller operably coupled to the array of electromagnets and multiphase alternating current power source, with the multiphase alternating current with a predetermined excitation characteristic so that the at least one reaction platen has six degrees of freedom reaction platen control and is levitated and propelled with at least four degrees of freedom from the six degrees of freedom reaction platen control; and determining, with the controller, reaction platen position feedback from variance in the predetermined excitation characteristic of the multiphase alternating current of at least one electromagnet of the at least one multiphase actuator unit effecting levitation and propulsion of the at least one reaction platen, wherein the variance in the predetermined characteristic defines self-deterministic reaction platen position feedback of each of the electromagnets of the at least one multiphase actuator unit effecting levitation and propulsion of the at least one reaction platen.

31. The method of claim 30, wherein each alternating current phase, of the multiphase alternating current, is dynamically allocated between respective electromagnets so that the alternating current phase of each respective electromagnet, of the electromagnet group of the at least one multiphase actuator unit, changes from a first alternating current phase to a second different alternating current phase so in effect the electromagnet group moves virtually and the at least one multiphase actuator unit formed by the electromagnet group moves virtually via dynamic phase allocation along the drive line.

32. The method of claim 30, further comprising:
superimposing a frequency on a fundamental frequency of a voltage generated by the multiphase alternating current power source, the frequency being separate and distinct from the fundamental frequency so as to decouple position feedback determination from levitation and propulsion of the at least one reaction platen.

33. The method of claim 30, wherein the reaction platen is levitated and propelled with the at least four degrees of freedom including at least one of attitude and yaw control with the virtually moving at least one multiphase actuator unit.

34. The method of claim 30, further comprising:
controlling, with the controller, the propulsion forces, generated by the array of electromagnets, across the reaction platen so as to impart a controlled yaw moment on the reaction platen, yawing the reaction platen about a yaw axis, substantially normal to the drive plane, from a first predetermined orientation relative to the chamber, to a second different predetermined orientation relative to the chamber.

35. The method of claim 30, further comprising:
controlling, with the controller, the propulsion forces, generated by the array of electromagnets, so as to impart a moment couple on the reaction platen effecting controlled yaw of the reaction platen so as to effect at least one of positioning and centering of a wafer payload on the reaction platen relative to a predetermined wafer holding location of the chamber.

36. The method of claim 30, further comprising:
controlling, with the controller, the levitation forces, generated by the array of electromagnets, so as to impart differential levitation forces across the reaction platen that effect a controlled inclination of the reaction platen, relative to the drive plane, that controls a predetermined reaction platen attitude in at least one of reaction platen pitch and reaction platen roll.

37. The linear electrical machine of claim 1, wherein the controller is configured with a predetermined reaction platen temperature management protocol effecting temperature control of the at least one reaction platen.

* * * * *